US012575175B2

(12) United States Patent
Park et al.

(10) Patent No.: US 12,575,175 B2
(45) Date of Patent: Mar. 10, 2026

(54) MULTIPLE GATE-ALL-AROUND SEMICONDUCTOR DEVICES WITH GATE SEPARATION

(71) Applicant: SAMSUNG ELECTRONICS CO., LTD., Suwon-si (KR)

(72) Inventors: Junmo Park, Seoul (KR); Yeonho Park, Seoul (KR); Kyubong Choi, Seoul (KR); Cheol Kim, Hwaseong-si (KR); Junseok Lee, Suwon-si (KR); Jinseok Lee, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 844 days.

(21) Appl. No.: 17/694,192

(22) Filed: Mar. 14, 2022

(65) Prior Publication Data

US 2023/0005910 A1    Jan. 5, 2023

(30) Foreign Application Priority Data

Jul. 5, 2021    (KR) ........................ 10-2021-0087744

(51) Int. Cl.
  *H10D 84/85*        (2025.01)
  *H01L 21/02*        (2006.01)
          (Continued)

(52) U.S. Cl.
  CPC ....... *H10D 84/856* (2025.01); *H01L 21/0259* (2013.01); *H10D 30/031* (2025.01);
          (Continued)

(58) Field of Classification Search
  CPC .............. H10D 84/85; H10D 84/0181; H10D 84/0184; H10D 84/0186; H10D 84/0188; H10D 30/62; H10D 30/501; H10D 30/508
  See application file for complete search history.

(56) References Cited

U.S. PATENT DOCUMENTS 9,330,983 B1 *  5/2016  Cheng .................. H10D 62/117
9,960,077 B1     5/2018  Zang et al.
            (Continued)

FOREIGN PATENT DOCUMENTS

KR    10-2016-0121765  A    10/2016
KR    1020190117177  A    10/2019
            (Continued)

*Primary Examiner* — Davienne N Monbleau
*Assistant Examiner* — Heim Kirin Grewal
(74) *Attorney, Agent, or Firm* — Wolf, Greenfield & Sacks, P.C.

(57)        ABSTRACT

A semiconductor memory device includes: a substrate having first and second channel structures extending in a first direction arranged spaced apart in a second direction; a first gate structure disposed on the first channel structure; a second gate structure disposed on the second channel structure; first source/drain regions disposed on opposite sides of the first gate structure; second source/drain regions disposed on opposite sides of the second gate structure; a gate separation pattern disposed between the gate structures to directly contact the gate structures and having an upper surface disposed at a level lower than an upper surface of the gate structures along a third direction; and a gate capping layer disposed on the gate structures and having an extension portion disposed between the gate structures such that the extension portion directly contacts the gate structures, the gate capping layer being connected to the gate separation pattern.

20 Claims, 138 Drawing Sheets

(51) Int. Cl.

| | |
|---|---|
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |

(52) U.S. Cl.
CPC ..... *H10D 30/6713* (2025.01); *H10D 30/6729* (2025.01); *H10D 30/6735* (2025.01); *H10D 30/6757* (2025.01); *H10D 62/118* (2025.01); *H10D 64/017* (2025.01); *H10D 84/0167* (2025.01); *H10D 84/017* (2025.01); *H10D 84/038* (2025.01)

(56) References Cited

U.S. PATENT DOCUMENTS

| | | | |
|---|---|---|---|
| 10,366,930 B1 | 7/2019 | Xie et al. | |
| 10,388,652 B2 | 8/2019 | Shi et al. | |
| 10,593,801 B2 * | 3/2020 | Lee | H10D 62/021 |
| 10,692,990 B2 | 6/2020 | Bao et al. | |
| 10,741,401 B1 | 8/2020 | Xu et al. | |
| 10,832,916 B1 | 11/2020 | Xie et al. | |
| 2014/0264483 A1 * | 9/2014 | Yoshida | H10D 64/666 |
| | | | 257/288 |
| 2018/0108770 A1 * | 4/2018 | Cheng | H01L 21/3085 |
| 2018/0248030 A1 | 8/2018 | Cheng et al. | |
| 2019/0312124 A1 | 10/2019 | Lee et al. | |
| 2020/0119163 A1 | 4/2020 | Xie et al. | |
| 2020/0243648 A1 | 7/2020 | Sporre et al. | |
| 2020/0287048 A1 | 9/2020 | Zhou et al. | |
| 2020/0343377 A1 * | 10/2020 | Chiang | H10D 30/62 |
| 2021/0057525 A1 | 2/2021 | Chiang et al. | |

FOREIGN PATENT DOCUMENTS

| | | | |
|---|---|---|---|
| KR | 10-2020-0125896 A | 11/2020 | |
| KR | 1020210024405 A | 3/2021 | |

* cited by examiner

II2-II2'

II1–II1'

I1-I1'

III1–III1'

I2–I2'

II1–II1'

I2–I2'

II2-II2'

III1–III1'

I1–I1'

I2-I2'

II2–II2'

II2-II2'

III1-III1'

II2–II2'

I1–I1'

I2–I2'

II2–II2'

I1-I1'

II1-II1'

II2–II2'

II1–II1'

III1–III1'

I1-I1'

II1–II1'

I1-I1'

II1–II1'

II1–II1'

II1–II1'

III1-III1'

II1-II1'

III1–III1'

I1-I1'

III1-III1'

II1–II1′

I1–I1'

III1–III1'

I1-I1'

III1–III1'

I1-I1'

III1-III1'

I1-I1'

II2-II2'

I1-I1'

II1–II1'

II2–II2'

II1–II1'

II2-II2'

I1-I1'

II1–II1'

II2-II2'

I1-I1'

I1–I1'

III1–III1'

I1-I1'

II1–II1'

II1–II1'

II2–II2'

MULTIPLE GATE-ALL-AROUND SEMICONDUCTOR DEVICES WITH GATE SEPARATION

CROSS-REFERENCE TO RELATED APPLICATION

This application is based on and claims priority to Korean Patent Application No. 10-2021-0087744 filed on Jul. 5, 2021 in the Korean Intellectual Property Office, the disclosure of which is incorporated herein by reference in its entirety.

BACKGROUND

The present disclosure relates to a semiconductor device.

With increasing demand for high performance, high speed, and/or multi-functionality in the semiconductor device, there is significantly increasing demand for a high degree of integration of semiconductor devices. According to downscaling of semiconductor devices, a short channel effect of a transistor may occur, and the short channel effect may cause reliability of an integrated circuit device to be deteriorated. A semiconductor device including fin-shaped active region has been proposed to reduce a short channel effect. In addition, a gate cutting technology having high reliability has been required with a reduction in design rule.

SUMMARY embodiments provide a semiconductor device having an improved degree of integration.

According to embodiments, there is provided a semiconductor device which may include: a substrate having a first channel structure and a second channel structure respectively extending in a first direction and arranged in a second direction perpendicular to the first direction; a first gate structure disposed on the first channel structure and extending in the second direction on the substrate; a second gate structure disposed on the second channel structure and extending in the second direction; first source/drain regions respectively disposed on opposite sides of the first gate structure; second source/drain regions respectively disposed on opposite sides of the second gate structure; a gate separation pattern disposed between the first and second gate structures and having an upper surface at a level lower than that of an upper surface of each of the first and second gate structures, the gate separation pattern including a first insulating material; and a gate capping layer disposed on the first and second gate structures and having an extension portion extending between the first and second gate structures to be connected to the gate separation pattern, the gate capping layer including a second insulating material different from the first insulating material.

According to embodiments, there is provide a semiconductor device which may include: a substrate having a first channel structure and a second channel structure respectively extending in a first direction and arranged in a second direction, intersecting the first direction; a device isolation layer disposed on the substrate and defining the first and second channel structures; a first gate structure disposed on the first channel structure and extending in the second direction on the substrate; a second gate structure disposed on the second channel structure and extending in the second direction; first source/drain regions, respectively disposed on opposite sides of the first gate structure; second source/drain regions, respectively disposed on opposite sides of the second gate structure; and a gate capping layer having a first region, disposed on the first and second gate structures, and a second region, extending to a space between the first and second gate structures and provided as a gate separation pattern, the first region and the second region being a single integrated structure.

According to embodiments, there is provide a semiconductor device which may include: a substrate having a channel structure extending in a first direction; a gate structure disposed on the channel structure and extending in a second direction intersecting the first direction; a gate separation pattern disposed to be in contact with a lower region of one end portion of the gate structure and having an upper surface at a level lower than that of an upper surface of the gate structure, the gate separation pattern comprising a first insulating material; a gate capping layer disposed on the gate structure and having an extension portion extending to be in contact with an upper region of the one end portion of the gate structure, the gate capping layer comprising a second insulating material different from the first insulating material; source/drain regions respectively disposed on opposite sides adjacent to the gate structure; and contact structures respectively connected to the source/drain regions.

BRIEF DESCRIPTION OF DRAWINGS

The above and other aspects, features, and advantages of the present disclosure will be more clearly understood from the following detailed description, taken in conjunction with the accompanying drawings.

FIGS. 12A to 23A, FIGS. 12B to 23B, FIGS. 12C to 23C, and FIGS. 12D to 23D are cross-sectional views of main processes illustrating a method of fabricating a semiconductor device, according to an embodiment (see FIGS. 1A to 1E), respectively.

FIGS. 24A to 27A and FIGS. 24B to 27B are cross-sectional views of main processes illustrating a method of fabricating a semiconductor device, according to an embodiment (see FIG. 3), respectively.

FIGS. 34A to 37A and FIGS. 34B to 37B are cross-sectional views of main processes illustrating a method of fabricating a semiconductor device, according to an embodiment (see FIGS. 6A to 6C), respectively.

FIGS. 43A to 46A, FIGS. 43B to 46B, and FIGS. 43C to 46C are cross-sectional views of main processes illustrating a method of fabricating a semiconductor device, according to an embodiment (see FIGS. 9A and 9B), respectively.

DETAILED DESCRIPTION

All of the embodiments described herein are example embodiments, and thus, the inventive concept is not limited thereto and may be realized in various other forms. Hereinafter, these embodiments are be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1A:
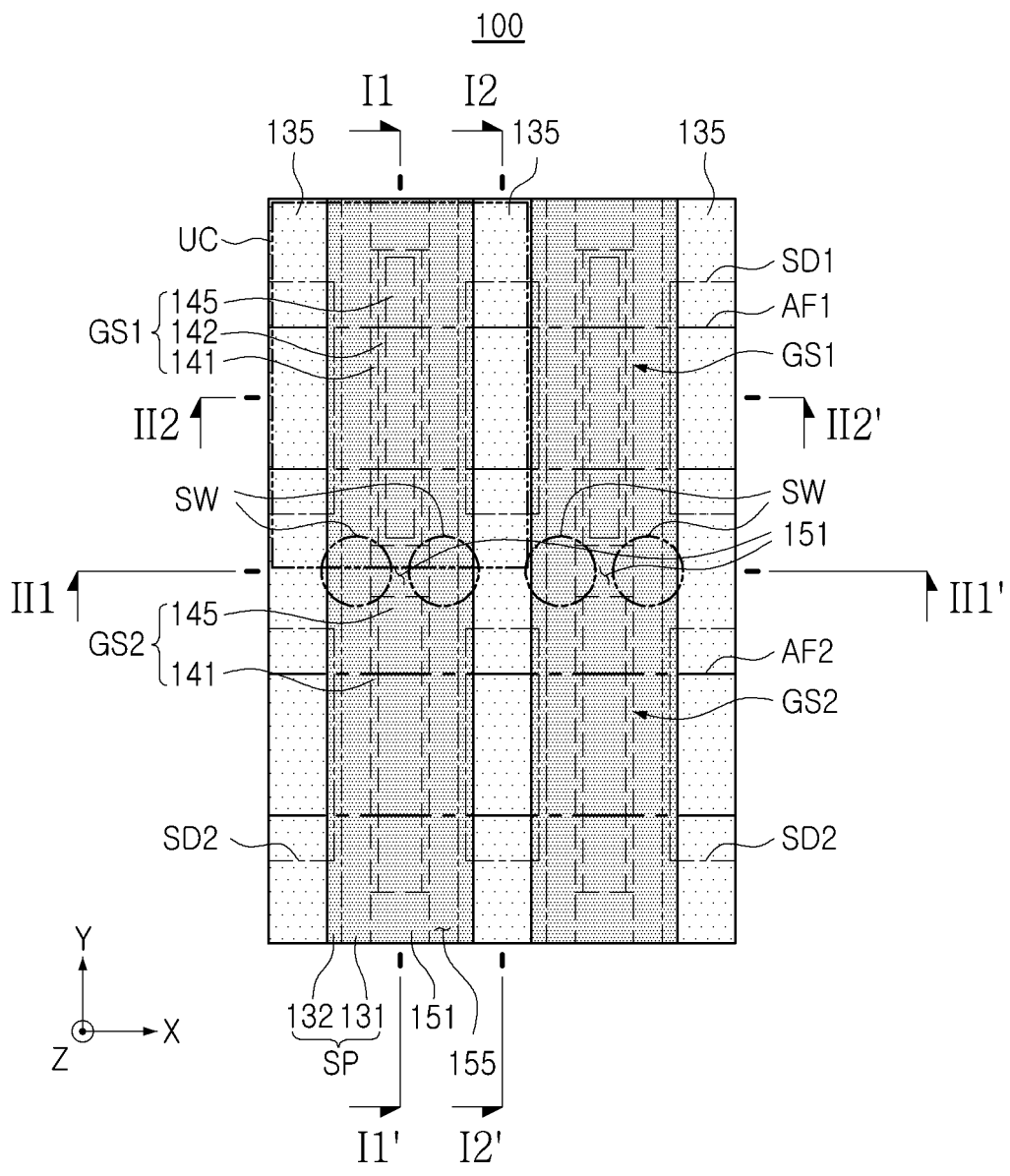
FIG. 1A is a plan view of a semiconductor device according to an embodiment.
Figure 1B:
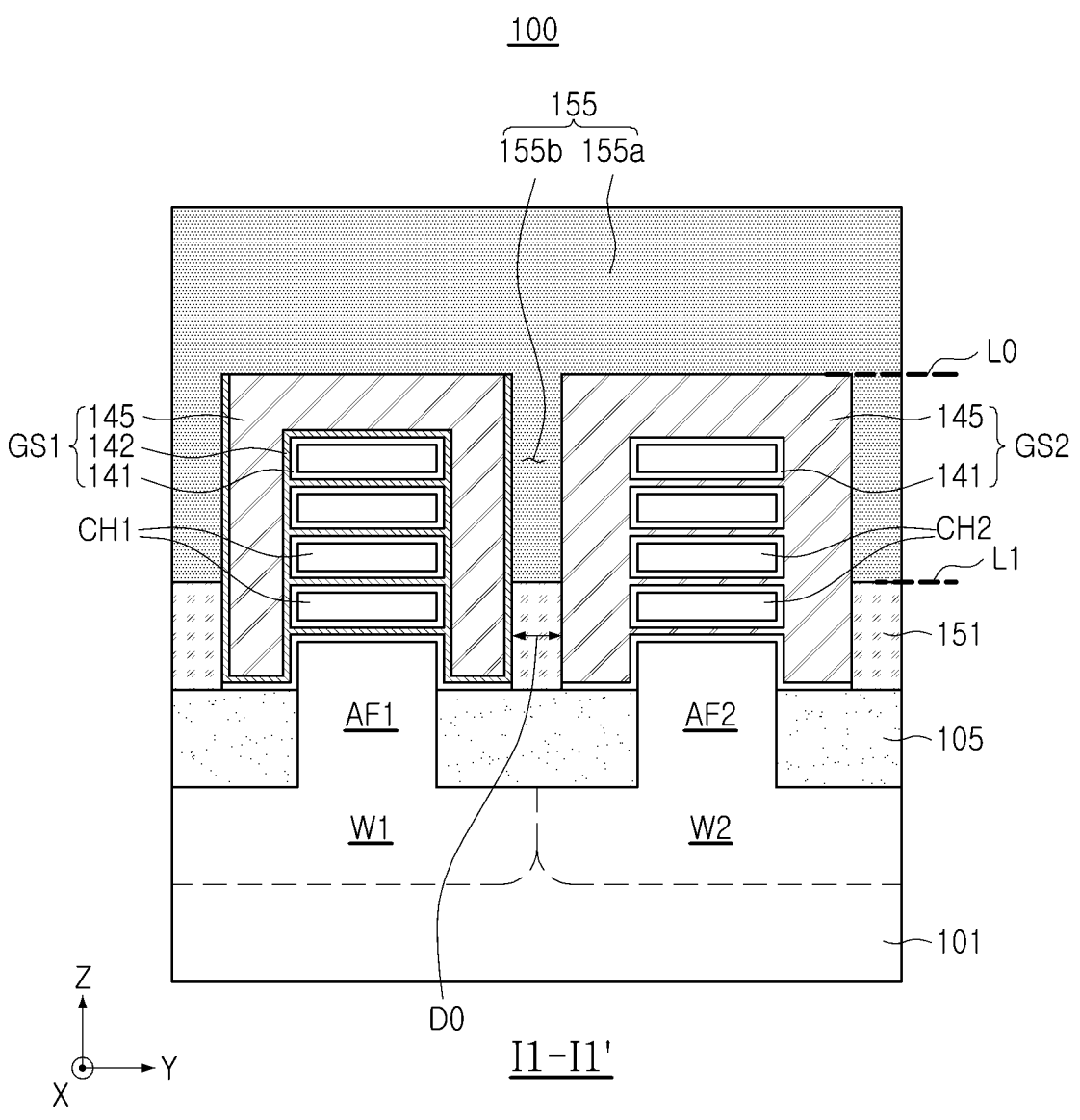
FIGS. 1B and 1C are cross-sectional views of the semiconductor device illustrated in FIG. 1A, respectively taken along lines I1-I1' and I2-I2'.
Figure 1C:
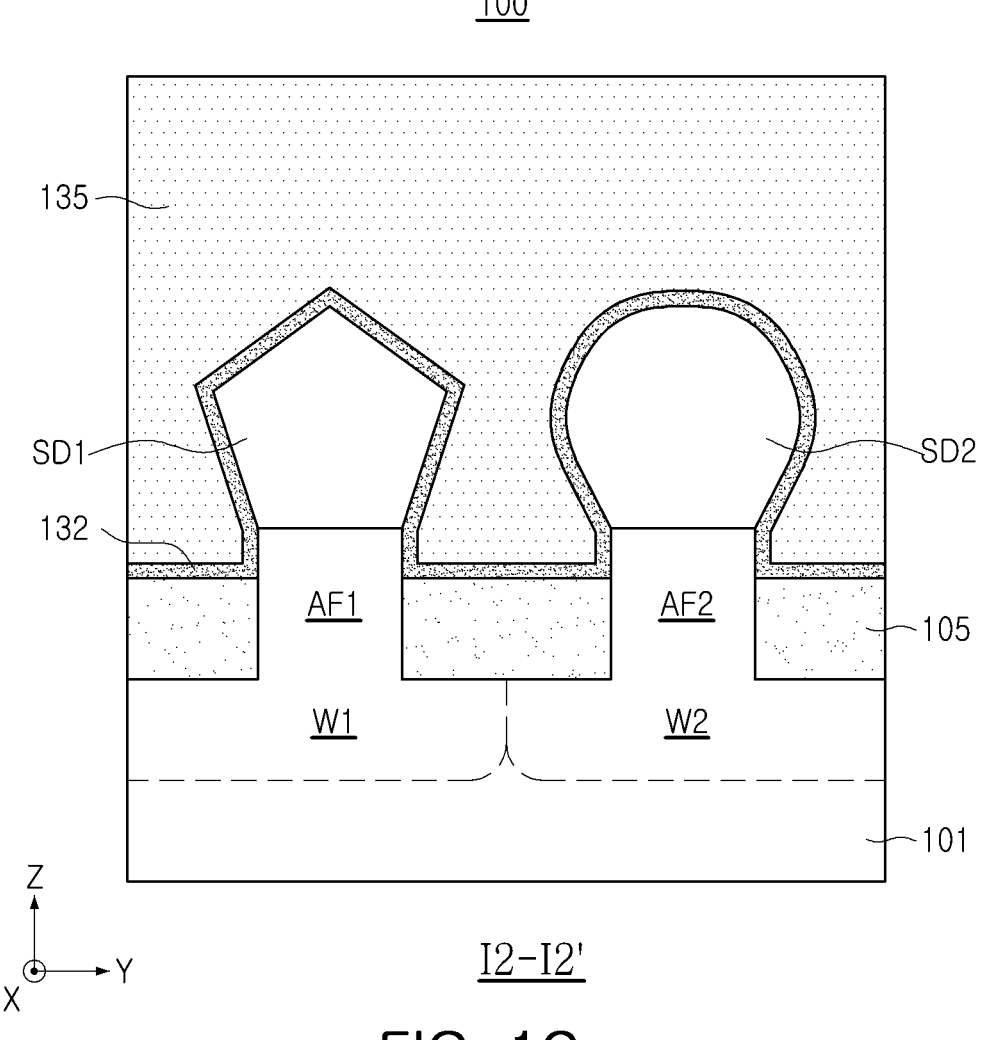
Figure 1D:
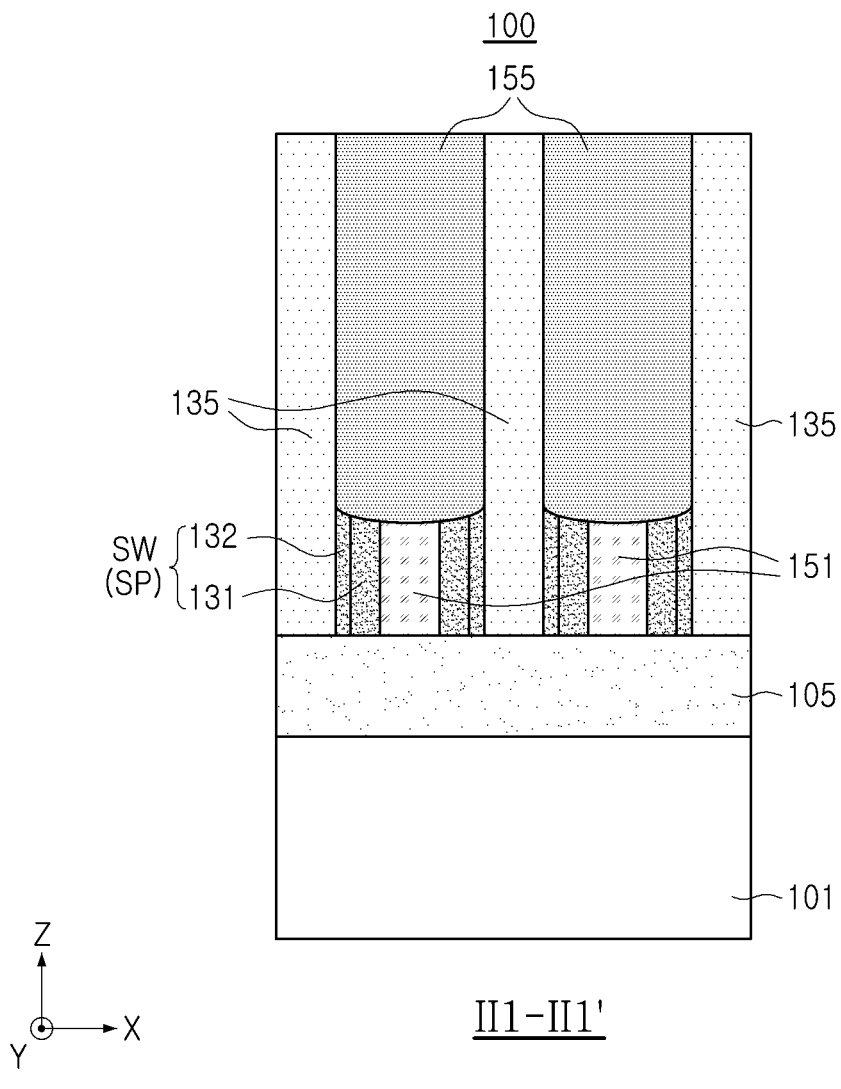
FIGS. 1D and 1E are cross-sectional views of the semiconductor device illustrated in FIG. 1A, respectively taken along lines II1-II1' and II2-II2'.
Figure 1E:
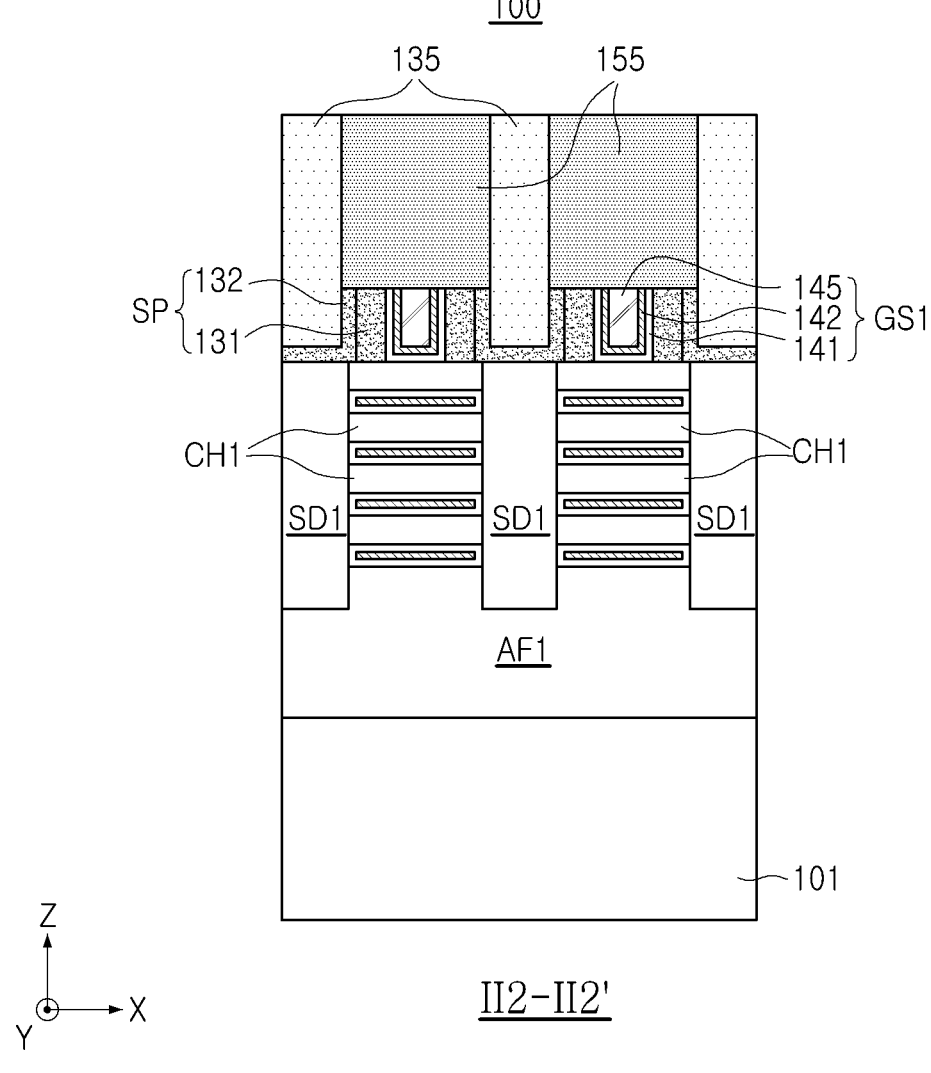

FIG. 1A is a plan view of a semiconductor device according to an embodiment, FIGS. 1B and 1C are cross-sectional views of the semiconductor device illustrated in FIG. 1A, respectively taken along lines I1-I1' and I2-I2', and FIGS. 1D and 1E are cross-sectional views of the semiconductor device illustrated in FIG. 1A, respectively taken along lines II1-II1' and II2-II2'.

Referring to FIGS. 1A to 1E, a semiconductor device 100 according to an embodiment may include a substrate 101, first and second active fins AF1 and AF2 extending in a first direction (for example, an X direction hereafter) on the substrate 101, a plurality of first and second channel layers CH1 and CH2 respectively disposed on the first and second active fins AF1 and AF2, and spaced apart from each other in a third direction (for example, a Z direction hereafter), perpendicular to an upper surface of the substrate 101, and a plurality of first and second gate structures GS1 and GS2 respectively intersecting the first and second active fins AF1 and AF2 and extending in a second direction (for example, a Y direction hereafter). The first and second channel layers CH1 and CH2 may be nanosheet layers to form corresponding nanosheet transistors, respectively, according to an embodiment. It is understood herein that the first, second and third directions may also be referred to as channel length, channel width and channel height directions, respectively.

Also, the semiconductor device 100 may include first and second source/drain regions SD1 and SD2, respectively disposed on opposite sides adjacent to the first and second gate structures GS1 and GS2. The first and second source/drain regions SD1 and SD2 may be configured to be in contact with the plurality of first and second channel layers CH1 and CH2, respectively.

In the present embodiment, the first and second active fins AF1 and AF2 have a fin structure extending in the first direction and protruding in the third direction. For example, the substrate 101 may be a semiconductor substrate such as a silicon substrate or a germanium substrate, or a silicon-on-insulator (SOI) substrate. The first and second active fins AF1 and AF2 may be formed in a conductivity-type semiconductor region such as an impurity-doped well or an impurity-doped structure. For example, the first active fin AF1 may be formed in an P-type well W1 for a PMOS transistor, and the second active fin AF2 may be formed in a N-type well W2 for an NMOS transistor.

A device isolation layer 105 may define the first and second active fins AF1 and AF2. Referring to FIGS. 1B and 1C, the device isolation layer 105 may be disposed on the substrate 101 to be disposed on side surfaces of each of the first and second active fins AF1 and AF2. The device isolation layer 105 may be disposed such that upper regions of the first and second active fins AF1 and AF2 are exposed. In some embodiments, the device isolation layer 105 may have a curved top surface having a height level increased in a direction toward the first and second active fins AF1 and AF2. The device isolation layer 105 may be formed by a shallow trench isolation (STI) process. In some embodiments, the device isolation layer 105 may further include a region extending deeper inwardly of the substrate 101 (for example, a deep trench isolation (DTI) region). For example, the device isolation layer 105 may include an oxide layer, a nitride layer, or a combination thereof.

Referring to FIGS. 1A, 1B, and 1E, each of the first and second gate structures GS1 and GS2 may include first and second gate electrode layers 142 and 145 extending in the second direction and surrounding a plurality of first and second channel layers CH1 and CH2, a gate insulating layer 141 disposed between the plurality of first and second channel layers CH1 and CH2 and the first and second gate electrode layers 142 and 145, and a gate spacer SP disposed on opposite side surfaces of the second gate electrode layer 145. A gate capping layer 155 may be disposed on the first and second gate structures GS1 and GS2. The above-described semiconductor structures may for gate-all-around type field effect transistors.

In the present embodiment, the gate spacer SP may include a first layer 131 (also referred to as a "sidewall spacer"), disposed on opposite side surfaces of the first and second gate electrode layers 142 and 145, and a second layer 132 (referred to as an "etch stop layer") disposed on the first layer 131. The second layer 132 may be disposed on an upper surface of the device isolation layer 105 except for the first and second gate structures GS1 and GS2, and on the first and second sources/drain regions SD1 and SD2 except for a contact region (see FIGS. 2A and 2B), and may be used as an etch-stop layer in a subsequent process (for example, a process for forming first and second contact structures). For example, at least one of the first layer 131 and the second layer 132 may be formed of an insulating material such as silicon nitride (SiN$_x$), silicon oxynitride (SiO$_x$N$_y$), silicon carbonitride (SiC$_x$N$_y$), or silicon oxycarbonitride (SiO$_x$C$_y$N$_z$). For example, the gate insulating layer 141 may include at least one of a silicon oxide layer, a silicon nitride layer, a silicon oxynitride layer, or a high-k dielectric layer. The high-k dielectric layer may include a material, having a higher dielectric constant than a silicon oxide layer, such hafnium oxide (HfO), aluminum oxide (AlO), or tantalum oxide (TaO).

The first and second gate electrode layers 142 and 145 may include a conductive material, for example, metal nitride such as titanium nitride (TiN), tantalum nitride (TaN), or tungsten nitride (WN), and/or a metallic material such as aluminum (Al), tungsten (W), or molybdenum (Mo), or a semiconductor material such as doped polysilicon. In some embodiments, the first and second gate electrode layers 142 and 145 may have a multilayer structure including two or more layers.

An interlayer insulating layer 135 may be disposed on the substrate 101, the first and second source/drain regions SD1 and SD2, and the first and second gate structures GS1 and GS2. In some regions, the interlayer insulating layer 135 may be disposed on the device isolation layer 105. For example, the interlayer insulating layer 135 may include a low-k dielectric material such as silicon oxide. The low-k dielectric material may include flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PE-TEOS), fluoride silicate glass (FSG), high-density plasma (HDP) oxide, plasma enhanced oxide (PEOX), flowable CVD (FCVD) oxide, or combination thereof.

In the present embodiment, as illustrated in FIG. 1A, two first gate structures GS1 may extend in the second direction to intersect the first active fin AF1, and may be disposed side by side in the first direction. Similarly, two second gate structures GS2 may each extend in the second direction to intersect the second active fin AF2 and may be disposed on the same line as each of the two first gate structures GS1.

As described above, the first gate structure GS1 and the second gate structure GS2 disposed on the same line may be structures separated by a gate separation pattern 151 to be obtained.

The gate separation pattern 151, employed in the present embodiment, may be disposed between the first and second gate structures GS1 and GS2, and may have an upper surface at a level L1 lower than a level L0 of an upper surface of each of the first and second gate structures GS1 and GS2.

The gate capping layer 155, disposed on the first and second gate structures GS1 and GS2, may include a main region 155a disposed on the first and second gate structures GS1 and GS2, and an extension portion 155b extending from the main region 155a to the remaining space (an upper region) between the first and second gate structures GS1 and GS2. The gate separation pattern 151 may be provided as a structure coupled to the extension portion 155b of the gate capping layer 155 to separate the first and second gate structures GS1 and GS2 from each other. The gate separation pattern 151 may include a first insulating material, and the gate capping layer 155 may include a second insulating material, different from the first insulating material. For example, the first insulating material may include silicon oxide (SiO$_x$), and the second insulating material may include silicon nitride (SiN$_x$), silicon oxynitride (SiO$_x$N$_y$), silicon carbonitride (SiC$_x$N$_y$), or silicon oxycarbonitride (SiO$_x$C$_y$N$_z$).

Unlike a gate separation method according to the related art, the gate separation pattern 151 may be formed using an organic planarization layer (for example, bottom anti-reflective coating (BARC), spin-on-hardmask (SOH), amorphous carbon layer (ACL), etc.) having high selectivity with respect to a surrounding insulating material (for example, SiN) after removal of a dummy gate electrode (for example, polysilicon) and before formation of a gate electrode (see FIGS. 12A to 23D). As a result, loss of a peripheral insulating material such as an interlayer insulating layer may be significantly reduced during a process of self-forming a contact structure without formation of an additional protective layer, so that a defect may be effectively removed during a process of forming a contact structure under scaled-down conditions.

Referring to FIGS. 1A and 1D, the gate separation pattern 151 may further include a pair of sidewall portions SW extending from each of the pair of gate spacers SP in the second direction. In the present embodiment, the pair of gate spacers SP and the pair of sidewall portions SW may be portions of the sidewall spacer 131 and the etch-stop layer 132 extending in the second direction. In this specification, a portion of the sidewall spacer 131 and the etch stop layer 132, overlapping the first and second gate electrode layers 142 and 145 in the first direction, may be referred to as a gate spacer SP, and a portion of the sidewall spacer 131 and the etch stop layer 132, overlapping the gate separation pattern 151 in the first direction, may be referred to as a sidewall portion SW.

In the present embodiment, the first insulating material included in the gate separation pattern 151 may be disposed between the pair of sidewall portions SW. Upper ends of the pair of sidewall portions SW may also be disposed to be lower than the level L0 of the upper surface of each of the first and second gate structures GS1 and GS2, for example, the level L0 of the upper surface of the second gate electrode layer 145. As illustrated in FIG. 1D, the sidewall portions SW may have substantially the same height as the first insulating material of the gate separation pattern 151.

Also, the pair of sidewall portions SW may have substantially the same width as the gate spacers SP in the first direction. The gate separation pattern 151 may have various different shapes. In particular, a cross-sectional structure in the first direction may be variously changed (see FIGS. 5A to 8C).

In the present embodiment, the first gate structure GS1 may constitute a PMOS transistor together with a plurality of first channel layers CH1 disposed on the first active fin AF1 and the first source/drain regions SD1, and the second gate structure GS2 may constitute an NMOS transistor together with a plurality of second channel layers CH2 disposed on the second active fin AF2 and the second source/drain regions SD2.

For example, as illustrated in FIGS. 1B and 1E, the first gate structure GS1 may include the first and second gate electrode layers 142 and 145 formed of different materials. The first gate electrode layer 142 may be disposed on the first active fin AF1 and may be disposed to surround the plurality of first channel layers CH1, and the second gate electrode layer 145 may be disposed on the first gate electrode layer 142. The second gate structure GS2 may include a second gate electrode layer 145 without a first gate electrode layer 142, and the second gate electrode layer 145 may be disposed on the second active fin AF2 and may be disposed to surround a plurality of second channel layers CH2.

In the present embodiment, the first gate electrode layer 142 of the first gate structure GS1 may extend to be disposed between the sidewall of the gate separation pattern 151 and the second gate electrode layer 145. As illustrated in FIG. 1B, the first gate electrode layer 142 may be disposed on a side surface of the second gate electrode layer 145 facing the gate separation pattern 151.

Referring to FIG. 1C, the exposed portions of the first and second active fins AF1 and AF2, disposed on opposite sides adjacent to the first and second gate structures GS1 and GS2, may have recessed regions. Epitaxially regrown first and second source/drain regions SD1 and SD2 may be disposed in recessed regions of the first and second active fins AF1 and AF2.

For example, as illustrated in FIG. 1E, the first and second source/drain regions SD1 and SD2 may be formed to be in contact with opposite side surfaces of the plurality of first and second channel layers CH1 and CH2 in the first direction.

In the cross-section (FIG. 1B) in the second direction, the plurality of first and second channel layers CH1 and CH2 may each have a width the same as or similar to a width of each of the first and second active fins AF1 and AF2, respectively. In the cross-section (FIG. 1E) in the first direction, the first and second gate structures GS1 and GS2 may the same or similar length. In some embodiments, the plurality of first and second channel layers CH1 and CH2 may each have a width smaller than the length of each of the first and second gate structures GS1 and GS2 in the first direction.

The plurality of first and second channel layers CH1 and CH2 may include a semiconductor material which may provide a channel region. For example, the plurality of first and second channel layers CH1 and CH2 may include at least one of silicon (Si), silicon germanium (SiGe), and germanium (Ge). The plurality of first and second channel layers CH1 and CH2 may be formed of, for example, the same material as the substrate 101.

For example, in the case of a PMOS transistor, the first source/drain regions SD1 may include a material providing compressive strain to the first channel layers CH1. For example, the first source/drain regions SD1 may include a silicon-germanium (SiGe) layer having a lattice constant greater than a lattice constant of silicon (Si). The first source/drain regions SD1 may have P-type conductivity. Meanwhile, in the case of an NMOS transistor, the second source/drain regions SD2 may include a semiconductor material providing a tensile strain to the second channel layers CH2. For example, the second source/drain regions SD2 may include a silicon carbide (SiC) layer having a lattice constant smaller than that the lattice constant of silicon (Si) or a silicon (Si) layer having substantially the same lattice constant as the substrate 101. The second source/drain regions SD2 may have N-type conductivity.

As illustrated in FIG. 1C, the first and second source/drain regions SD1 and SD2 may have various shapes defined as crystallographically stable surfaces during a growth process. A cross-section of the first source/drain regions SD1 may have a pentagonal shape, and a cross-section of the second source/drain regions SD2 may have a hexagonal shape or a polygonal shape having a gentle angle.

In the present embodiment, a description has been provided for an in which the first gate structure GS1 and the second gate structure GS2 separated by the gate separation pattern 151 constitute transistors having different conductivity types. However, the present embodiment is not limited thereto. In an embodiment, the first gate structure GS1 and the second gate structure GS2 may include transistors, having the same conductivity type, formed in wells having the same conductivity type.

Figure 2A:
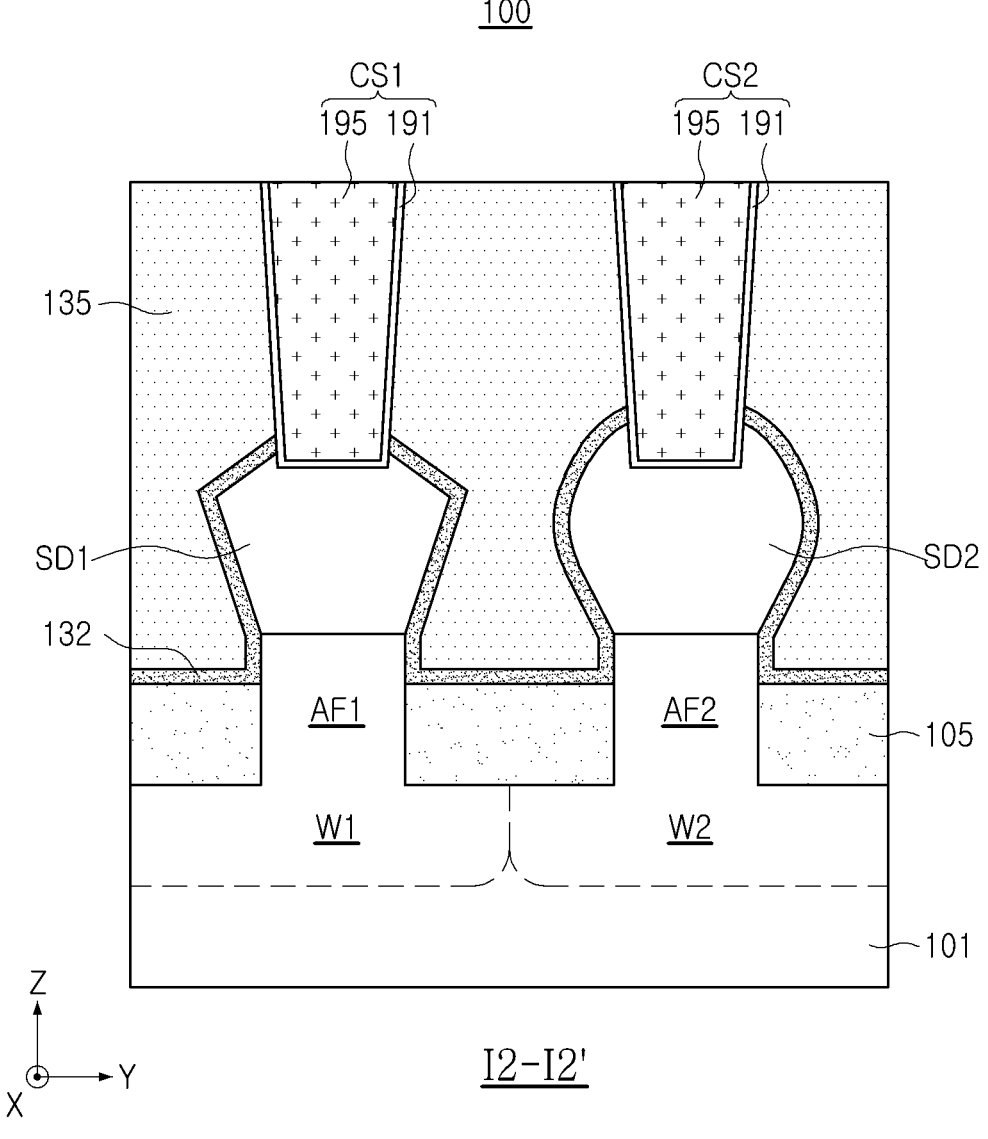
FIGS. 2A and 2B are cross-sectional views of a semiconductor device, according to an embodiment.
Figure 2B:
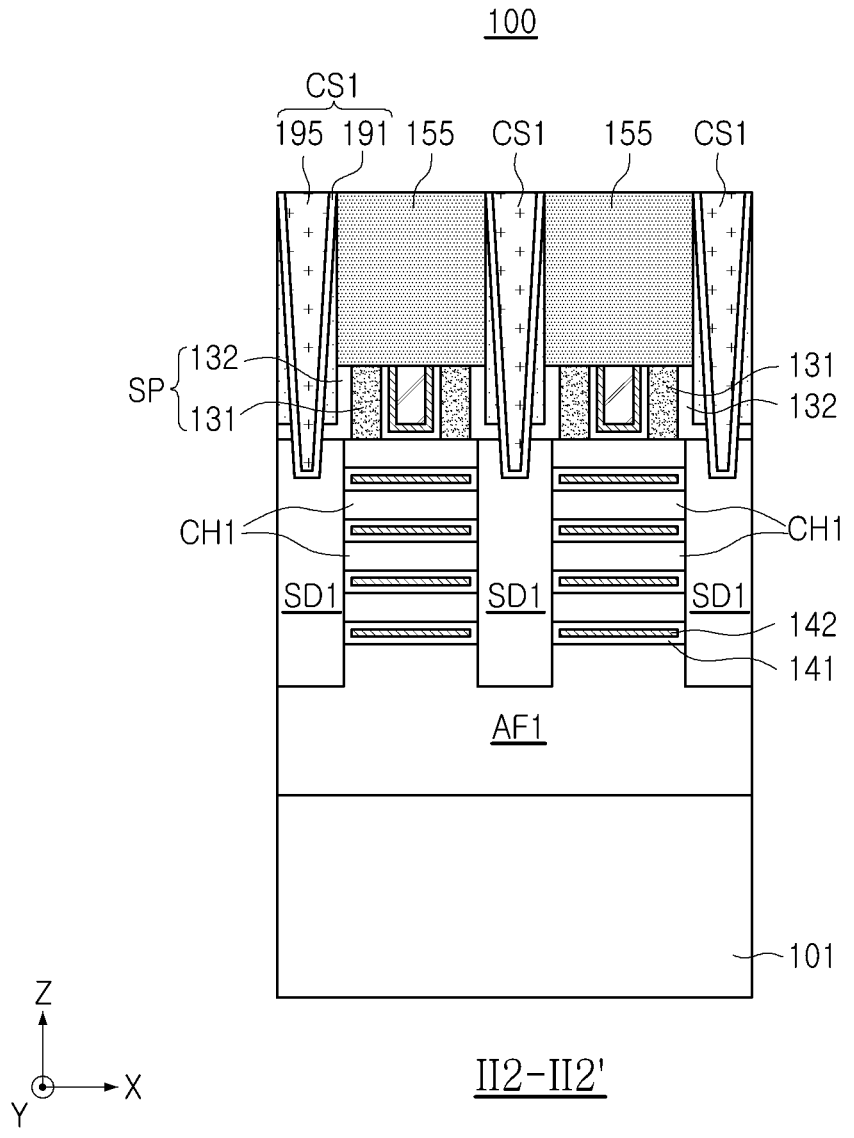

Referring to FIGS. 2A and 2B, the semiconductor device 100 according to the present embodiment may further include first and second contact structures CS1 and CS2, respectively connected to the first and second source/drain regions SD1 and SD2. FIGS. 2A and 2B may be understood as cross-sections corresponding to FIGS. 1C and 1E, respectively.

The first and second contact structures CS1 and CS2 may penetrate through the interlayer insulating layer 135 to be connected to the first and second source/drain regions SD1 and SD2, respectively. The first and second contact structures CS1 and CS2 may include a conductive barrier 191 and a contact plug 195 disposed on the conductive barrier 191. The first and second contact structures CS1 and CS2 may form a metal silicide layer in a contact region of the first and second source/drain regions SD1 and SD2, respectively, to improve contact resistance with the first and second source/drain regions SD1 and SD2. In some embodiments, the conductive barrier 191 may be a conductive metal nitride layer. For example, the conductive barrier 191 may include titanium nitride (TiN), tantalum nitride (TaN), aluminum nitride (AlN), tungsten nitride (WN), and combinations thereof. The contact plug 195 may include tungsten (W), cobalt (Co), titanium (Ti), alloys thereof, or combinations thereof. The gate separation pattern 151 may be formed using an organic planarization layer OPL having high selectivity with respect to a surrounding material (for example, SiN) to prevent loss of the interlayer insulating layer 135 during a process of self-forming the first and second contact structures CS1 and CS2. As a result, short-circuit of a contact may be avoided.

Figure 3:
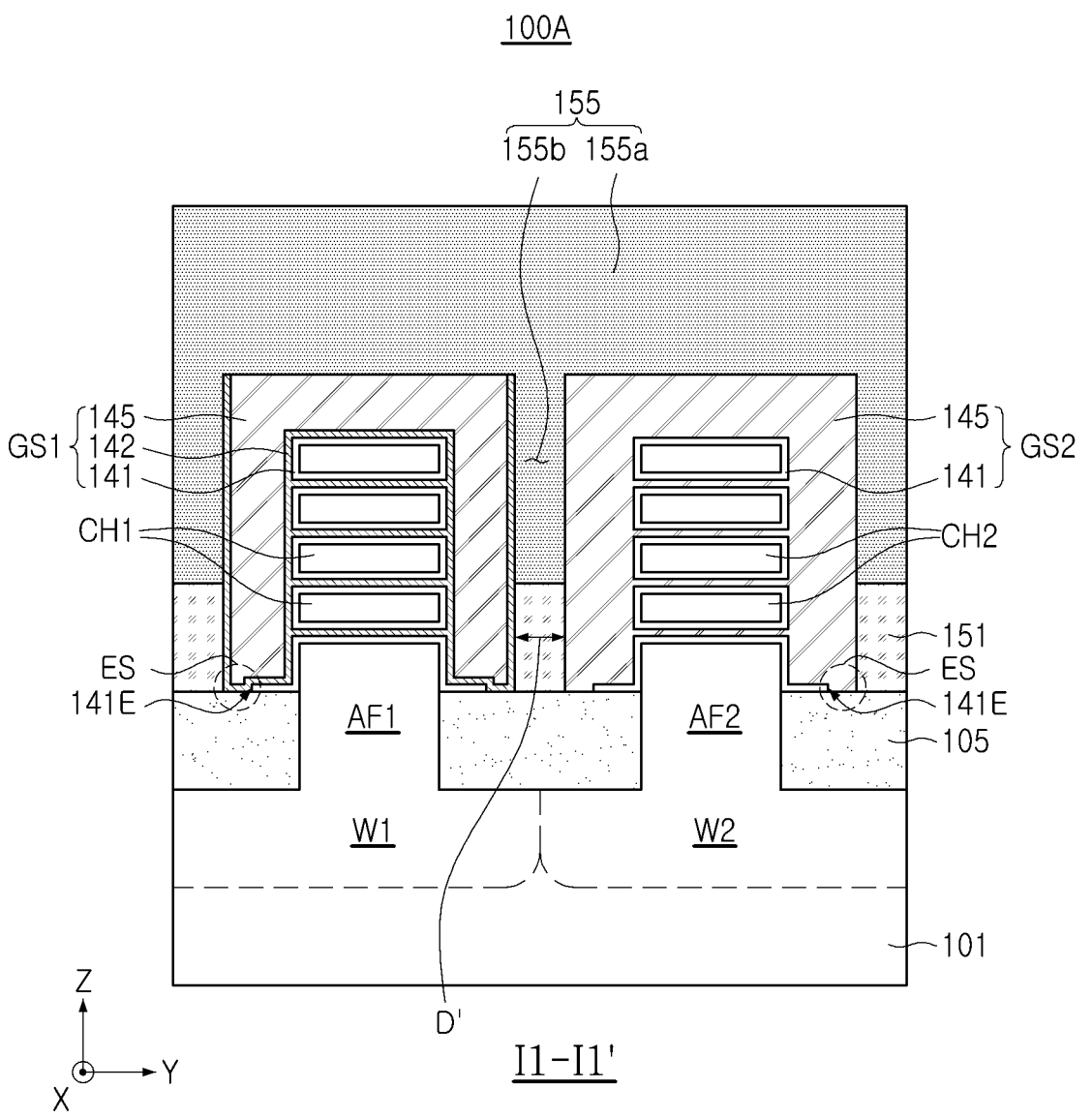
FIG. 3 is a cross-sectional view of a semiconductor device, according to an embodiment.

FIG. 3 is a cross-sectional view of a semiconductor device according to an embodiment. FIG. 3 is a cross-section corresponding to FIG. 1B (I1-I1'), and the other cross-sectionals (I2-I2', II1'-II1', and II2-II2') of a semiconductor device 100A according to the present embodiment may be understood as having substantially the same structure as illustrated in FIGS. 1C to 1E.

Referring to FIG. 3, the semiconductor device 100A according to the present embodiment may be understood to be similar to the semiconductor device 100 illustrated in FIGS. 1A to 1E, except that end portions 141E of an extending portion of a gate insulating layer 141 on the device isolation layer 105 is shortened so that a combination of the first and second gate electrode layers 142 and 145 may be disposed on side and upper surfaces of the end portions 141E on the device isolation layer 105. In addition, elements of the embodiment of FIG. 3 may be understood with reference to the description of the same or similar elements of the embodiment illustrated in FIGS. 1A to 1E unless specifically stated otherwise.

Similarly to the above-described embodiment, the gate insulating layer 141 may be disposed on upper surfaces of first and second active fins AF1 and AF2 in the second direction, and may be formed to surround each of a plurality of first and second channel layers CH1 and CH2. In addition, as illustrated in FIG. 3, the gate insulating layer 141 may have a portion extending between first and second gate electrode layers 142 and 145 and a device isolation layer 105.

Referring to a region ES shown in FIG. 3, the first and second gate electrode layers 142 and 145 employed in the present embodiment may be formed to be disposed on the end portions 141E of an extending portion of the gate insulating layer 141. In the present embodiment, a distance D' between first and second gate structures GS1 and GS2 in the second direction may be implemented to be shorter than the distance DO of the embodiment illustrated in FIG. 1B. The distance D' may be expressed as a width of a gate separation pattern 151 in the second direction. For example, the distance D' between the first and second gate structures GS1 and GS2 may be set to be 15 nm or less. In some embodiments, the distance D' between the first and second gate structures GS1 and GS2 may be set to be 12 nm or less. This will be described in detail later with reference to FIGS. 24A to 27B and FIGS. 28A to 29B.

Figure 4A:
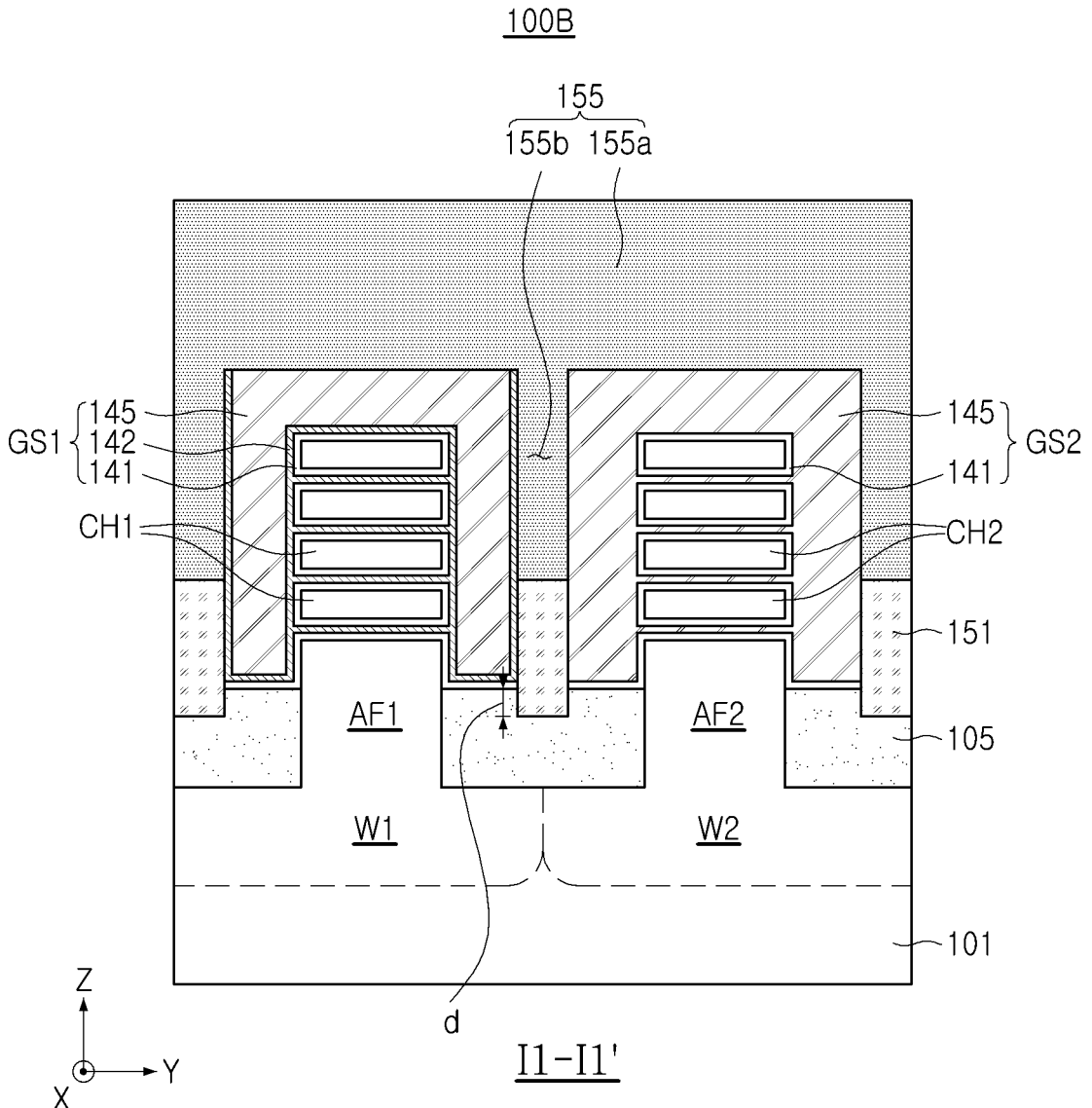
FIGS. 4A and 4B are cross-sectional views of a semiconductor device, according to an embodiment.
Figure 4B:
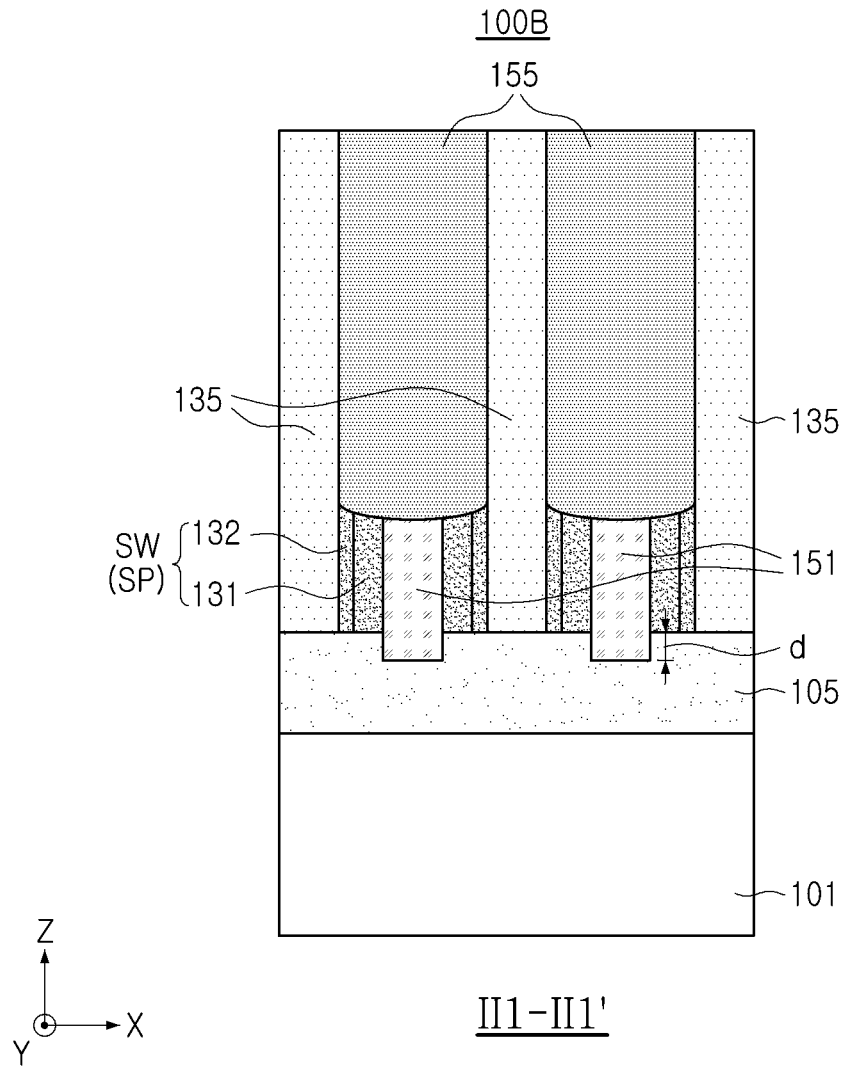

FIGS. 4A and 4B are cross-sectional views of a semiconductor device according to an embodiment. FIGS. 4A and 4B are cross-sections corresponding to FIG. 1B (I1-I1') and FIG. 1D (II1-II1'), respectively. The other cross-sections (I2-I2' and II2-II2') of a semiconductor device 100B according to the present embodiment may be understood to have substantially the same structure as illustrated in FIGS. 1C and 1E.

Referring to FIGS. 4A and 4B, the semiconductor device 100B according to the present embodiment may be understood to be similar to the semiconductor device 100 illustrated in FIGS. 1A to 1E, except that a gate separation pattern extends downward into a device isolation layer. In addition, elements of the embodiment of FIGS. 4A and 4B may be understood with reference to the description of the same or similar elements of the embodiment illustrated in FIGS. 1A to 1E unless specifically stated otherwise.

Figure 30A:
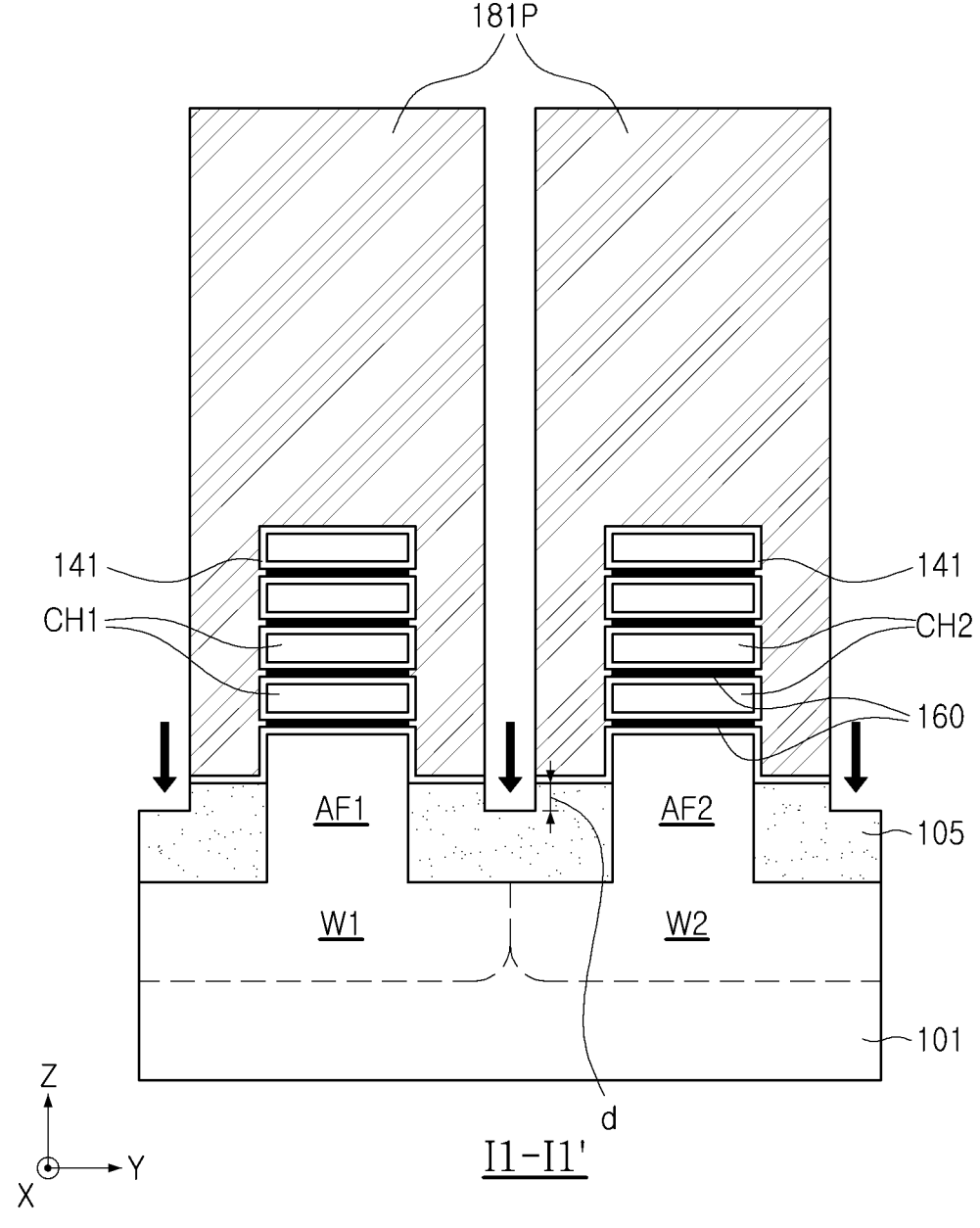
FIGS. 30A and 31A and FIGS. 30B and 31B are cross-sectional views of main processes illustrating a method of fabricating a semiconductor device, according to an embodiment (see FIGS. 4A and 4B), respectively.
Figure 30B:
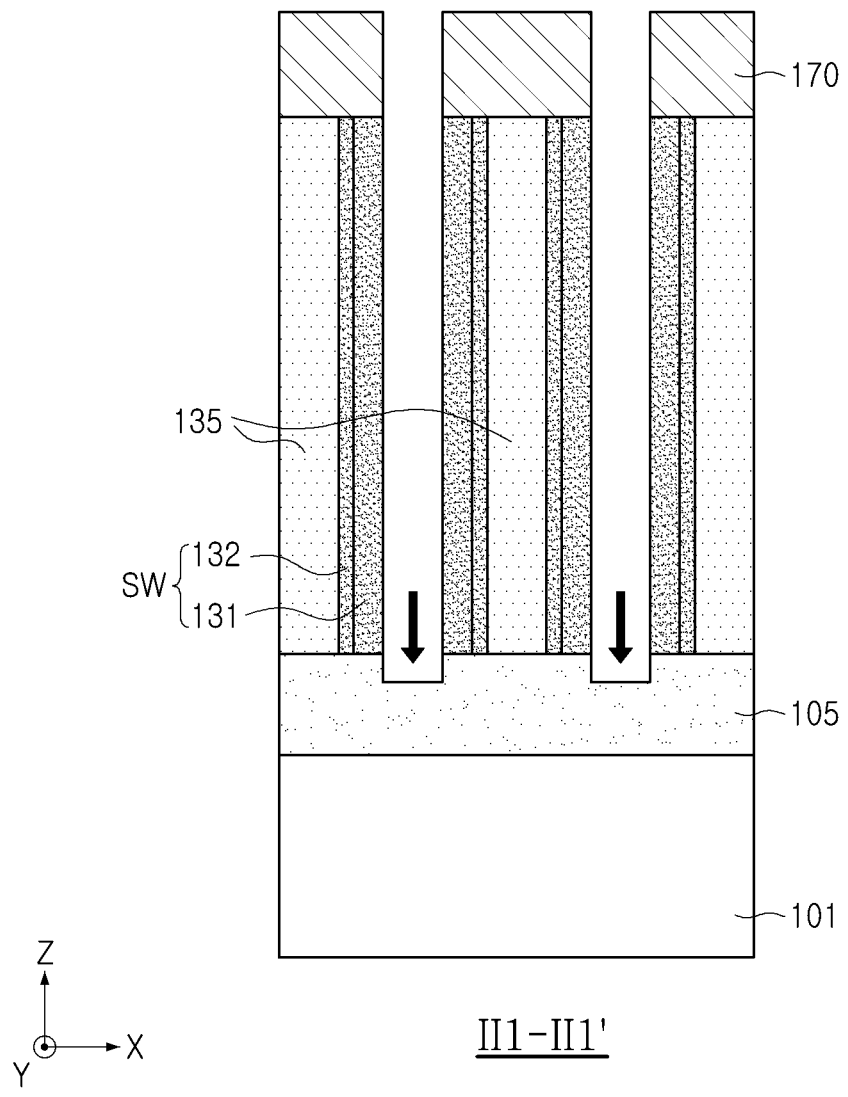

Unlike the above description, a gate separation pattern 151 employed in the present embodiment may extend downward into the device isolation layer 105 by a predetermined depth "d." Such an extending structure of the gate separation pattern 151 may be implemented by performing an additional etching process in a gate separation space through a separation process of the gate insulating layer 141 using an organic pattern layer (181P of FIG. 30A) or a subsequent process (see FIGS. 30A and 30B).

Figure 5A:
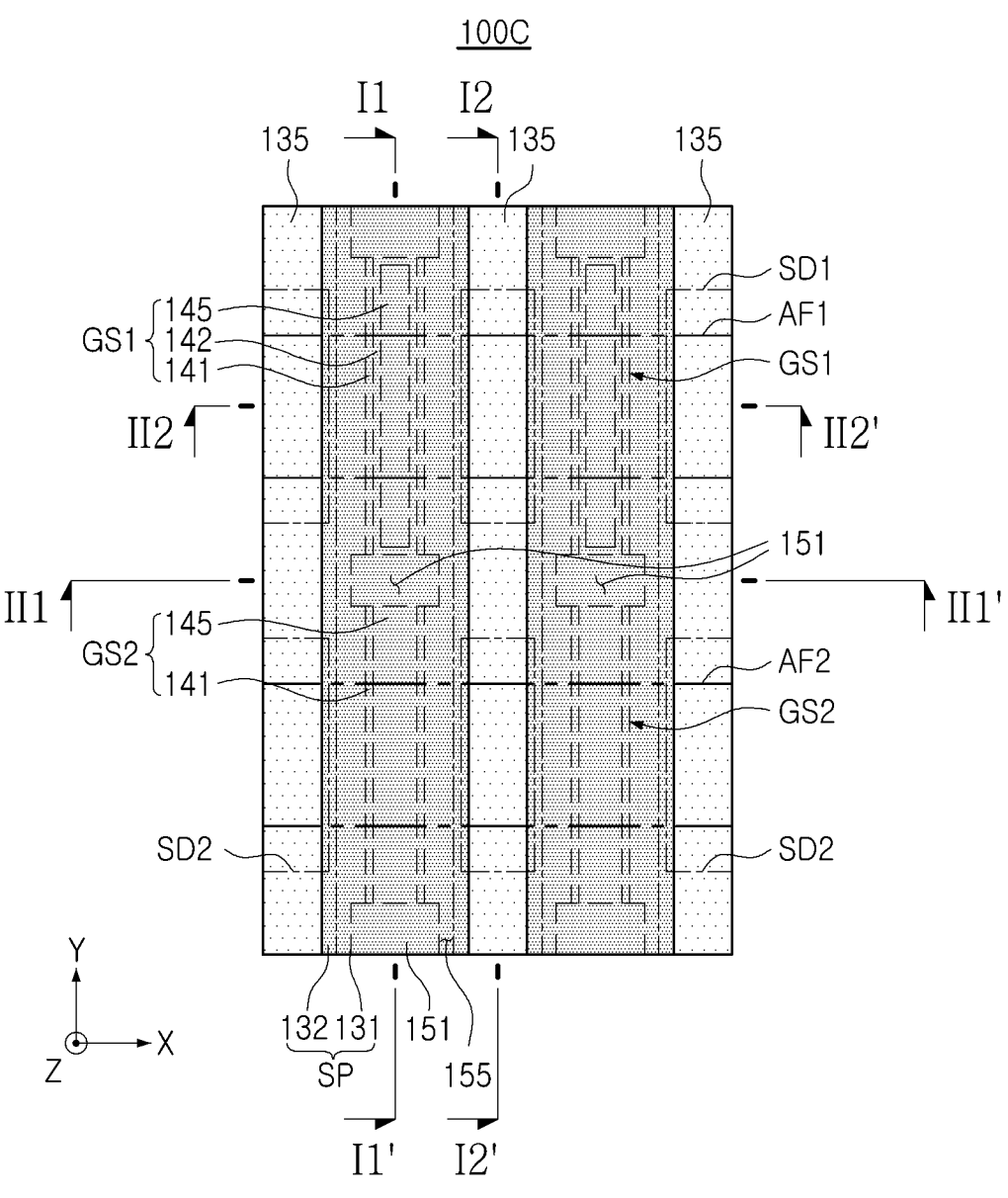
FIG. 5A is a plan view of a semiconductor device according to an embodiment.
Figure 5B:
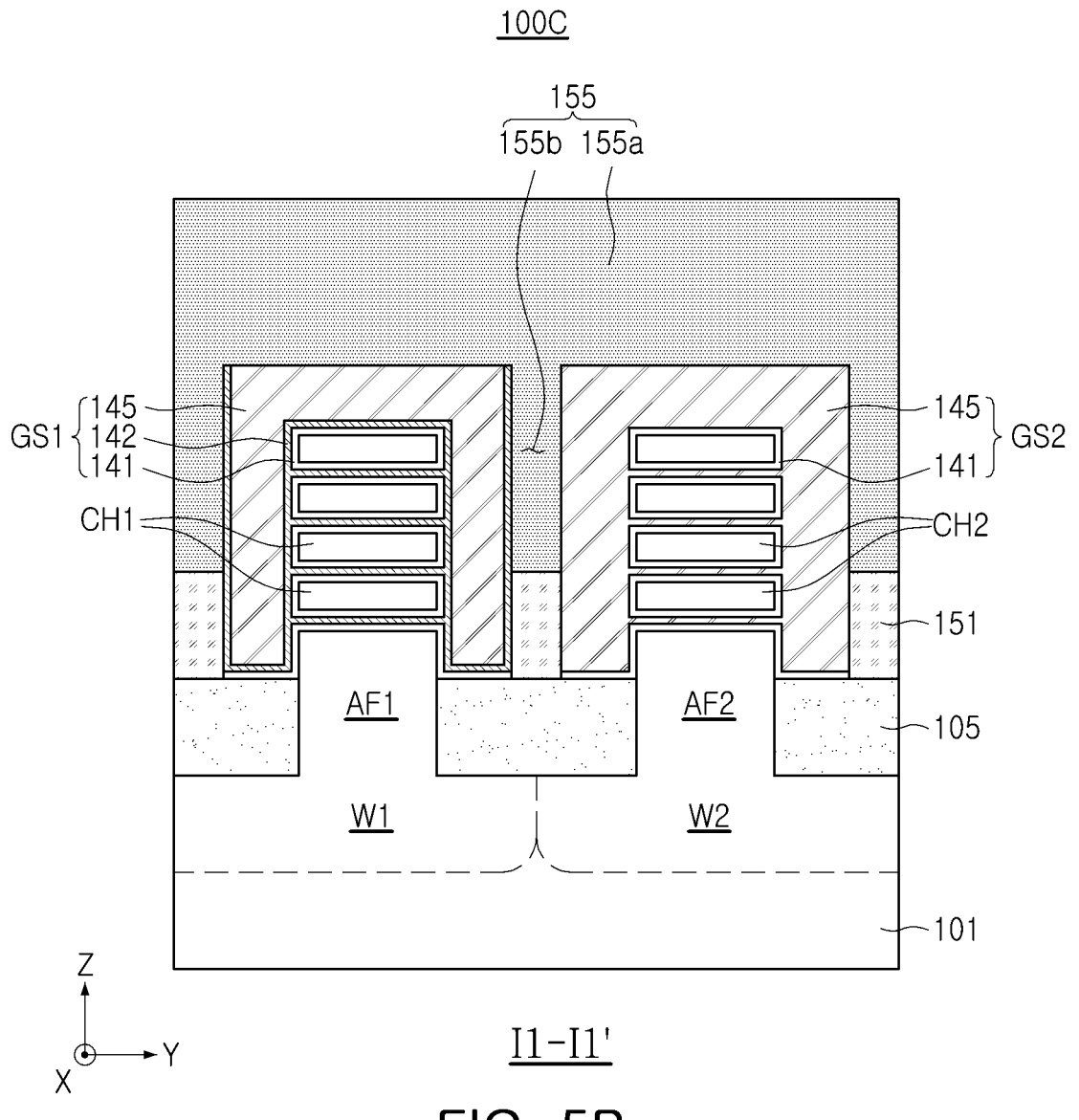
FIG. 5B is a cross-sectional view of the semiconductor device illustrated in FIG. 5A, taken along line I1-I1'.
Figure 5C:
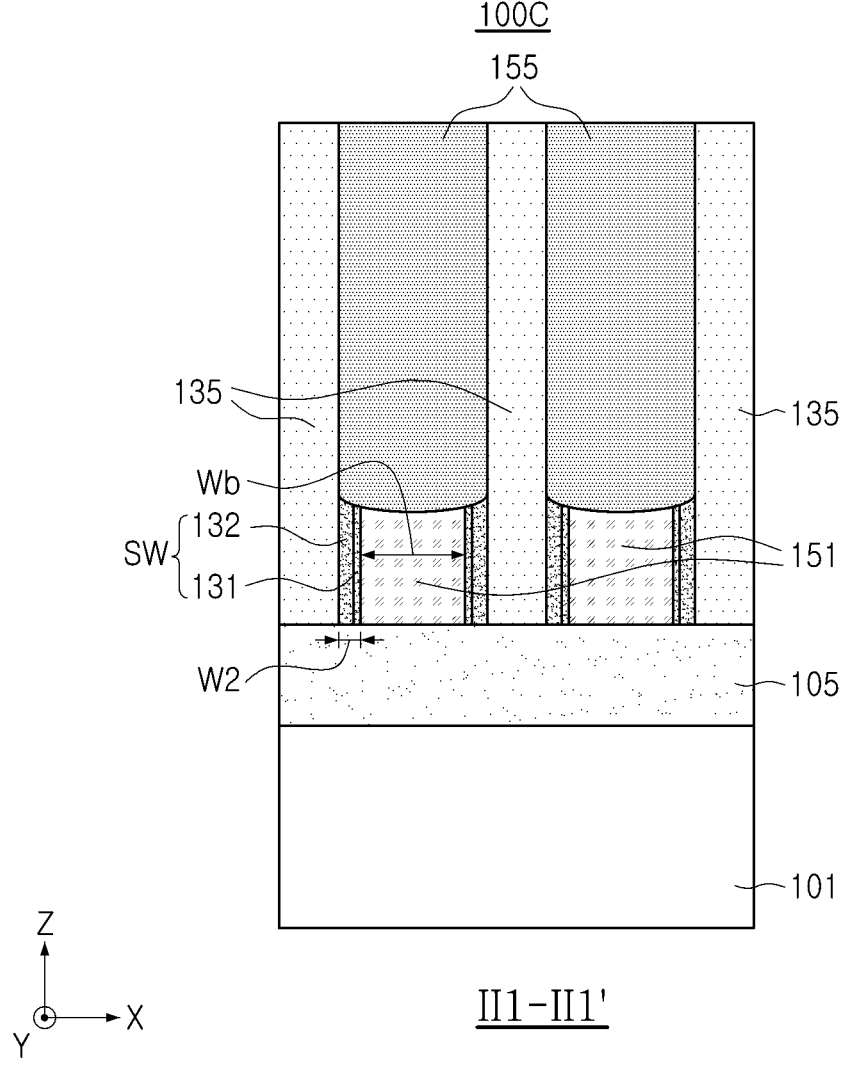
FIGS. 5C and 5D are cross-sectional views of the semiconductor device illustrated in FIG. 5A, respectively taken along lines II1-II1' and II2-II2'.
Figure 5D:
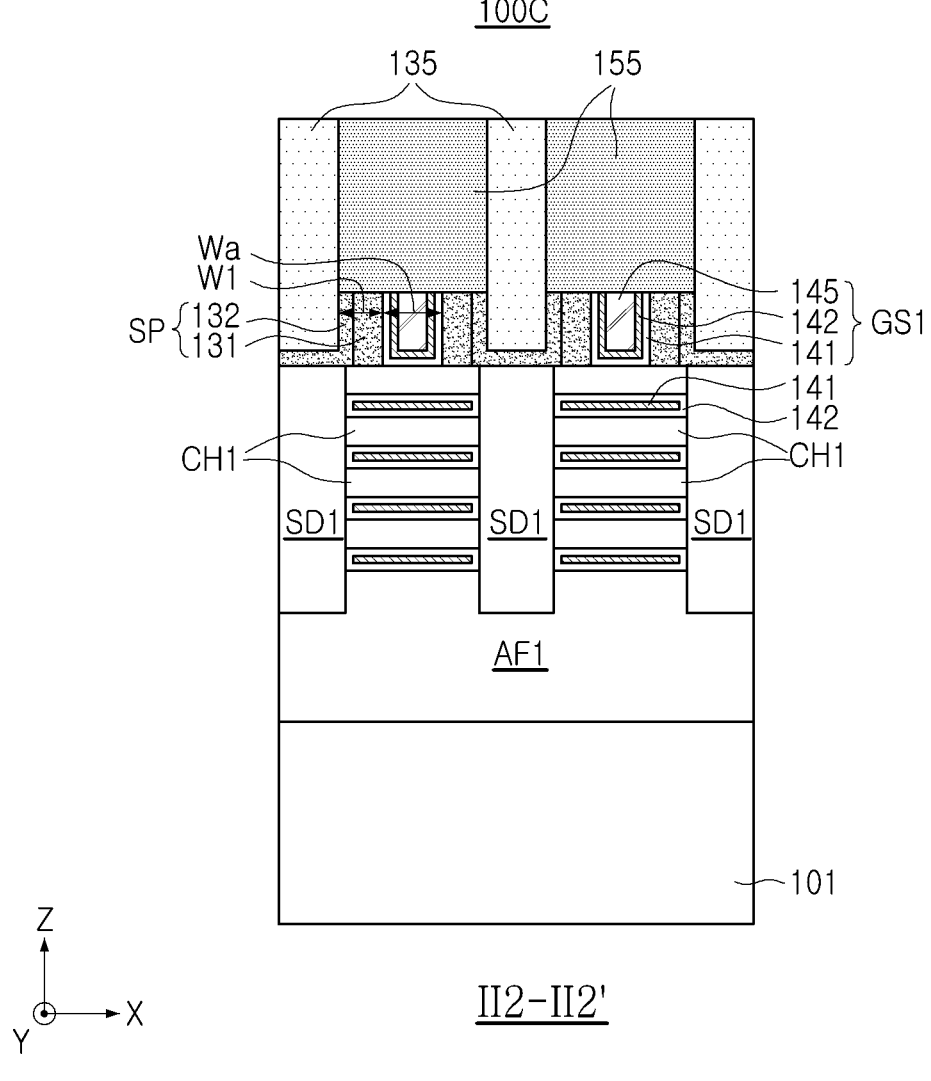

FIG. 5B is a cross-sectional view of the semiconductor device illustrated in FIG. 5A, taken along line I1-I1', and FIGS. 5C and 5D are cross-sectional views of the semiconductor device illustrated in FIG. 5A, respectively taken along lines II1-III' and II2-II2'. The other cross-section (I2-I2') of a semiconductor device 100C according to the present embodiment may be understood to have the same structure as illustrated in FIG. 1C.

Referring to FIGS. 5A to 5D, the semiconductor device 100C may be understood to be similar to the semiconductor device 100 illustrated in FIGS. 1A to 1E, except that a width Wb of a gate separation pattern 151 is increased in the first direction to cause a width W2 of a sidewall portion SW to be different from a width W1 of a gate spacer SP. In addition, elements of the embodiment of FIGS. 5A to 5D may be understood with reference to the description of the same or similar elements of the embodiment illustrated in FIGS. 1A to 1E unless specifically stated otherwise.

Referring to FIGS. 5C and 5D together with FIG. 5A, the width W2 of each of a pair of sidewall portions SW in the first direction may be smaller than the width W1 in each of a pair of gate spaces SP in the first directions. As illustrated in FIG. 5C, a sidewall spacer 131 may be formed such that a portion thereof adjacent to a gate separation pattern 151 has a thickness smaller than a thickness of the other region. Such a change in thickness may be obtained by additionally etching a portion of the sidewall spacer 131 exposed to a gate separation space (see FIG. 32A). In some embodiments, the sidewall spacer 131 may be entirely etched or a portion of an etch-stop layer 132 may be etched in the sidewall portion SW, so that a thickness thereof may be reduced to be smaller than the thickness of the present embodiment.

Accordingly, the width Wb of the gate separation pattern 151 may be further increased in the first direction. In the embodiment illustrated in FIGS. 1D and 1E, the width of the gate separation pattern 151 and the width of the first and second gate electrode layers 142 and 145 are substantially the same, whereas in the present embodiment (FIGS. 5C and 5D), the width Wb of the gate separation pattern 151 in the first direction may be greater than the width Wa of the first and second gate electrode layers 142 and 145 in the first direction.

Figure 6A:
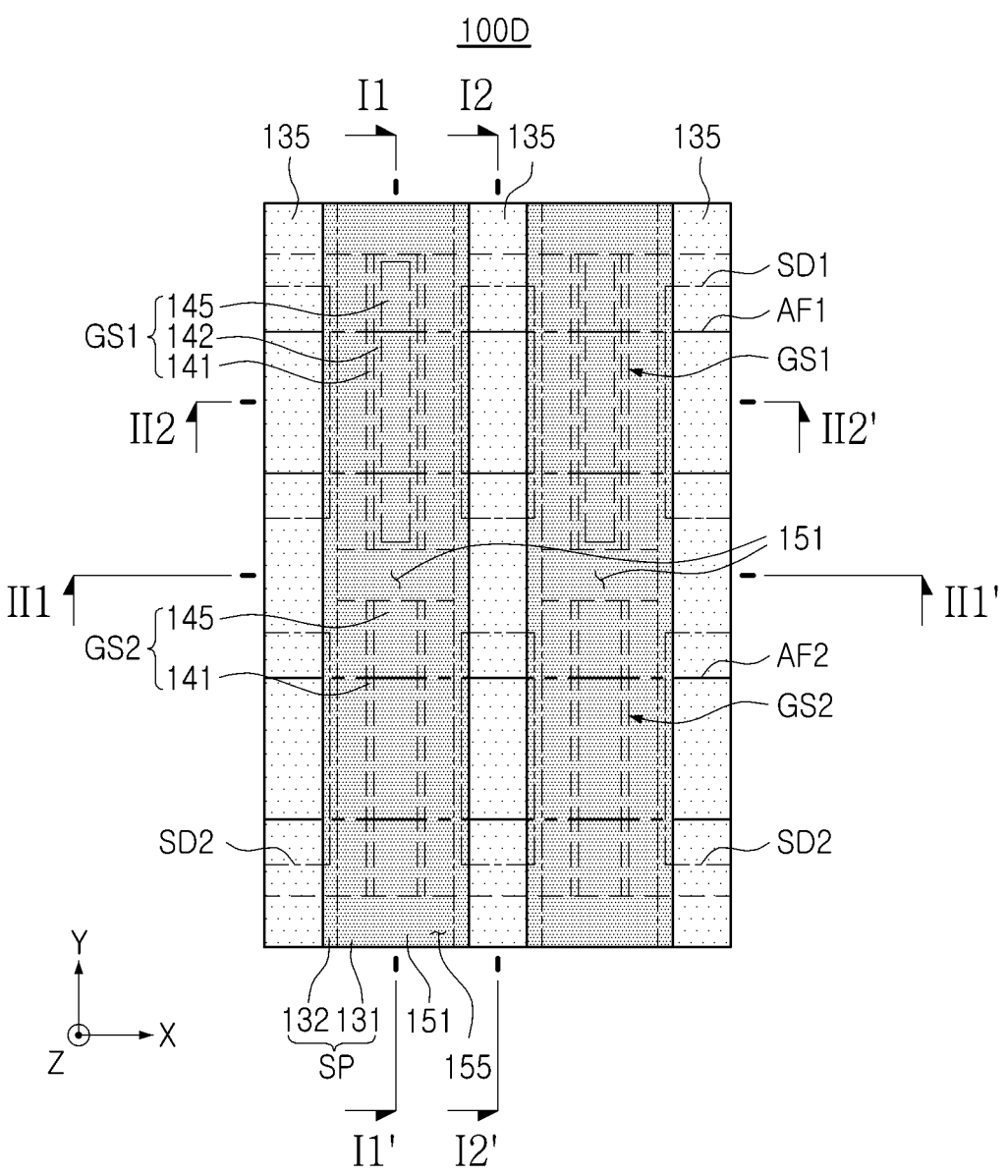
FIG. 6A is a plan view of a semiconductor device according to an embodiment.
Figure 6B:
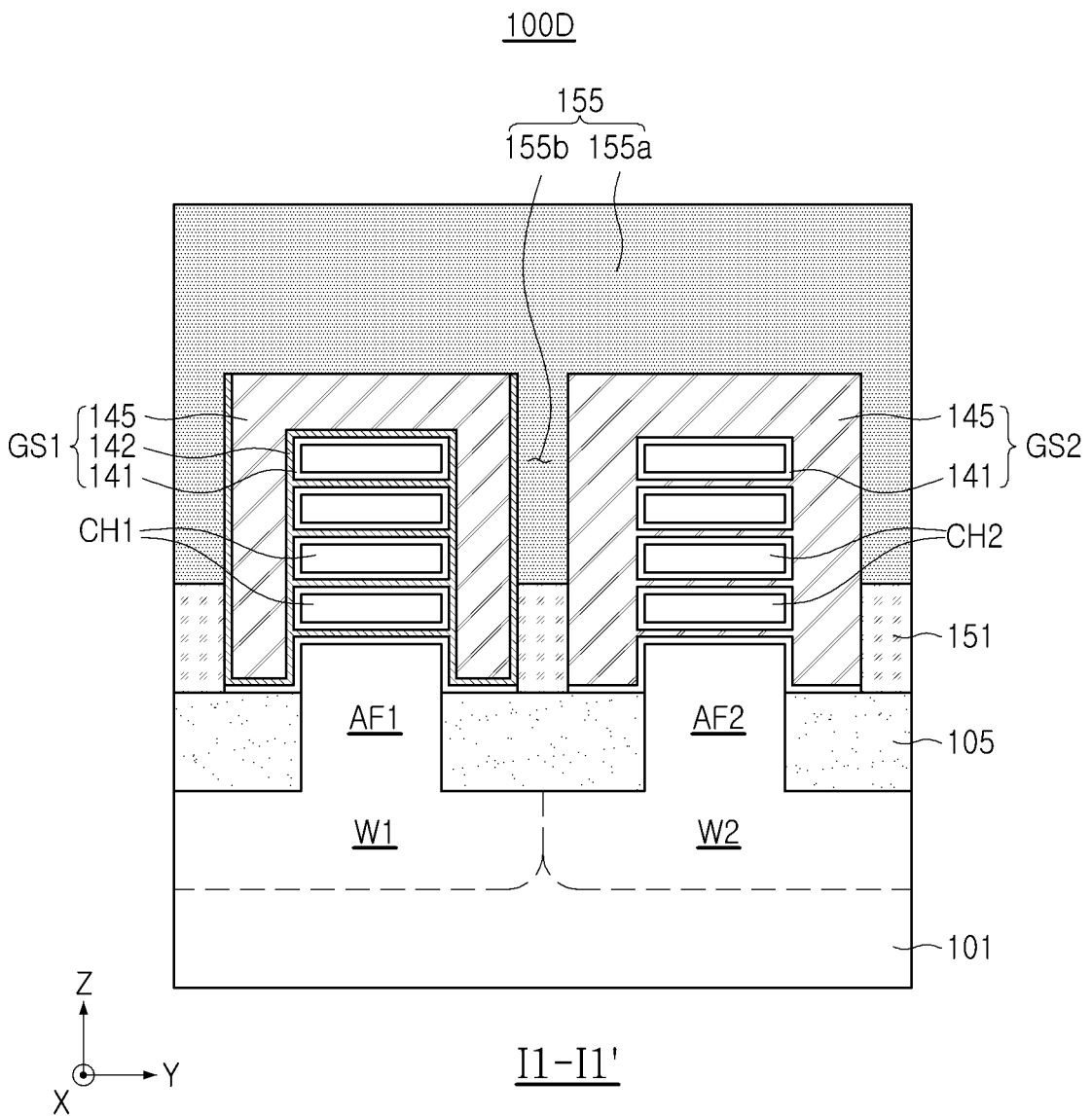
FIGS. 6B and 6C are cross-sectional views of the semiconductor device illustrated in FIG. 6A, respectively taken along lines I1-I1' and III'-III1'.
Figure 6C:
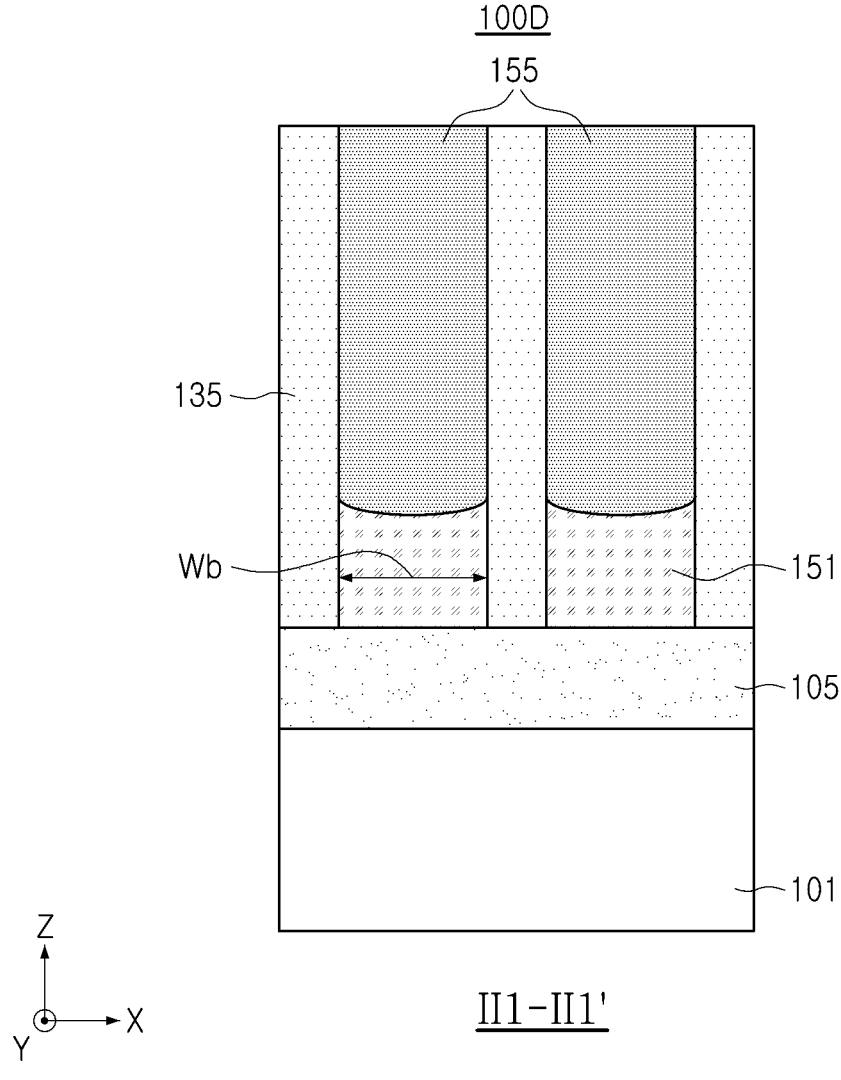

FIG. 6A is a plan view of a semiconductor device according to an embodiment, and FIGS. 6B and 6C are cross-sectional views of the semiconductor device illustrated in FIG. 6A, respectively taken along lines I1-I1' and III-III'. The other cross-sections (I2-I2' and II2-II2') of a semiconductor device 100D according to present embodiment may be understood to have substantially the same structure as illustrated in FIGS. 1C and 1E.

Referring to FIGS. 6A to 6C, a semiconductor device 100D according to the present embodiment may be understood to be similar to the semiconductor device 100 illustrated in FIGS. 1A to 1E, except that a region of a gate spacer SP adjacent to a gate separation pattern 151 (for example, a sidewall portion of the gate spacer SP) is removed and a width of the gate separation pattern 151 is increased in the first direction. In addition, elements of the embodiment of FIGS. 6A to 6C may be understood with reference to the description of the same or similar elements of the embodiment illustrated in FIGS. 1A to 1E unless specifically stated otherwise.

Referring to FIGS. 6A and 6C, a region of a gate spacer SP, adjacent to the gate separation pattern 151, for example, a portion referred to as a "sidewall portion" in the previous embodiments may be removed. Similarly to the embodiment illustrated in FIGS. 5A to 5D, a structure illustrated in FIG. 6C may be obtained by etching portions of a sidewall spacer 131 and an etch-stop layer 132, exposed to a gate separation space, to be removed (see FIG. 34B).

Accordingly, a width Wb of a gate separation pattern 151 may be further increased in the first direction, and may correspond to a width of a gate capping layer disposed on an upper surface of the gate separation pattern 151 in the first direction. In the embodiment illustrated in FIGS. 1D and 1E, the width of the gate separation pattern 151 and the width of the first and second gate electrode layers 142 and 145 are substantially the same, whereas in the present embodiment (FIG. 6C), a width Wb of the gate separation pattern 151 in the first direction may correspond to a width of each of the first and second gate structures GS1 and GS2 in the first direction.

Figure 7A:
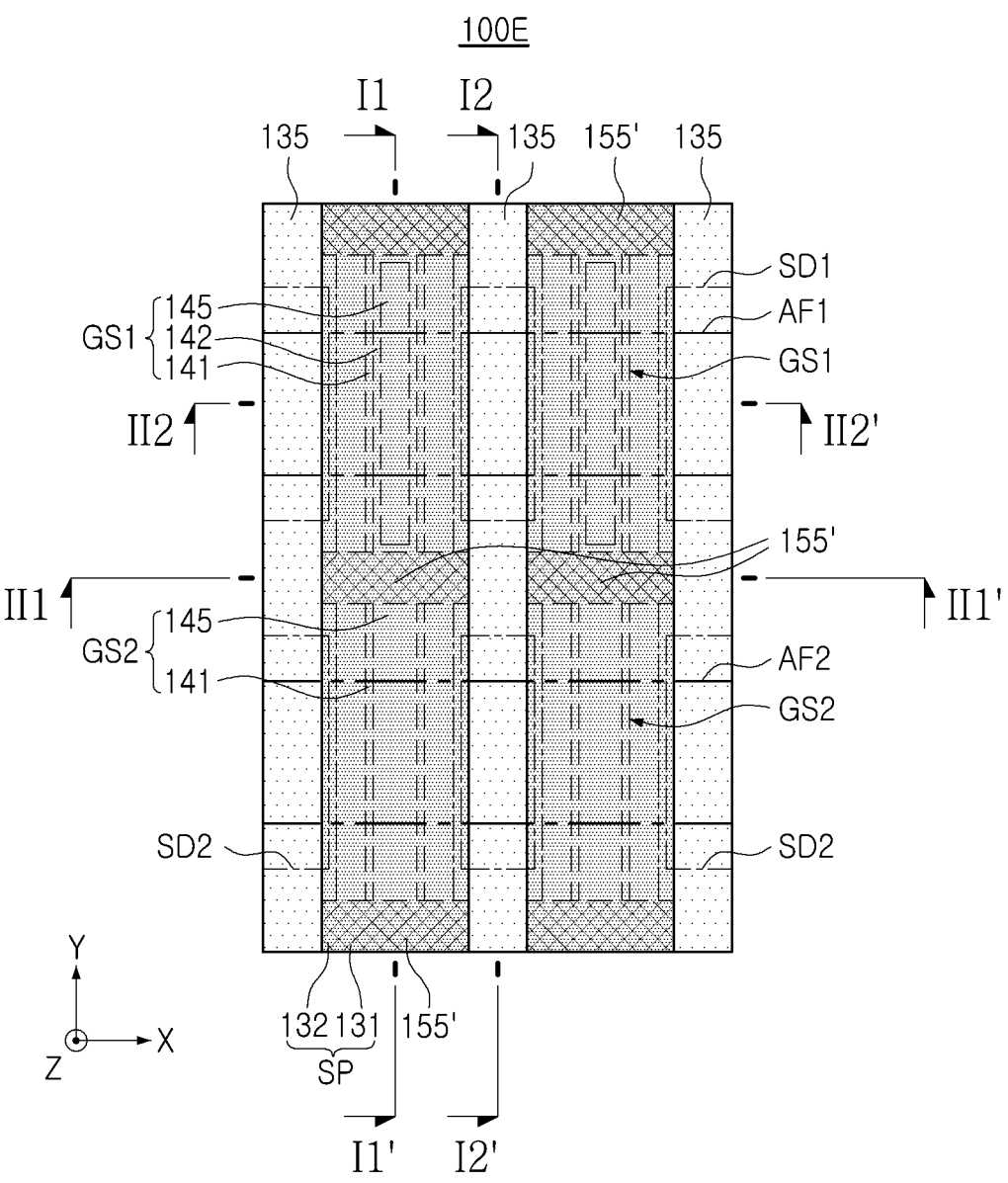
FIG. 7A is a plan view of a semiconductor device according to an embodiment.
Figure 7B:
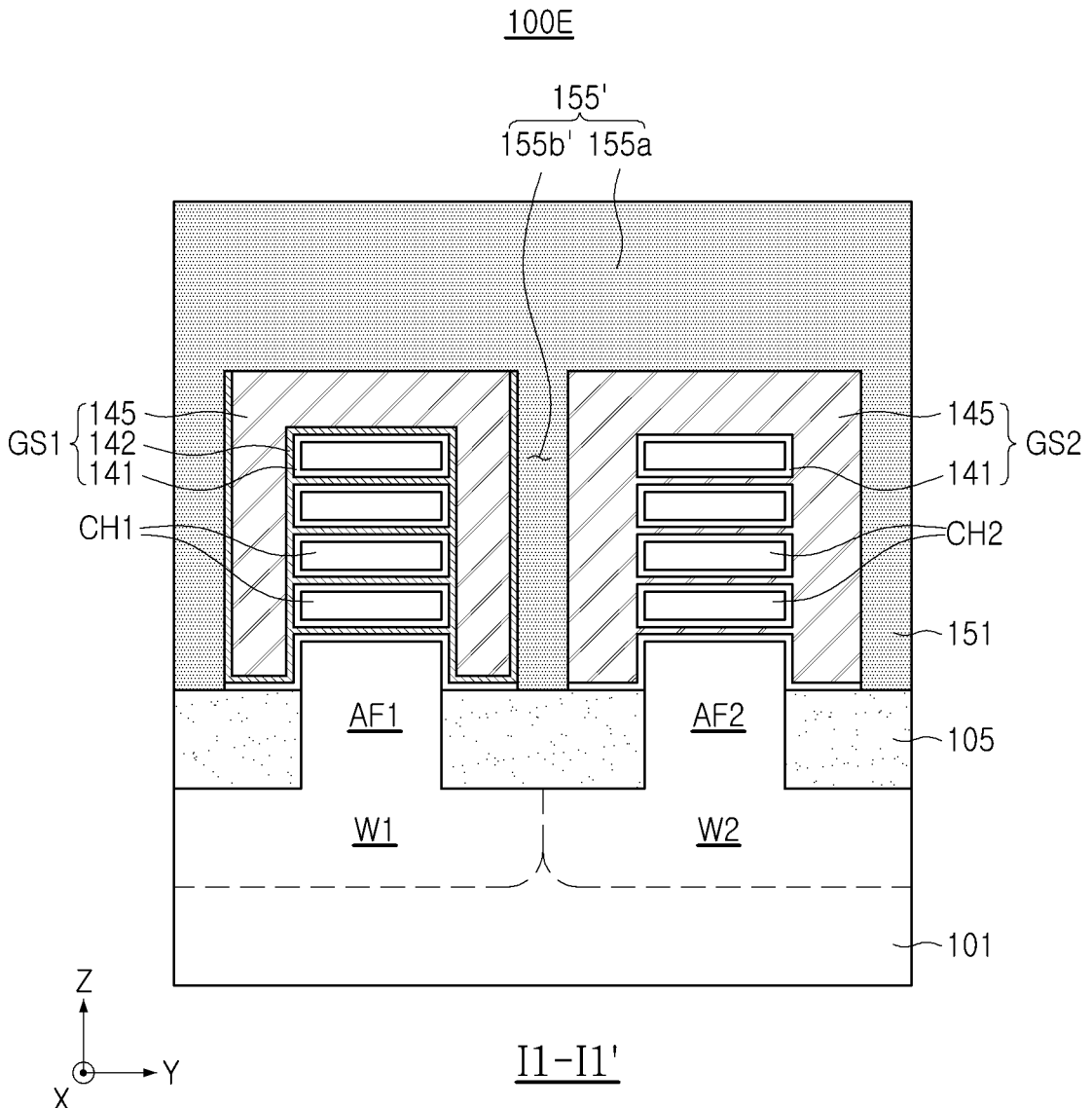
FIGS. 7B and 7C are cross-sectional views of the semiconductor device illustrated in FIG. 7A, respectively taken along lines I1-I1' and III'-III1'.
Figure 7C:
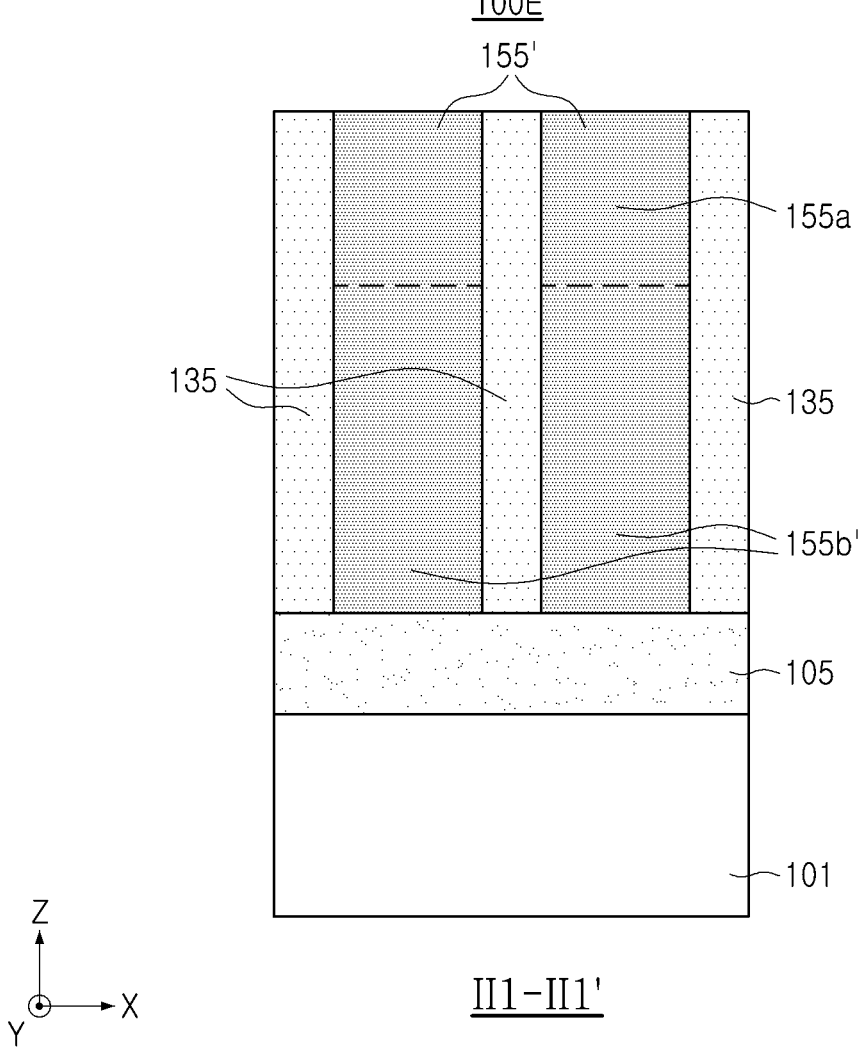

FIG. 7A is a plan view of a semiconductor device according to an embodiment, and FIGS. 7B and 7C are cross-sectional views of the semiconductor device illustrated in FIG. 7A, respectively taken along lines I1-I1' and II1-II1'. The other cross-sections (I2-I2' and II2-II2') of a semiconductor device 100E according to the present embodiment may be understood to have substantially the same structure as illustrated in FIGS. 1C and 1E.

Referring to FIGS. 7A to 7C, a semiconductor device 100E according to the present embodiment may be understood to be similar to the semiconductor device 100 illustrated in FIGS. 1A to 1E, except that a gate separation structure includes only a portion from which a gate capping layer 155' extends. In addition, elements of the embodiment of FIGS. 7A to 7C may be understood with reference to the description of the same or similar elements of the embodiment illustrated in FIGS. 1A to 1E unless specifically stated otherwise.

A gate capping layer 155', employed in the present embodiment, may include a first region 155a, disposed on first and second gate structures GS1 and GS2, and a second region 155b' extending to a space between the first and second gate structures GS1 and GS2. The second region 155b' may extend to a device isolation layer 105 to be provided as a single gate separation structure, unlike the extension portion 155b of the gate capping layer 155 of the previous embodiments.

In the present embodiment, the first region 155a and the second region 155b' may include a single component system or may be a single integrated structure. The gate capping layer 155' may include silicon nitride (SiN$_x$), silicon oxynitride (SiO$_x$N$_y$), silicon carbonitride (SiC$_x$N$_y$), or silicon oxycarbonitride (SiO$_x$C$_y$N$_z$).

Referring to FIGS. 7A and 7C, the gate capping layer 155' may be disposed in the form of two lines with an interlayer insulating layer 135 interposed therebetween. For example, the interlayer insulating layer 135 may include silicon oxide (SiO$_x$). As illustrated in FIG. 7C, in the gate capping layer 155' disposed in a gate separation space, the first region 155a and the second region 155b' may have substantially the same width.

Figure 8A:
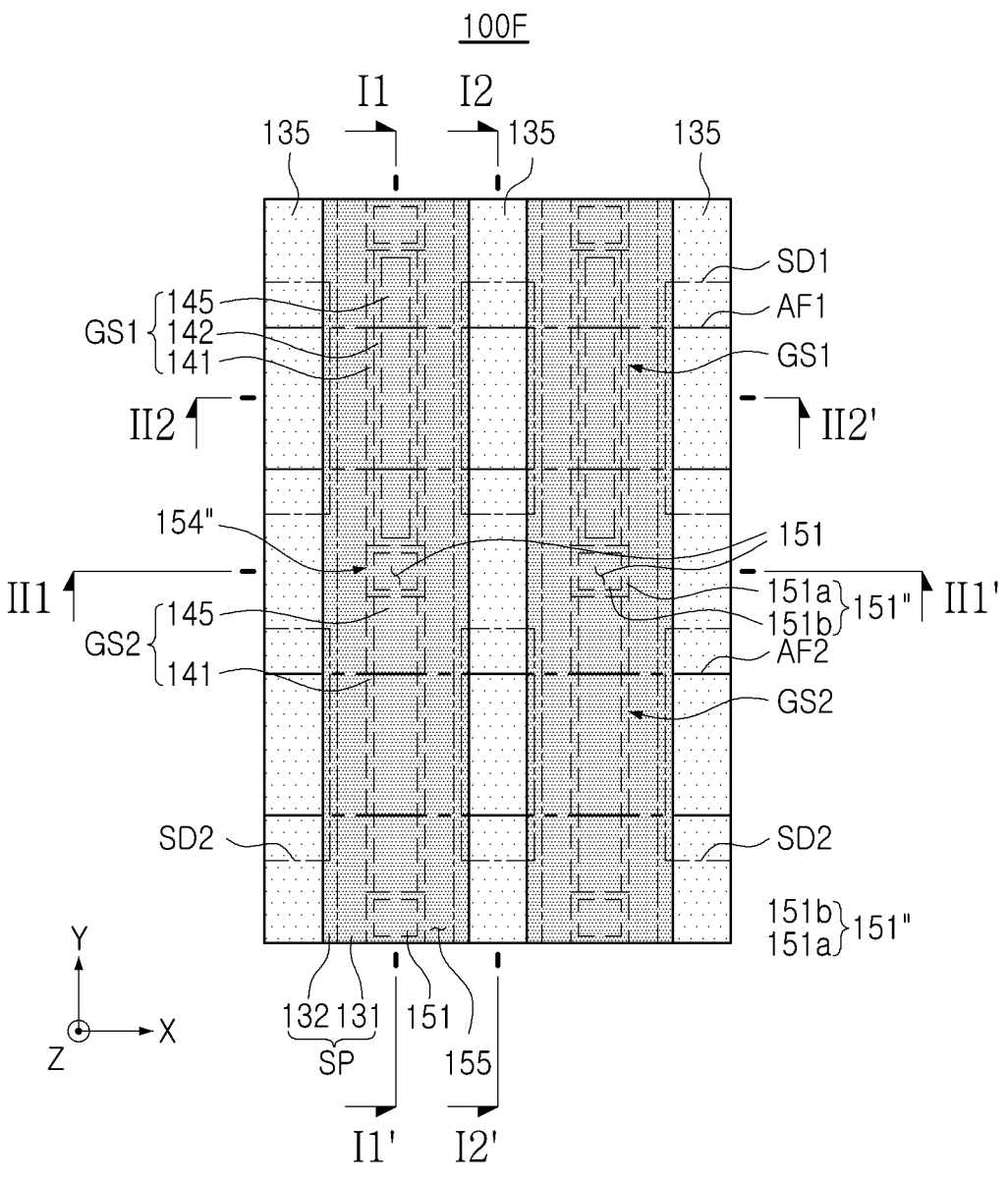
FIG. 8A is a plan view of a semiconductor device according to an embodiment.
Figure 8B:
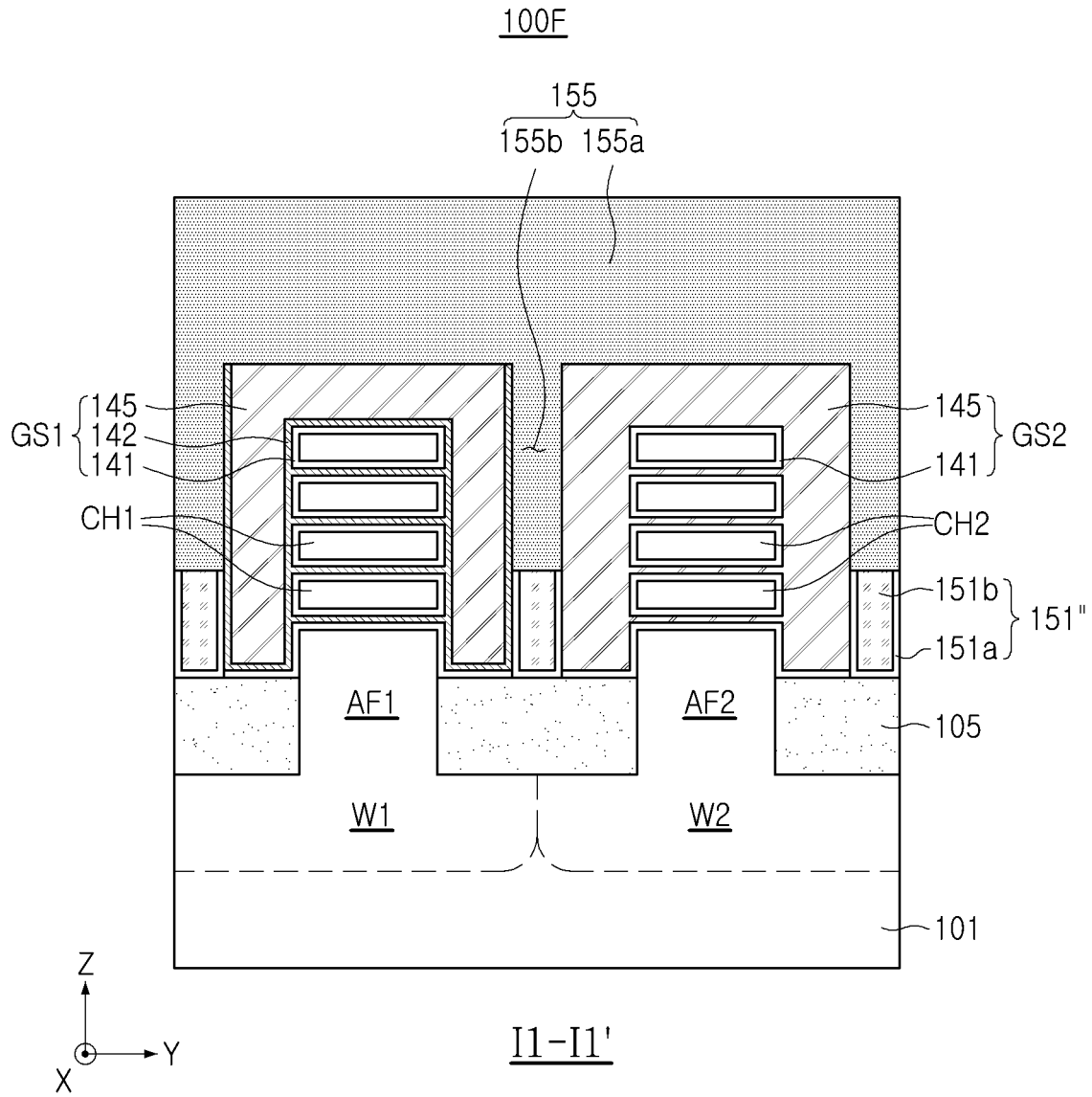
FIGS. 8B and 8C are cross-sectional views of the semiconductor device illustrated in FIG. 8A, respectively taken along lines I1-I1' and III'-III1'.
Figure 8C:
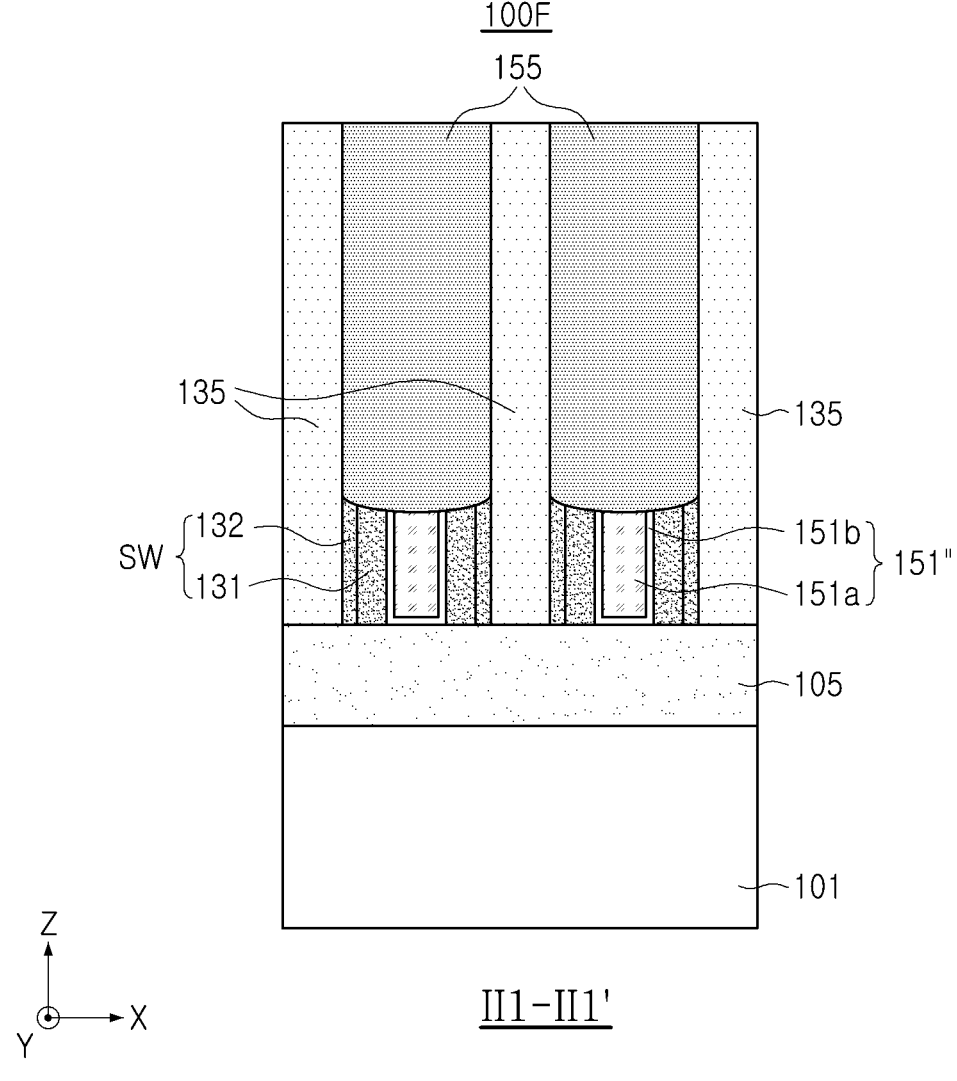

FIG. 8A is a plan view of a semiconductor device according to an embodiment, and FIGS. 8B and 8C are cross-sectional views of the semiconductor device illustrated in FIG. 8A, respectively taken along lines I1-I1' and II1-II1'. The other cross-sections (I2-I2' and II2-II2') of a semiconductor device 100F according to the present embodiment may be understood to be substantially the same as illustrated in FIGS. 1C and 1E.

Referring to FIGS. 8A to 8C, the semiconductor device 100F according to the present embodiment may be understood to be similar to the semiconductor device 100 illustrated in FIGS. 1A to 1E, except that a gate separation pattern 151" has a double structure. In addition, elements of the embodiment of FIGS. 8A to 8C may be understood with reference to the description of the same or similar elements of the embodiment illustrated in FIGS. 1A to 1E unless specifically stated otherwise.

The gate separation pattern 151", employed in the present embodiment, may include a separation region 151b, including a first insulating material, and a barrier layer 151a surrounding a bottom surface and side surfaces of the separation region 151b and including a third insulating material, different from the first insulating material. For example, the first insulating material may include silicon oxide (SiO$_x$), and the third insulating material may include silicon nitride (SiN$_x$), silicon oxynitride (SiO$_x$N$_y$), silicon carbonitride (SiC$_x$N$_y$), or silicon oxycarbonitride (SiO$_x$C$_y$N$_z$).

Figure 9A:
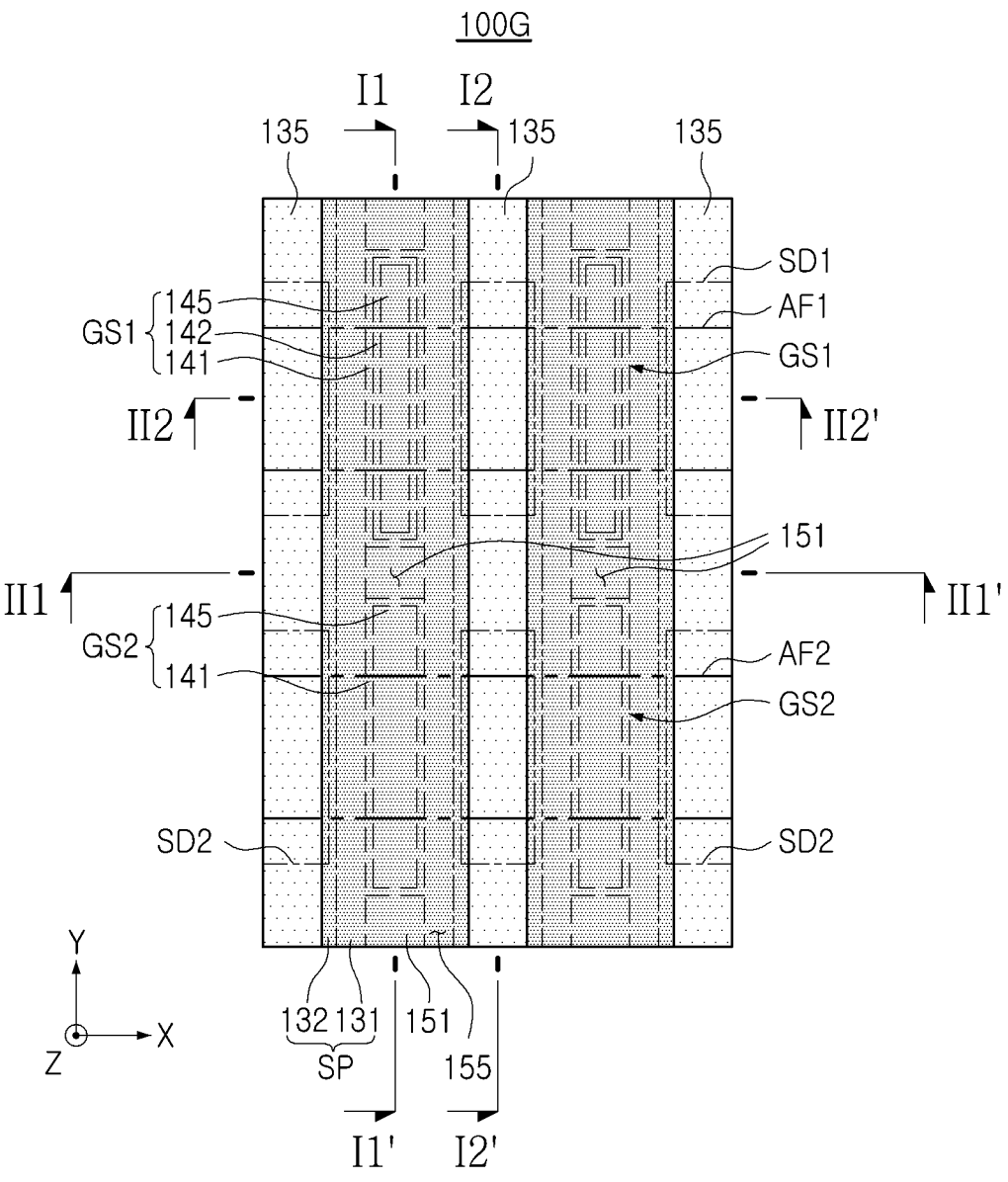
FIG. 9A is a plan view of a semiconductor device according to an embodiment.
Figure 9B:
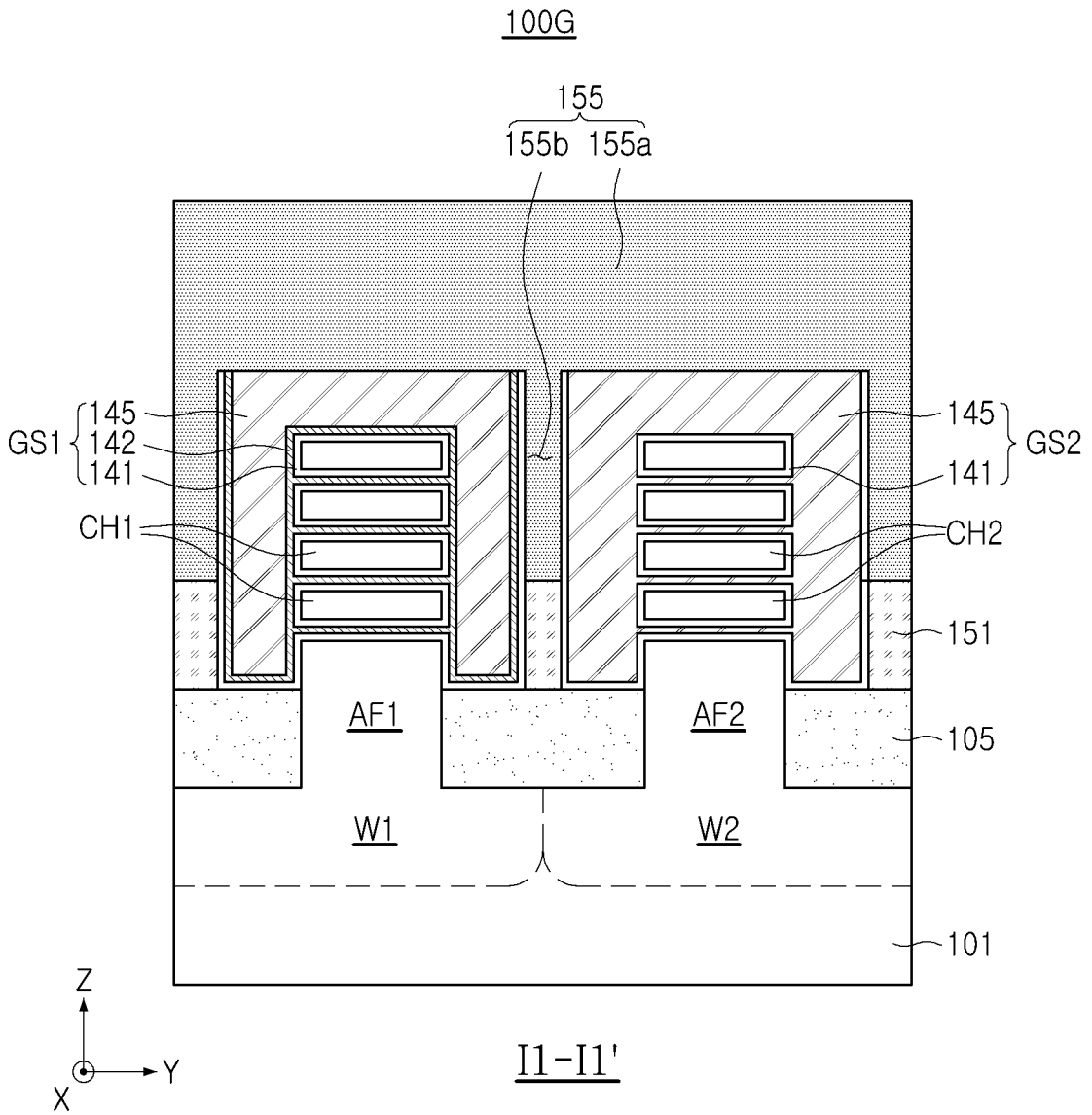
FIG. 9B is a cross-sectional view of the semiconductor device illustrated in FIG. 9A, taken along line I1-I1'.

FIG. 9A is a plan view of a semiconductor device according to an embodiment, and FIG. 9B is a cross-sectional view of the semiconductor device illustrated in FIG. 9A, taken along line I1-I1'. The other cross-sections (I2-I2', II1-II1', and II2-II2') of a semiconductor device 100G according to the present embodiment may be understood to have substantially the same as illustrated in FIGS. 1C to 1E.

Referring to FIGS. 9A and 9B, the semiconductor device 100G according to the present embodiment may be understood to be similar to the semiconductor device 100 illustrated in FIGS. 1A to 1E, except that a gate insulating layer 141 extends upward along sidewalls of first and second gate structures GS1 and GS2 in the third direction. In addition, elements of the embodiment of FIGS. 9A and 9B may be understood with reference to the description of the same or similar elements of the embodiment illustrated in FIGS. 1A to 1E unless specifically stated otherwise.

As described above, in the present embodiment, the first and second gate structures GS1 and GS2 may introduce first and second gate electrode layers 142 and 145 to constitute a PMOS transistor and an NMOS transistor, respectively. The first gate electrode layer 142 for a P-side electrode may be formed to surround only a first channel layer CH1, and a second gate electrode layer 145 for an N-side electrode may be applied to both the first and second gate structures GS1 and GS2 to surround the second channel layer CH2. In this case, the first gate electrode layer 142 may be disposed on sidewalls of the first gate structures GS1 in the third direction.

In the present embodiment, as illustrated in FIG. 9B, the gate insulating layer 141 may extend between a sidewall of the gate separation pattern 151 and the first and second gate electrode layers 142 and 145 of the first and second gate structures GS1 and GS2. Substantially, the gate insulating layer 141 may be disposed on almost entire sidewalls of the first and second gate structures GS1 and GS2 in the third direction.

In the previous embodiments, a description has been provided for only an in which a structure such as a gate separation pattern is applied to a gate-all-around type field effect transistor. However, such a structure may be applied to a transistor having a general three-dimensional fin structure, except for only a configuration related to a plurality of channel layers. Such an embodiment is illustrated in FIGS. 10A to 10E.

Figure 10A:
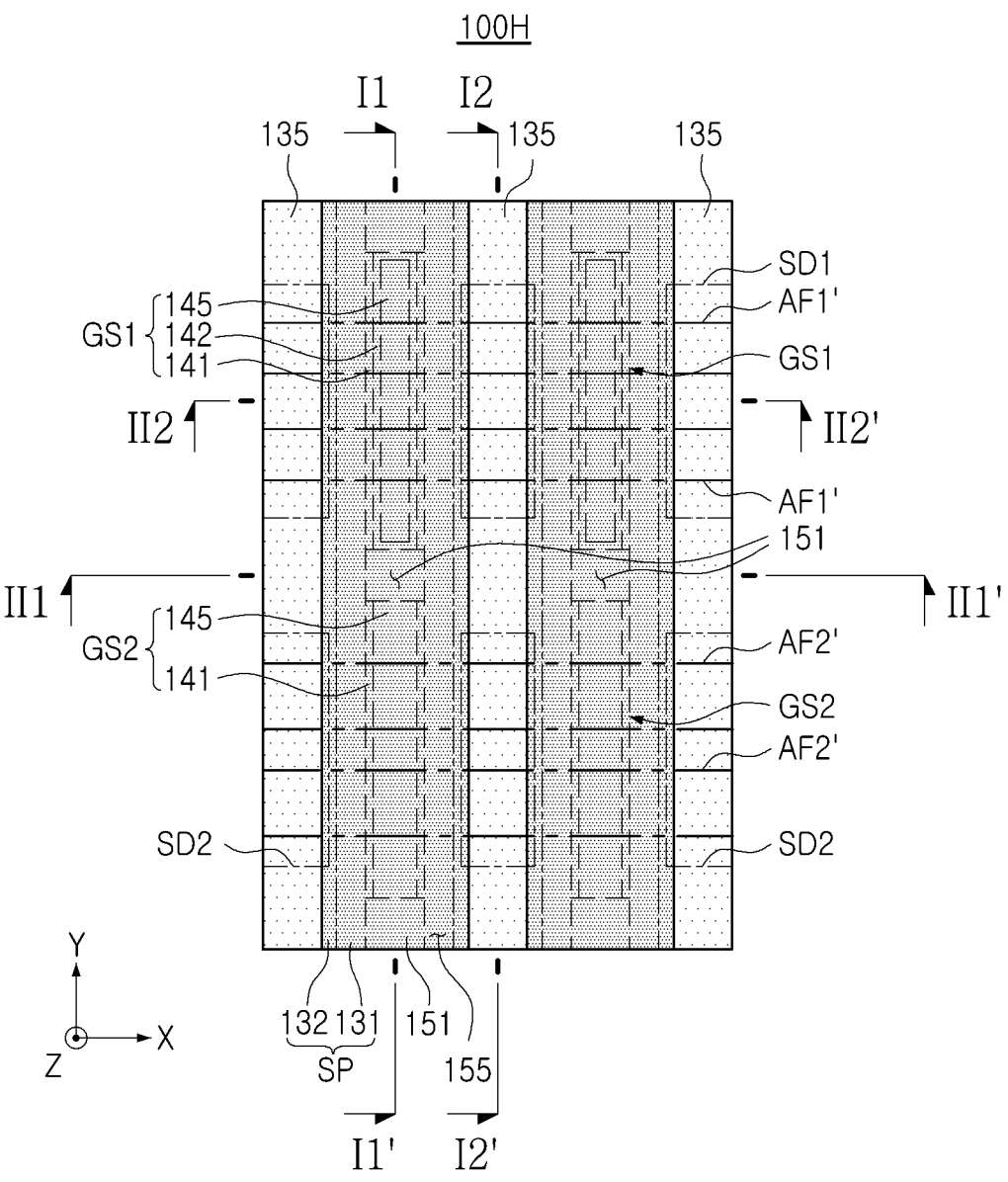
FIG. 10A is a plan view of a semiconductor device according to an embodiment.
Figure 10B:
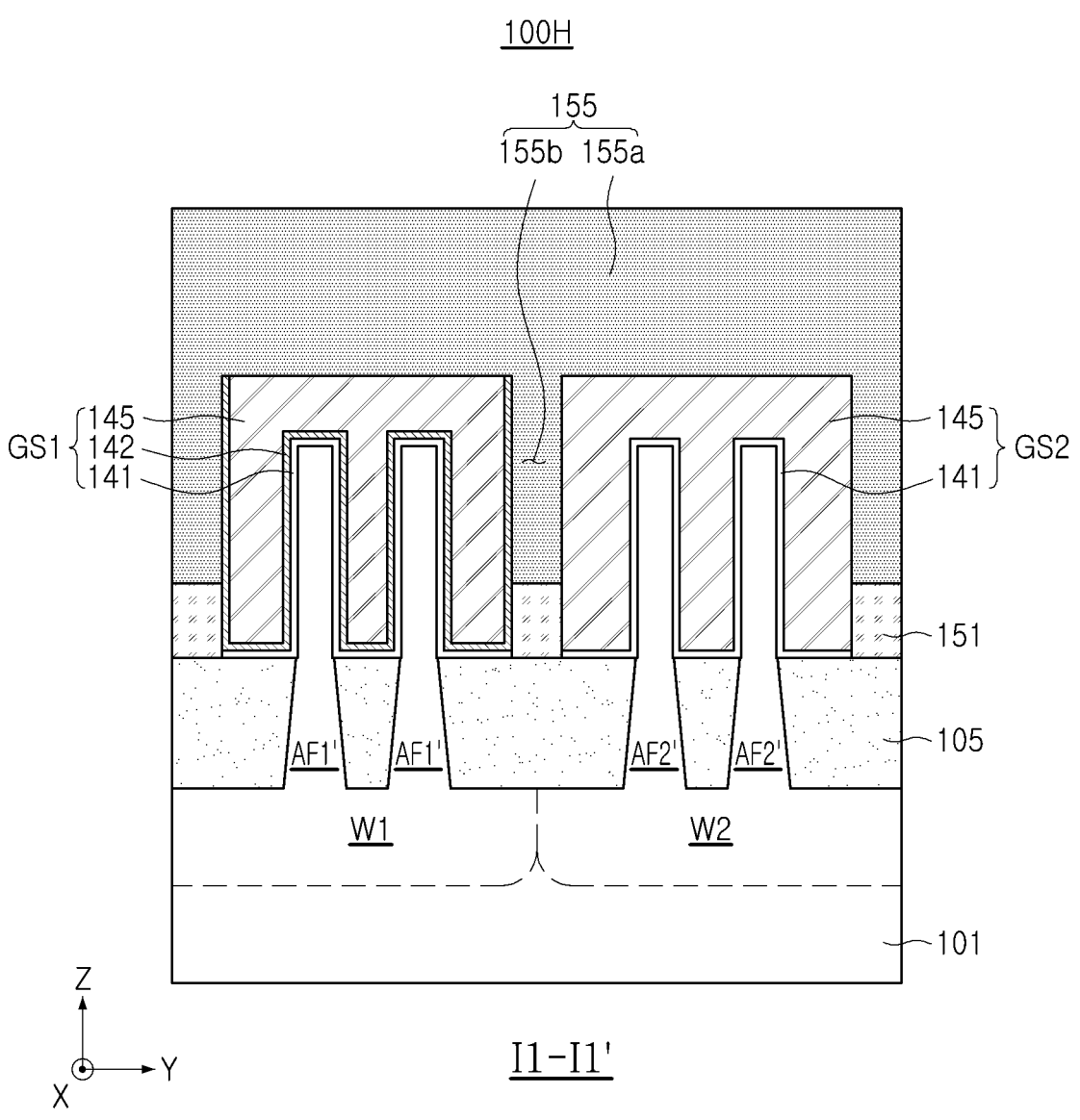
FIGS. 10B and 10C are cross-sectional views of the semiconductor device illustrated in FIG. 10A, respectively taken along lines I1-I1' and I2-I2'.
Figure 10C:
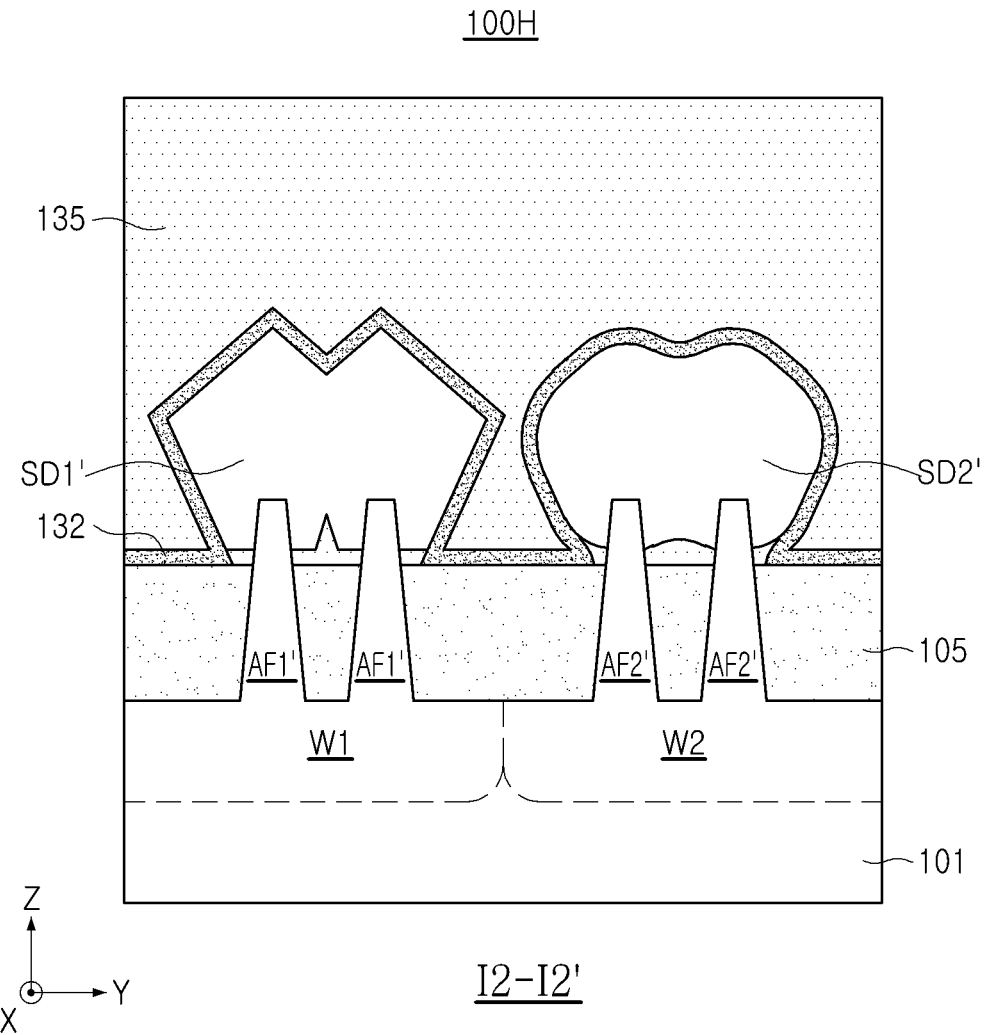
Figure 10D:
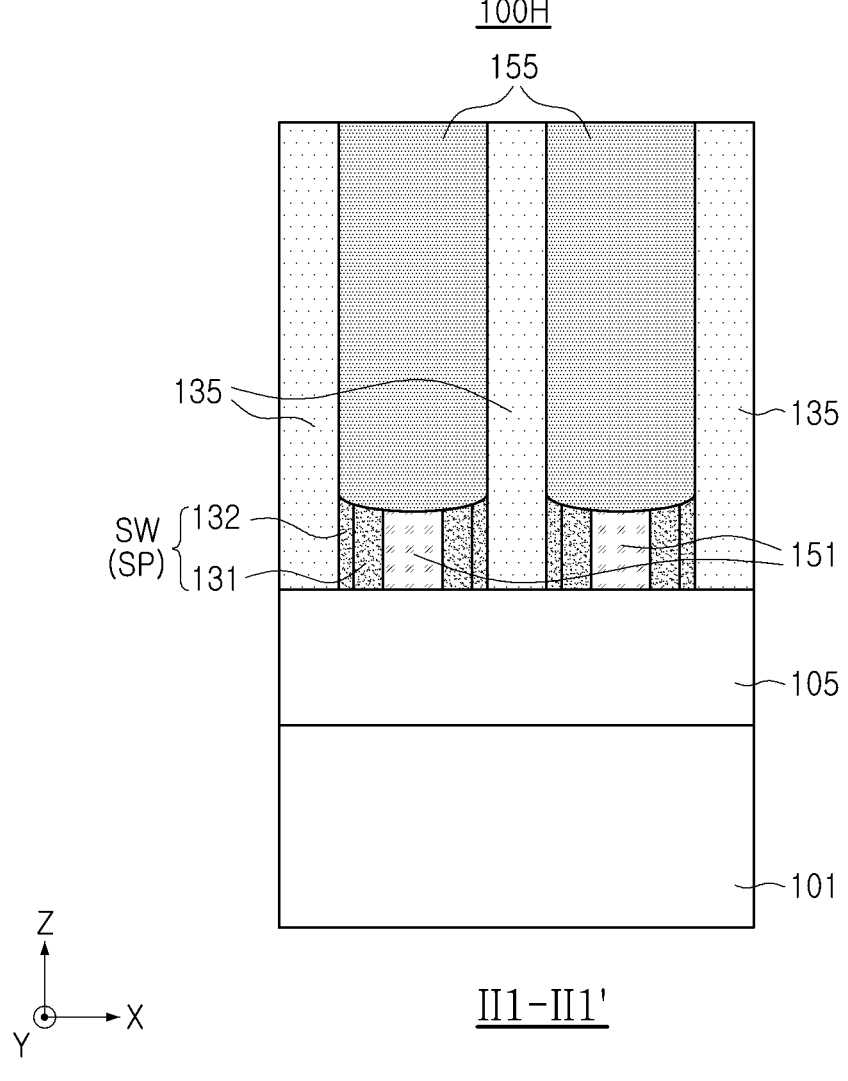
FIGS. 10D and 10E are cross-sectional views of the semiconductor device illustrated in FIG. 10A, respectively taken along lines II1-II1' and II2-II2'.
Figure 10E:
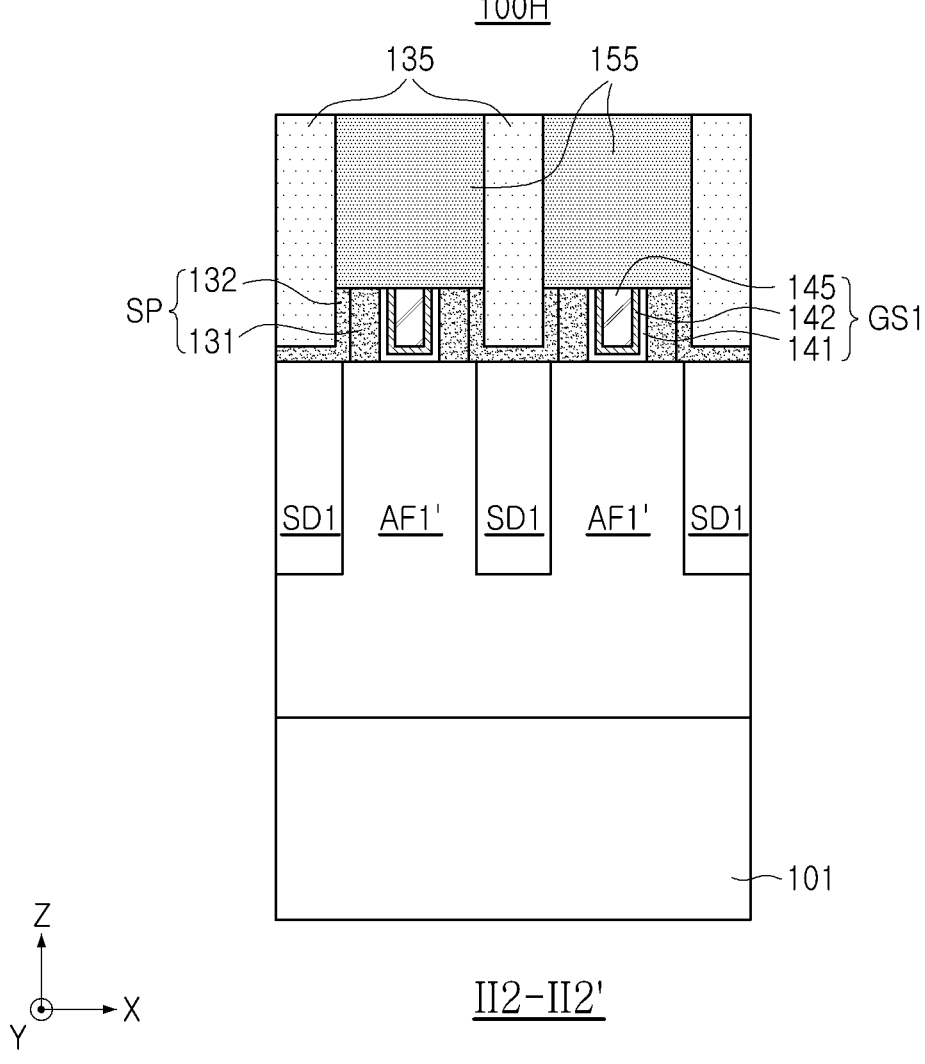

FIG. 10A is a plan view of a semiconductor device according to an embodiment, FIGS. 10B and 10C are cross-sectional views of the semiconductor device illustrated in FIG. 10A, respectively taken along lines I1-I1' and I2-I2', and FIGS. 10D and 10E are cross-sectional views of the semiconductor device illustrated in FIG. 10A, respectively taken along lines II1-II1' and II2-II2'.

Referring to FIGS. 10A to 10E, a semiconductor device 100G according to the present embodiment may be understood to be similar to the semiconductor device 100 illustrated in FIGS. 1A to 1E, except that a plurality of active fins AF1' and AF2' having a three-dimensional structure, rather than a plurality of channel layers, may be used as a channel region or channel structure. In addition, elements of the embodiment of FIGS. 10A to 10E may be understood with reference to the description of the same or similar elements of the embodiment illustrated in FIGS. 1A to 1E unless specifically stated otherwise.

As illustrated in FIGS. 10A and 10B, the semiconductor device 100G according to the present embodiment may have a structure in which a plurality of first and second active fins AF1' and AF2' having a three-dimensional structure protruding upward from a device isolation layer 105 are used as a channel region without introduction of a plurality of channel layers. In the present embodiment, each of the active regions W1 and W2 may include two first active fins AF1' and two second active fins AF2'. As illustrated in FIG. 10B, epitaxial layers grown from recessed regions of each of the two first active fins AF1' and two second active fins AF2' may be merged with each other to provide first and second source/drain regions SD1' and SD2', respectively. Here, the two active fins AF1' and the two active fins AF2' may be referred to as fin structures forming two fin field-effect transistors (FinFETs), respectively, according to an embodiment.

Similarly to the previous embodiment, a gate separation pattern 151 employed in the present embodiment may be disposed between first and second gate structures GS1 and GS2, and may have an upper surface at a level lower than that of an upper surface of each of the first and second gate structures GS1 and GS2, as illustrated in FIG. 10B.

In addition, a gate capping layer 155 disposed on the first and second gate structures GS1 and GS2 may include a main region 155a, disposed on the first and second gate structures GS1 and GS2, and an extension portion 155b extending from the main region 155a to a remaining space (an upper region) between the first and second gate structures GS1 and GS2. The gate separation pattern 151 may be provided as a structure coupled to the extension portion 155b of the gate capping layer 155 to separate the first and second gate structures GS1 and GS2 from each other. The gate separation pattern 151 may include a first insulating material, and the gate capping layer 155 may include a second insulating material different from the first insulating material. For example, the first insulating material may include silicon oxide ($SiO_x$), and the second insulating material may include silicon nitride ($SiN_x$), silicon oxynitride ($SiO_xN_y$), silicon carbonitride ($SiC_xN_y$), or silicon oxycarbonitride ($SiO_xC_yN_z$). After removal of a dummy gate electrode (for example, polysilicon) and before formation of the first and second gate structures GS1 and GS2 including a gate insulating layer 141 and first and second gate electrode layers 142 and 145, the gate separation pattern 151 may be formed using an organic planarization layer having high selectivity (for example, bottom anti-reflective coating (BARC), spin-on-hardmask (SOH), amorphous carbon layer (ACL), etc.) with respect to a surrounding insulating material (for example, SiN).

Various features of the above-described embodiments may be combined with each other to be implemented in various forms, and all of the features may be advantageously applied to the transistor having the three-dimensional fin structure illustrated in FIGS. 10A to 10E.

Hereinafter, an example of a method of fabricating semiconductor devices according to the above-described embodiments will be described in detail.

FIGS. 11A to 11H are process cross-sectional views of partial processes (formation of an active fin and a source/drain and removal of a dummy gate material) illustrating a method of fabricating a semiconductor device, according to an embodiment.

For ease of description, perspective views of FIGS. 11A to 11G illustrate only a unit cell UC constituting a single transistor of the semiconductor device 100 illustrated in FIG. 1A, and other cells may also be understood to be subjected to the same process.

Figure 11A:
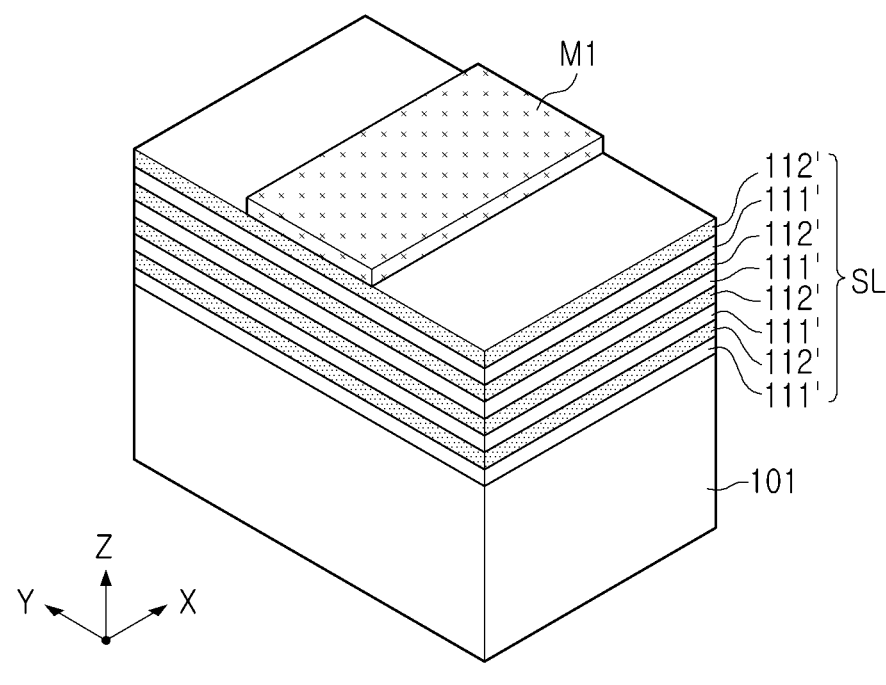
FIGS. 11A to 11H are process cross-sectional views of partial processes (formation of an active fin and a source/drain and removal of a dummy gate material) illustrating a method of fabricating a semiconductor device, according to an embodiment.

Referring to FIG. 11A, a stack structure SL, in which first semiconductor layers 111' and second semiconductor layers 112' are alternately stacked, may be formed on a substrate 101.

The second semiconductor layers 112' and the first semiconductor layers 111' may be alternately formed on the lowermost first semiconductor layer 111' in contact with the substrate 101, and the uppermost layer may be the second semiconductor layer 112' but is not limited thereto. For example, the first semiconductor layers 111' and the second semiconductor layers 112' may be formed using an epitaxial growth method. Each of the first semiconductor layers 111' and each of the second semiconductor layers 112' may include materials having different etching selectivity. For example, each of the first semiconductor layers 111' may be used as a sacrificial layer providing a space for forming a gate electrode layer, and each of the second semiconductor layers 112' may be used as a channel layer. In this case, even when the first semiconductor layers 111' are etched, the second semiconductor layers 112' may be barely etched and may remain. For example, the first semiconductor layers 111' may include silicon-germanium (SiGe), and the second semiconductor layers 112' may include either silicon (Si) or a group III-V compound semiconductor. Then, a first mask pattern M1 may be formed on the stack structure SL to extend in the first direction. The first mask pattern M1 may be formed of at least one of, for example, silicon oxide, silicon nitride, and silicon oxynitride.

Figure 11B:
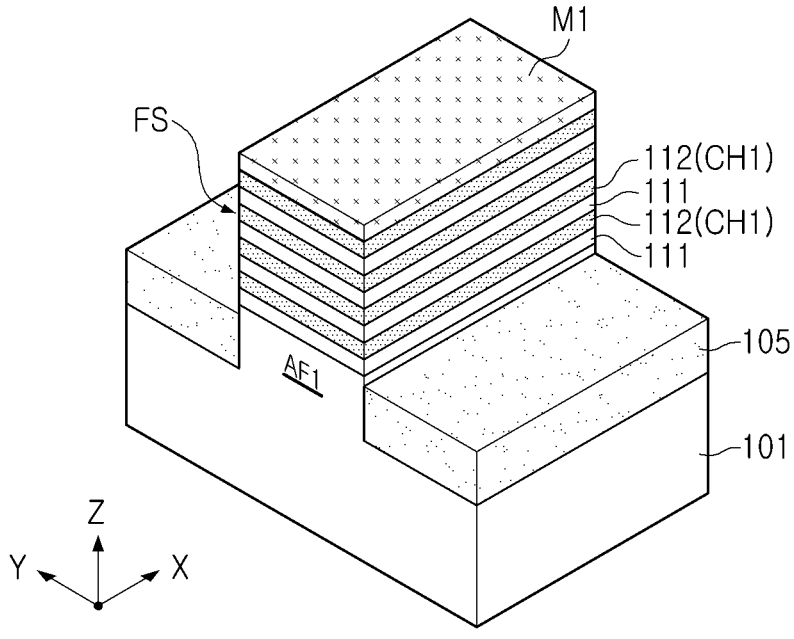

Referring to FIG. 11B, the stack structure SL may be etched using a first mask pattern M1 to form a first active fin AF1 and the fin-shaped structure FS.

In the present embodiment, the fin-shaped structure FS may include a plurality of first semiconductor patterns 111 and a plurality of second semiconductor patterns 112 patterned out from the first semiconductor layers 111' and the second semiconductor layers 112'. A region of the substrate 101 may also be patterned to form the first active fin AF1. A device isolation layer 105 may be formed on an upper surface of the substrate 101 disposed around the first active fin AF1. The device isolation layer 105 may also be formed on a portion of a side surface of the first active fin AF1, and an upper surface of the device isolation layer 105 may be lower than an upper surface of the first active fin AF1. For example, the first active fin AF1 on the substrate 101 may protrude upward from the device isolation layer 105.

Figure 11C:
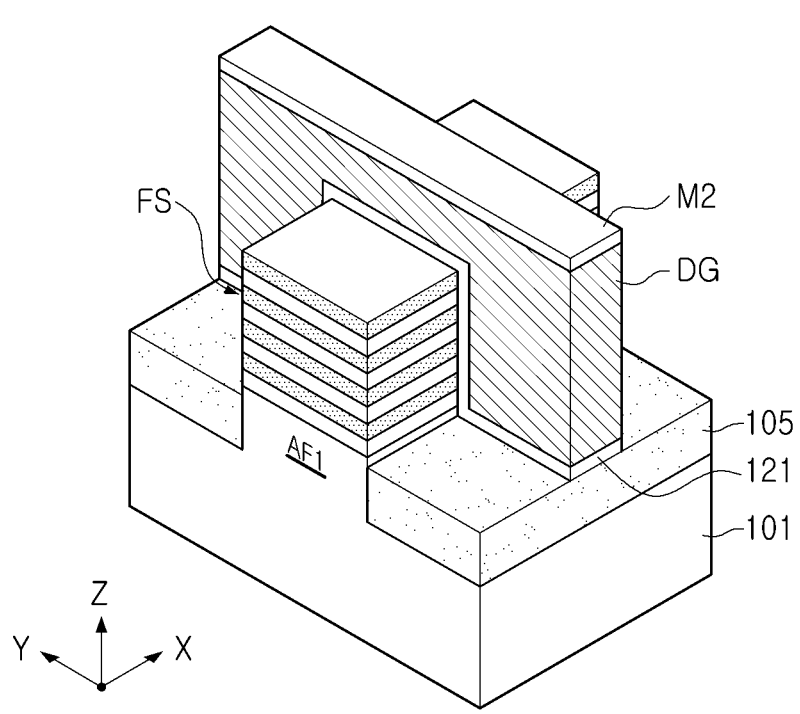

Referring to FIG. 11C, the first mask pattern M1 may be removed and an etch-stop layer 121 and a dummy gate layer may be formed, and a dummy gate layer may then be patterned using a second mask pattern M2 to form a dummy gate pattern DG.

In the present process, the etch-stop layer 121 may be formed almost entirely on the fin structure FS and the device isolation layer 105, and the dummy gate layer may be formed on the etch-stop layer 121. Then, a second mask pattern M2 may be formed on the dummy gate layer to extend in the second direction Y while overlapping one region of the fin-shaped structure FS, and a dummy gate pattern DG may be formed using the second mask pattern M2. In this etching process, the etch-stop layer 121 may also be patterned together with the dummy gate layer. For example, the dummy gate layer may include polysilicon or amorphous silicon, and the etch-stop layer 121 may include silicon nitride or silicon oxynitride.

Figure 11D:
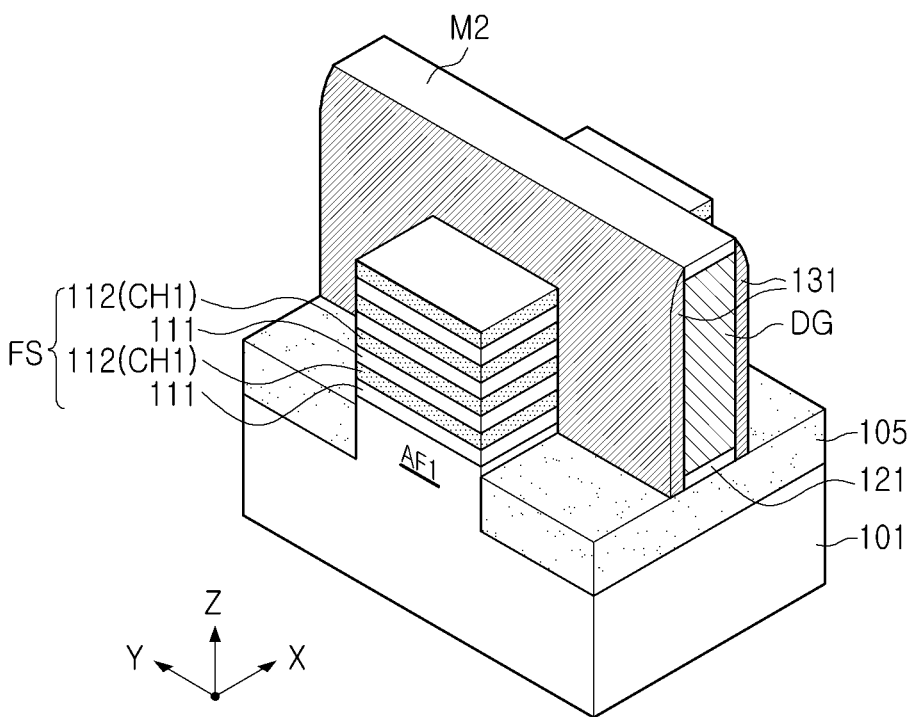

Referring to FIG. 11D, a gate spacer may be formed on a sidewall of the dummy gate pattern DG.

For example, a spacer layer may be formed on the substrate to be disposed on the dummy gate pattern DG and the fin-shaped structure FS. The spacer layer may be etched back to form a sidewall spacer 131 remaining only on the sidewall of the dummy gate pattern DG. The sidewall spacer 131 may include an insulating material such as, for example, silicon nitride (SiN$_x$), silicon oxynitride (SiO$_x$N$_y$), silicon carbonitride (SiC$_x$N$_y$), or silicon oxycarbonitride (Si-O$_x$C$_y$N$_z$). In some embodiments, the sidewall spacers 131 may be formed to include two or more insulating layers.

Figure 11E:
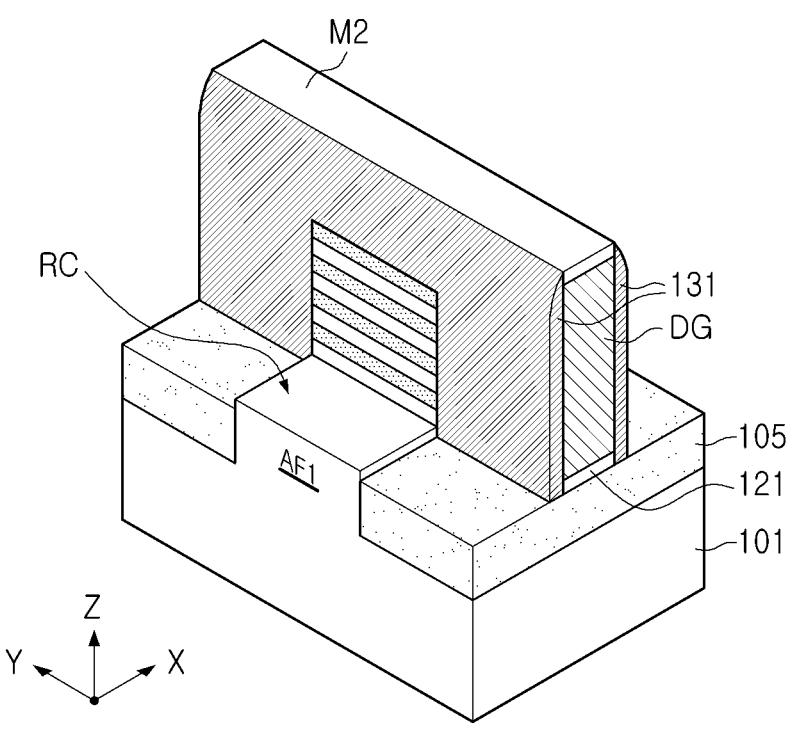
Figure 11F:
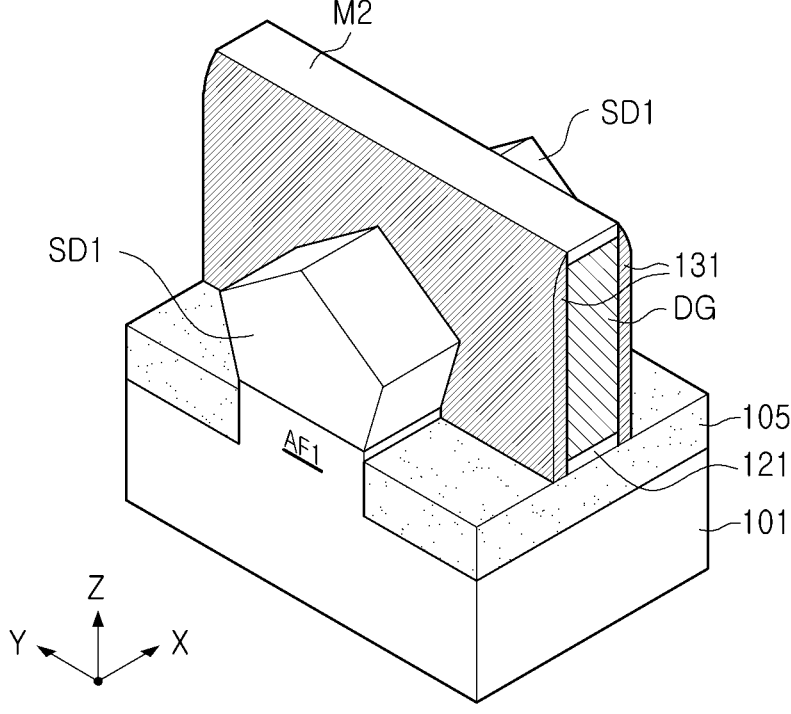

Referring to FIG. 11E, the fin-shaped structure FS region exposed on both sides of the dummy gate pattern DG and the sidewall spacer 131 may be removed to form a recess RC. Referring to FIG. 11F, the epitaxial layer may be regrown on a surface of the recess RC to form first source/drain regions SD1.

Figure 11G:
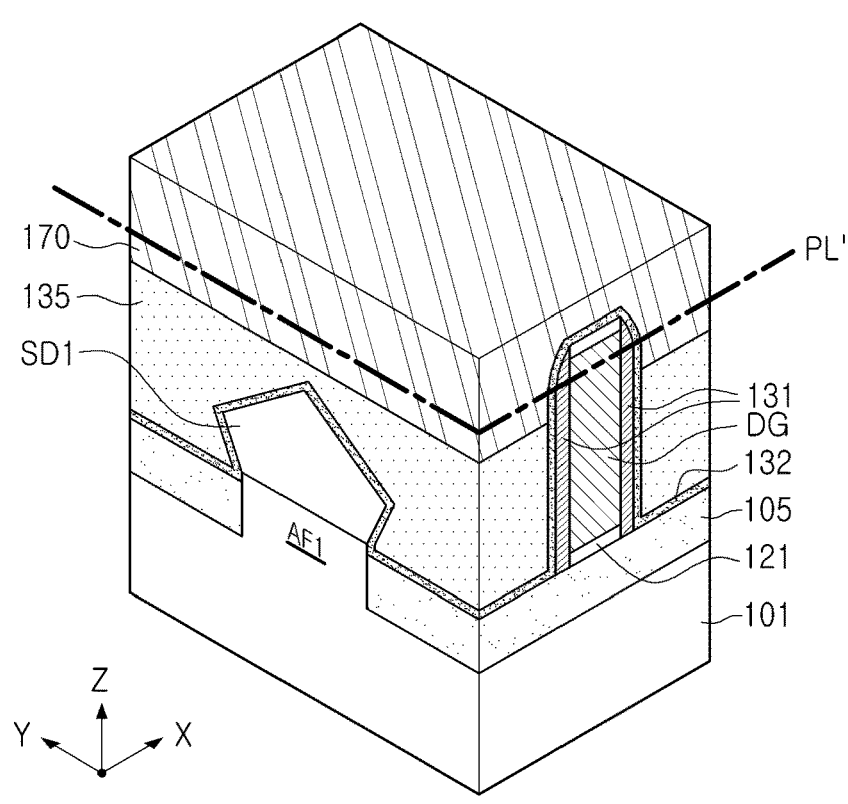

As illustrated in FIG. 11G, an etch-stop layer 132, an interlayer insulating layer 135, and an interlayer dielectric (ILD) protection layer 170 may be formed on the substrate 101. The etch-stop layer 132 may be formed on the dummy gate pattern DG on which the isolation layer 105, the first source/drain regions SD1, and the sidewall spacers 131 are formed. The interlayer insulating layer 135 and the ILD protection layer 170 may be sequentially formed on the first source/drain regions SD1 and the dummy gate pattern DG. For example, at least one of the etch-stop layer 132 and the ILD protective layer 170 may include an insulating material such as silicon nitride (SiN$_x$), silicon oxynitride (SiO$_x$N$_y$), silicon carbonitride (SiC$_x$N$_y$), or silicon oxycarbonitride (SiO$_x$C$_y$N$_z$). In some embodiments, the ILD protective layer 170 may include silicon nitride, and the interlayer insulating layer 135 may include a low-k dielectric material such as silicon oxide.

Figure 11H:
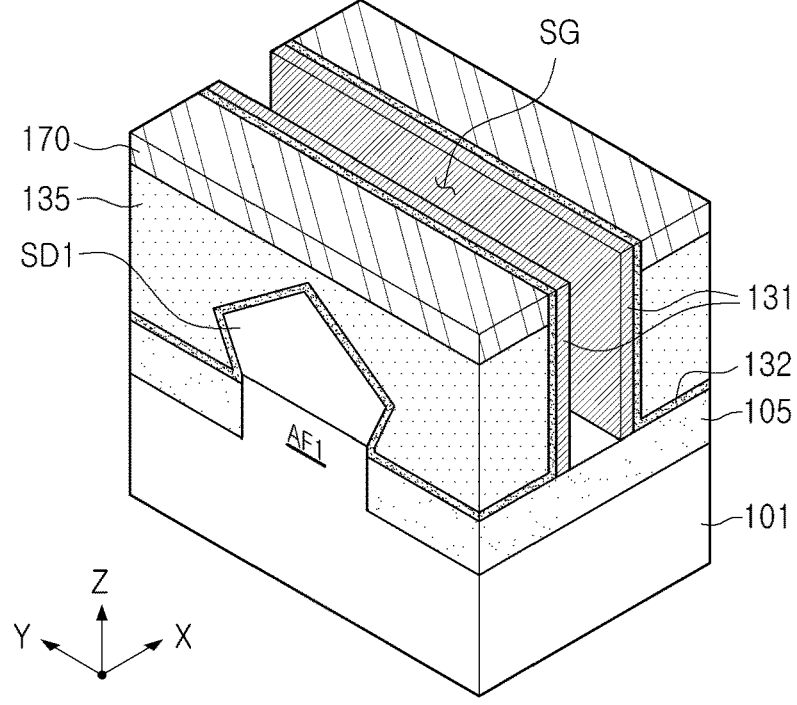

As illustrated in FIG. 11H, a process of planarizing the ILD protective layer 170 may be performed until the dummy gate pattern DG is exposed based on a line PL' shown in FIG. 11G, and portions of the dummy gate pattern DG and the etch-stop layer 132 disposed between the sidewall spacers 131 may be removed through an exposed region to prepare a space SG for forming a first gate structure (in particular, a gate electrode layer). In a similar manner, unit cells disposed in different regions in the plane illustrated in FIG. 1A may be formed together.

FIGS. 12A to 23A, FIGS. 12B to 23B, FIGS. 12C to 23C, and FIGS. 12D to 23D are cross-sectional views of main processes illustrating a method of fabricating a semiconductor device according to an embodiment (see FIGS. 1A to 1E), respectively.

The drawings illustrate show a cross-sectional structure after a process of removing a dummy gate pattern DG. A method of fabricating a semiconductor device 100 according to the present embodiment may be understood to be an example of the method of fabricating a semiconductor device illustrated in FIGS. 1A to 1E. For example, cross-sections of FIGS. 12A to 12D may be understood to correspond to the cross-sections (FIGS. 1B to 1E) for the structure in which the unit cells UC described in the process of FIGS. 11A to 11H are arranged in a 2-by-2 array, respectively.

Figure 12A:
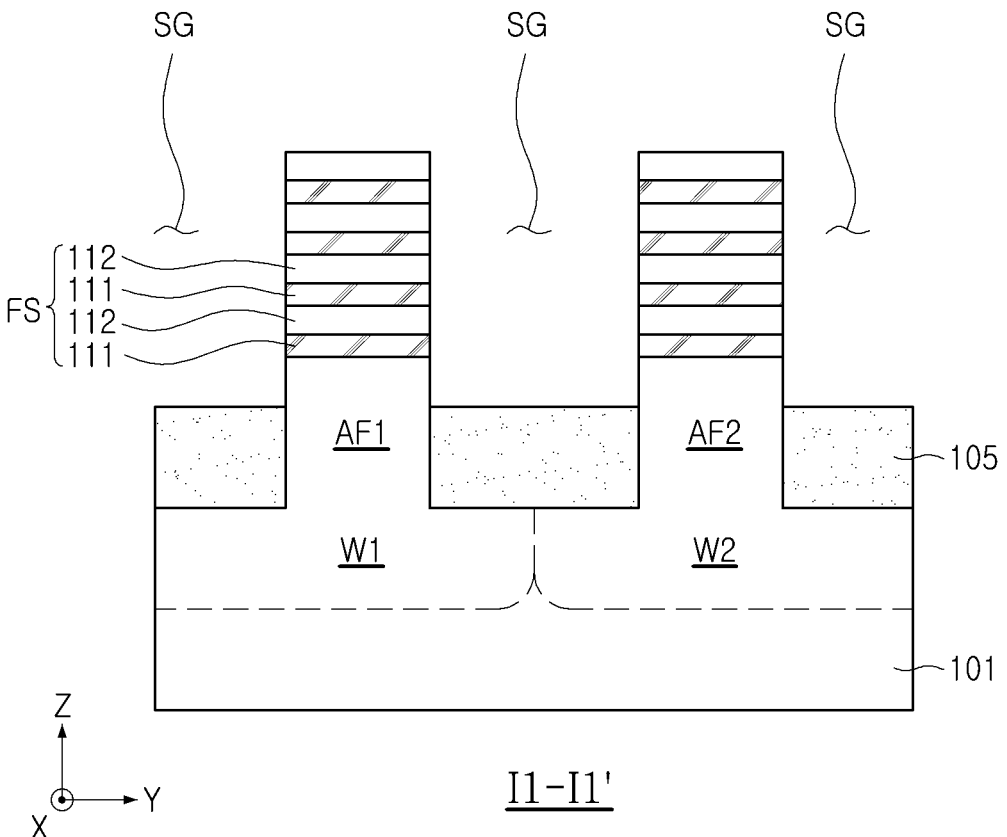
Figure 12B:
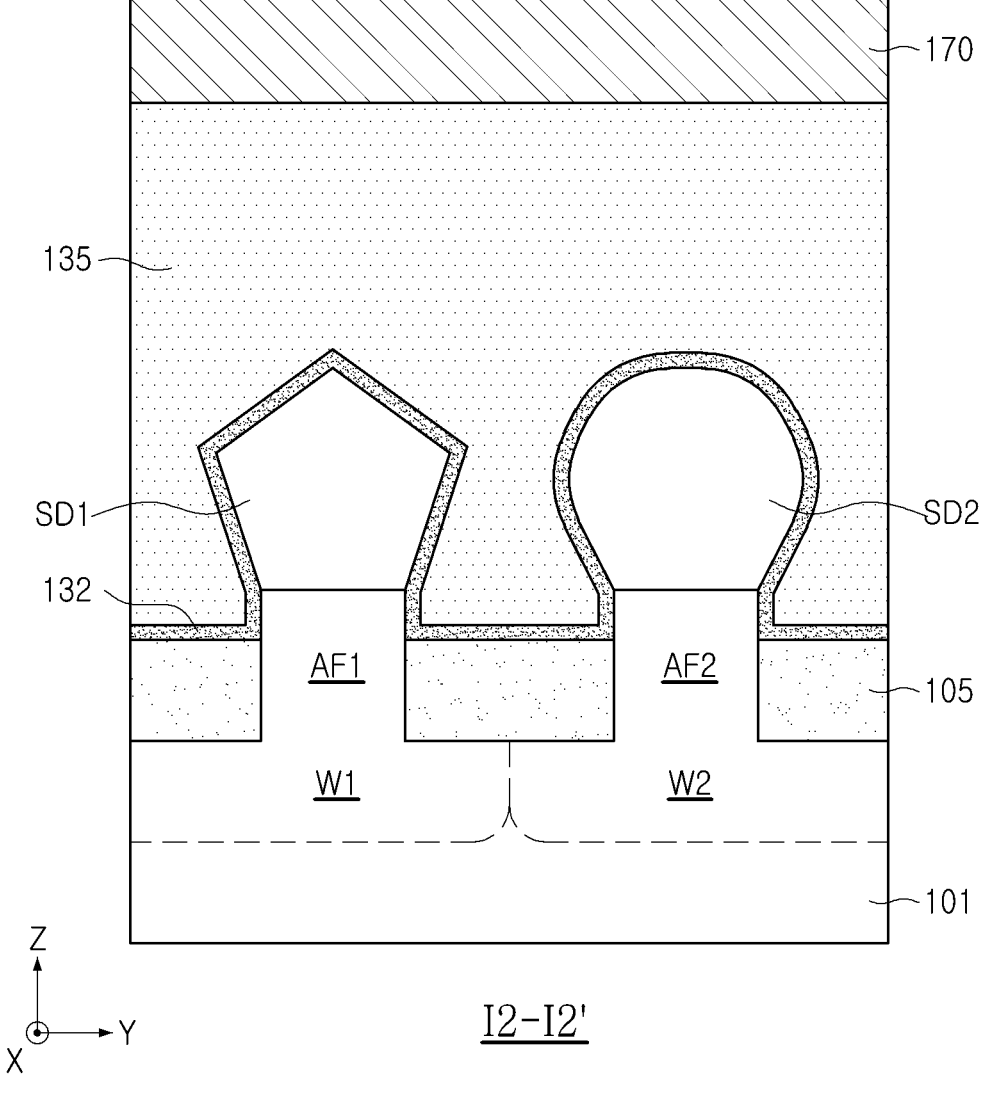
Figure 12C:
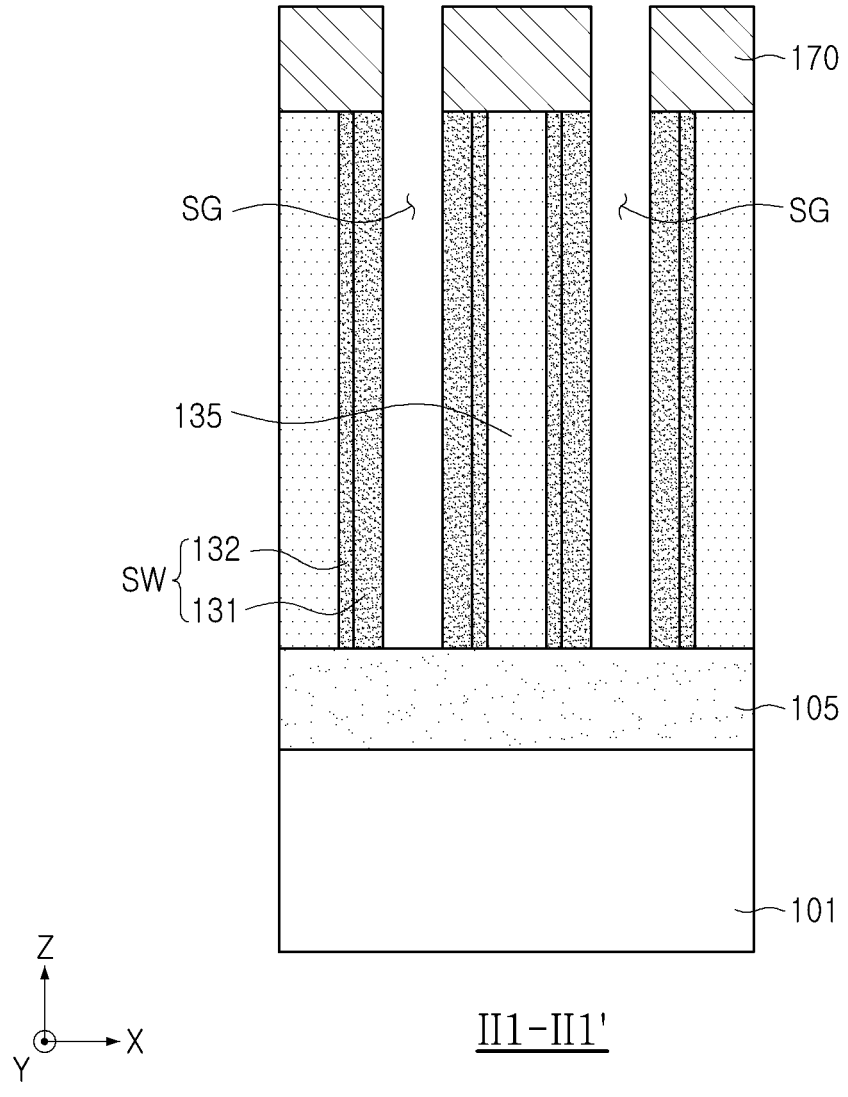
Figure 12D:
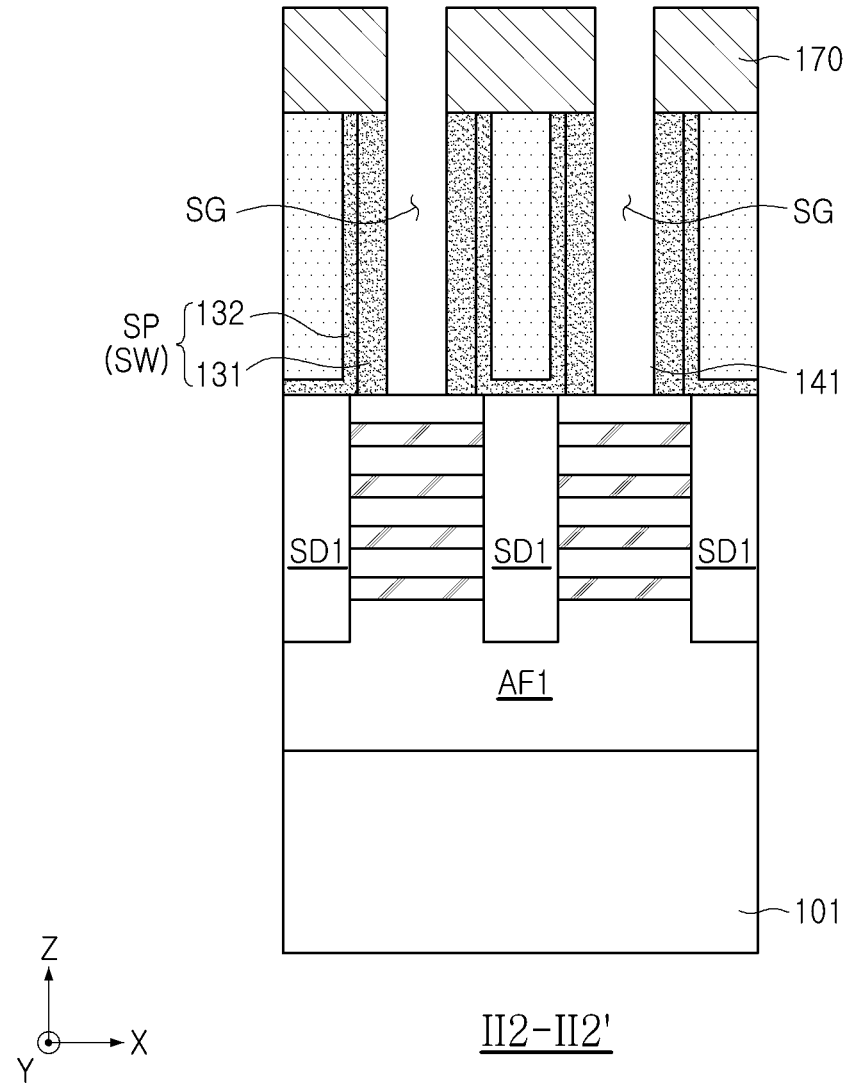
Figure 13A:
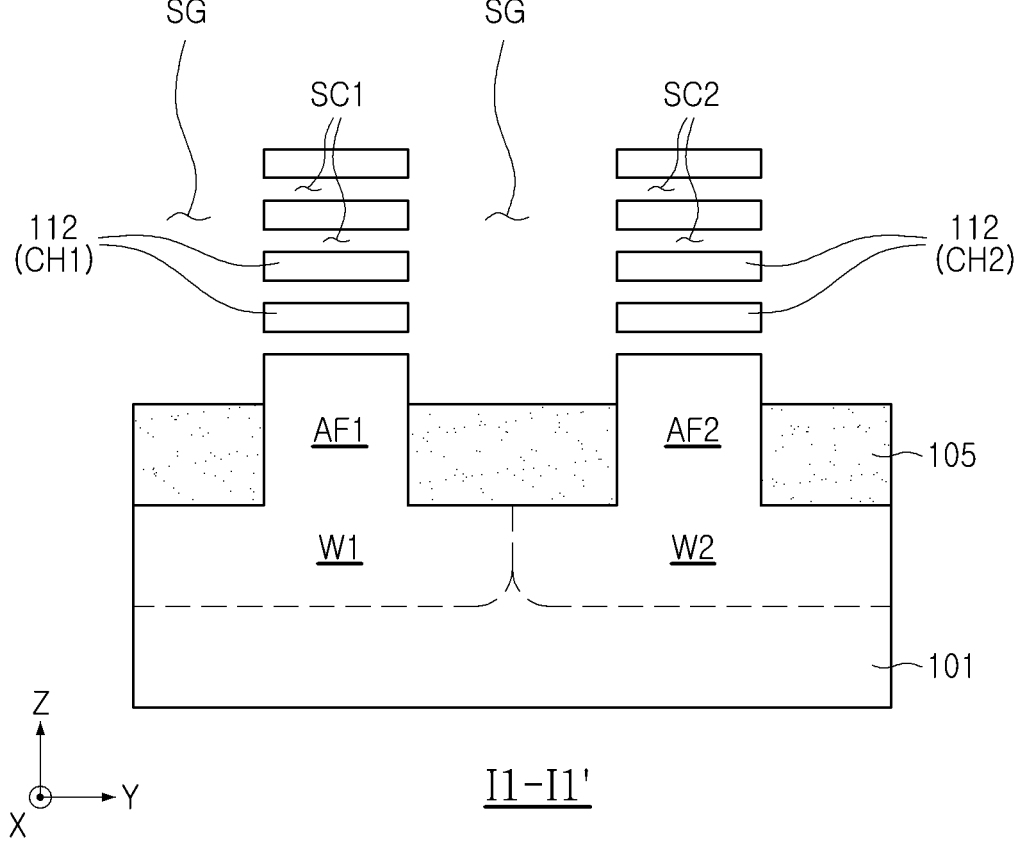
Figure 13B:
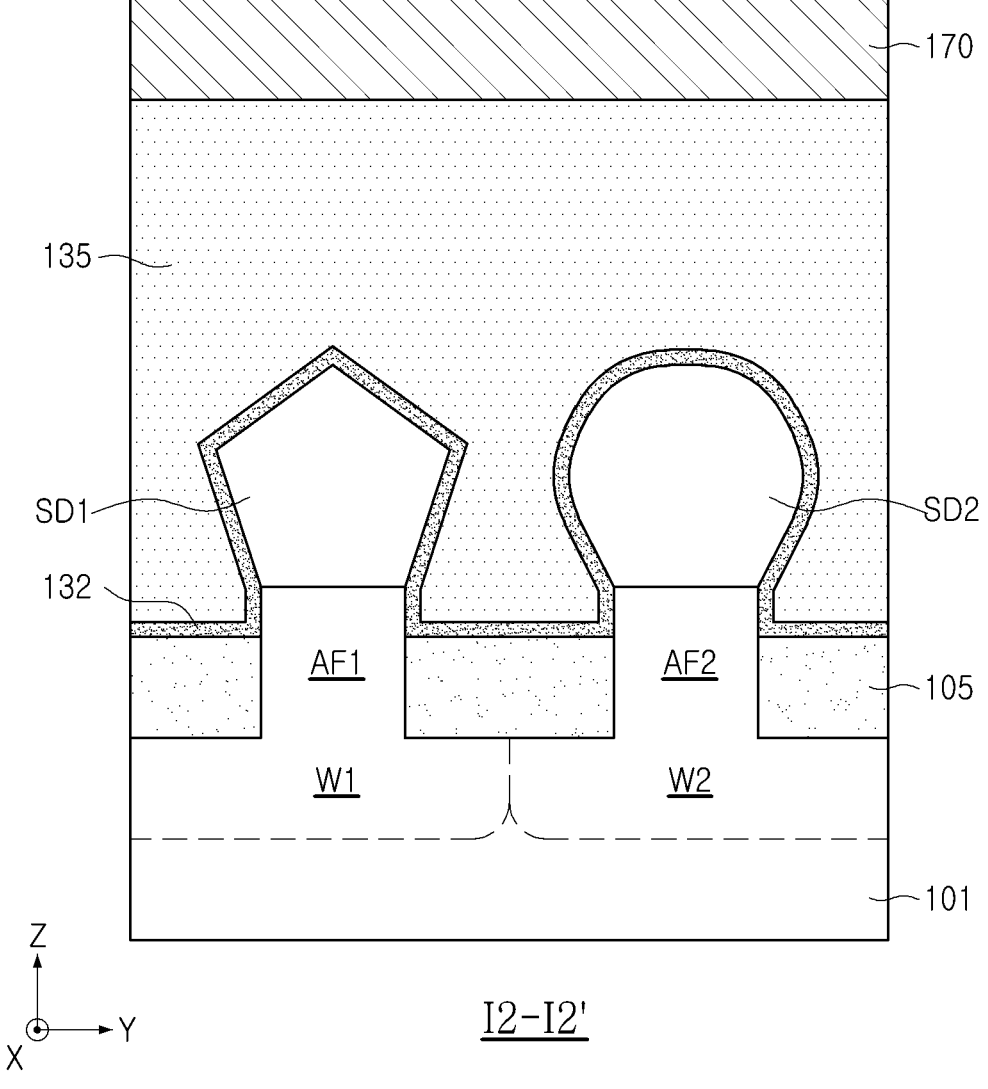
Figure 13C:
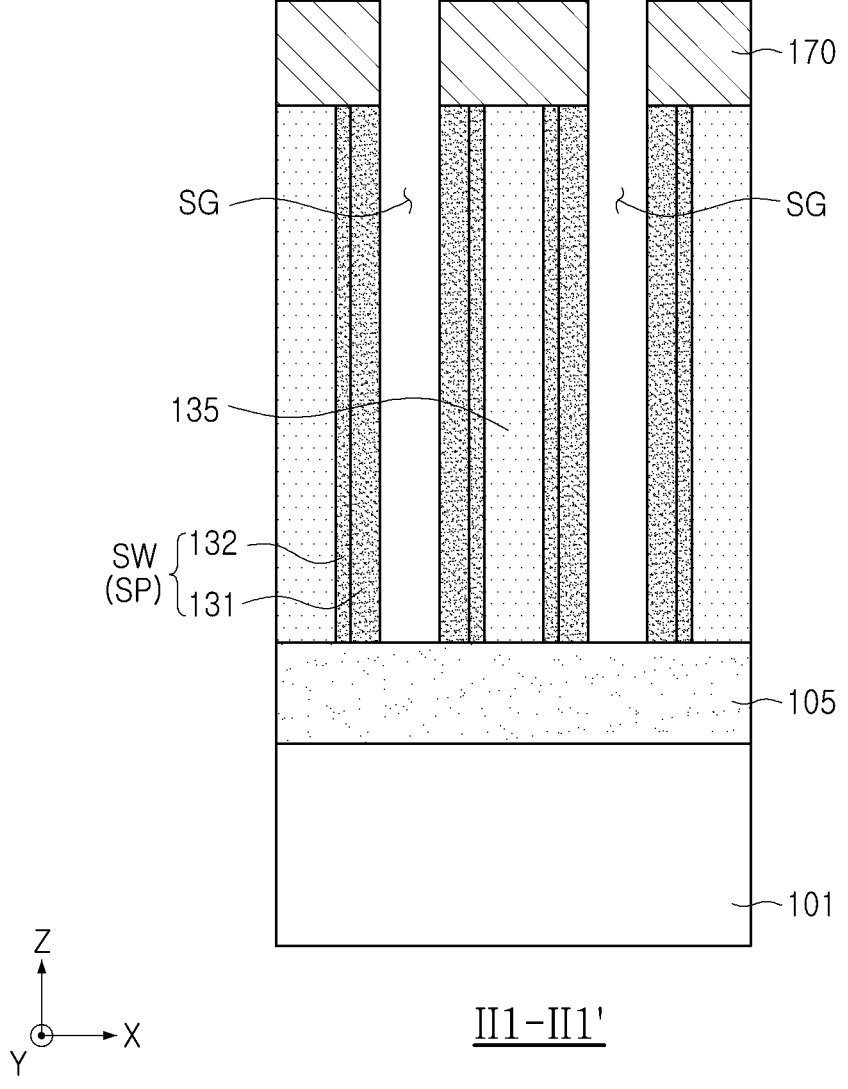
Figure 13D:
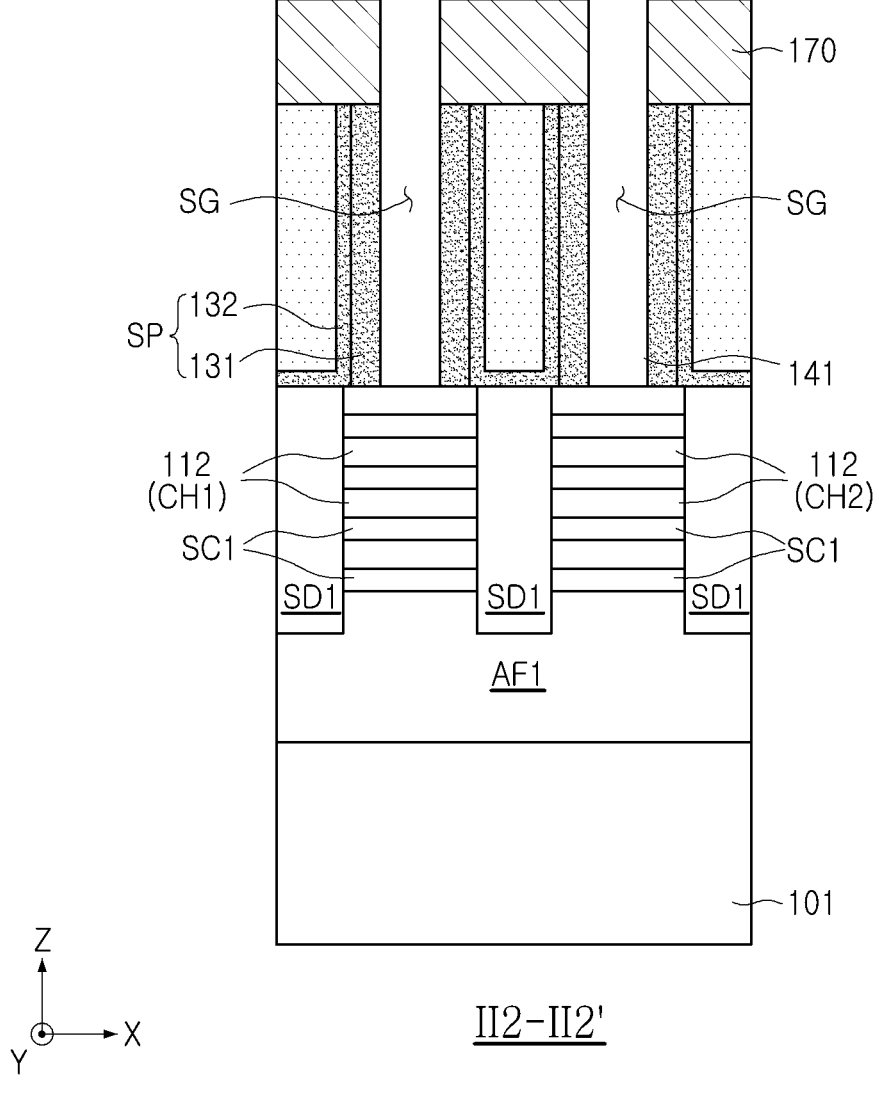
Figure 14A:
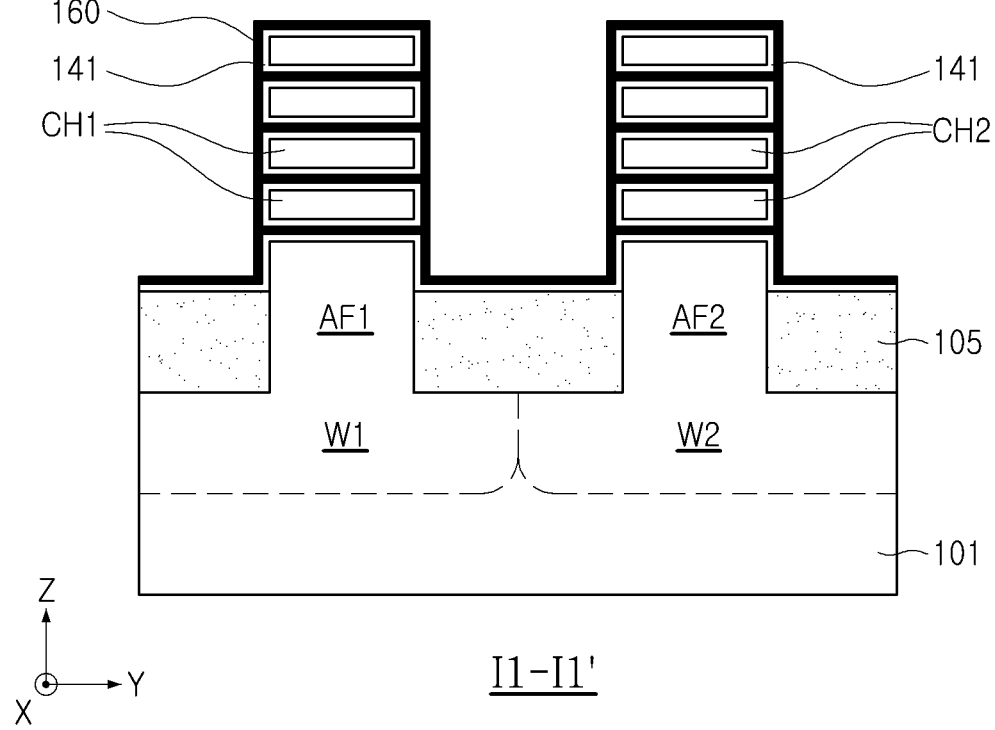
Figure 14B:
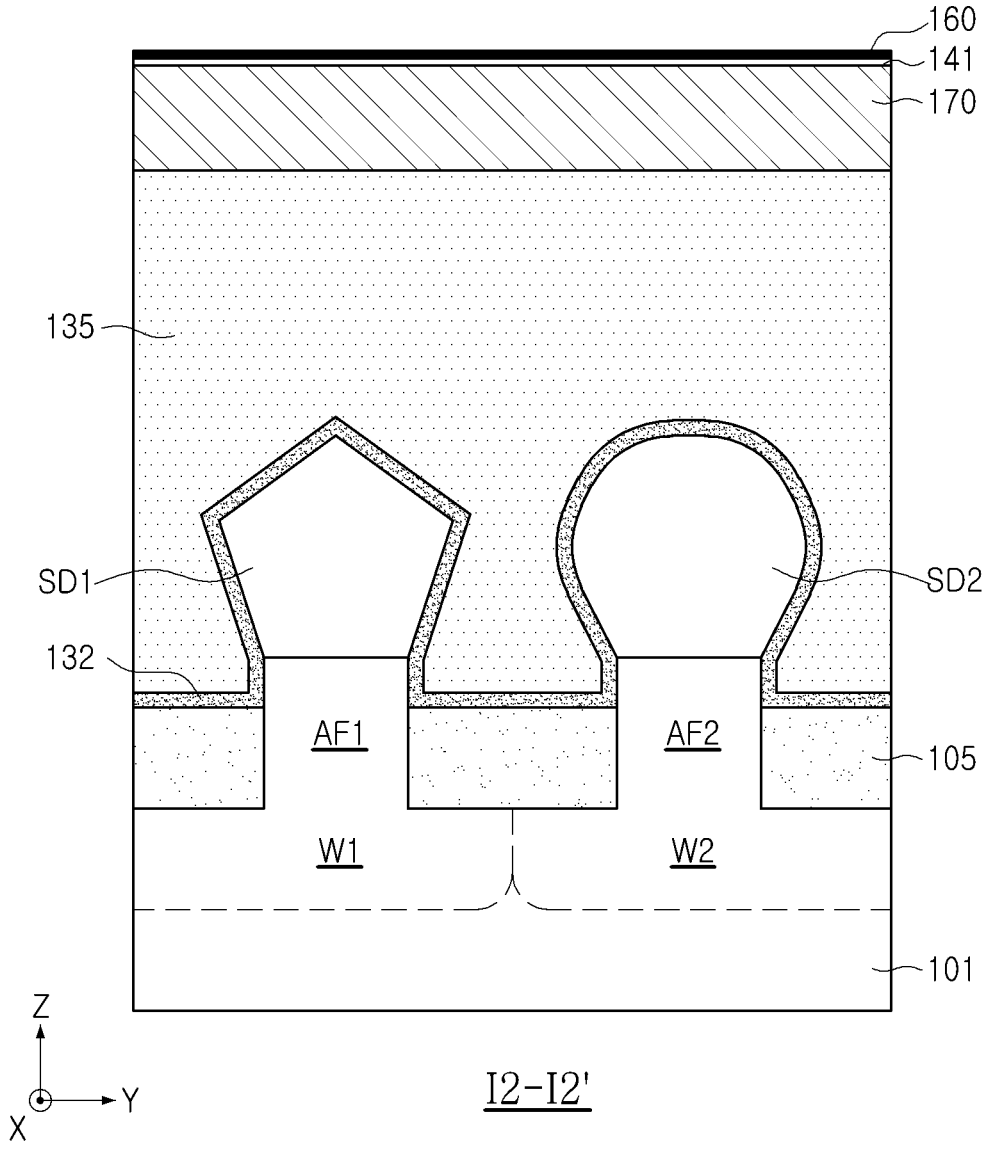
Figure 14C:
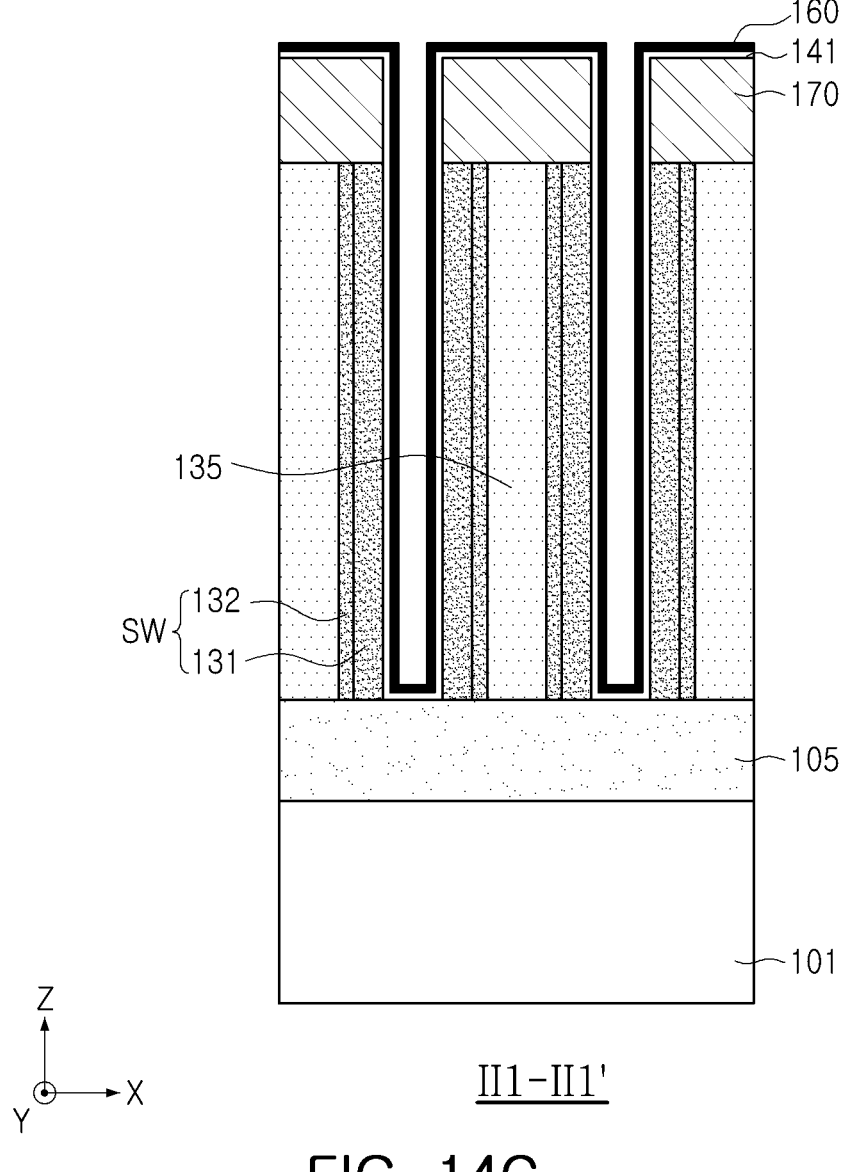
Figure 14D:
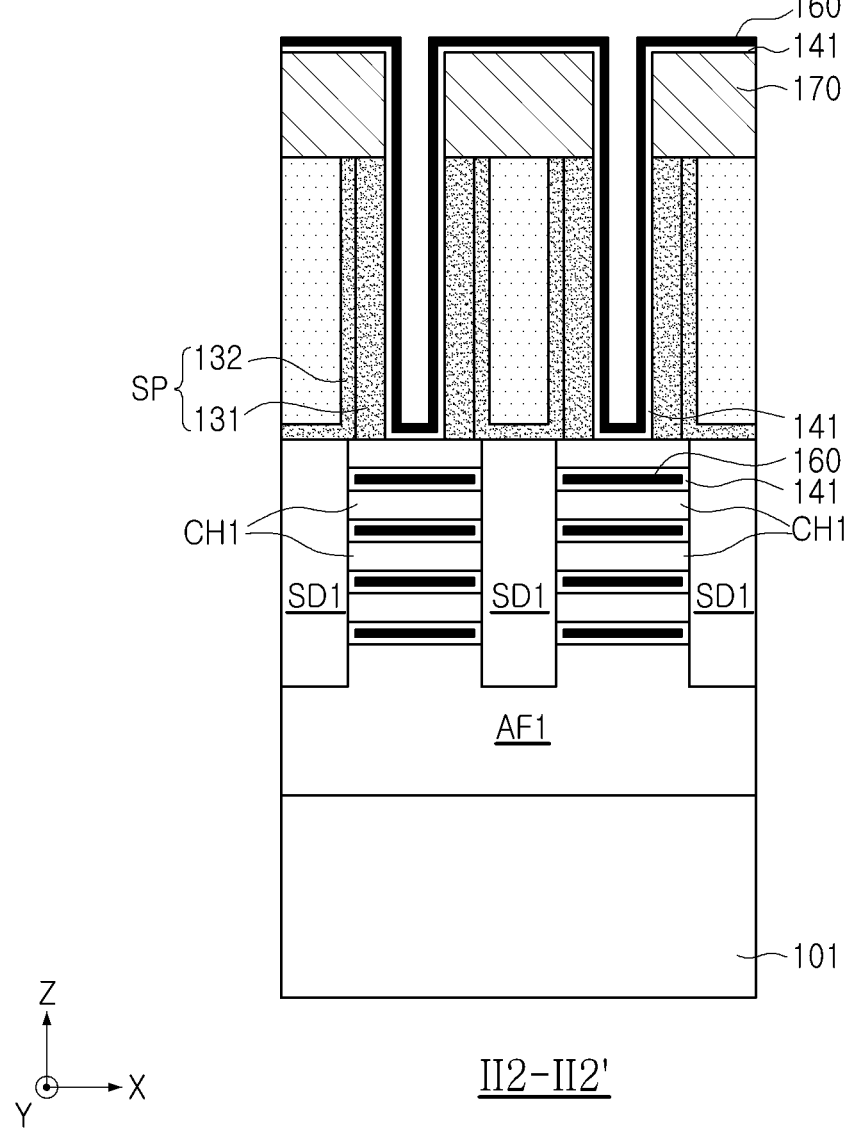
Figure 15A:
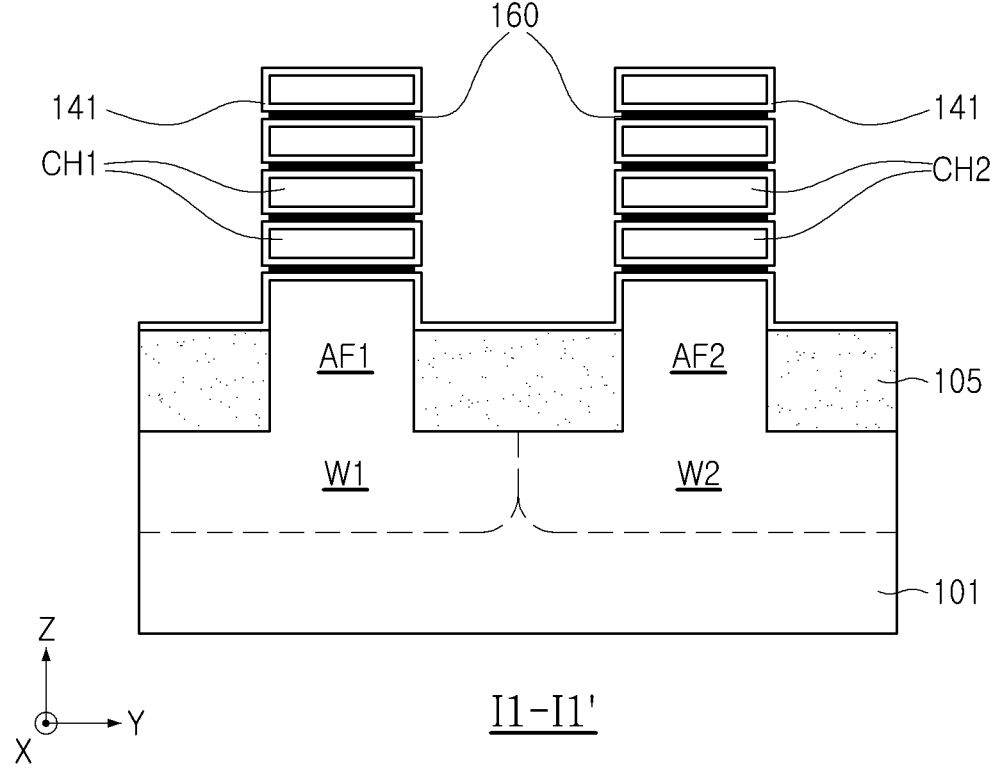
Figure 15B:
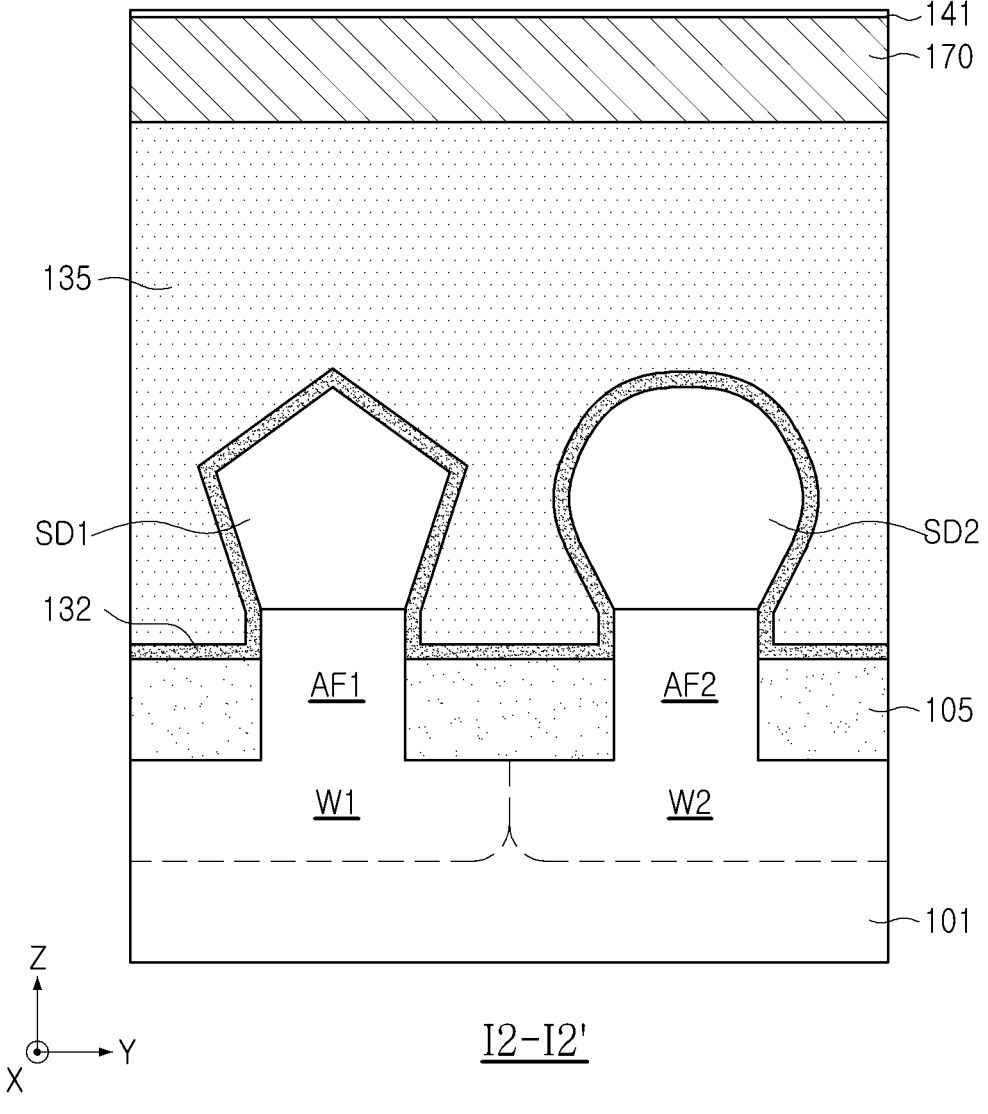
Figure 15C:
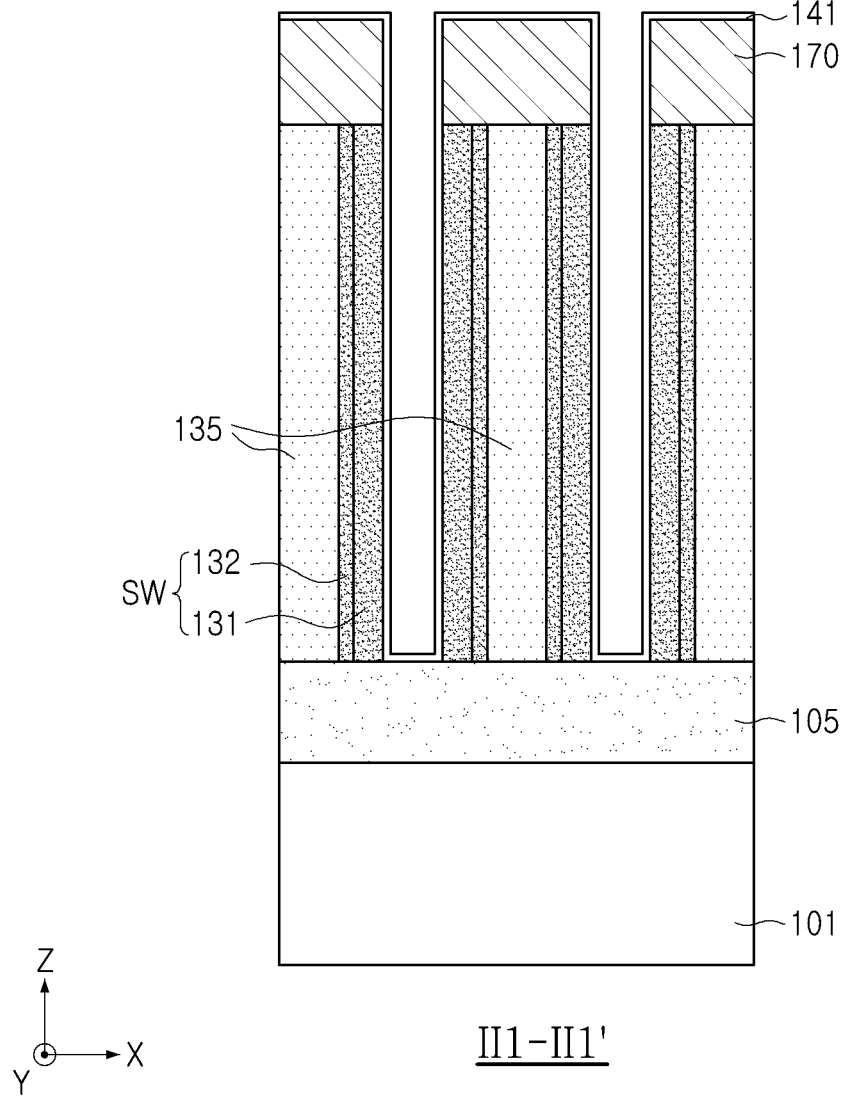
Figure 15D:
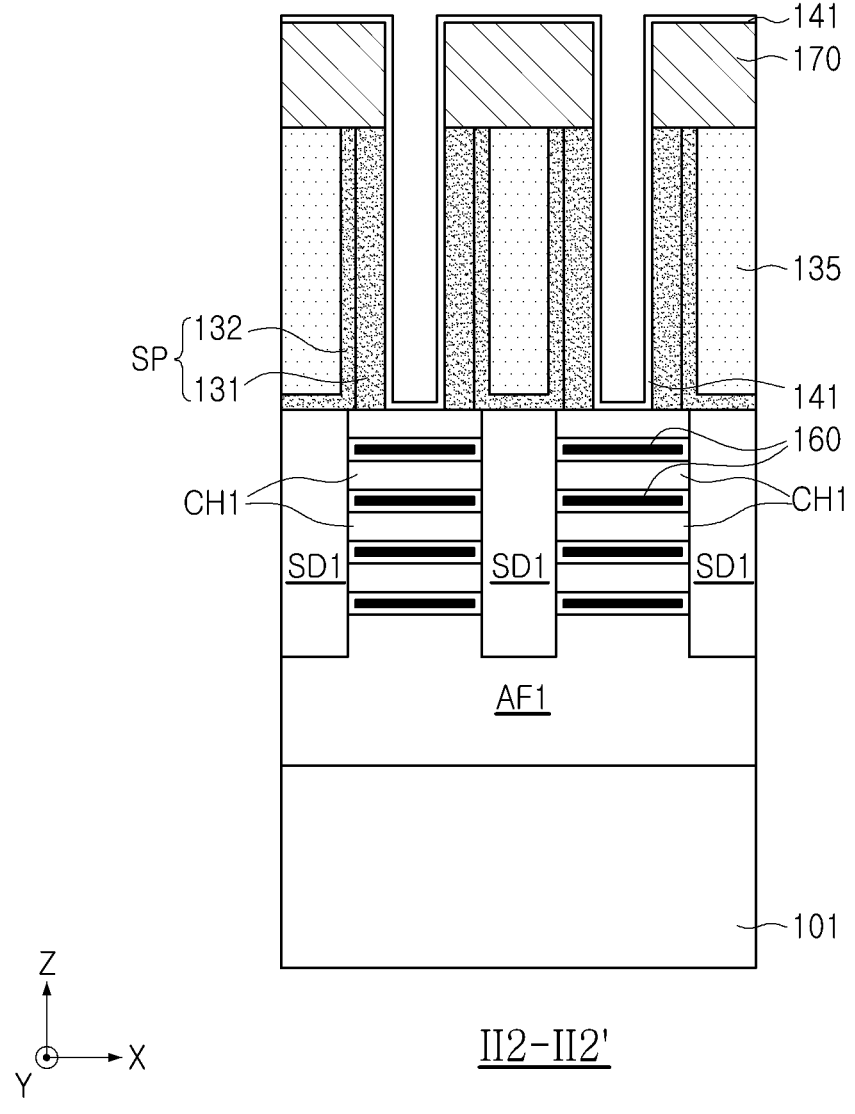
Figure 16A:
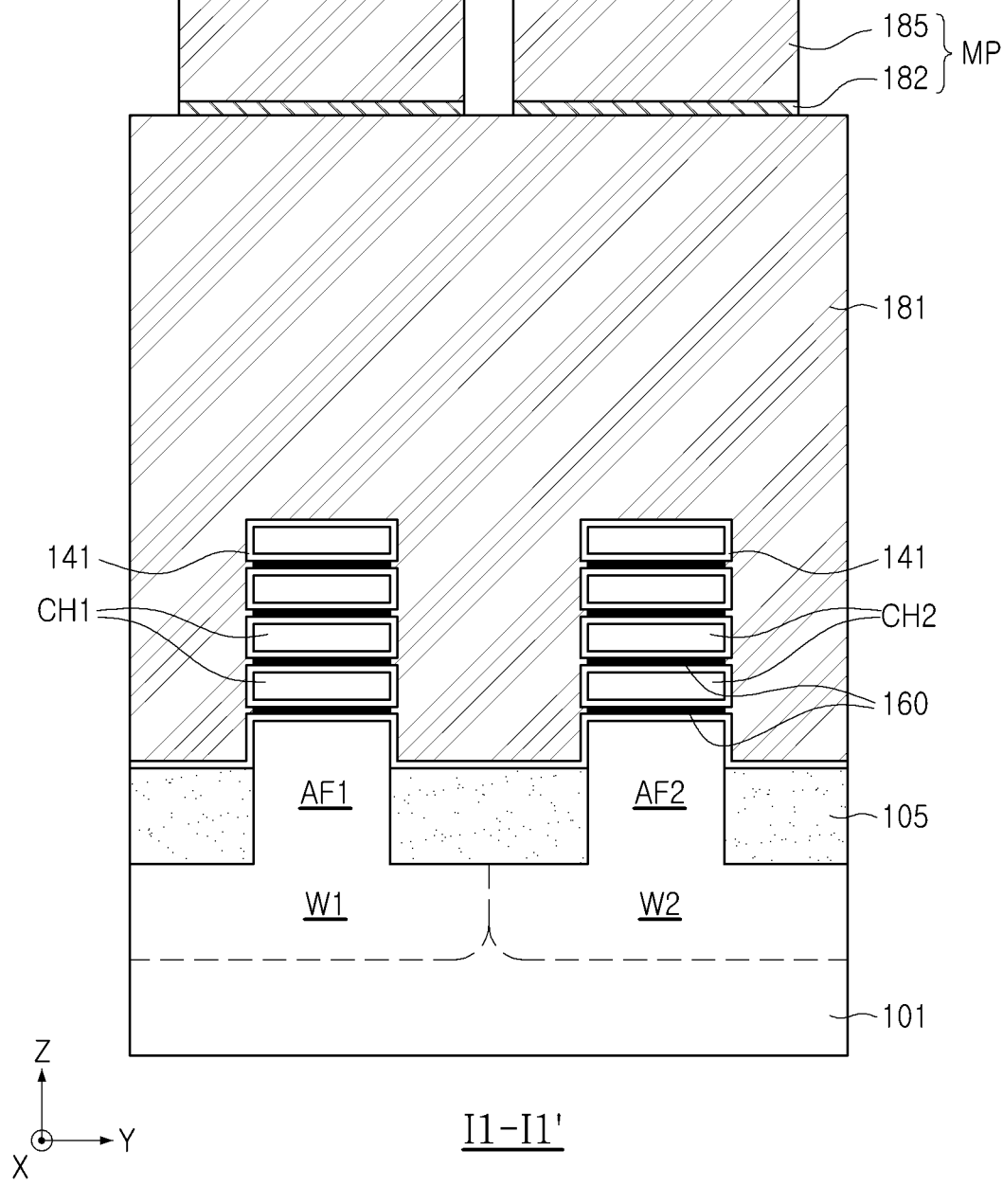
Figure 16B:
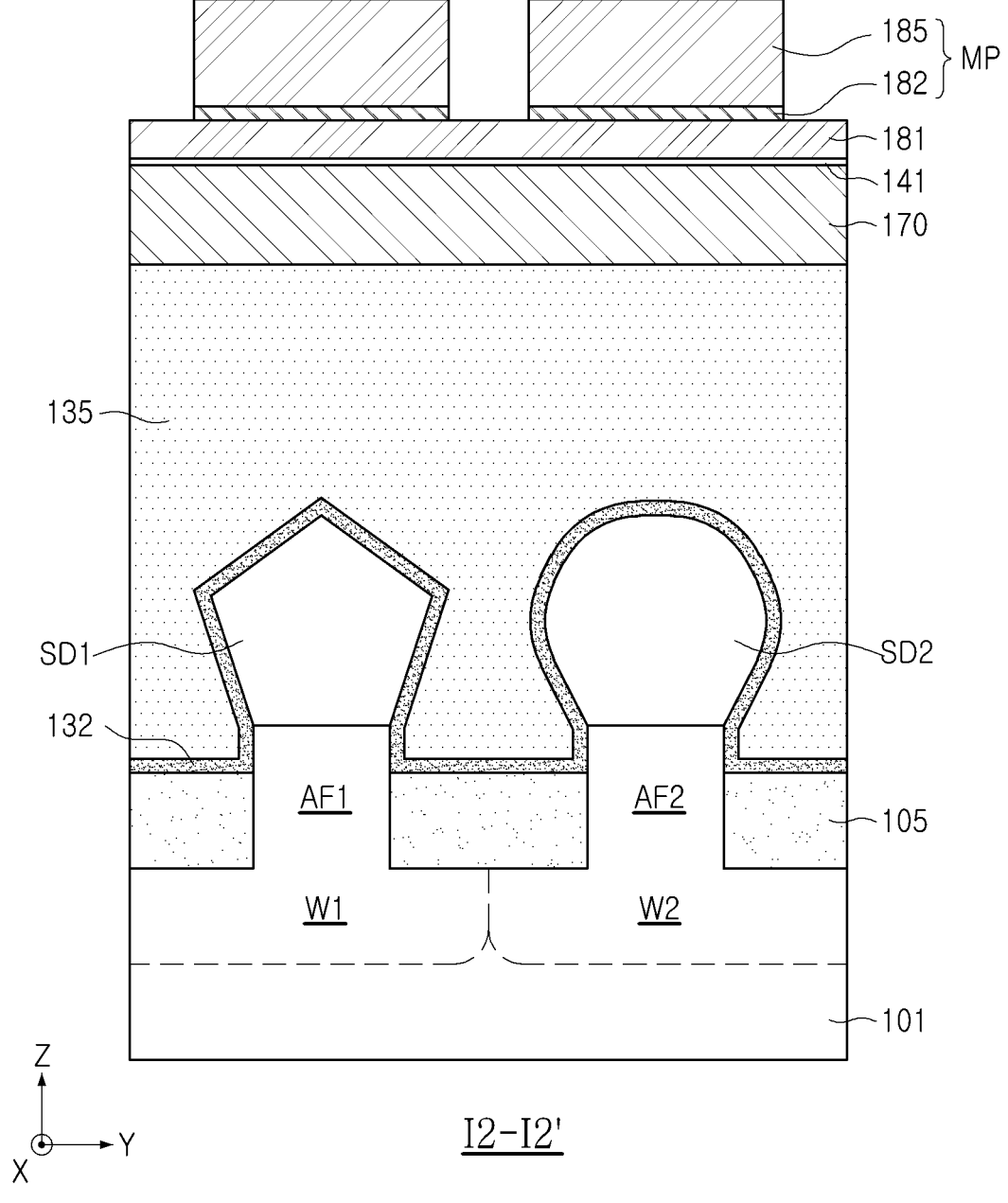
Figure 16C:
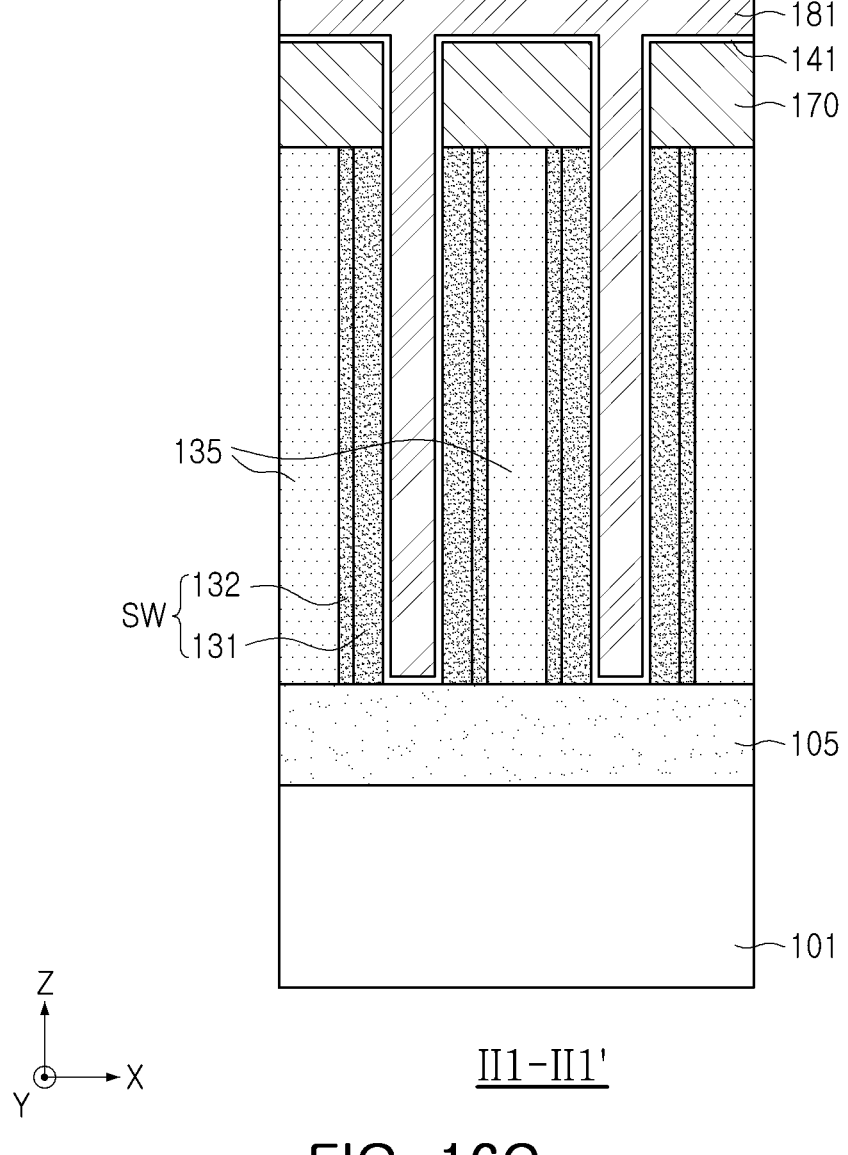
Figure 16D:
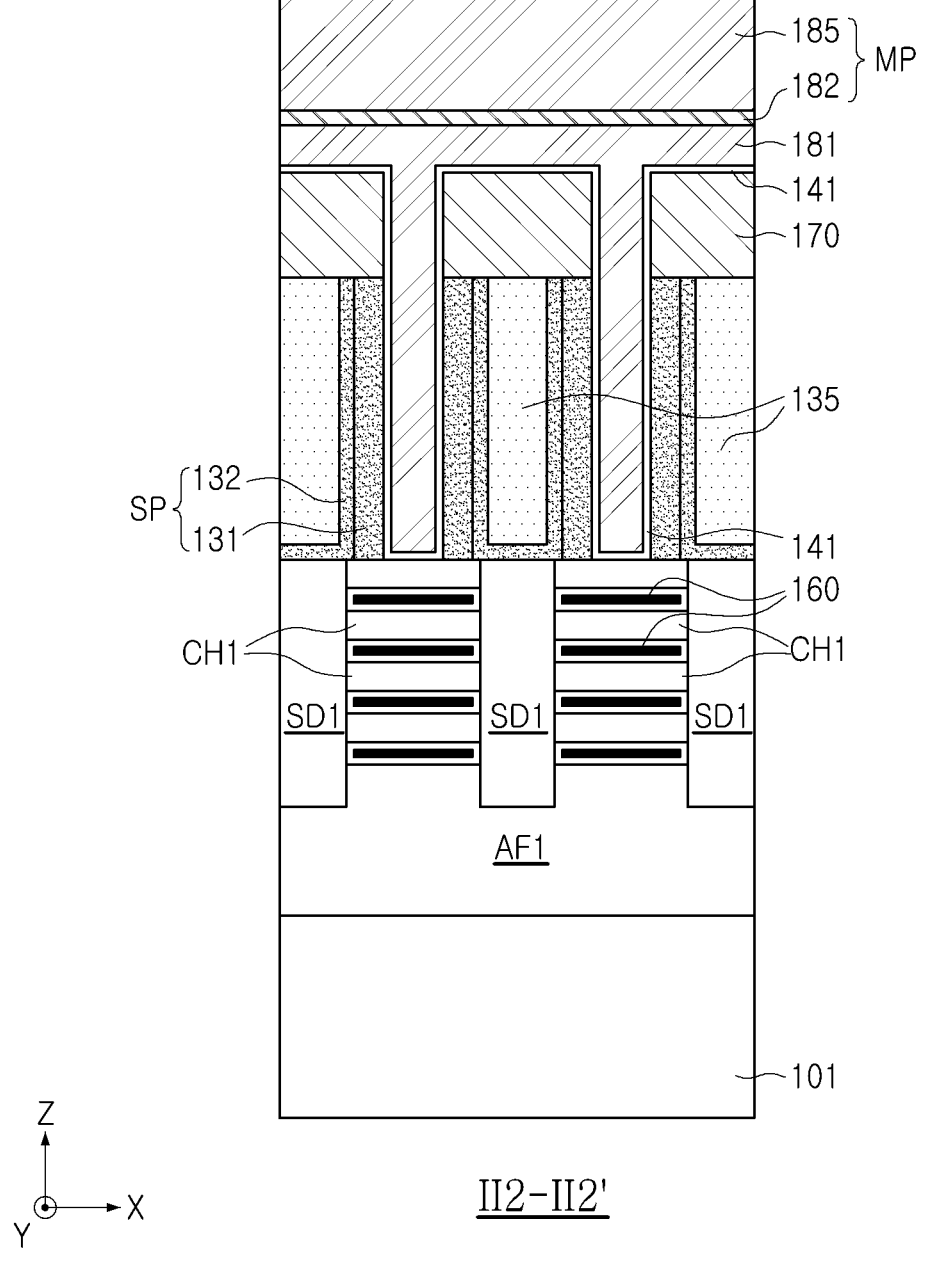
Figure 17A:
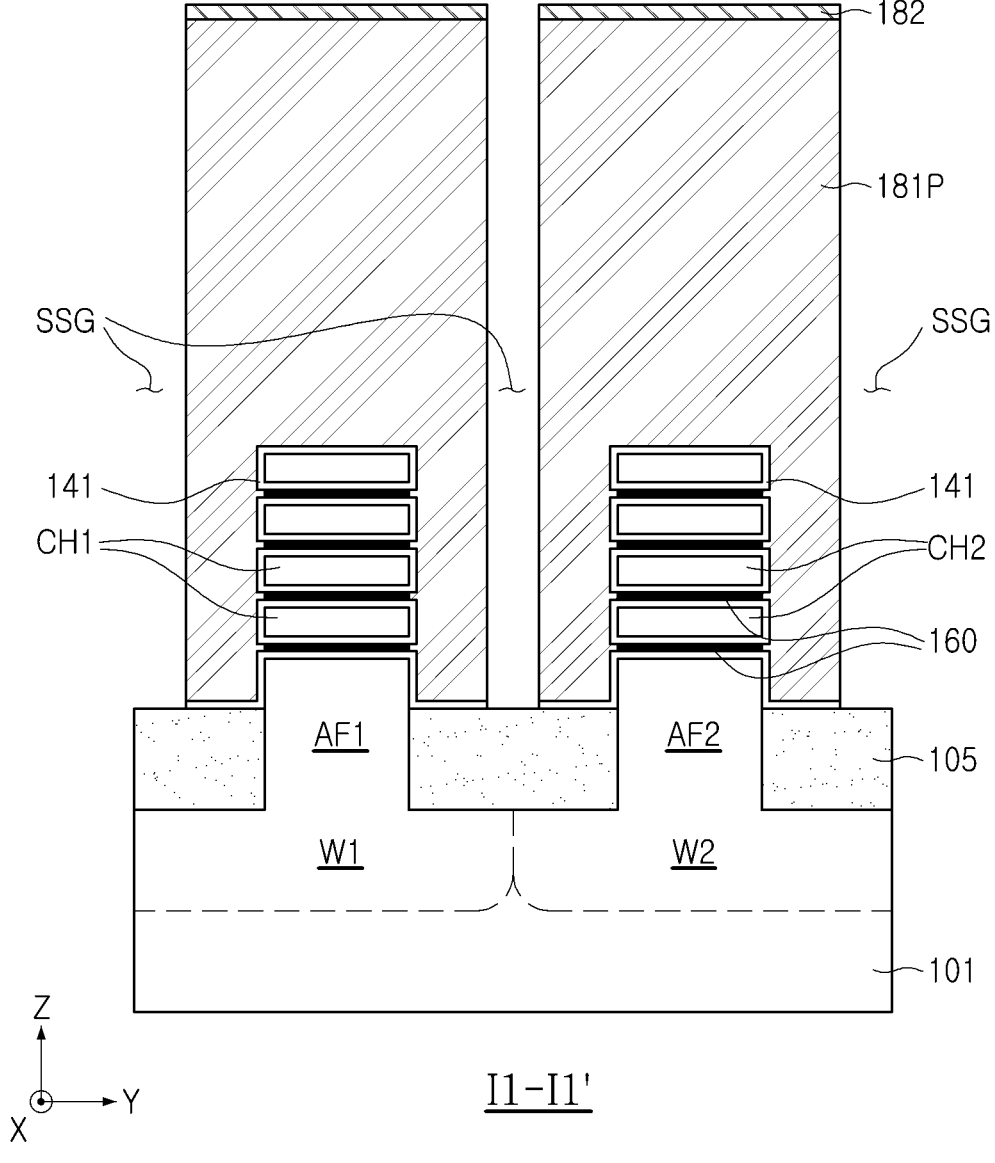
Figure 17B:
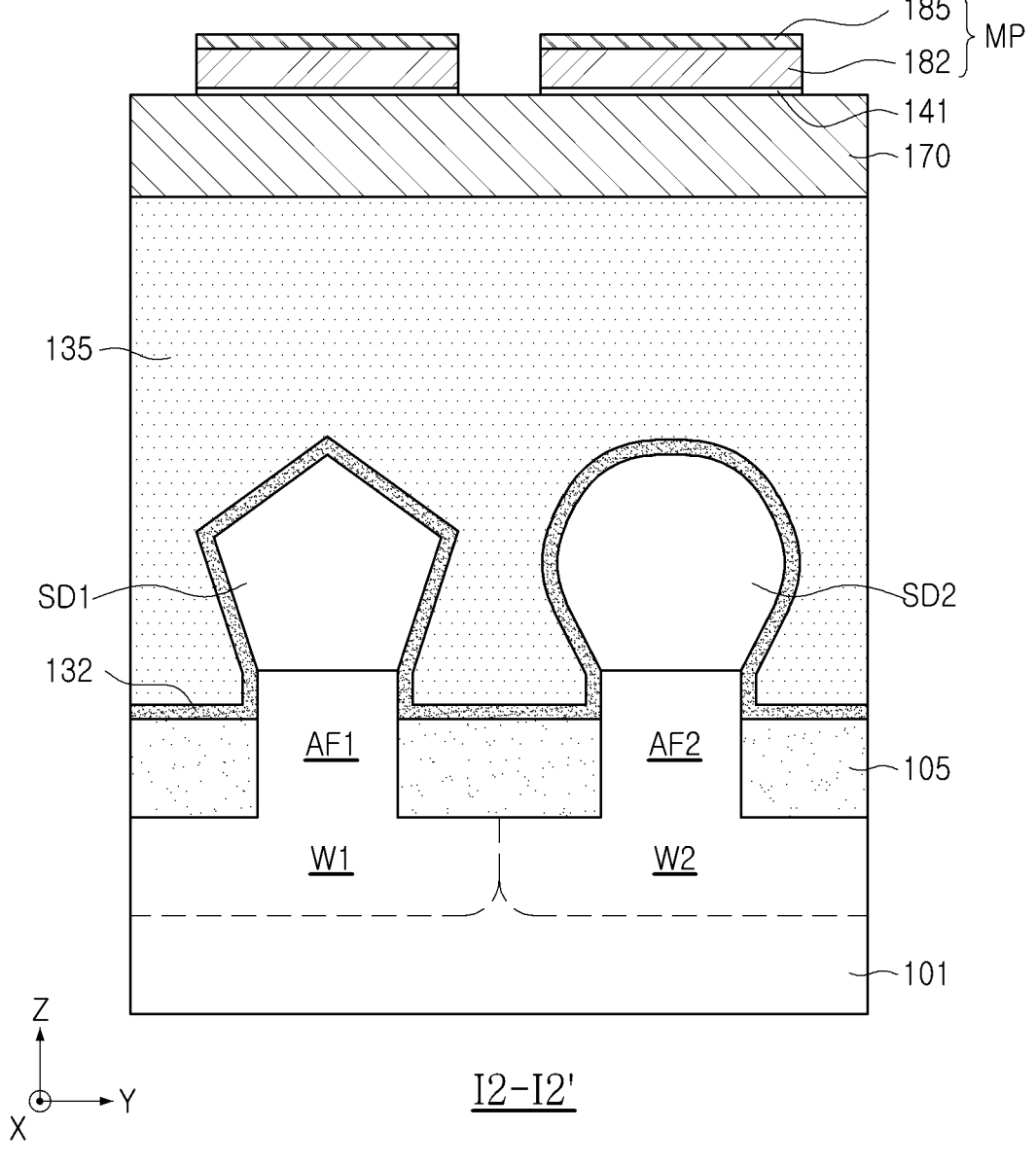
Figure 17C:
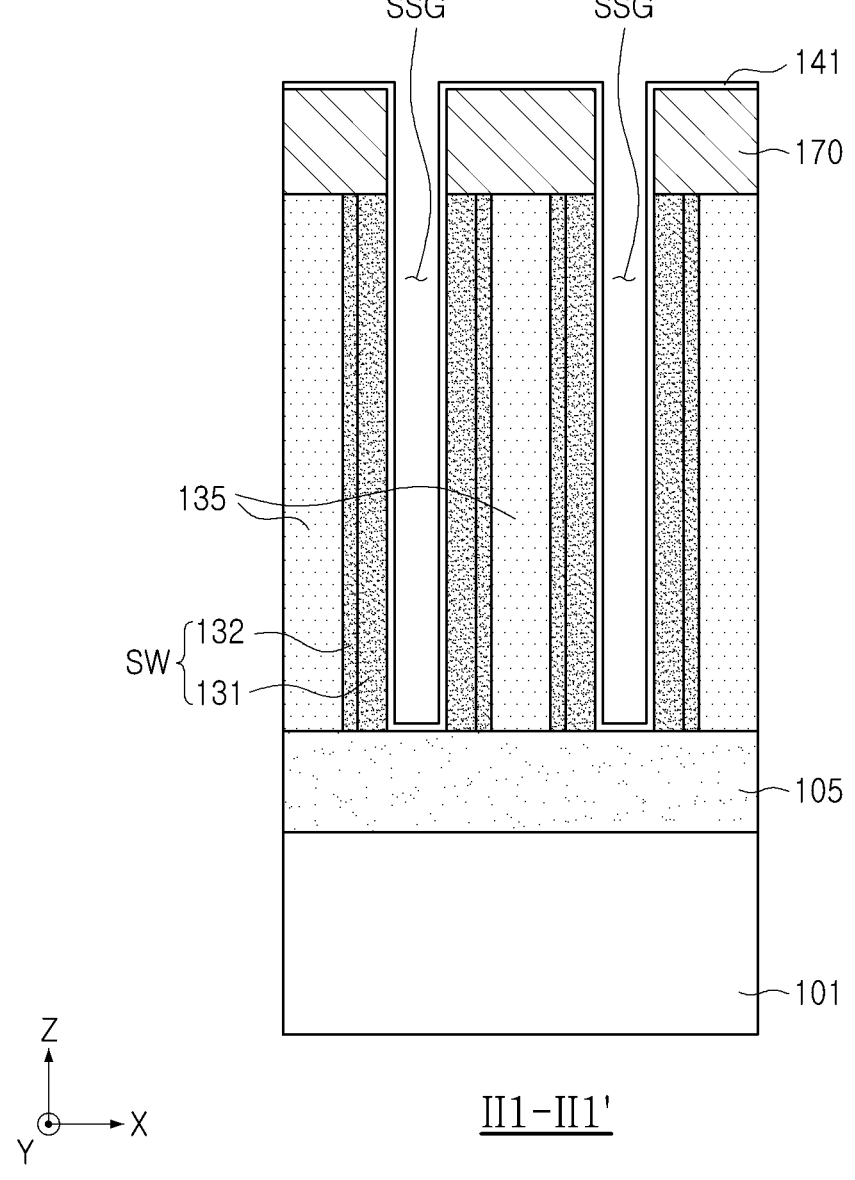
Figure 17D:
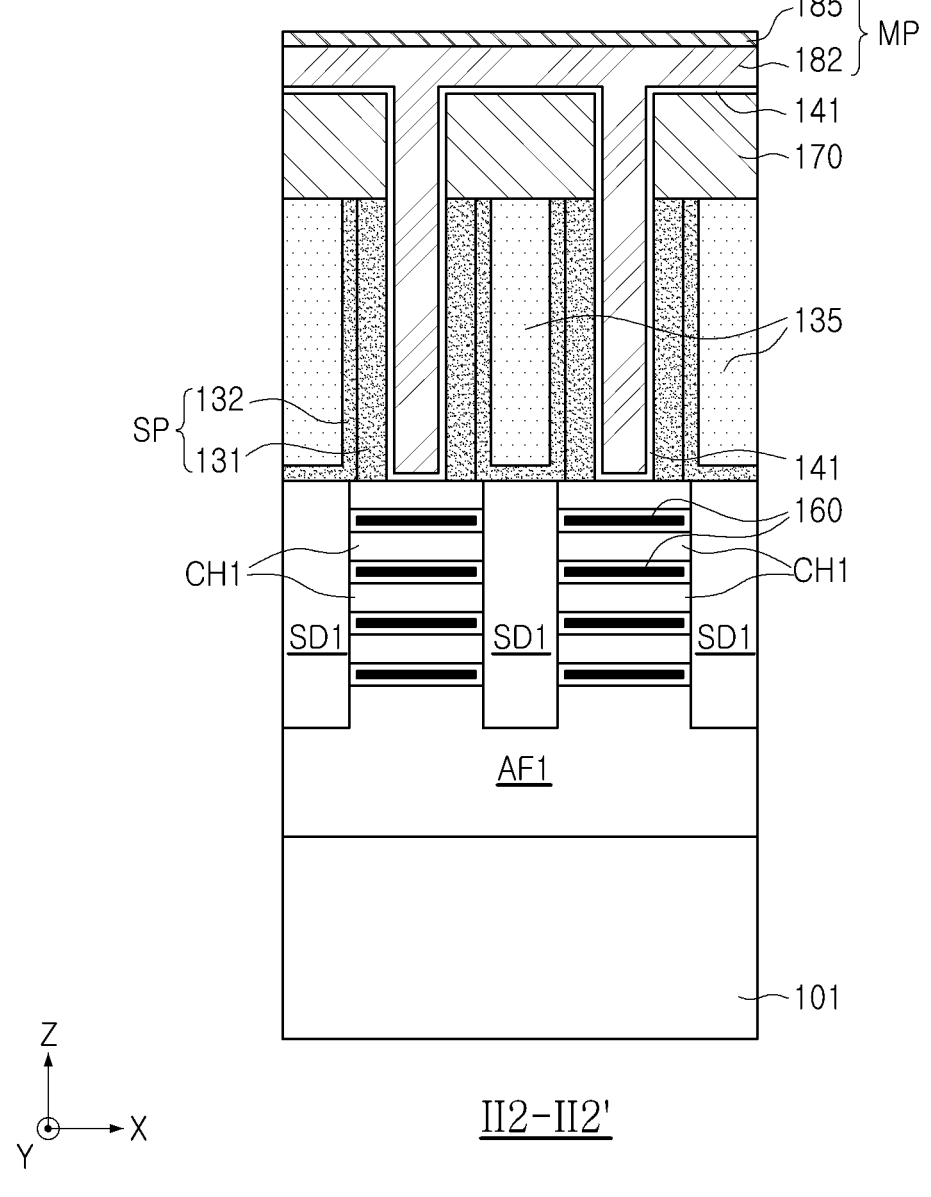
Figure 18A:
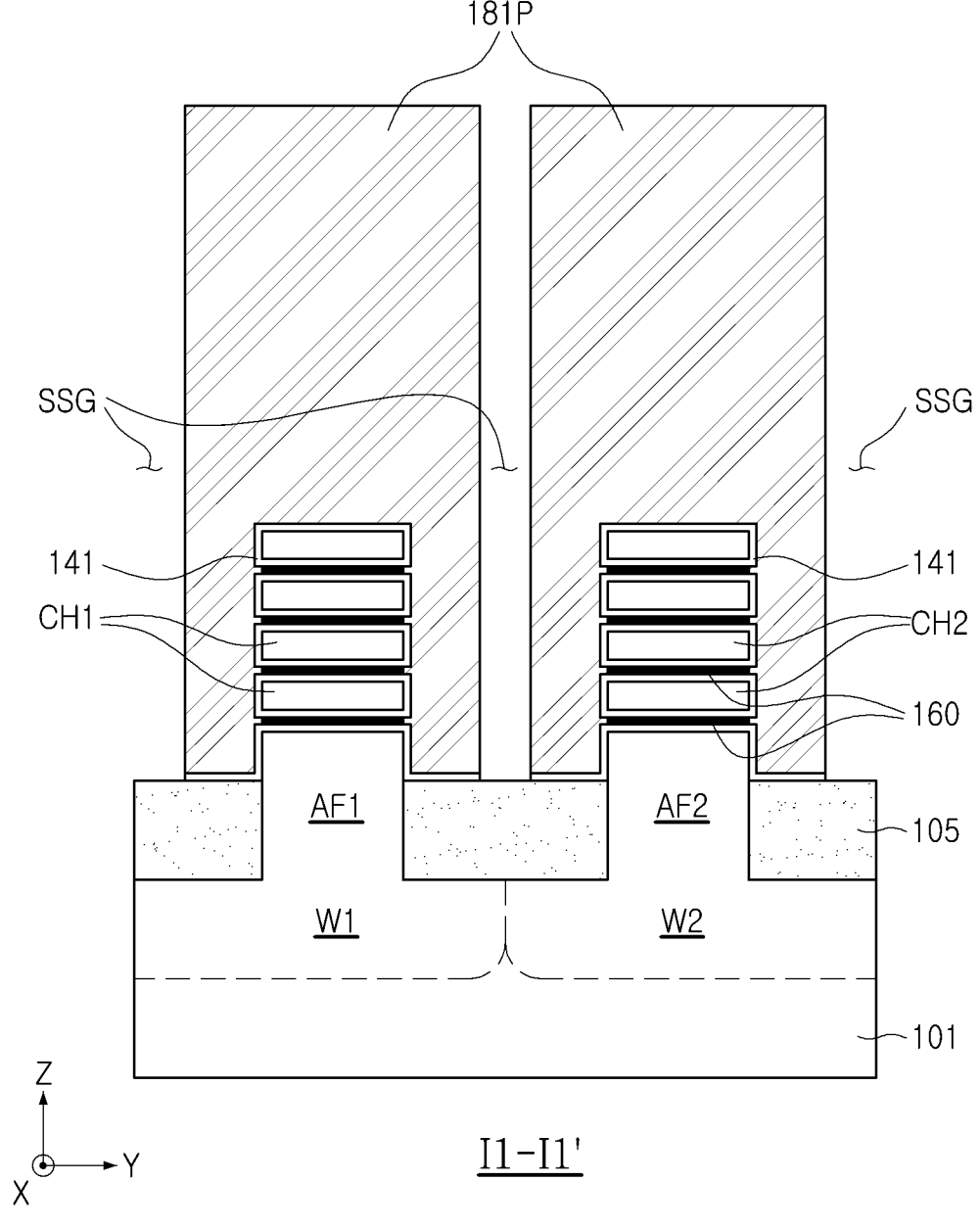
Figure 18B:
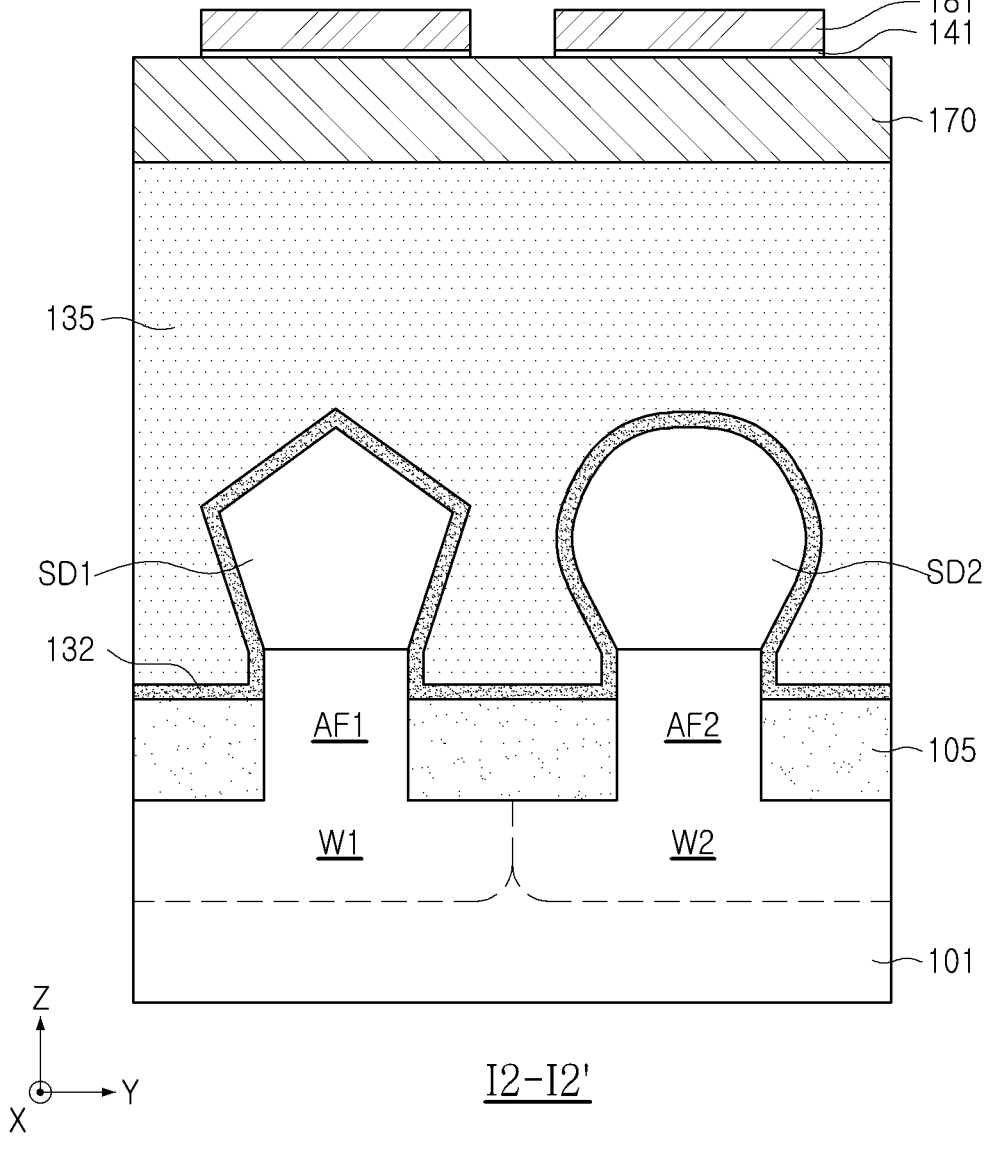
Figure 18C:
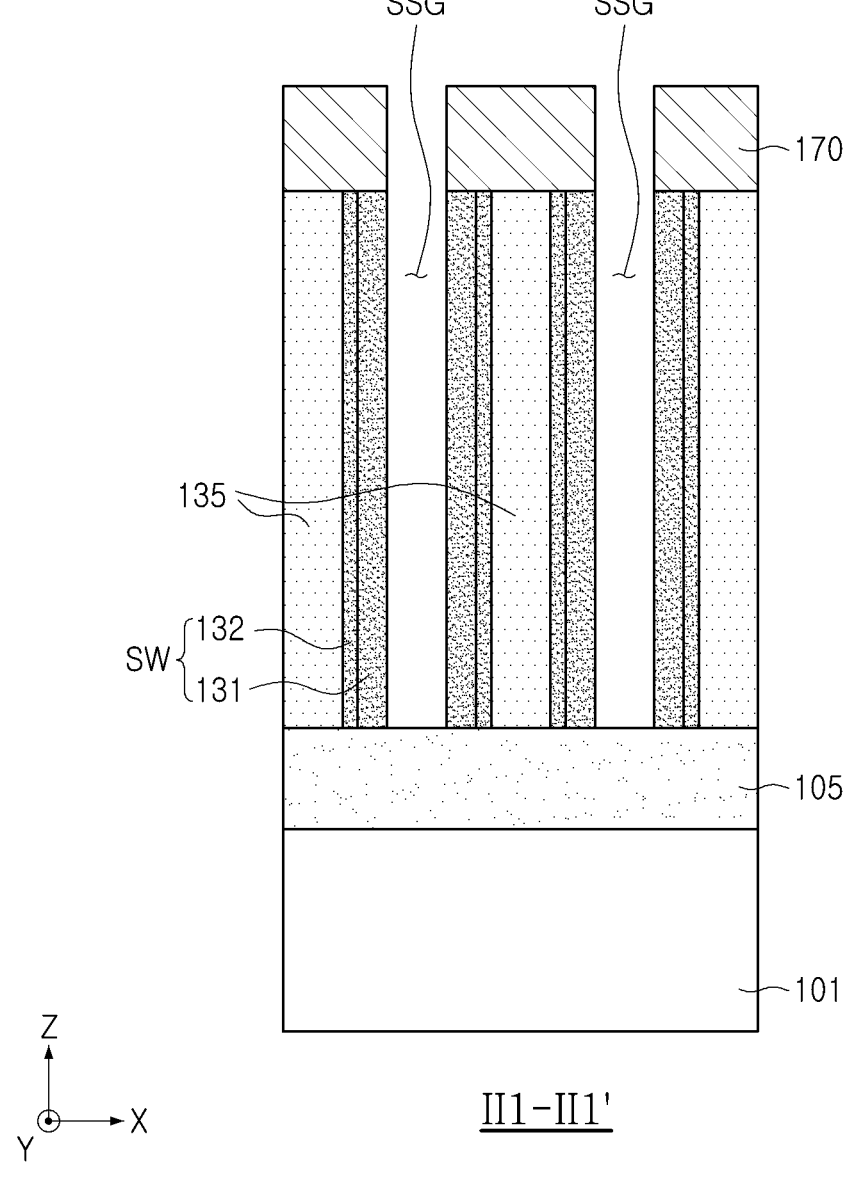
Figure 18D:
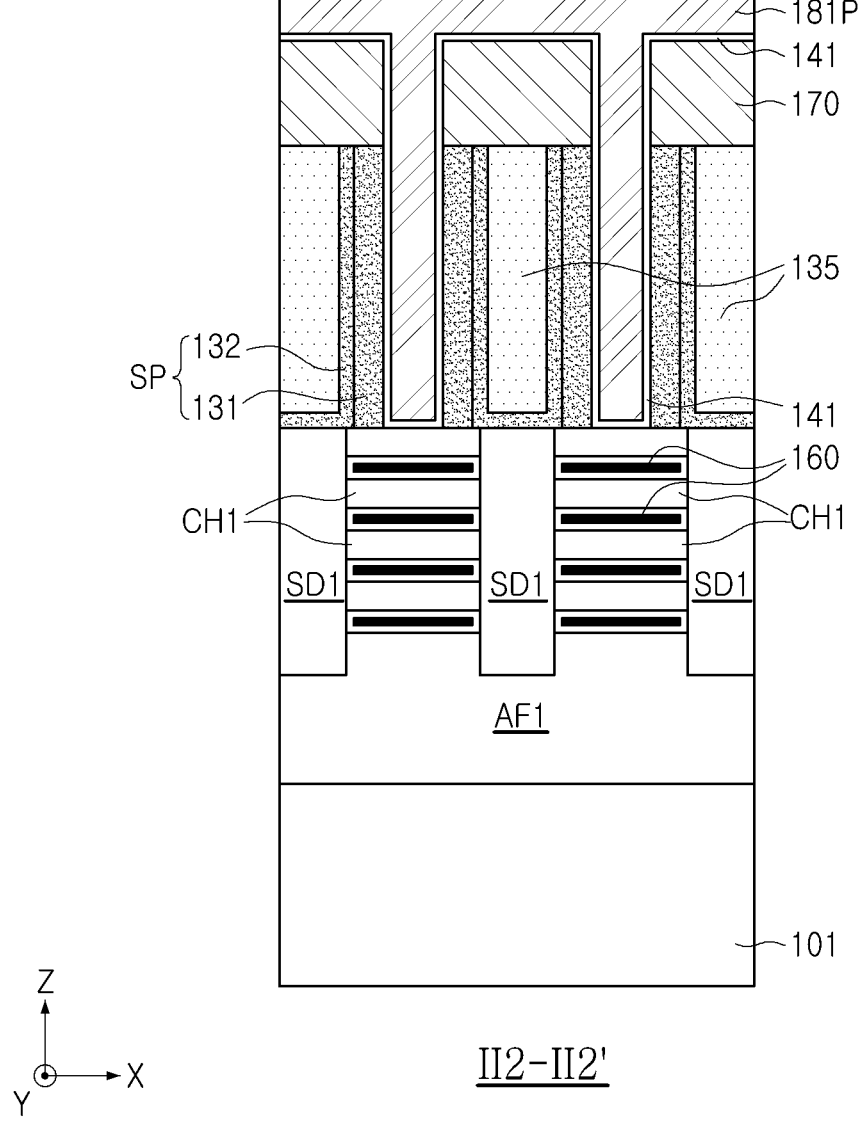
Figure 19A:
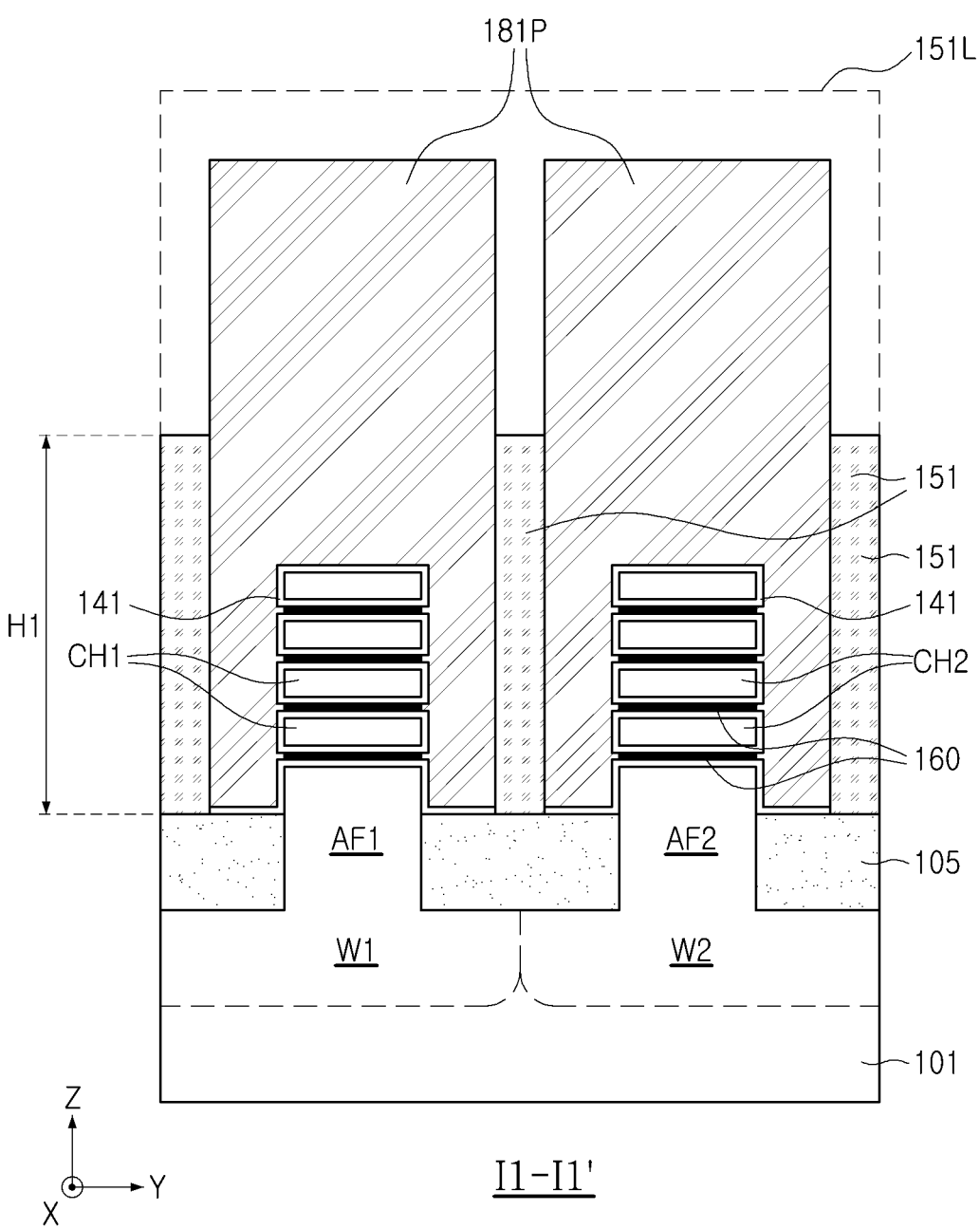
Figure 19B:
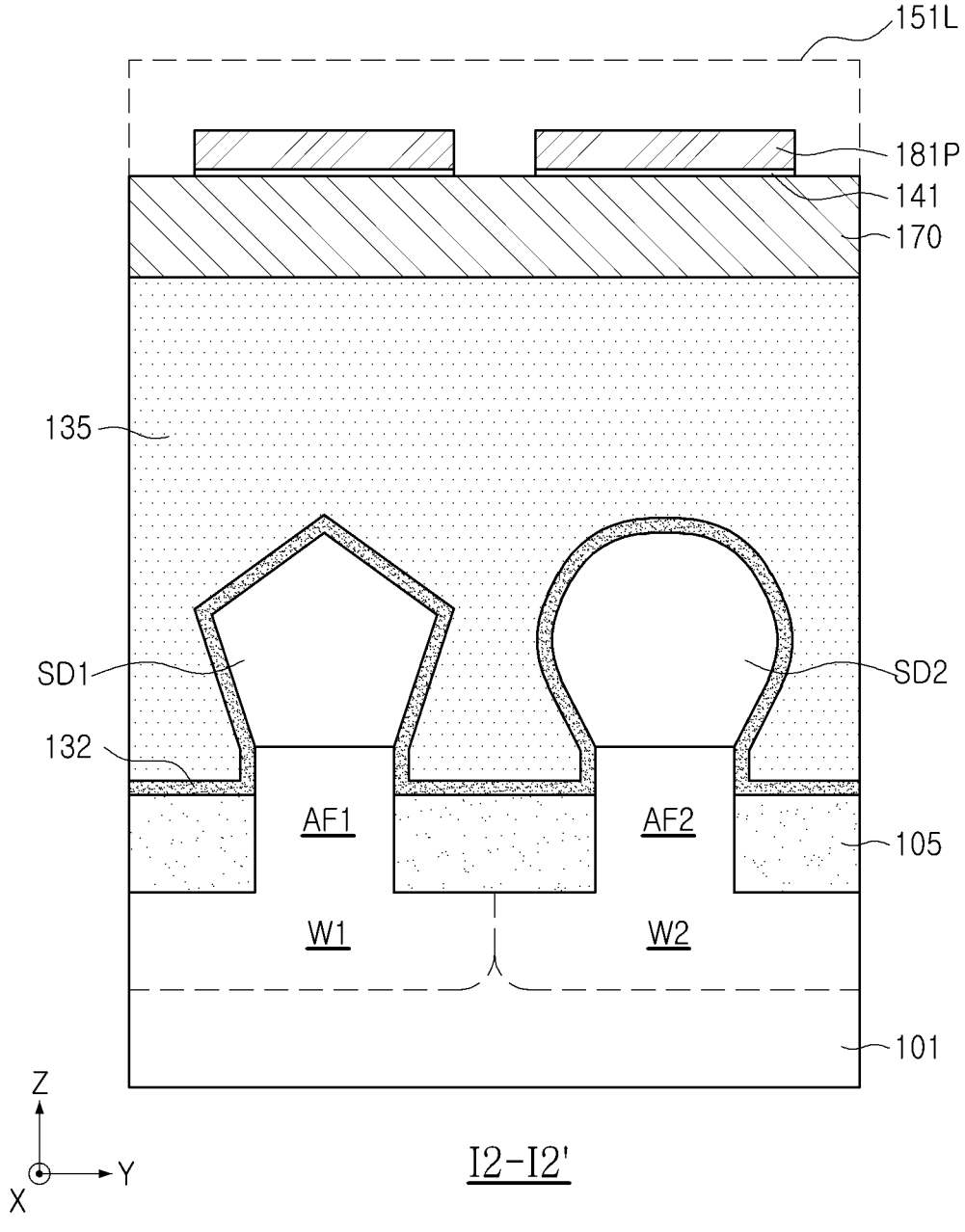
Figure 19C:
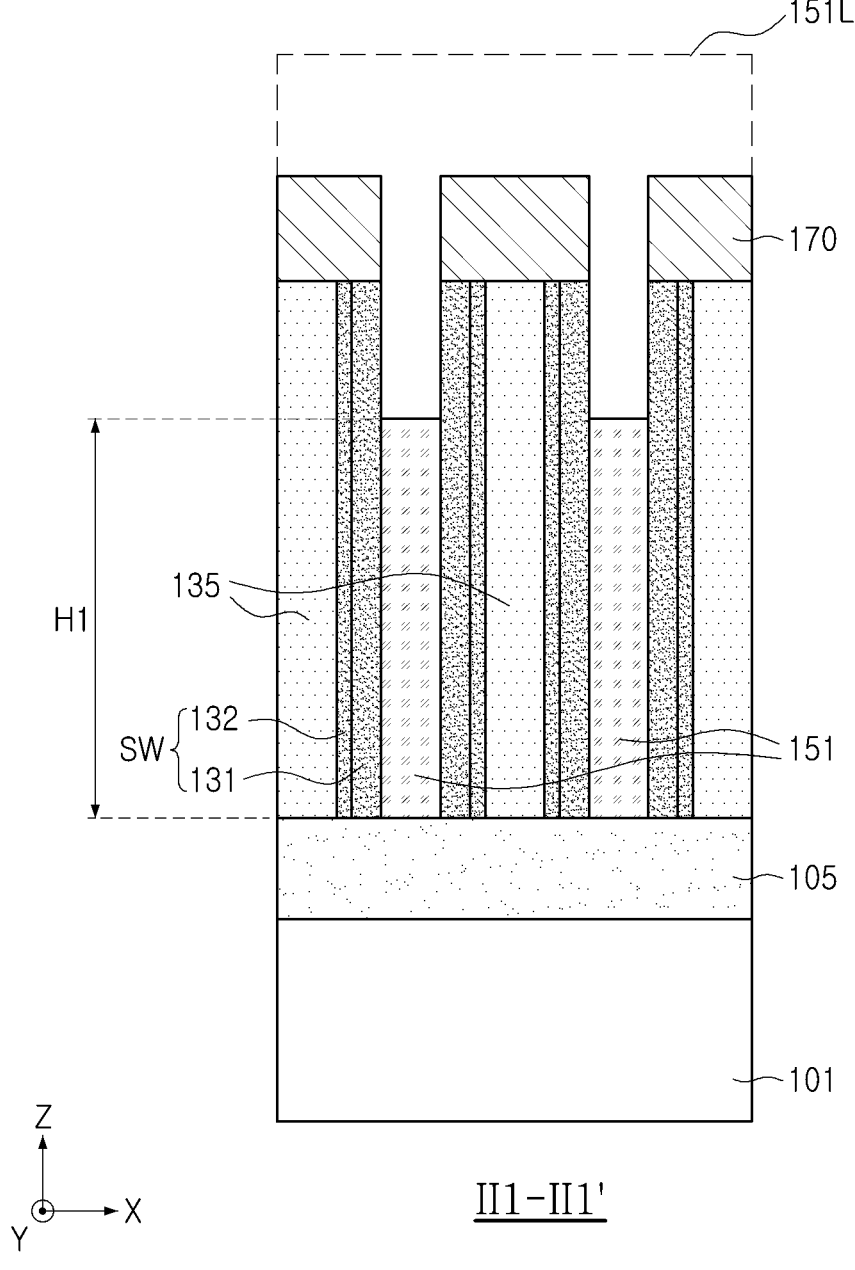
Figure 19D:
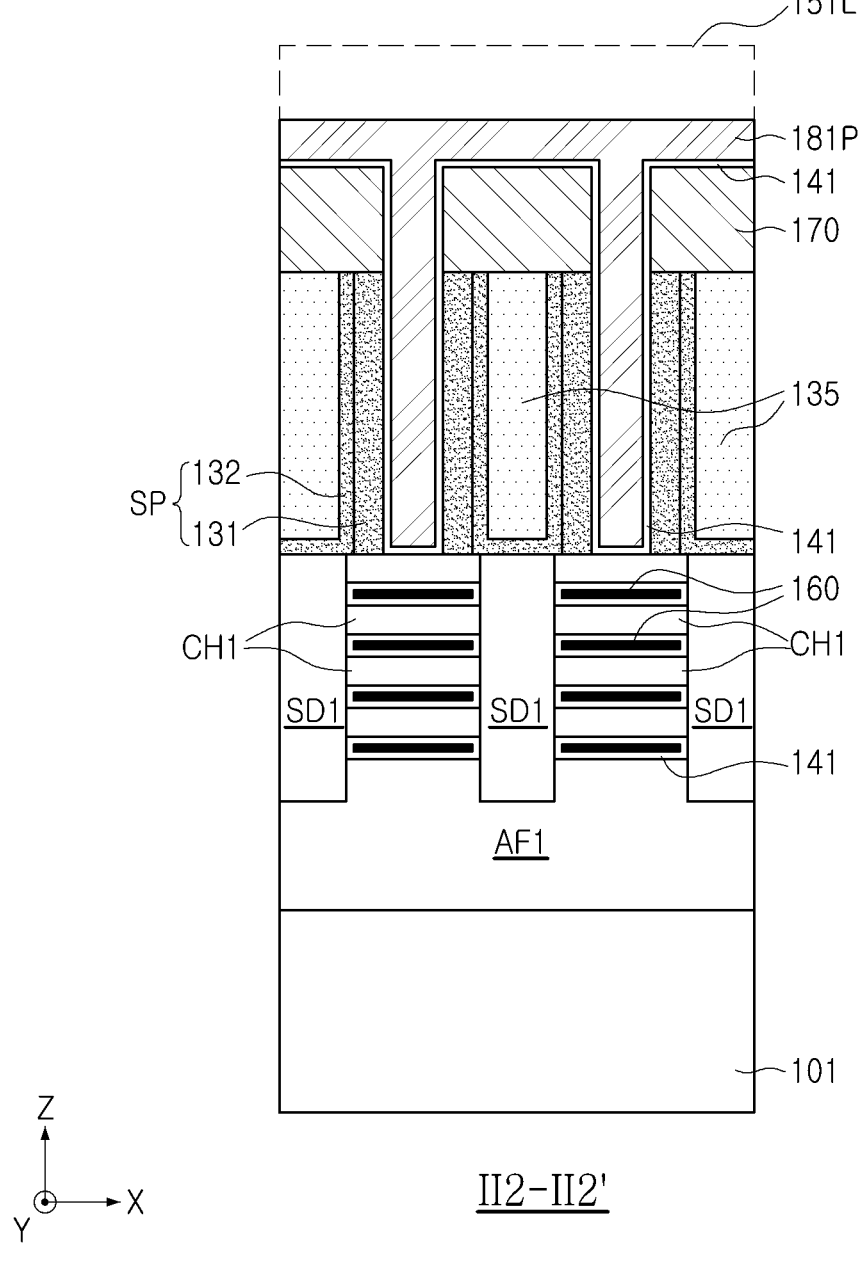

Referring to FIGS. 12A to 12D, a gate electrode formation space SG obtained by removing the dummy gate pattern DG may be provided. In the present embodiment, the gate electrode formation space SG may include two lines extending in the second direction. The two lines may be disposed with insulating structures 131, 132, 135, and 170 interposed therebetween in the first direction. As illustrated in FIGS. 12C and 12D, the insulating structures 131, 132, 135, and 170 may include the gate spacers SP and the interlayer insulating layer 135 disposed therebetween, and the ILD protective layer 170 disposed on the gate spacers SP and an upper surface of the interlayer insulating layer 135.

Referring to FIG. 12A, the first semiconductor patterns 111 and the second semiconductor patterns 112 may be alternately stacked on the first active fin AF1 and the second active fin AF2, respectively. As described above, the first semiconductor patterns 111 may be provided as sacrificial layers, and the second semiconductor patterns 112 may be provided as the first and second channel layers CH1 and CH2, respectively. As illustrated in FIG. 12B, first and second source/drain regions SD1 and SD2 may be formed with the interlayer insulating layer 135 and the ILD protection layer 170 thereon.

Referring to FIGS. 13A to 13D, the first semiconductor patterns 111, sacrificial layers, may be removed to secure spaces SC1 and SC2 between the second semiconductor patterns 112, for example, the first and second channel layers CH1 and CH2. The first semiconductor patterns 111 may be removed by a selective etching process through the gate electrode formation space SG prepared in the previous process. The spaces SG, SC1, and SC2 for the entire gate electrode layers may be secured by the present process.

Referring to FIGS. 14A to 14D, a gate insulating layer 141 may be formed on an entire exposed surface, and a protective metal layer 160 may then be additionally formed.

The gate insulating layer 141 may be formed to surround surfaces of the first and second active fins AF1 and AF2 and the first and second channel layers CH1 and CH2. The gate insulating layer 141 may be relatively conformally formed on an upper surface of the device isolation layer 105, as well as on side surfaces and upper surfaces of the insulating structures 131, 132, 135, and 170. For example, the gate insulating layer 141 may include at least one of a silicon oxide layer, a silicon nitride layer, a silicon oxynitride layer, or a high-k dielectric layer. The high-k dielectric layer may include a material, having a dielectric constant higher than a dielectric constant of a silicon oxide layer, such as hafnium oxide (HfO), aluminum oxide (AlO), or tantalum oxide (TaO). The protective metal layer 160 may be formed on a surface of the gate insulating layer 141. In the present embodiment, the protective metal layer 160 may fill the spaces SC1 and SC2 between the first and second channel layers CH1 and CH2. The protective metal layer 160 employed in the present embodiment may protect the gate insulating layer 141 from damage in a subsequent process. In some embodiments, the process of forming the protective metal layer 160 may be omitted.

Referring to FIGS. 15A to 15D, the protective metal layer 160 may be removed using a selective etching process of the protective metal layer 160 except a portion thereof between the first and second channel layers CH1 and CH2.

Referring to FIGS. 16A to 16D, an organic planarization layer 181 may be formed, and a photomask pattern MP may be formed on the organic planarization layer 181 to define a gate electrode formation region.

The organic planarization layer 181 employed in the present embodiment may include an organic material having high selectivity with respect to the insulating structure (in particular, the ILD protective layer 170). Damage to the insulating structure may be significantly reduced in a subsequent process of forming a gate separation pattern. The organic planarization layer 181 may include, for example, a bottom anti-reflective coating (BARC), a spin-on-hardmask (SOH), or an amorphous carbon layer (ACL).

The photomask pattern MP may include an anti-reflective layer 182 and a photoresist 185. For example, the anti-reflective layer 182 may be formed of silicon nitride, silicon oxynitride, amorphous silicon, titanium, titanium dioxide, titanium nitride, chromium oxide, carbon, or combinations thereof. A structure of the photomask pattern MP is not limited to a two-layer structure and may be changed into various mask structures.

Referring to FIGS. 17A to 17D, the organic planarization layer 181 may be patterned using the photomask pattern MP to form a first organic pattern layer 181P.

The first organic pattern layer 181P may have a pattern corresponding to a separated gate electrode region. In the present embodiment, referring to FIGS. 18A and 18C, a space between the first organic pattern layers 181P may serve as a gate separation space SSG. As described above, in the present embodiment, the organic planarization layer 181 may be patterned to form the gate separation space SSG after removal of the dummy gate pattern DG and before formation of a gate electrode layer, rather than separation of a dummy gate pattern or a gate electrode layer as in the related art. In the present embodiment, the gate separation space SSG may define a formation region of a gate separation pattern 151 (FIG. 19A) to be formed in a subsequent process. In some embodiments, the photoresist 185 of the photomask pattern MP may also be removed while performing the present process.

Referring to FIGS. 18A to 18D, an exposed portion of the gate insulating layer 141 may be removed using the first organic pattern layer 181P.

In the present process, the gate insulating layer 141 may be divided into two transistor regions by removing a portion of the gate insulating layer 141 on a bottom surface of the gate separation space SSG. A portion of the gate insulating layer 141, disposed on a sidewall of the gate separation space SSG and an upper surface of the insulating structure as well as the bottom surface of the gate separation space SSG, may be removed.

Referring to FIGS. 19A to 19D, an insulating layer 151L for gate separation may be formed. Then, the insulating layer 151L for gate separation may be etched back to form a gate separation pattern 151 having a first height H1.

In the present process, the insulating layer 151L for gate separation may be formed by an atomic layer deposition (ALD) process to fill the gate separation space. The insulating layer 151L may be formed on the first organic pattern layer 181P, as indicated by dashed lines. The insulating layer 151L for gate separation may be formed of a material having etch selectivity different from that of the insulating structure (in particular, the ILD protective layer 170). For example, the insulating layer 151L for gate separation may include silicon oxide. Next, the gate separation pattern 151 having the first height H1 from the insulating layer 151L may be adjusted using an etch-back process. Since the gate separation pattern 151 is exposed to additional etching in a subsequent process, the height H1 of the gate separation pattern 151 may be greater than a final height in consideration of the etching.

Referring to FIGS. 20A to 20D, the first organic pattern layer 181P may be removed to prepare a gate electrode formation space.

Figure 20A:
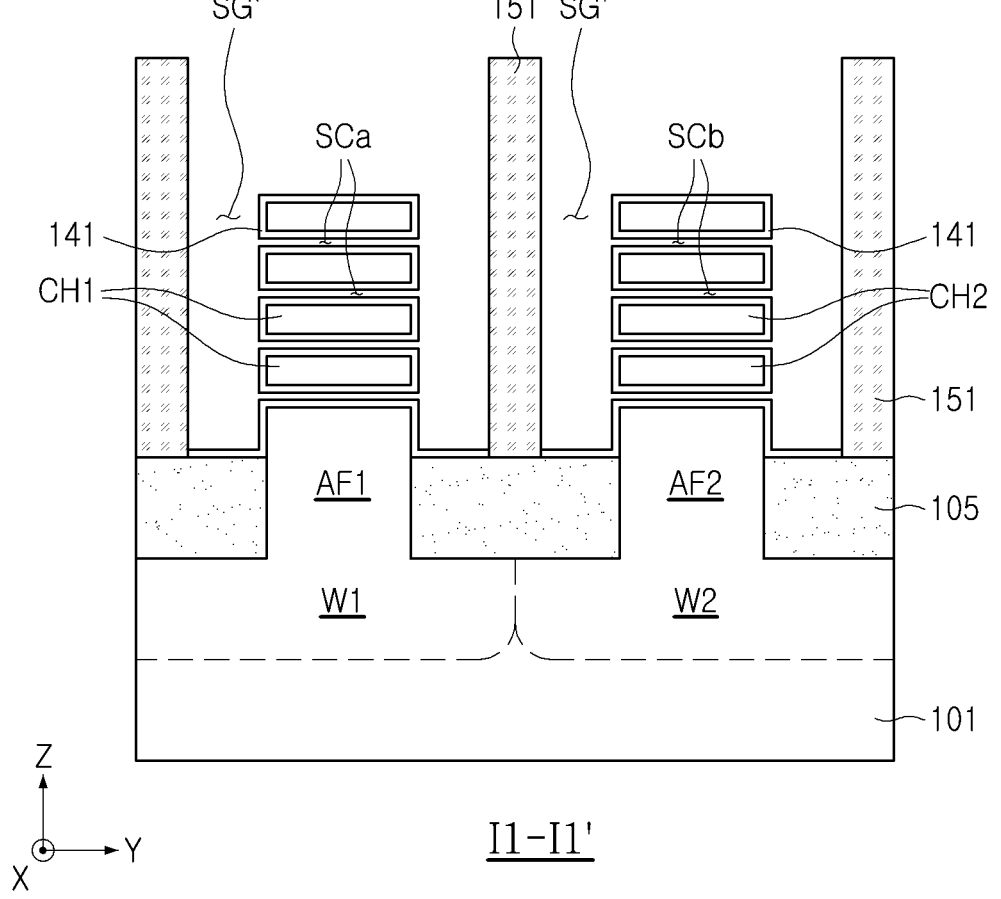
Figure 20B:
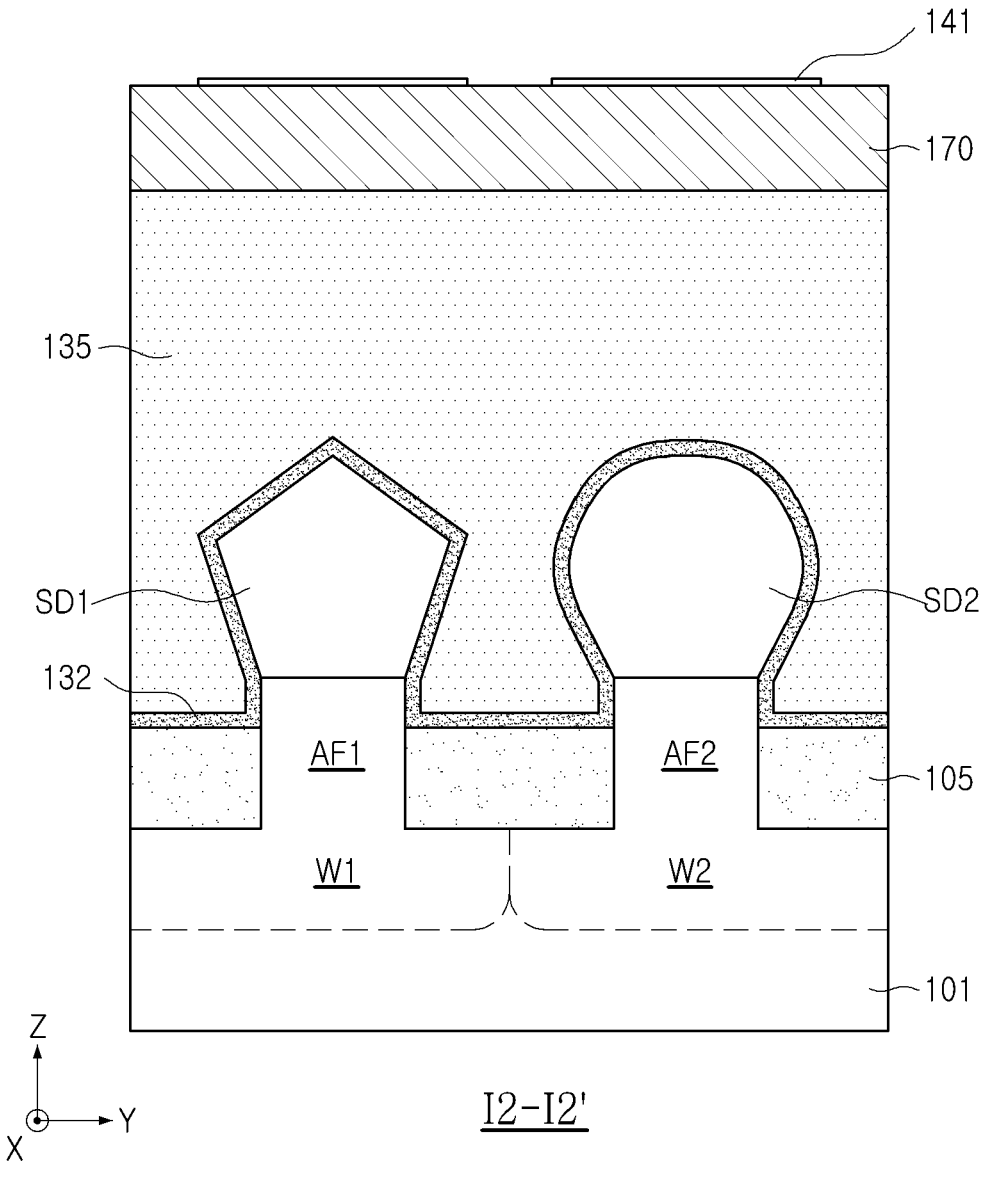
Figure 20C:
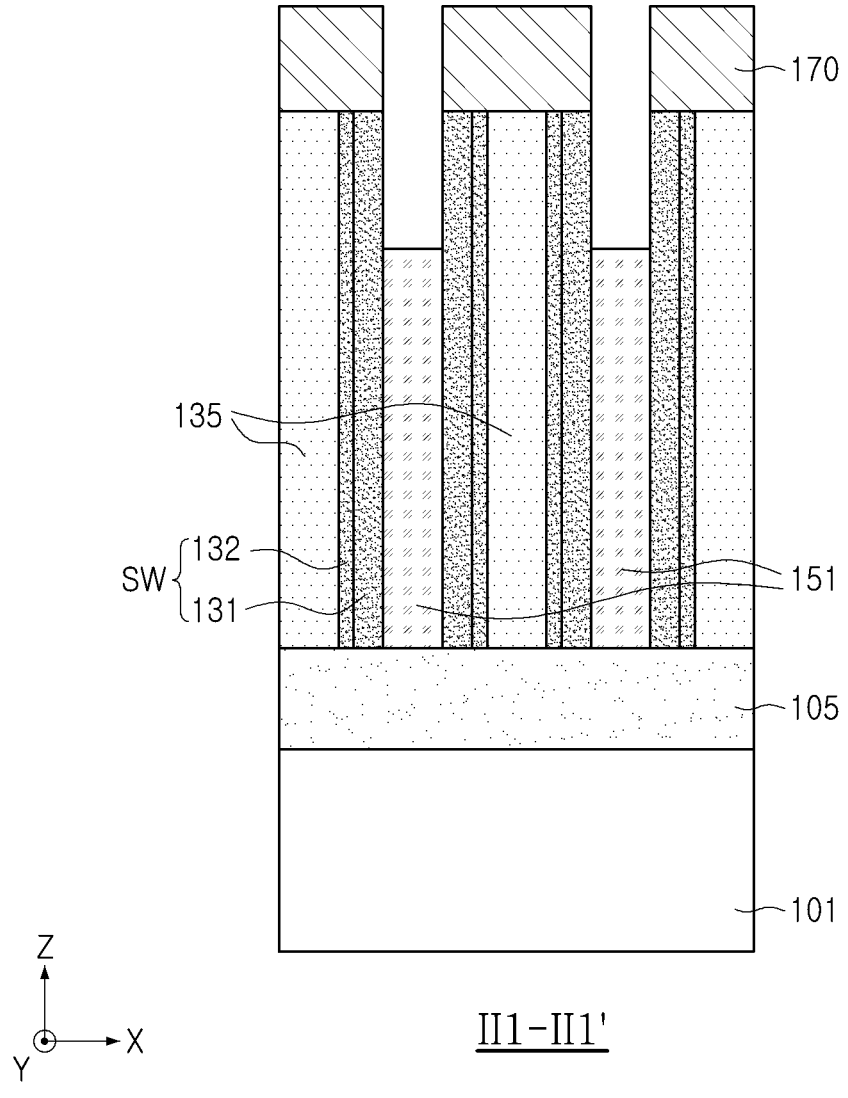
Figure 20D:
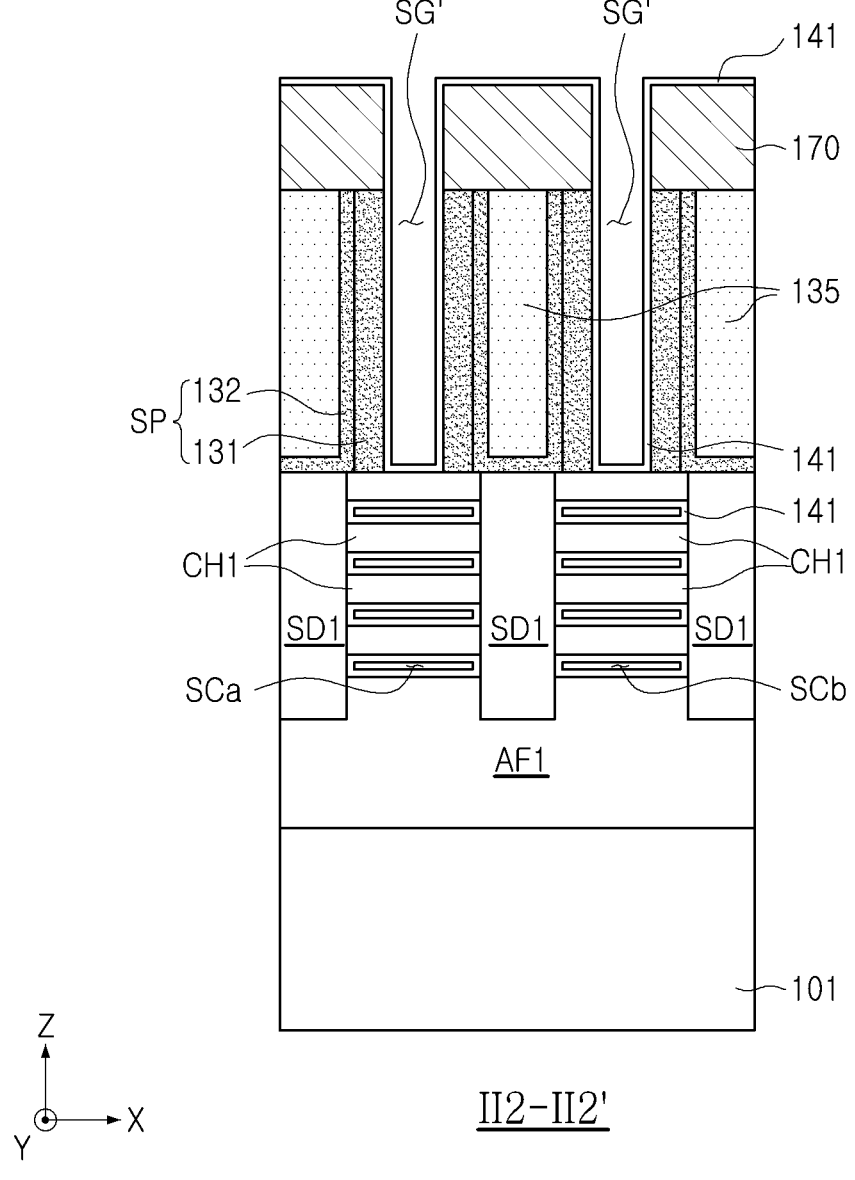
Figure 21A:
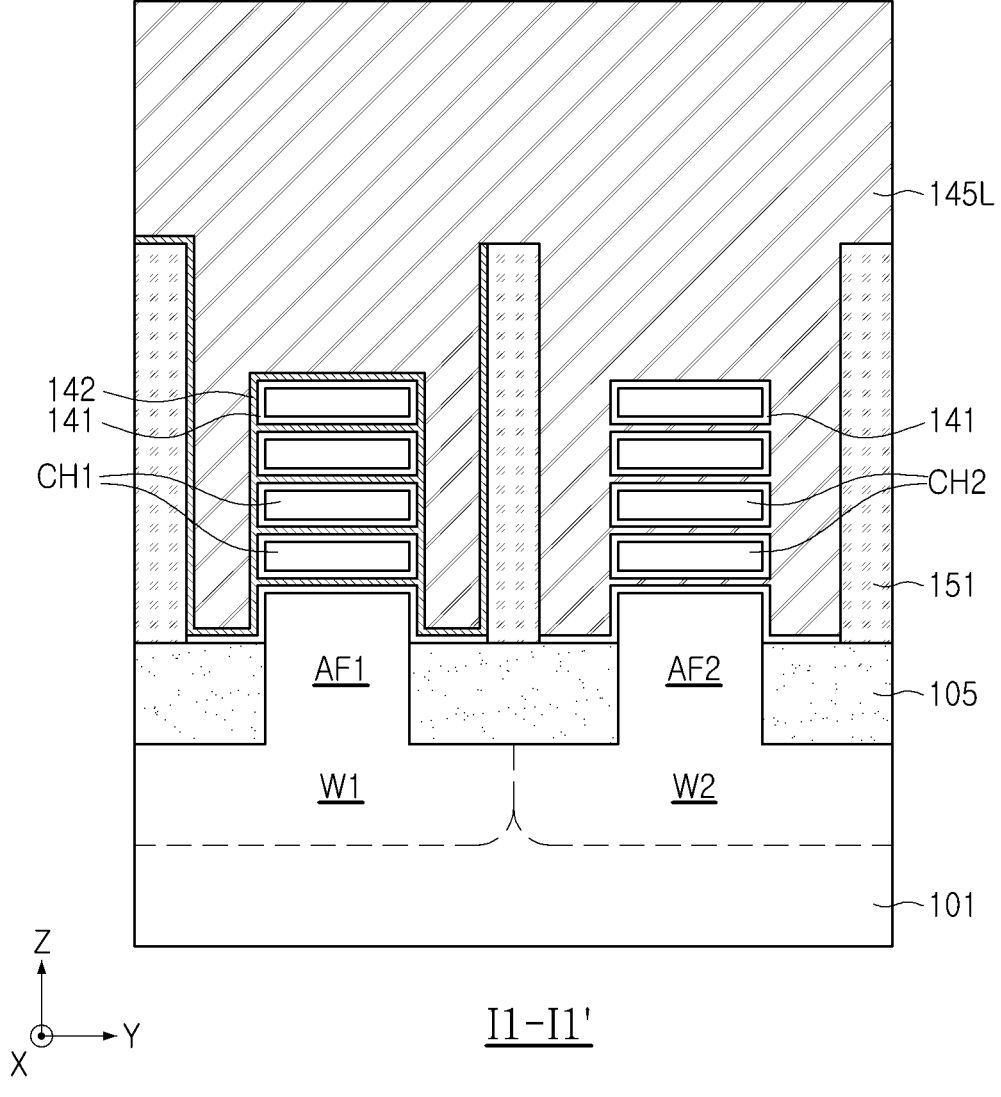
Figure 21B:
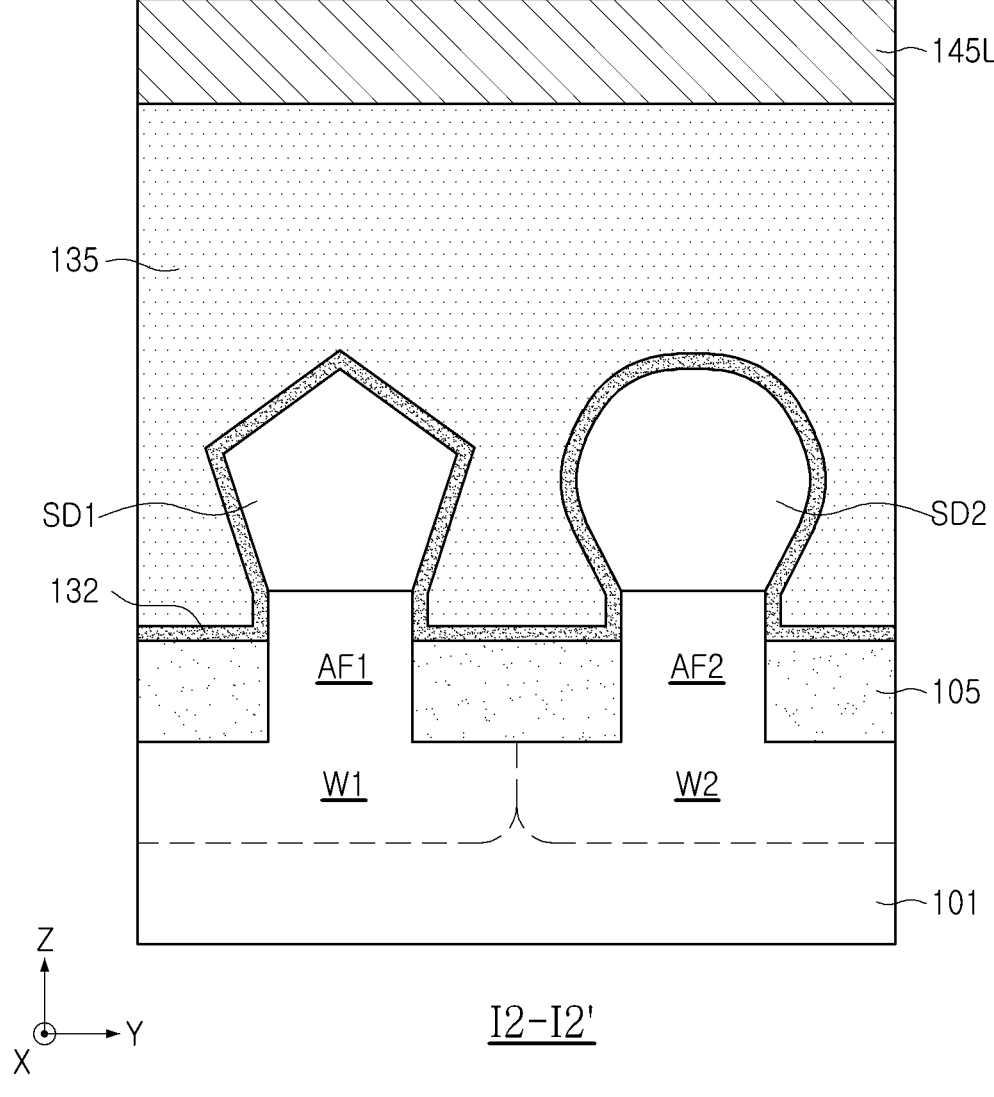
Figure 21C:
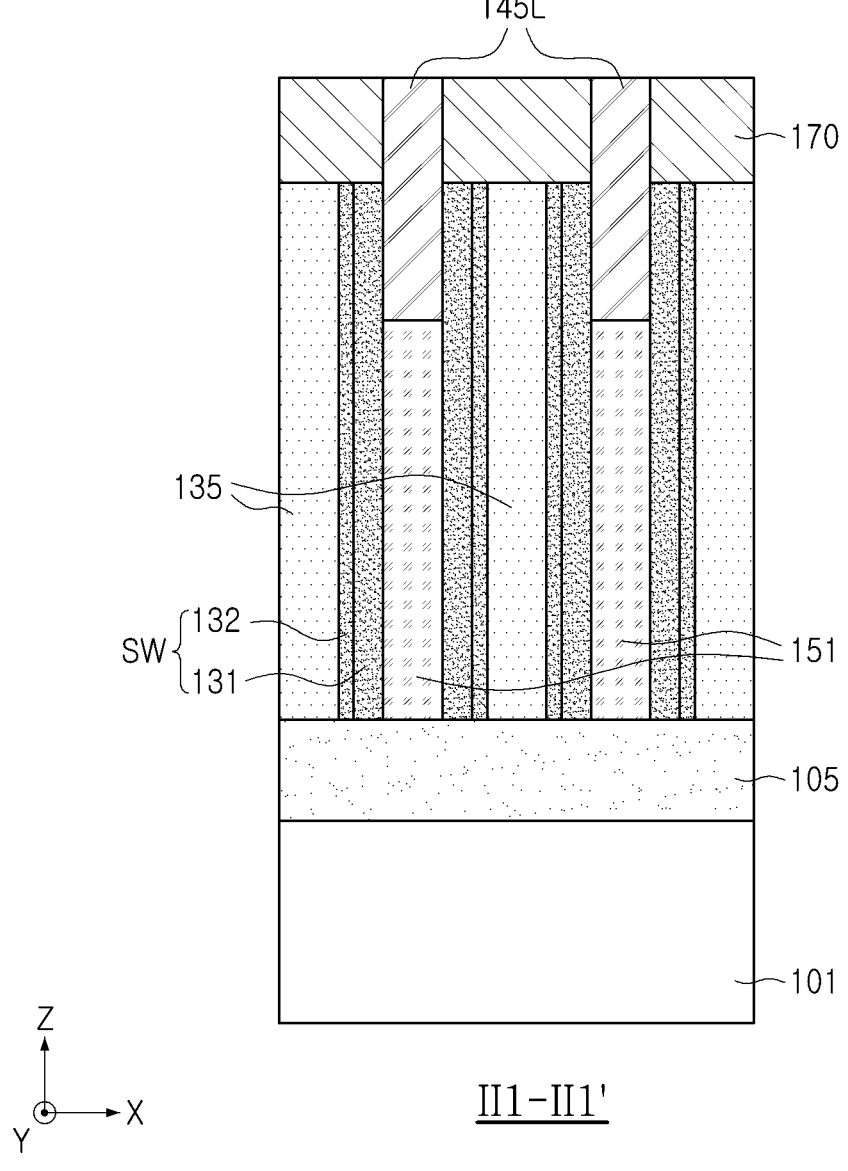
Figure 21D:
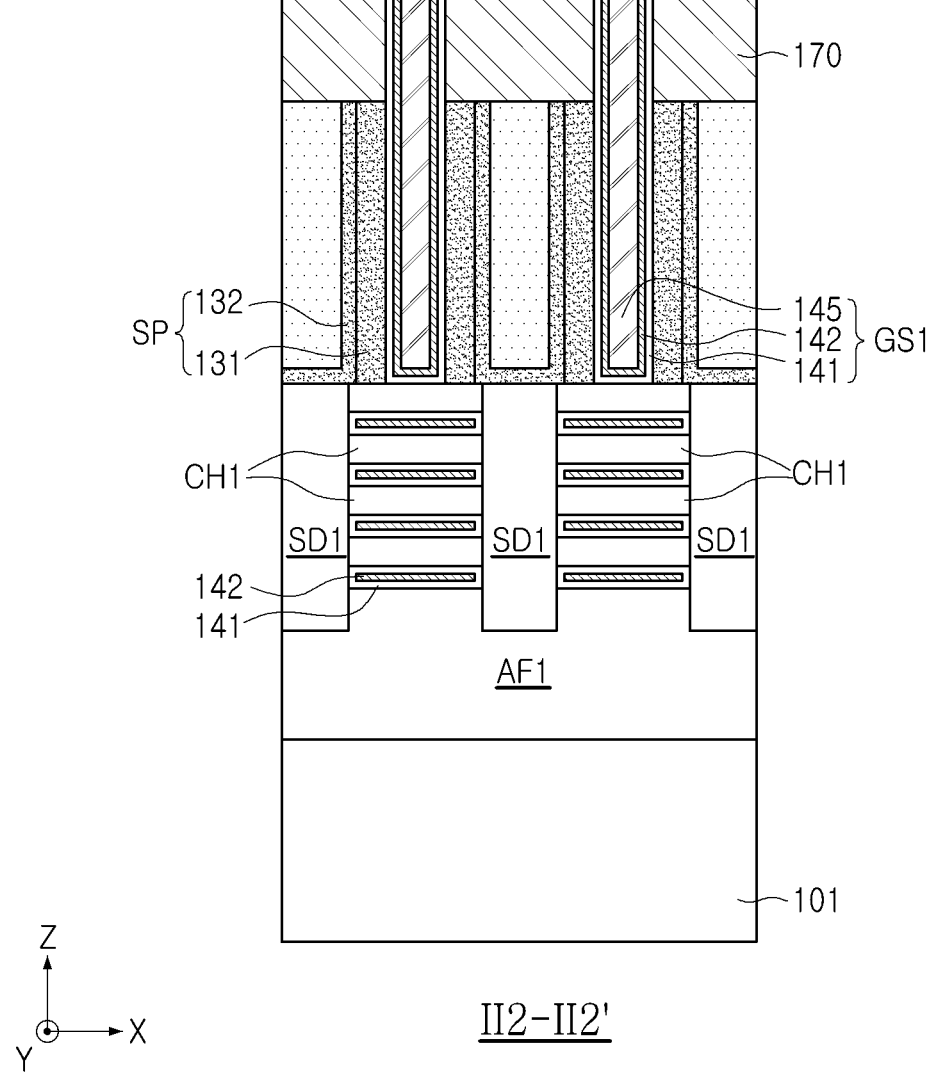
Figure 22A:
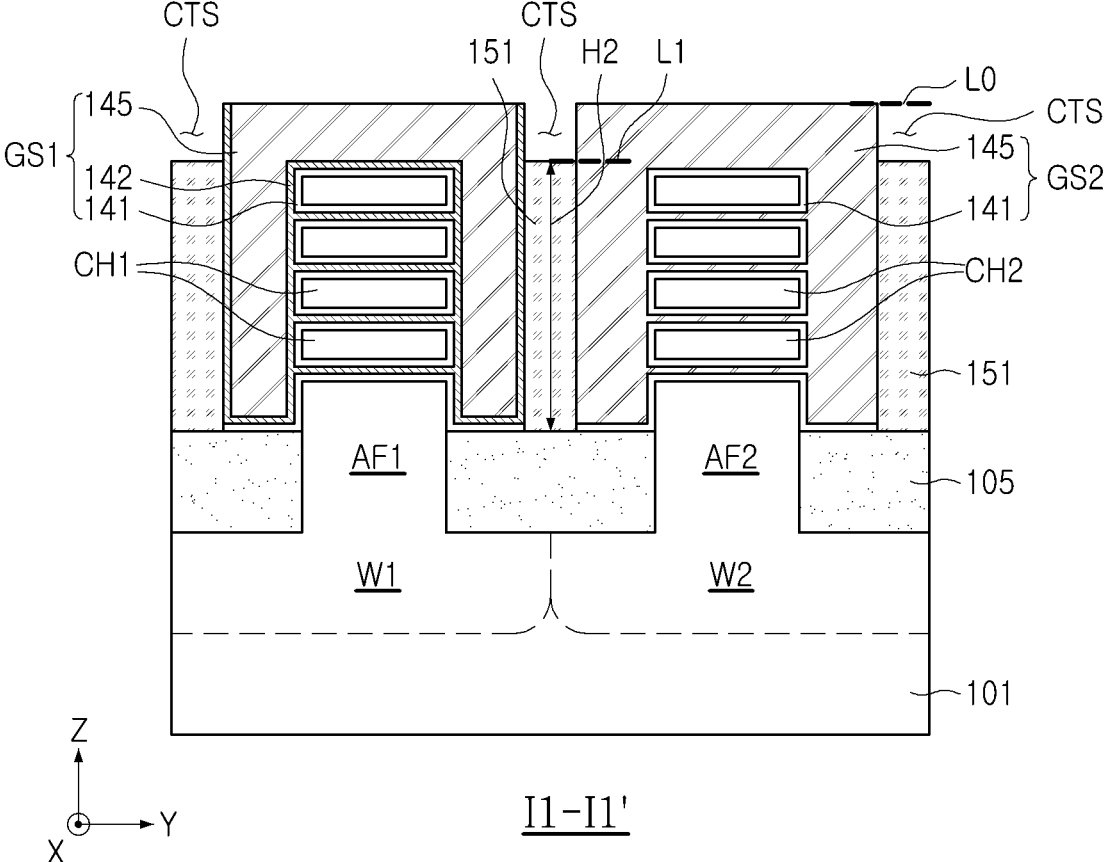
Figure 22B:
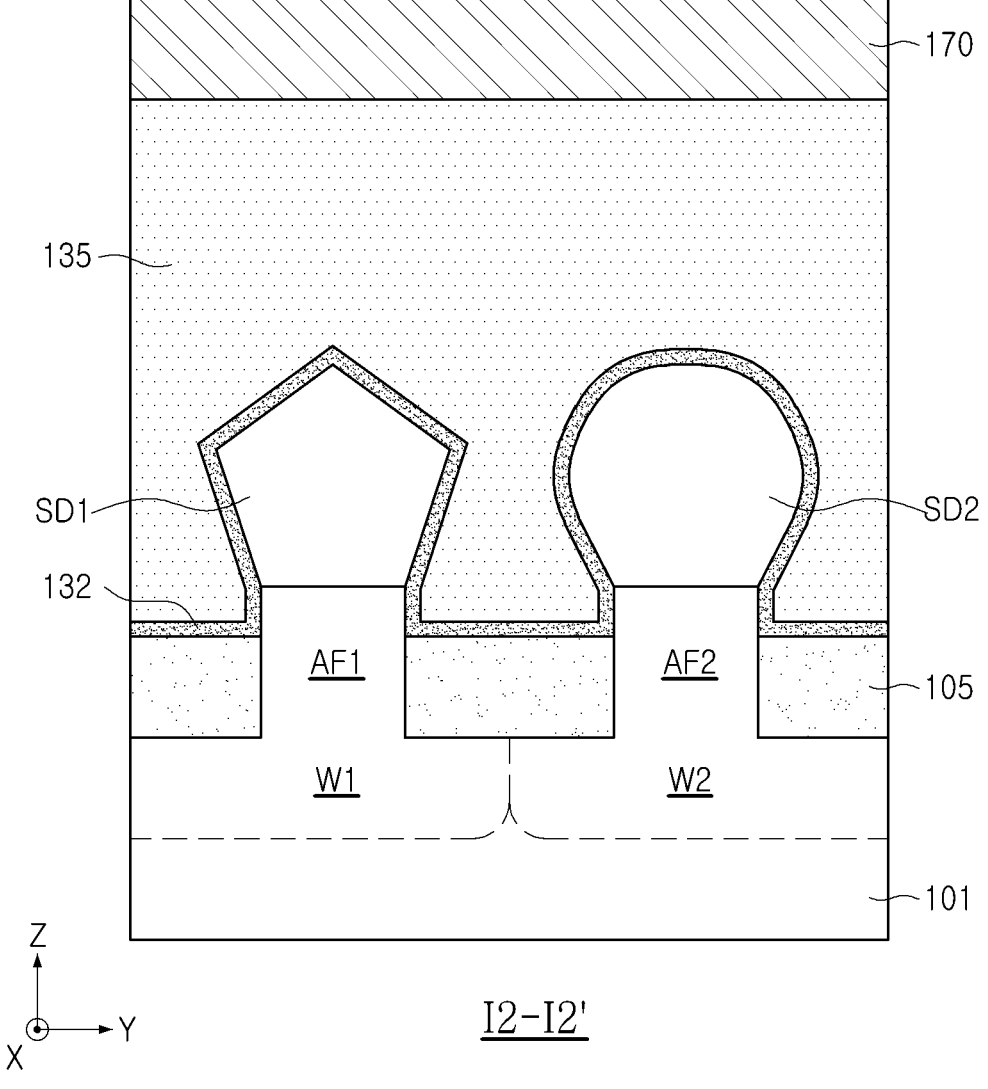
Figure 22C:
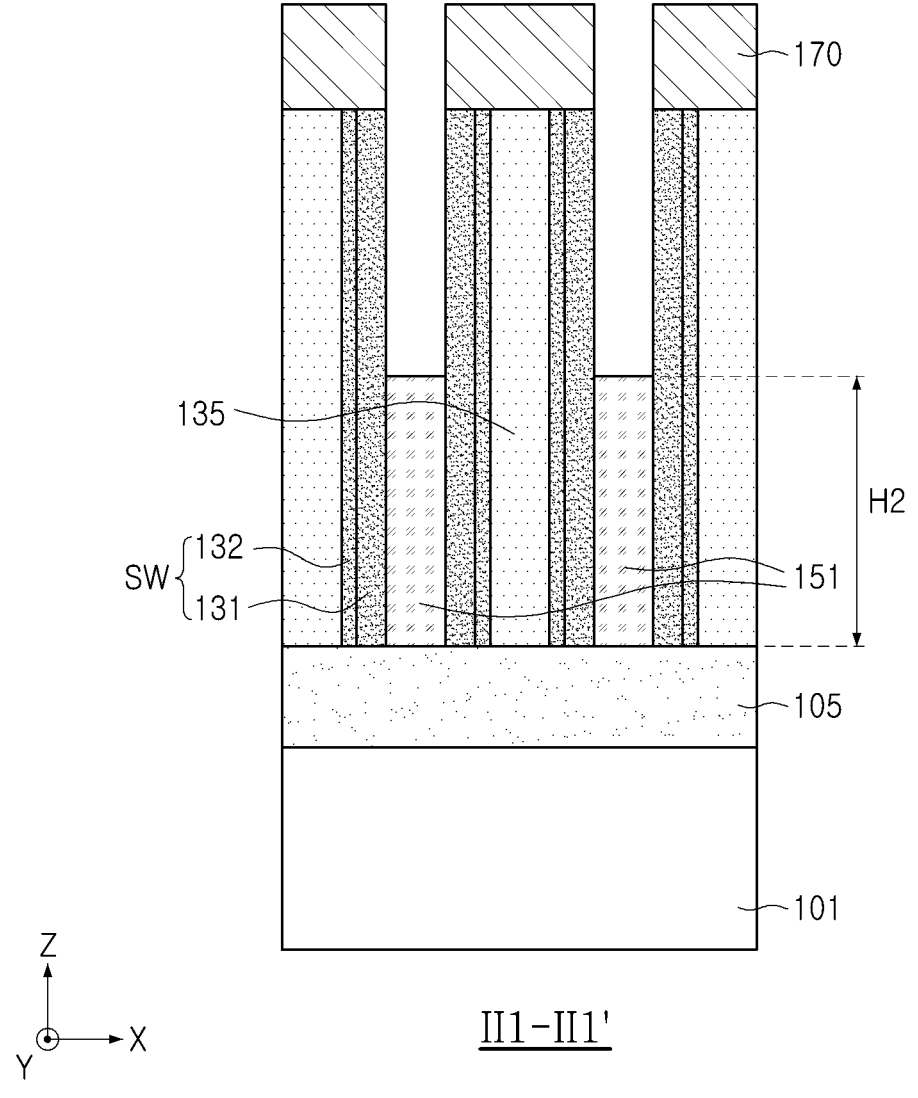
Figure 22D:
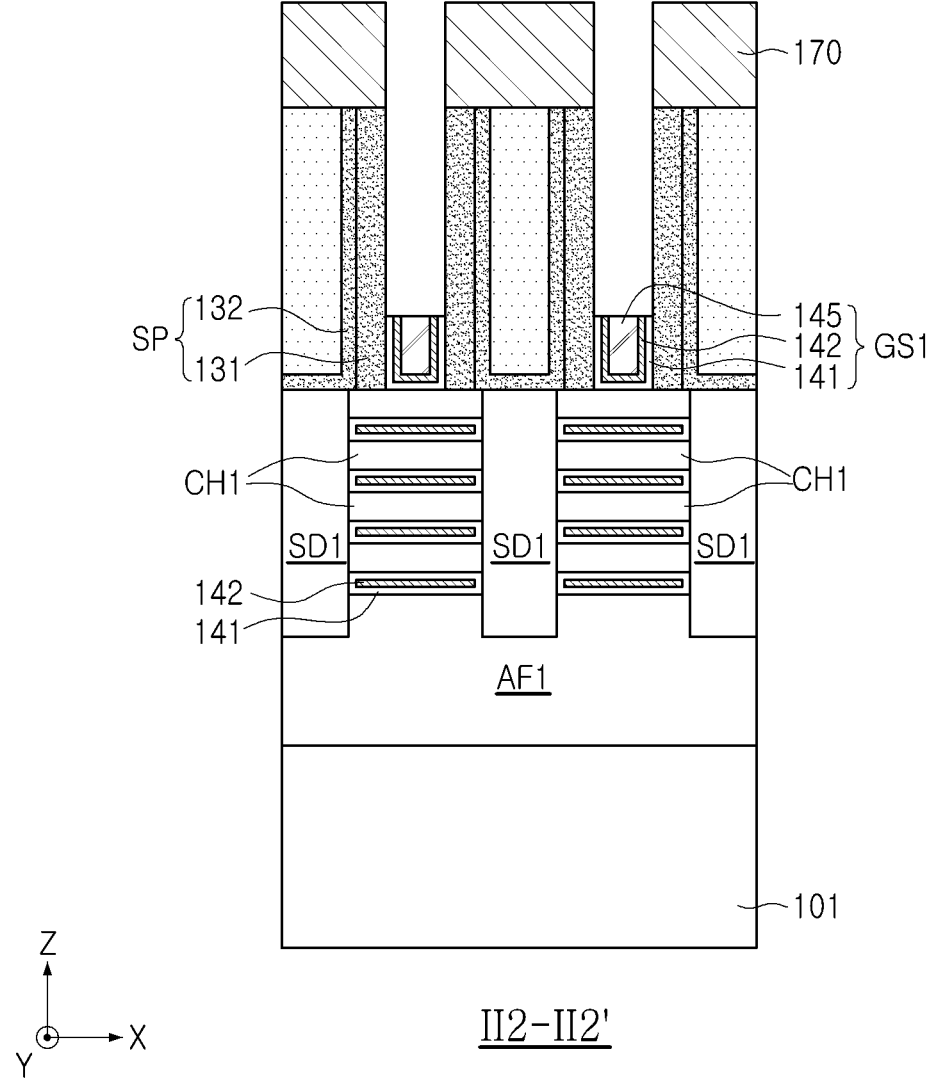

The process of removing the first organic pattern layer 181P may be performed by an ashing/strip process. A space, in which the first organic pattern layer 181P is removed, may serve as a main gate electrode formation space SG. In addition, a selective etching process for removing the protective metal layer 160 may be performed. Accordingly, as illustrated in FIG. 20A, gate electrode formation spaces SCa and SCb between the first and second channel layers CH1 and CH2 may be additionally secured. In such a series of removal processes, a portion of the gate separation pattern 151 may also be etched. However, in some embodiments, such partial etching may barely occur according to a material and etching conditions of the gate separation pattern 151.

Referring to FIGS. 21A to 21D, first and second gate electrode layers 142 and 145 may be formed in gate electrode formation spaces SG', SCa, and SCb.

In the present embodiment, the first gate electrode layer 142 may be applied to only a left gate electrode formation space (in particular, SCa) to surround the first channel layer CH1 (for example, for a PMOS transistor), and the second gate electrode layer 145 may be applied to both gate electrode formation spaces SG' and SCb on opposite sides thereof. The second channel layer CH2 may be surrounded by the second gate electrode layer 145 (for example, for an NMOS transistor). Additionally, a planarization process may be performed on the second gate electrode layer 145 until the ILD protective layer 170 is exposed. As described above, the first and second gate electrode layers 142 and 145 formed in the left and right gate electrode formation spaces may be separated by the gate separation pattern 151.

Referring to FIGS. 22A to 22D, the second gate electrode layer 145 may be recessed to have a desired height.

In the present embodiment, during the recess of the second gate electrode layer 145, the gate separation pattern 151 may also be partially etched to have a second height H2 smaller than the first height H1. An upper level of the gate separation pattern 151 may be adjusted to be lower than an upper level of the second gate electrode layer 145. As described above, in the present embodiment, an upper region CTS in a space between the left and right gate electrodes may not be filled with the gate separation pattern 151.

Referring to FIGS. 23A to 23D, an etching process may be performed on the ILD protective layer 170 and the gate spacer SP.

A selective etching process may be performed to remove the ILD protective layer 170 and the exposed gate spacer SP while allowing the interlayer insulating layer 135 to remain. In the present process, a portion of the gate separation pattern 151 and a portion of the gate spacer SP therearound may also be removed. As a result, the gate separation pattern 151 may be adjusted to have a third height H3 smaller than the second height H2. In some embodiments, since the ILD protective layer 170 and the gate spacer SP include silicon nitride (SiN$_x$), silicon oxynitride (SiO$_x$N$_y$), silicon carbonitride (SiC$_x$N$_y$), or silicon oxycarbonitride (SiO$_x$C$_y$N$_z$) and the interlayer insulating layer 135 includes silicon oxide (SiO$_x$), the interlayer insulating layer 135 may have predetermined selectivity.

A gate capping material layer 155L may be formed and then polished to a PL line to form the semiconductor device illustrated in FIGS. 1A to 1E. The gate capping material layer 155L disposed on the second gate electrode layer 145 may have a main region 155$a$, disposed on the first and second gate electrode layers 142 and 145, and an extension portion 155$b$ extending in the remaining space therebetween the first and second gate structures GS1 and GS2. The extension portion 155$b$ may be connected to the gate separation pattern 151 to be provided as a gate separation structure. The gate separation pattern 151 may include a first insulating material, and the gate capping material layer 155L may include a second insulating material different from the first insulating material. For example, the first insulating material may include silicon oxide (SiO$_x$), and the second insulating material may include silicon nitride (SiN$_x$), silicon oxynitride (SiO$_x$N$_y$), silicon carbonitride (SiC$_x$N$_y$), or silicon oxycarbonitride (SiO$_x$C$_y$N$_z$).

FIGS. 24A to 27A and FIGS. 24B to 27B are cross-sectional views of a main processes illustrating a method of fabricating a semiconductor device, according to an embodiment, respectively. A method of fabricating a semiconductor device according to the present embodiment may be an example of the method of fabricating the semiconductor device 100A illustrated in FIG. 3.

Figure 24A:
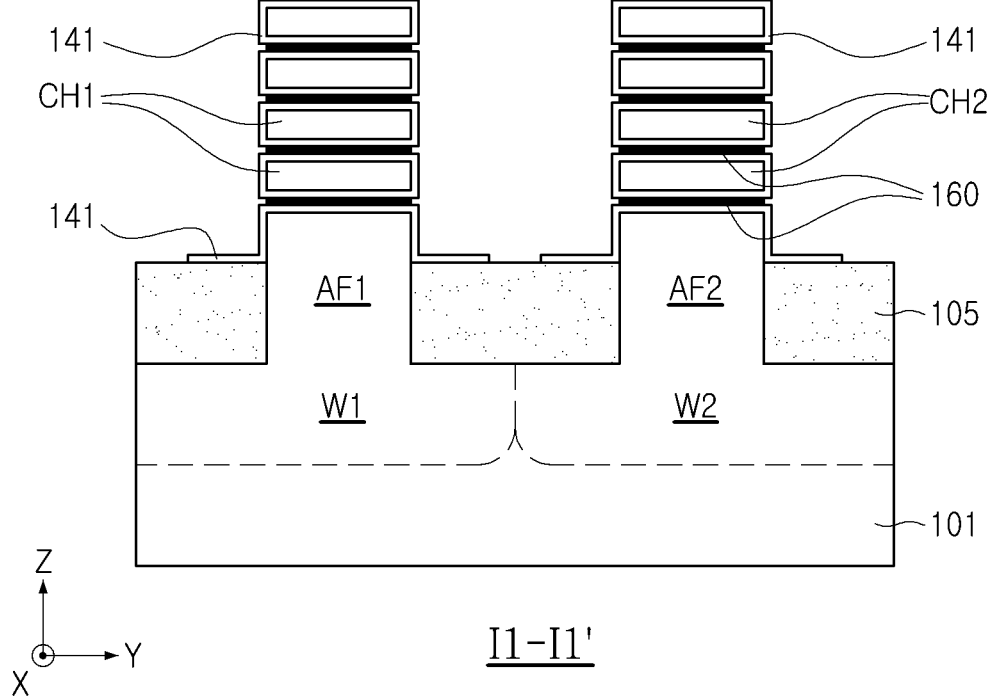
Figure 24B:
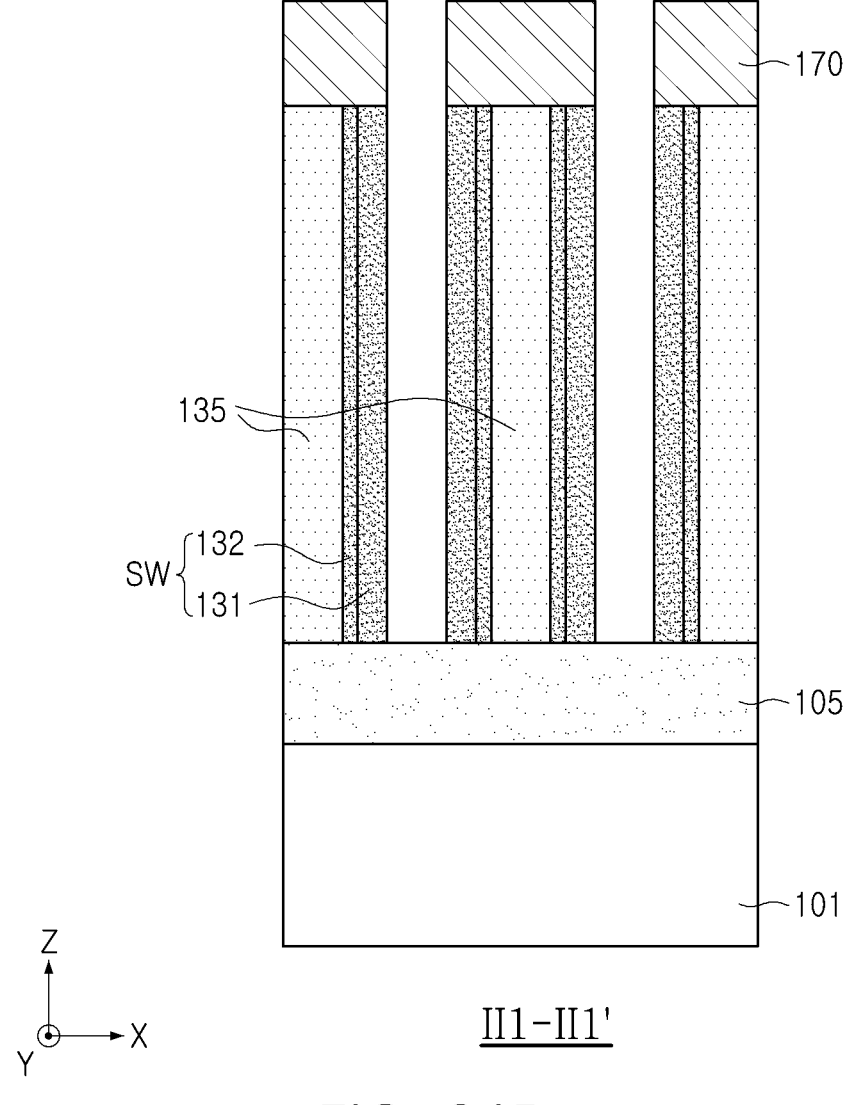

Referring to FIGS. 24A and 24B, the first organic pattern layer 181P may be removed after the process illustrated in FIGS. 18A to 18D. A process of removing the first organic pattern layer 181P may be performed by an ashing/strip process. In the fabricating process according to the previous embodiment, the separated gate insulating layer 141 may be exposed by removing the second organic pattern layer 186P without forming the gate separation pattern after the process illustrated in FIGS. 18A to 18E.

Figure 25A:
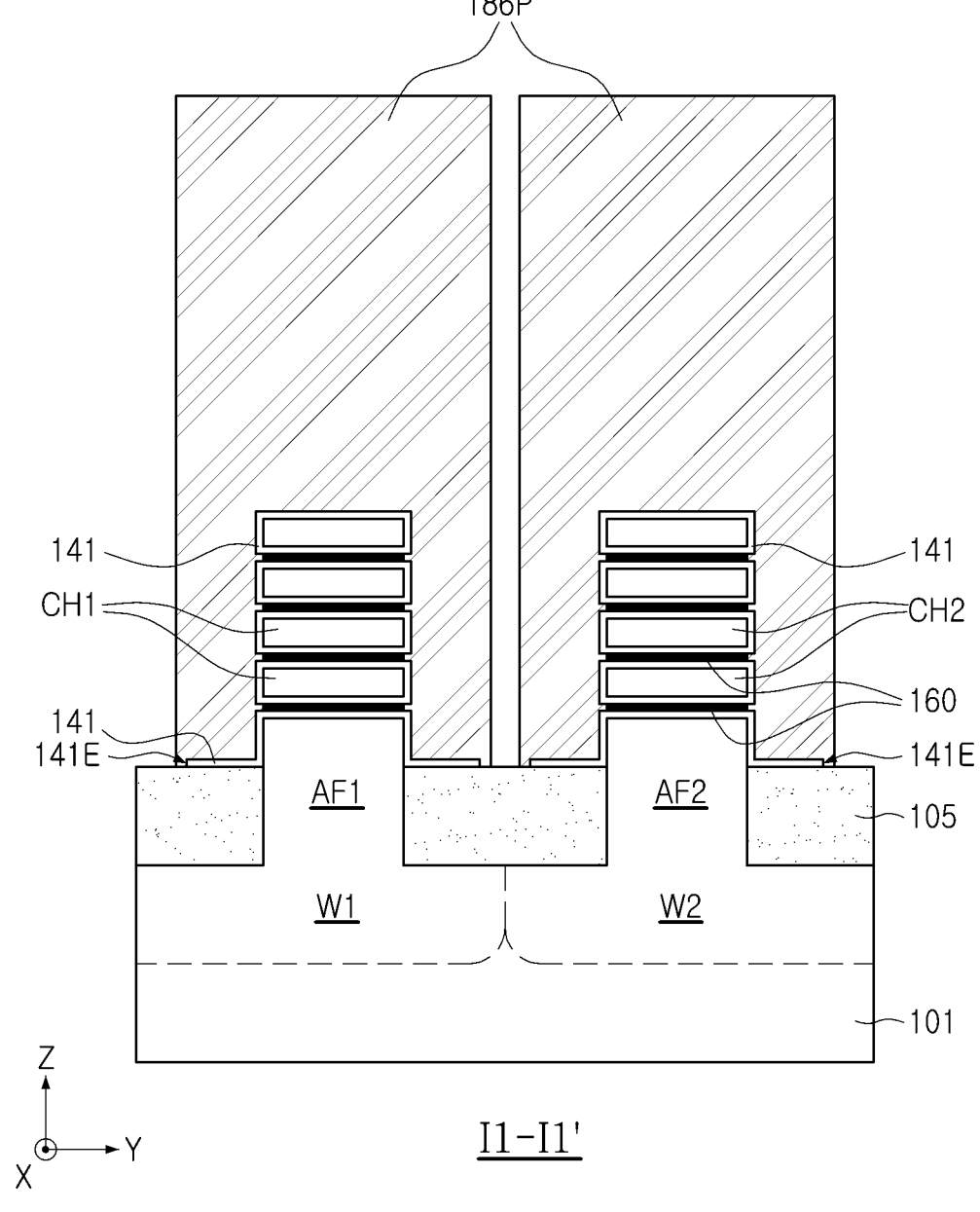
Figure 25B:
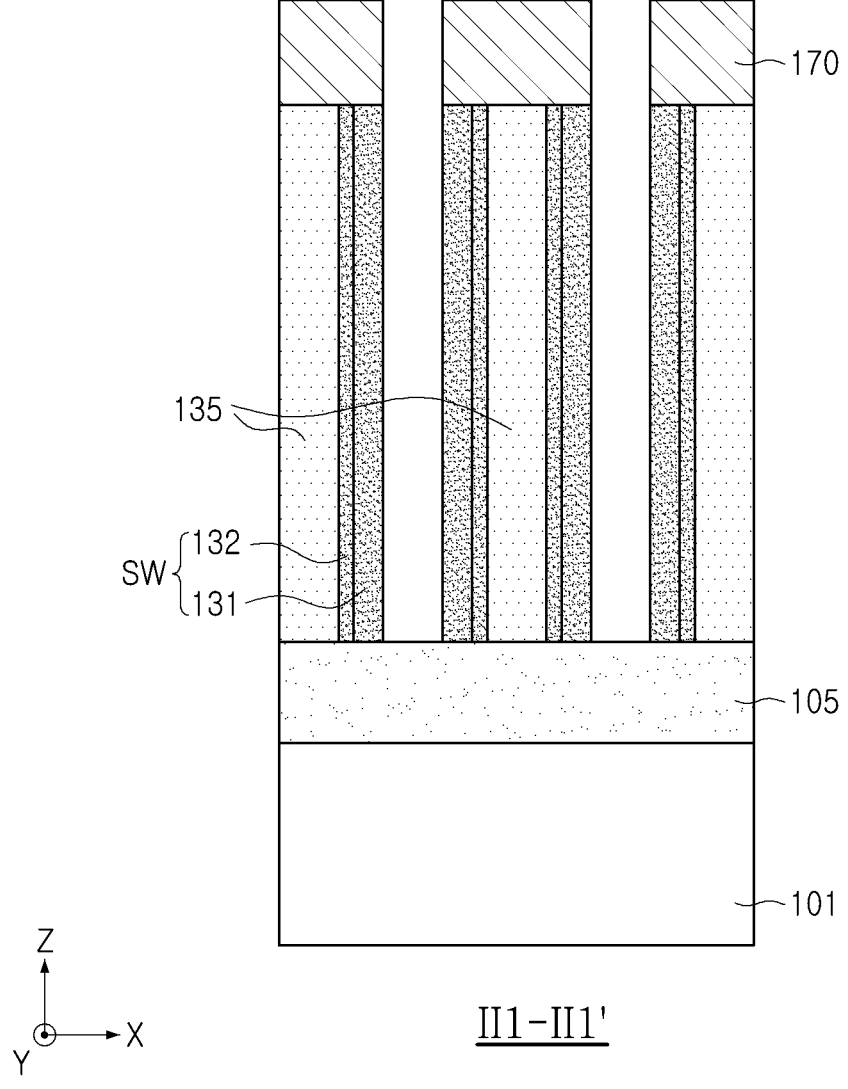

Referring to FIGS. 25A and 25B, a second organic pattern layer 186P may be formed on side and upper surfaces of end portions 141E of the extending portion of the gate insulating layer 141. A process of forming the second organic pattern layer 186P may be performed by forming second organic planarization layers and patterning the second organic planarization layers at an interval narrower than an interval between the first organic pattern layers 181P. Such a narrower interval may define an interval between the first and second gate structures, for example, a width of the gate separation pattern in the second direction. Referring to FIGS. 25A and 25B, in the present embodiment, even when the second organic pattern layer 186P is introduced, an interval defining a width of the gate separation pattern in the first direction may be maintained to be almost constant.

Figure 26A:
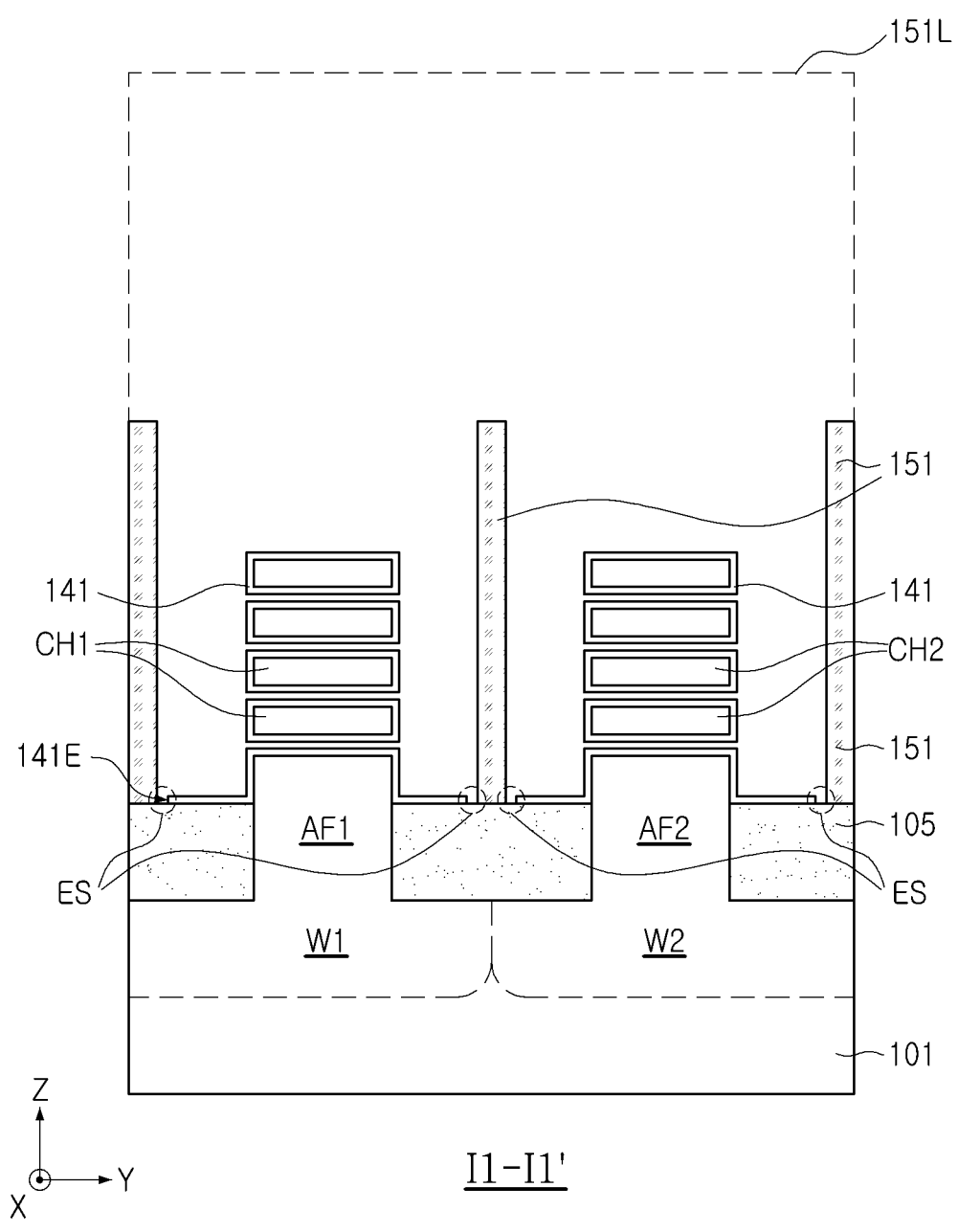
Figure 26B:
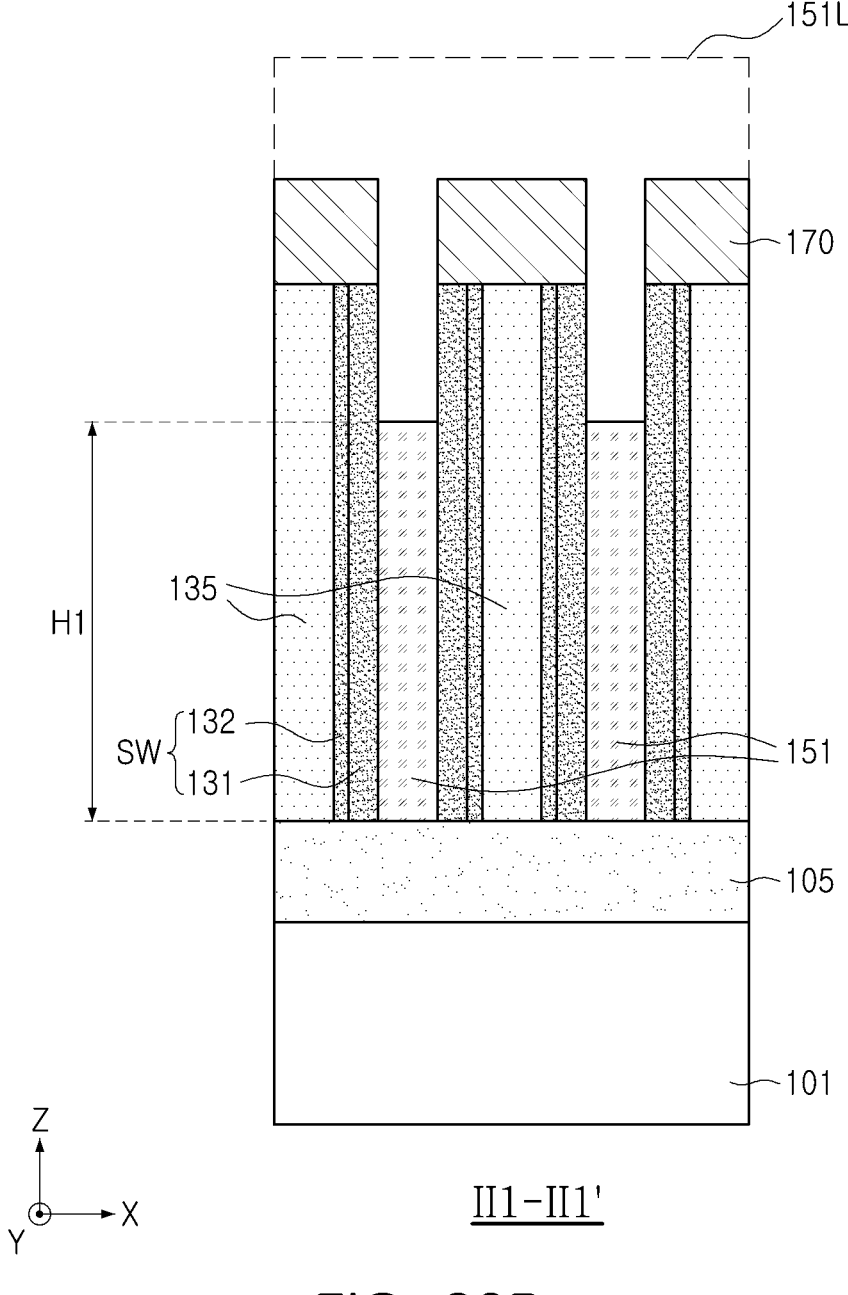

Referring to FIGS. 26A and 26B, an insulating layer 151L for gate separation may be formed and then etched back to form a gate separation pattern 151 having a first height H1 (see FIGS. 19A to 19D). Then, the second organic pattern layer 186P and the protective metal layer 160 may be removed to prepare a gate electrode formation space (see FIGS. 20A to 20D). A process of removing the second organic pattern layer 186P may be performed by an ashing/striping process. In the gate electrode formation space, as illustrated in region ES, the end portions 141E of the extending portion of the gate insulating layer 141 may be spaced apart from the gate separation pattern 151 by a predetermined interval.

Figure 27A:
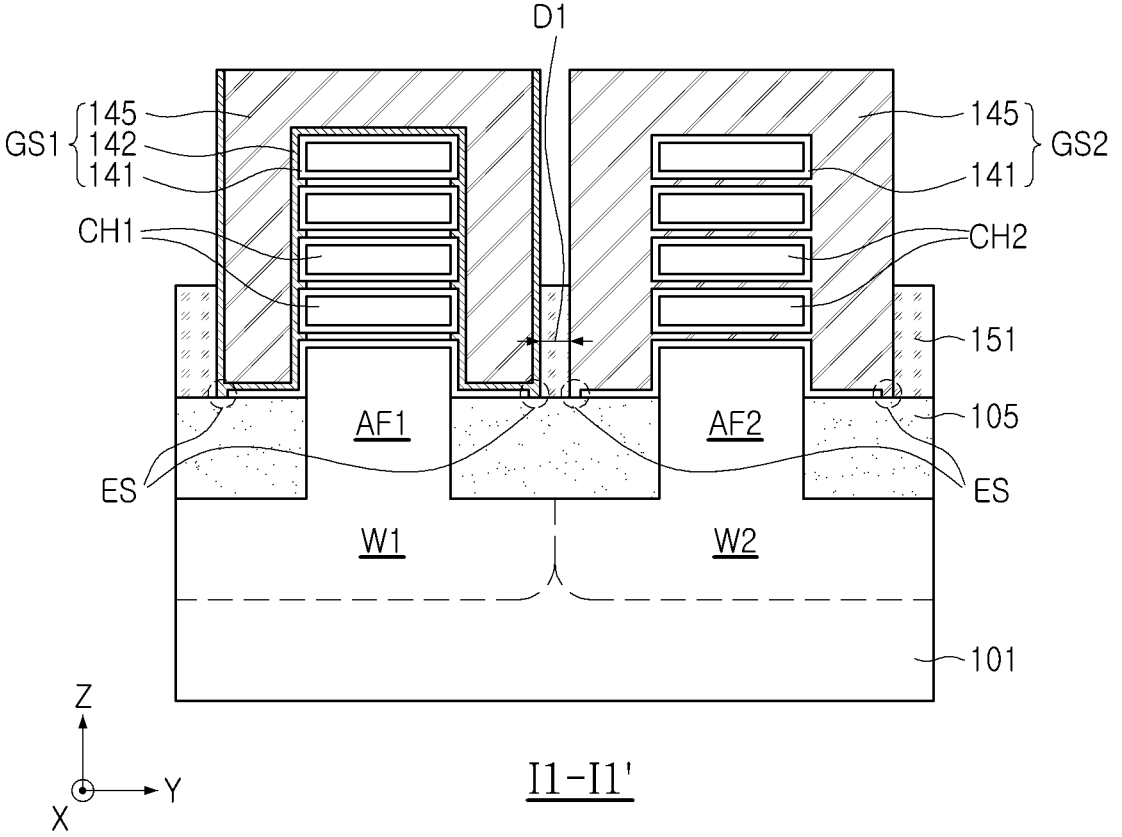
Figure 27B:
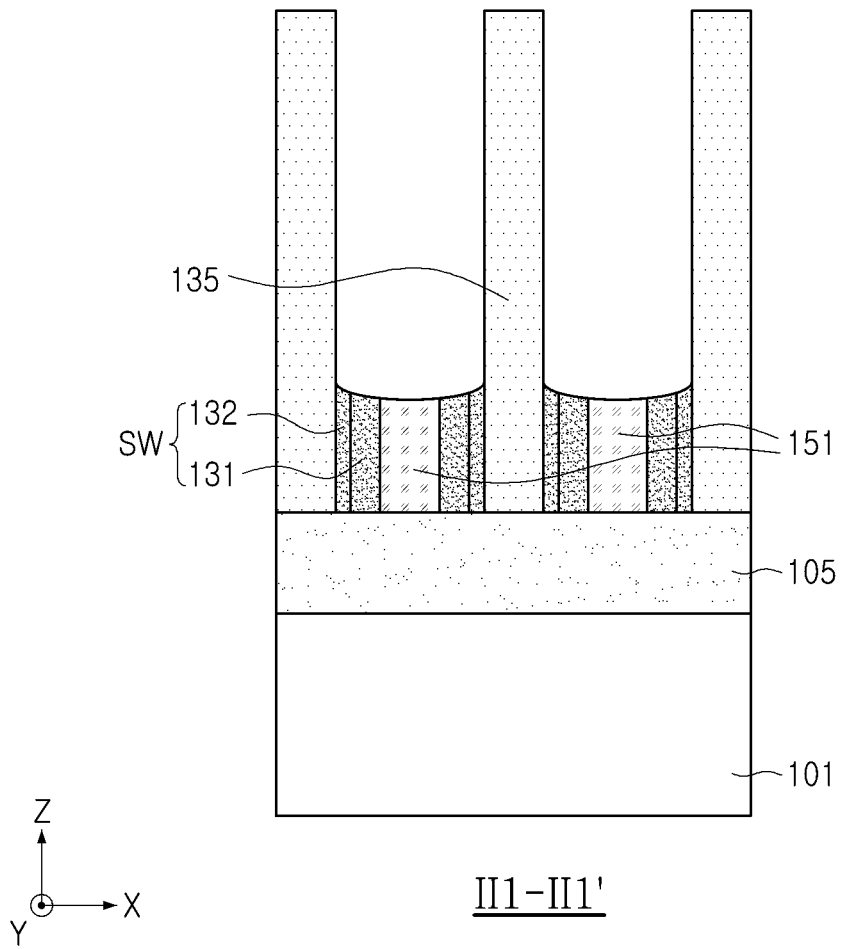

Referring to FIGS. 27A and 27B, first and second gate electrode layers 142 and 145 may be formed in the gate electrode formation space (see FIGS. 21A to 21D), and the second gate electrode layer 145 may be recessed to have a desired height (see FIGS. 22A to 22D).

In the present embodiment, after the first gate electrode layer 142 and the second gate electrode layer 145 are formed in the gate electrode formation space, the second gate electrode layer 145 may be planarized until the ILD protection layer 170 is exposed. Subsequent to the planarization process, the second gate electrode layer 145 may be additionally etched back to divide the first and second gate electrode layers 142 and 145 by gate separation patterns 151. In addition, during the process of recessing the second gate electrode layer 145, the gate separation pattern 151 may also be partially etched to have a second height smaller than the first height.

The gate insulating layer 141 may have a portion extending between the first and second gate electrode layers 142 and 145 and the device isolation layer 105. Referring to region ES, the first and second gate electrode layers 142 and 145 may be formed to cover the end portions 141E of the extending portion of the gate insulating layer 141. In the present embodiment, a distance D1 between the first and second gate structures GS1 and GS2 in the second direction may be implemented to be smaller than the distance DO of the embodiment illustrated in FIG. 1B. For example, the distance D1 between the first and second gate structures GS1 and GS2 may be set to be 15 nm or less. In some embodiments, the distance D1 may be set to be 12 nm or less.

Figure 23A:
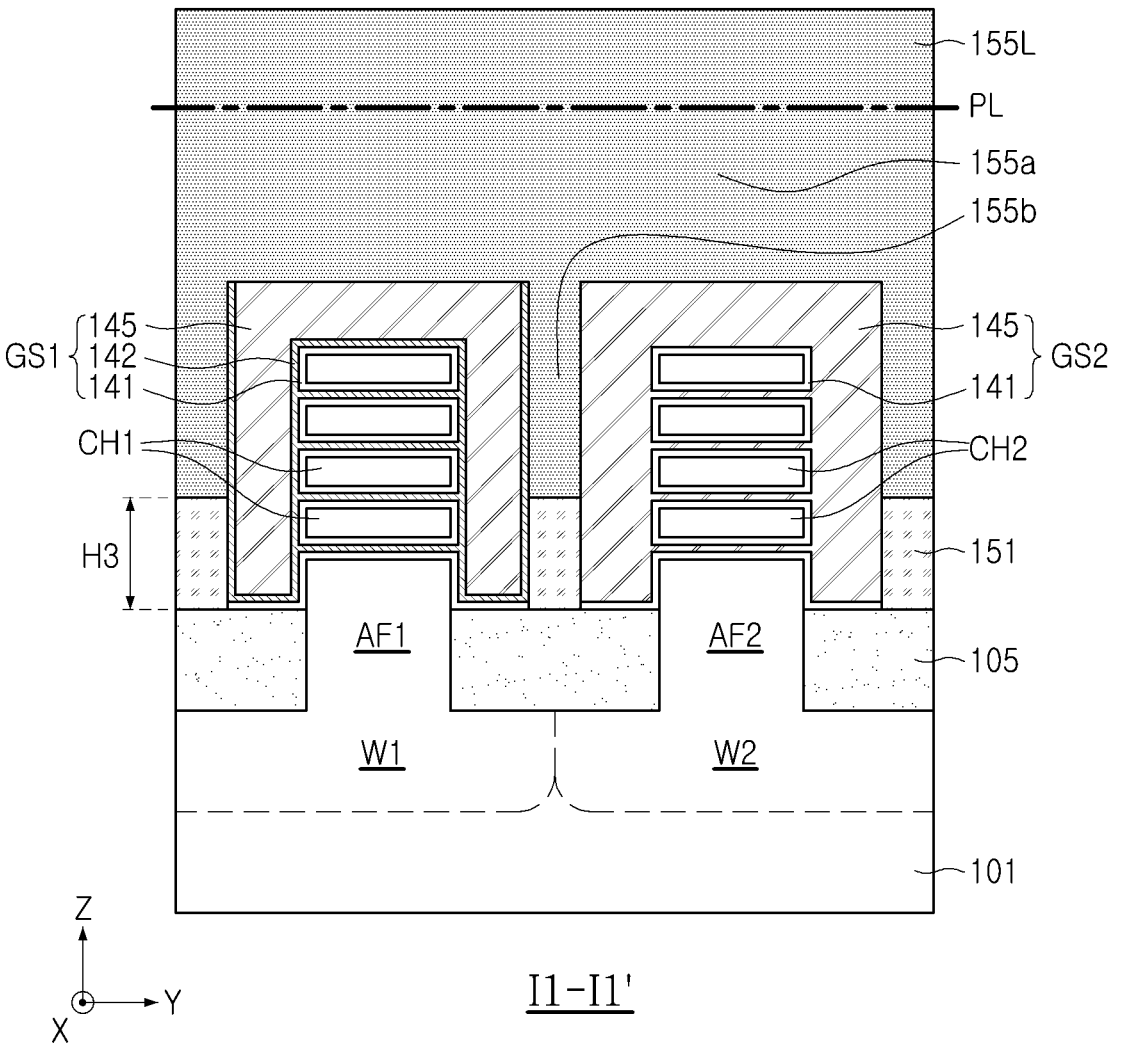
Figure 23B:
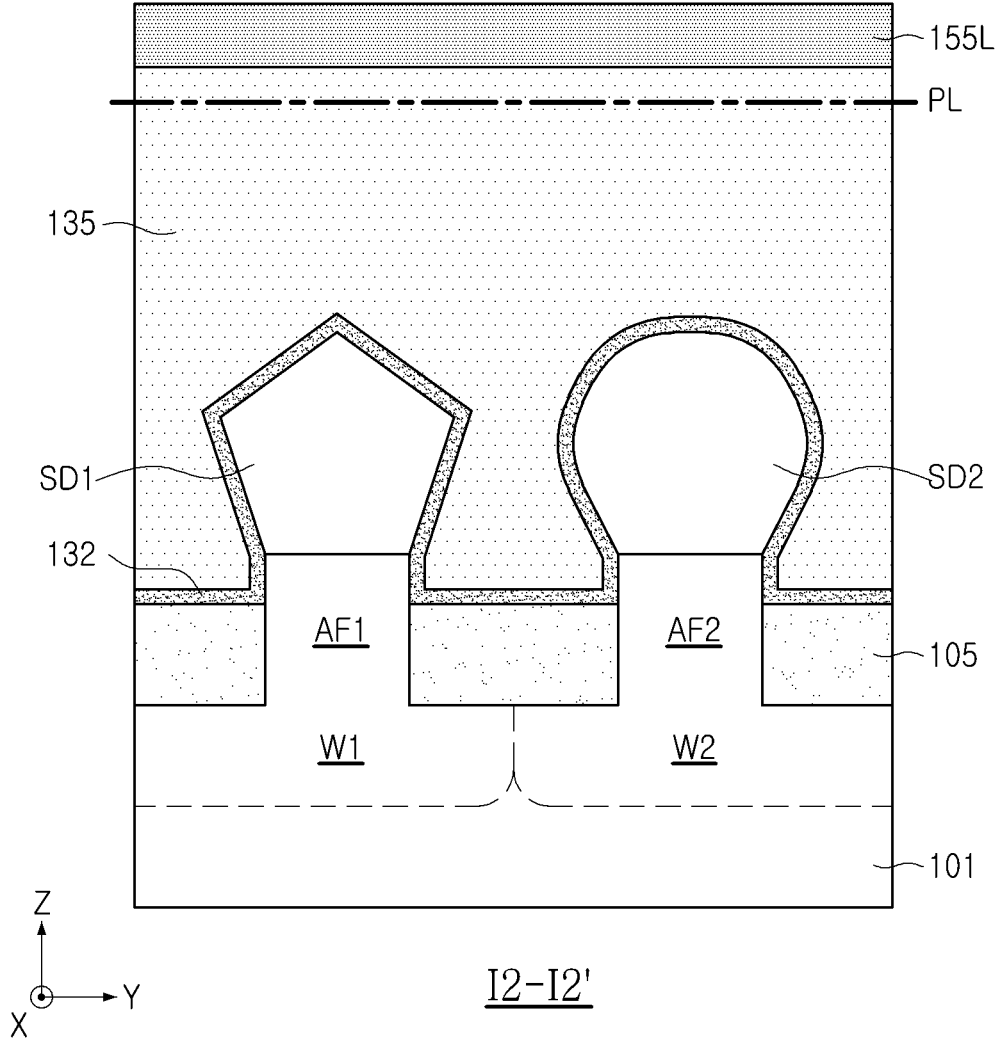
Figure 23C:
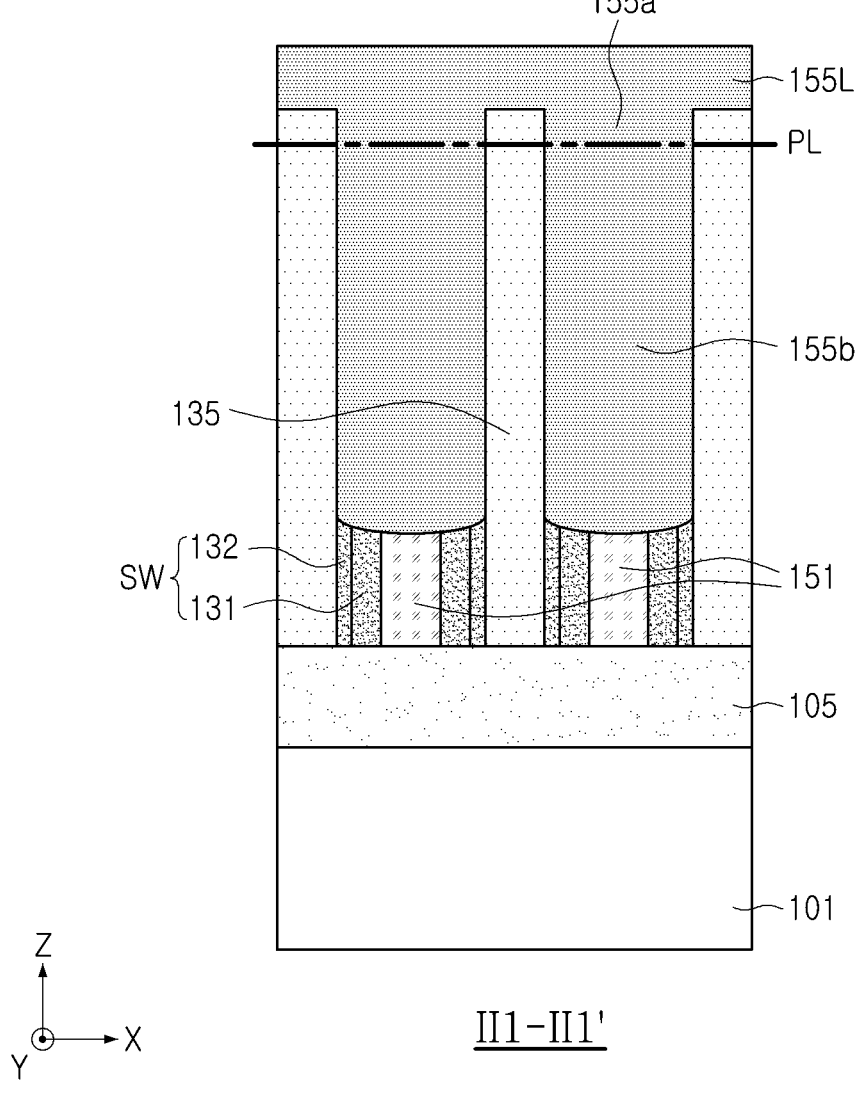
Figure 23D:
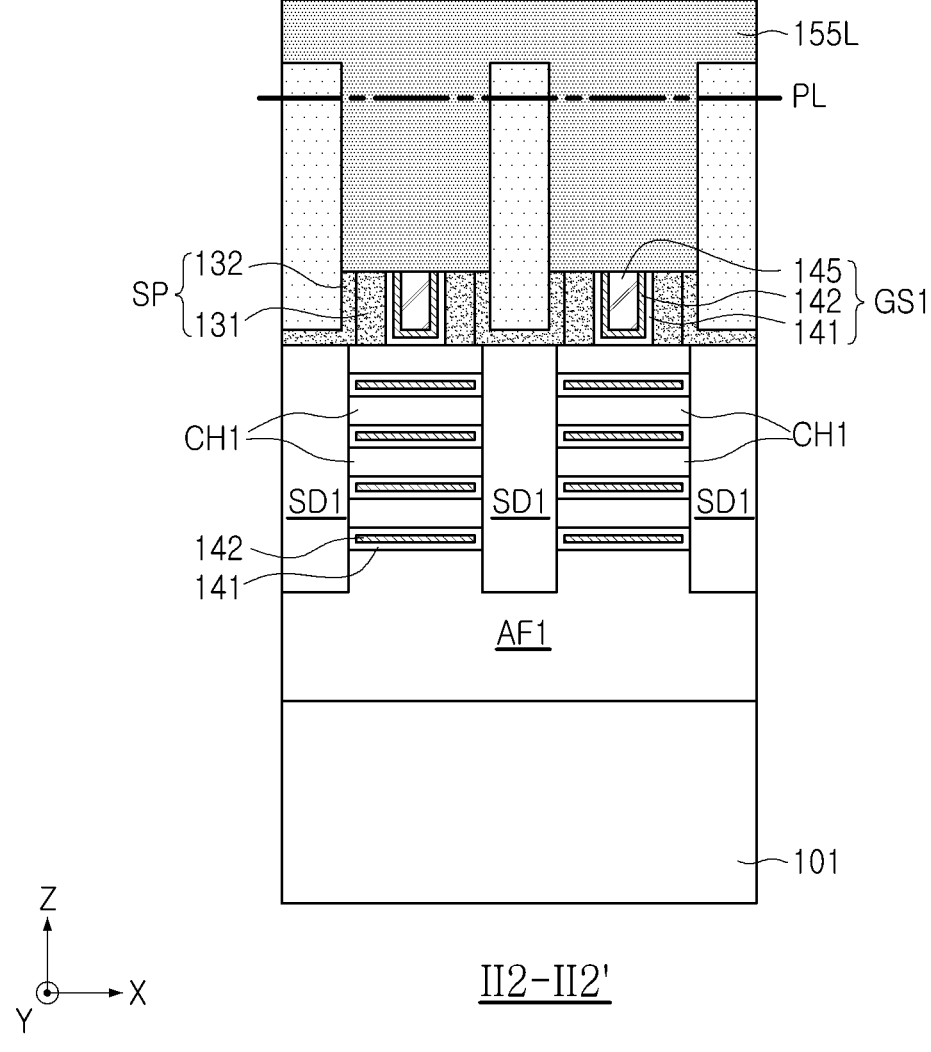

As a subsequent process, a series of processes described with reference to FIGS. 23 to 23D may be additionally performed to fabricate the semiconductor device 100A illustrated in FIG. 3.

FIGS. 28A and 29A and FIGS. 28B and 29B are cross-sectional views of main processes illustrating a method of fabricating a semiconductor device, according to an embodiment, respectively. The method of fabricating a semiconductor device according to the present embodiment may be another example of the method of fabricating the semiconductor device 100A illustrated in FIG. 3.

Figure 28A:
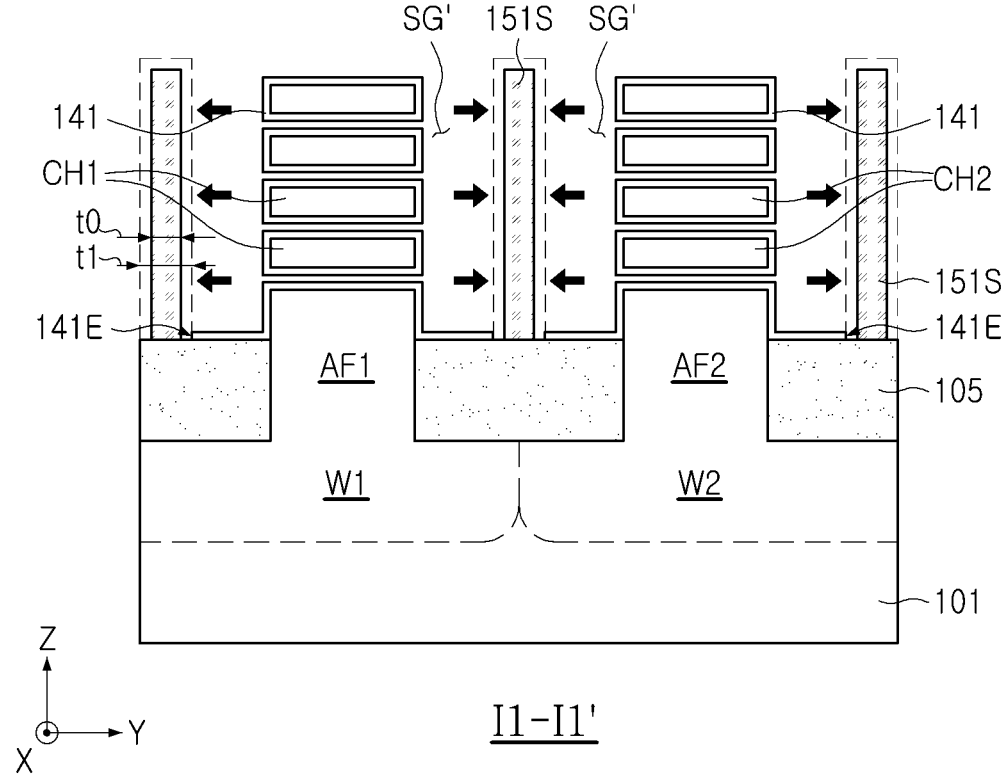
FIGS. 28A and 29A and FIGS. 28B and 29B are cross-sectional views of main processes illustrating a method of fabricating a semiconductor device, according to an embodiment, respectively.
Figure 28B:
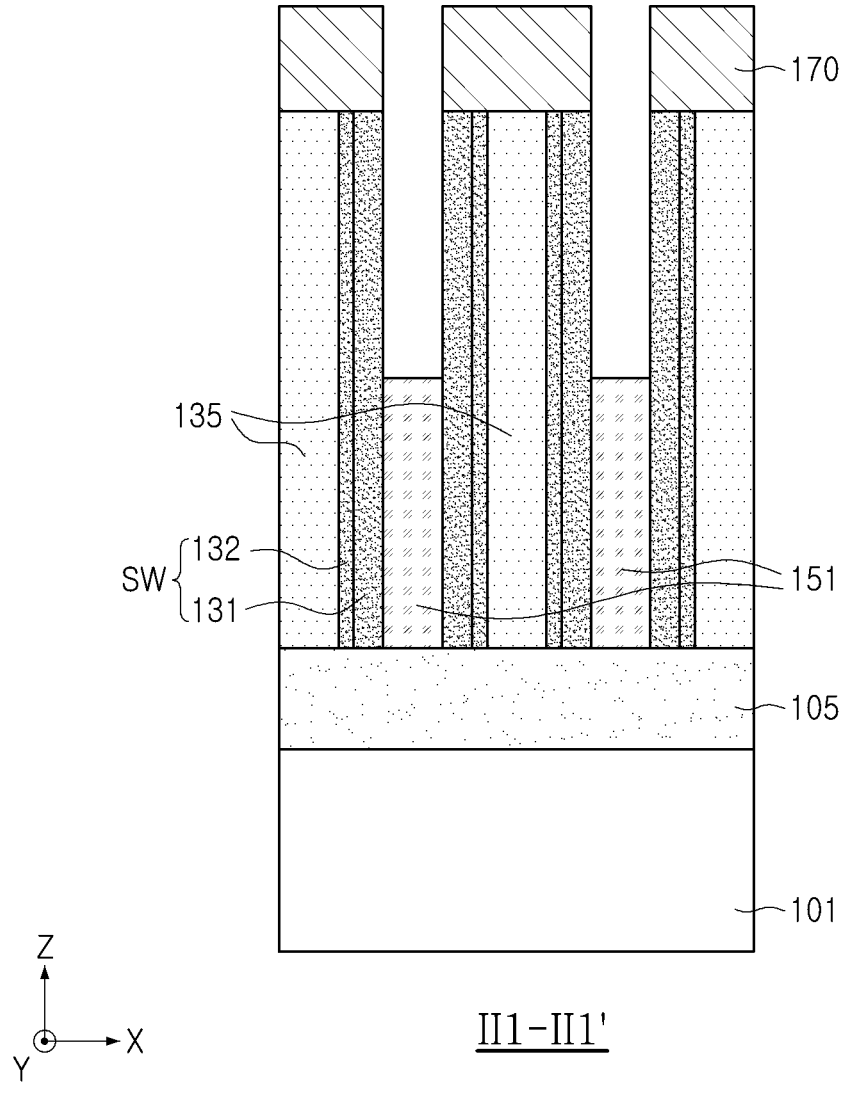

Referring to FIGS. 28A and 28B, after the process illustrated in FIGS. 20A to 20D, a trimming process may be performed on the gate separation pattern, as indicated by an arrow. The gate separation pattern 151S trimmed by the present process may have a decreased width. As described above, a width of the gate separation pattern 151S, employed in the present embodiment, in the second direction may be decreased to be smaller than a width DO of the gate separation pattern 151 illustrated in FIG. 1B, and end portions 141E of an extending portion of a gate insulating layer 141 may be spaced apart from the gate separation pattern 151 by a predetermined interval.

Figure 29A:
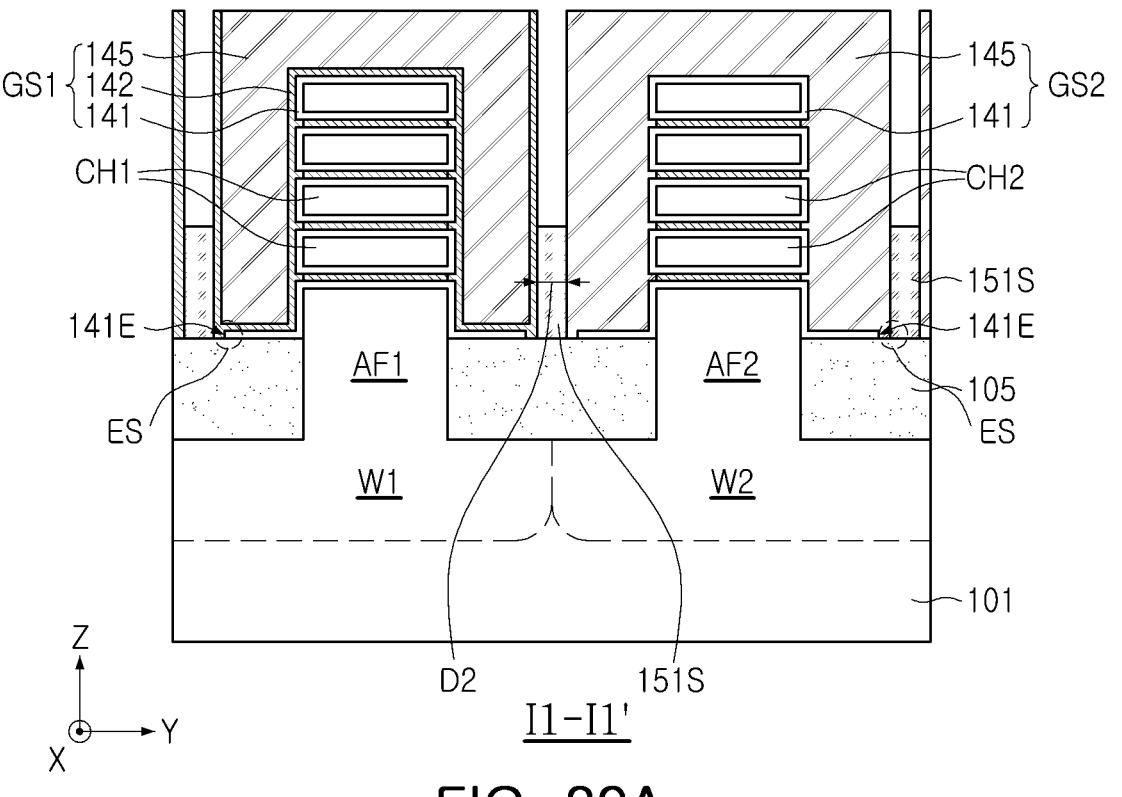
Figure 29B:
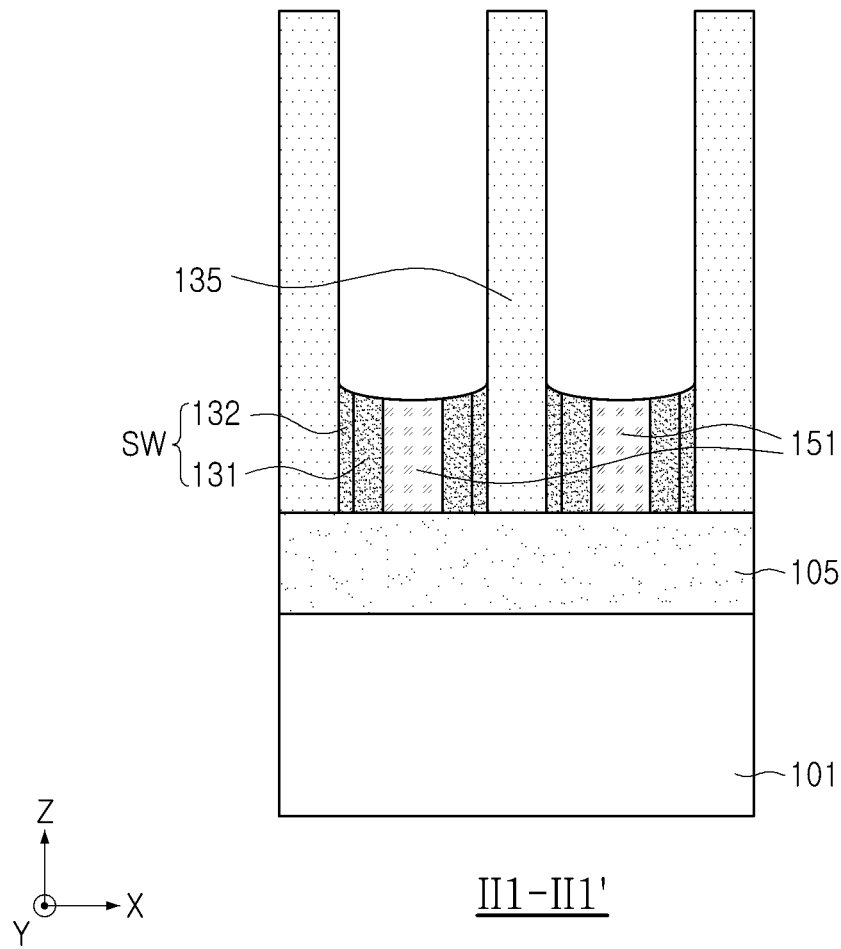

Referring to FIGS. 29A and 29B, first and second gate electrode layers 142 and 145 may be formed in a gate electrode formation space SG' (see FIGS. 21A to 21D), and the second gate electrode layer 145 may be recessed to have a desired height (see FIGS. 22A to 22D).

In the present embodiment, after the first gate electrode layer 142 and the second gate electrode layer 145 are formed in the gate electrode formation space SG', the second gate electrode layer 145 may be planarized until the ILD protective layer 170 is exposed. After the planarization process, the second gate electrode layer 145 may be etched back to divide the first and second gate electrode layers 142 and 145 by gate separation patterns 151. During the process of recessing the second gate electrode layer 145, the gate separation pattern 151 may also be partially etched to have a second height smaller than a first height.

The gate insulating layer 141 may have a portion extending between a device isolation layer 105 and a combination of the first and second gate electrode layers 142 and 145. Referring to a region ES, the first and second gate electrode layers 142 and 145 may be formed on side and upper surfaces of the end portions 141E of the extending portion of the gate insulating layer 141. In the present embodiment, a distance D2 between first and second gate structures GS1 and GS2 in the second direction may be implemented to be smaller than the distance DO of the embodiment illustrated in FIG. 1B. For example, the distance D2 between the first and second gate structures GS1 and GS2 may be set to be 15 nm or less. In some embodiments, the distance D2 may be set to be 12 nm or less.

As a subsequent process, a series of processes described with reference to FIGS. 23A to 23D may be additionally performed to fabricate the semiconductor device 100A illustrated in FIG. 3.

Unlike the fabrication process according to the previous embodiment, in the fabrication process according to the present embodiment, a distance between first and second gate structures GS1 and GS2 in the second direction may be decreased by trimming a gate separation pattern, rather than introducing an additional organic pattern layer.

FIGS. 30A and 31A and FIGS. 30B and 31B are cross-sectional views of main processes illustrating a method of fabricating a semiconductor device, according to an embodiment (see FIGS. 4A and 4B), respectively. The method of fabricating a semiconductor device according to the present embodiment may be an example of the method of fabricating the semiconductor device 100B illustrated in FIGS. 4A and 4B.

Referring to FIGS. 30A and 30B, after the process illustrated in FIGS. 18A to 18D, an etching process may be performed by the additionally exposed device isolation layer 105 to extend the gate separation space by a predetermined depth "d." In some embodiments, a portion of the device isolation layer 105, unintentionally exposed in the process of separating the gate insulating layer 141, may be removed without an additional etching process.

Figure 31A:
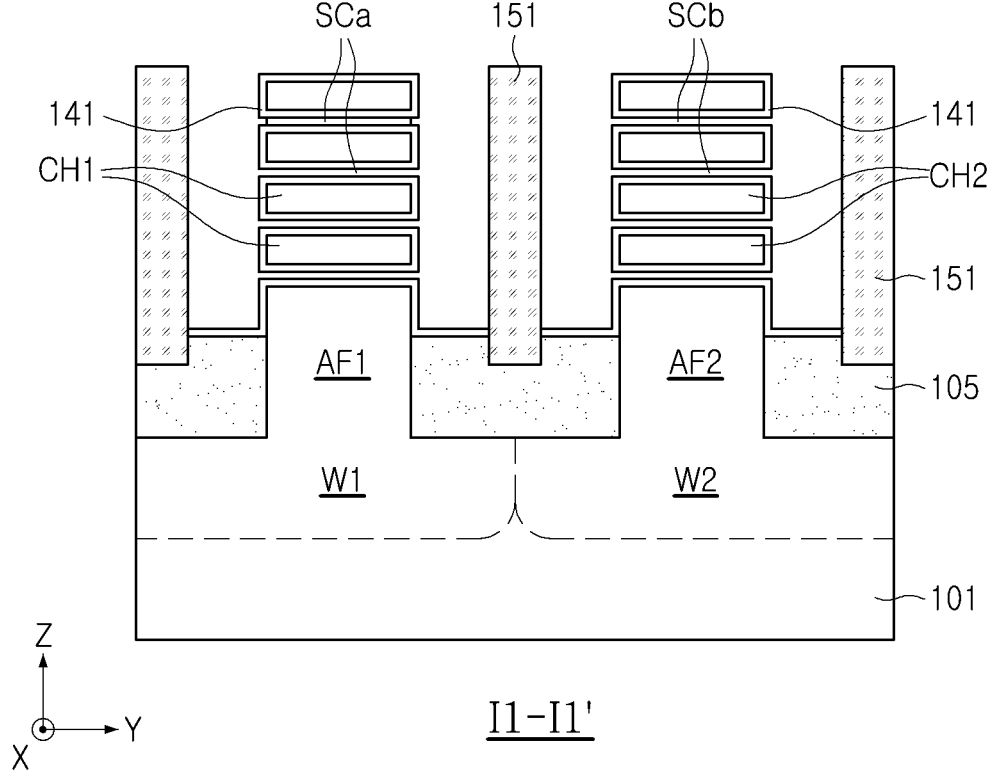
Figure 31B:
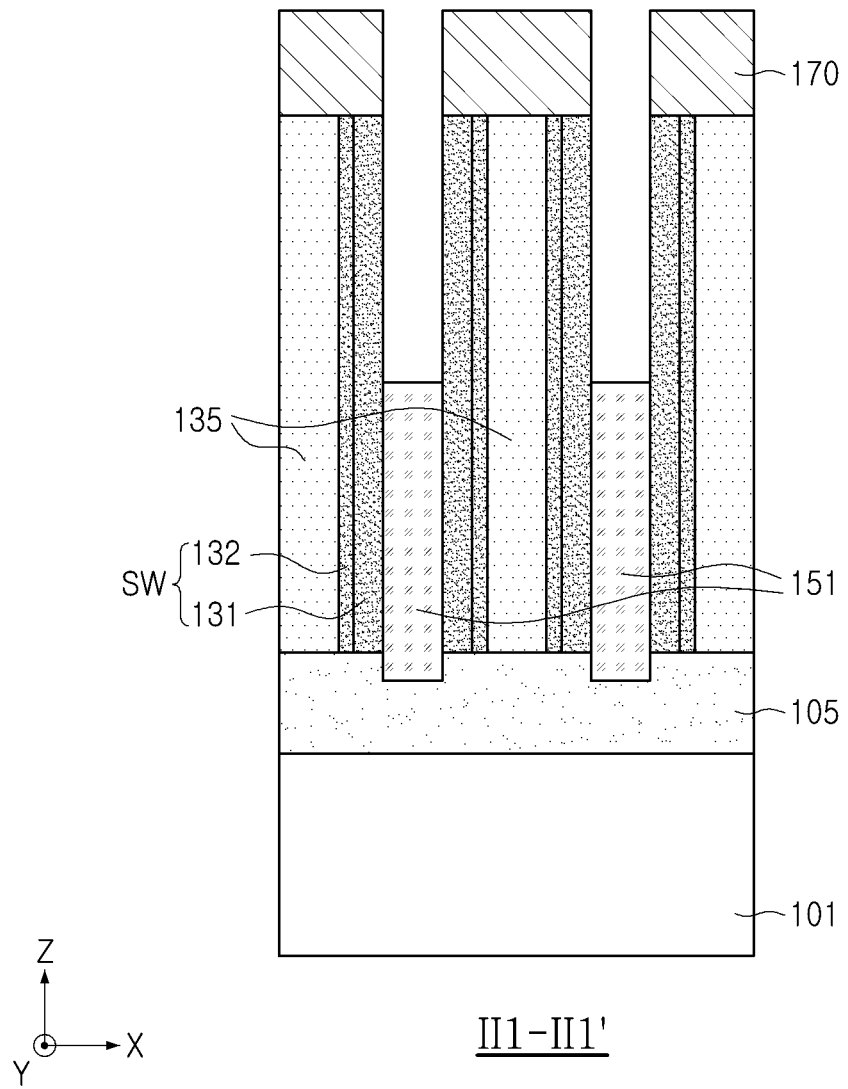

Referring to FIGS. 31A and 31B, an insulating layer 151L for gate separation may be formed and then etched back to form a gate separation pattern 151 having a first height H1 (see FIGS. 19A to 19D). Then, the organic pattern layer 181P and the protective metal layer 160 may be removed to prepare a gate electrode formation space (see FIGS. 20A to 20D).

As a subsequent process, a series of processes described with reference to FIGS. 21A to 23D may be additionally performed to fabricate the semiconductor device 100B illustrated in FIGS. 4A and 4B.

FIGS. 32A and 33A, FIGS. 32B and 33B, and FIGS. 32C and 33C are cross-sectional views of main processes illustrating a method of fabricating a semiconductor device, according to an embodiment (see FIGS. 5A to 5D), respectively. The method of fabricating a semiconductor device according to the present embodiment may be an example of the method of fabricating the semiconductor device 100C illustrated in FIGS. 5A and 5B.

Figure 32A:
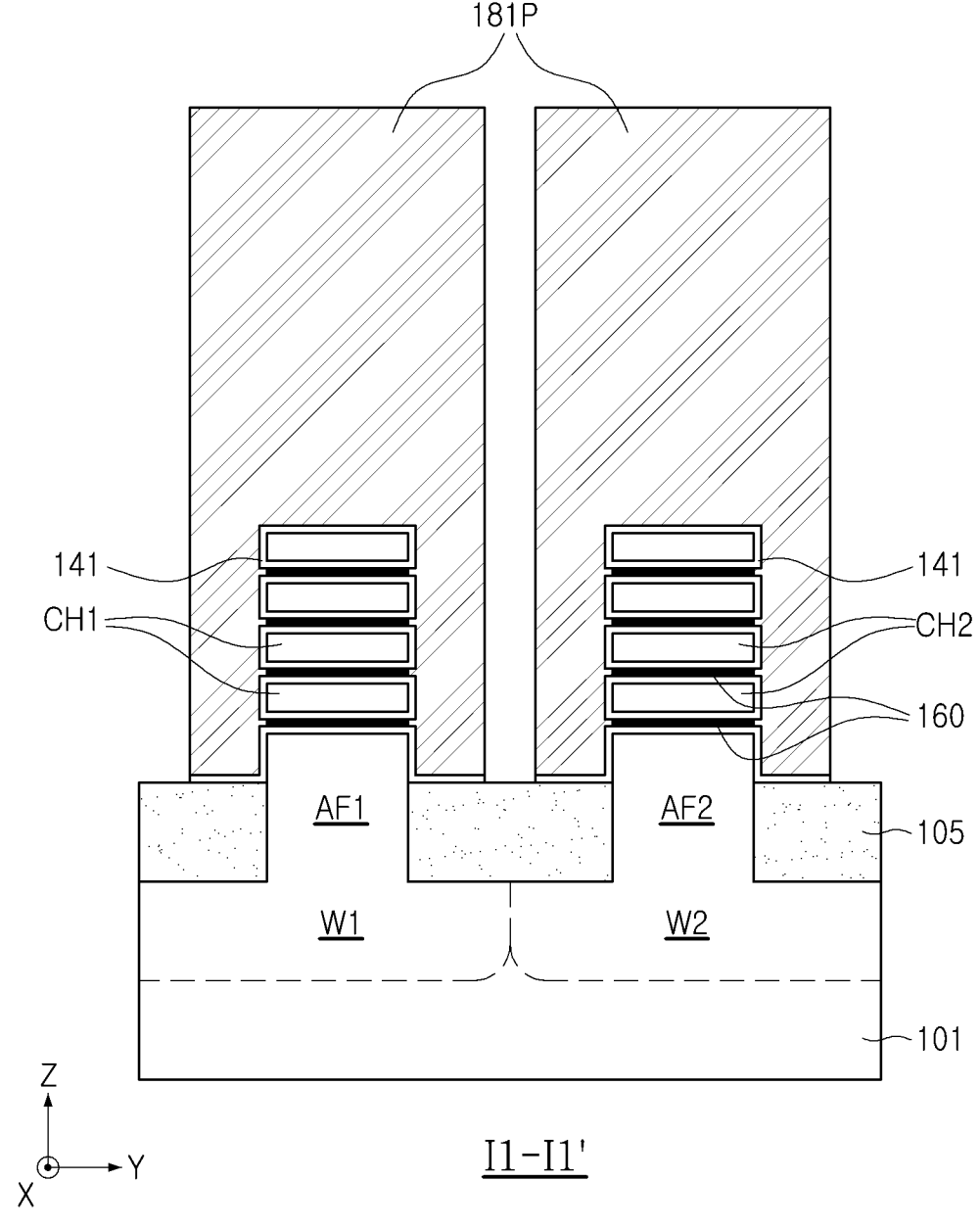
FIGS. 32A and 33A, FIGS. 32B and 33B, and FIGS. 32C and 33C are cross-sectional views of main processes illustrating a method of fabricating a semiconductor device, according to an embodiment (see FIGS. 5A to 5D), respectively.
Figure 32B:
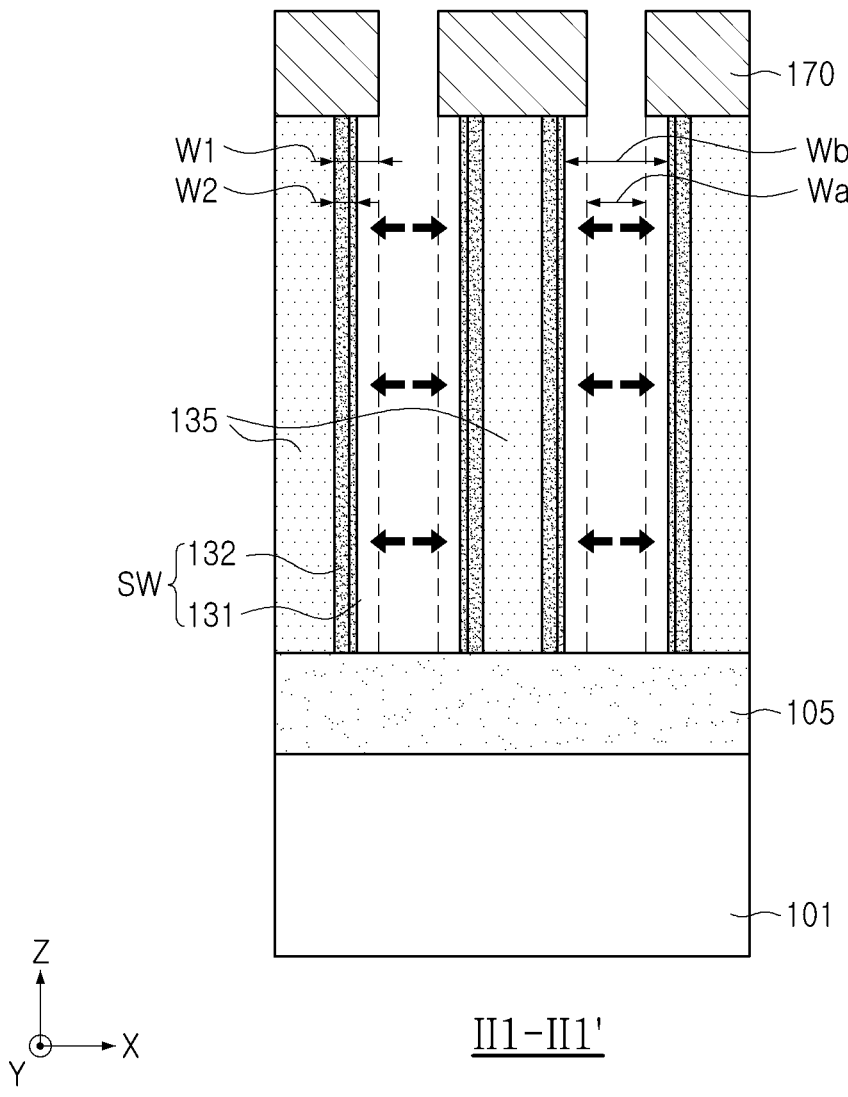
Figure 32C:
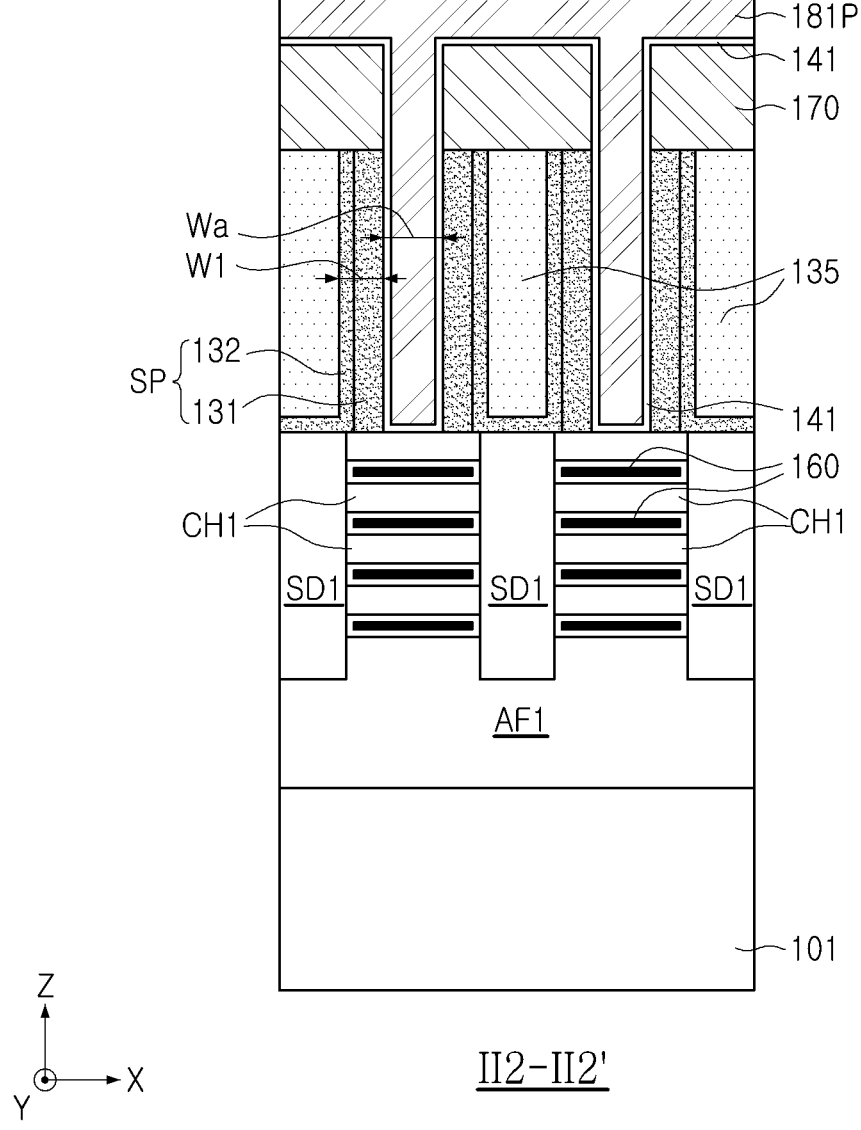

Referring to FIGS. 32A to 32C, after the process illustrated in FIGS. 18A to 18D, an etching process may be additionally performed on a sidewall portion SW exposed to a gate separation space, in particular, a sidewall spacer 131. As a thickness of the sidewall spacer 131 is decreased, a thickness of the sidewall portion SW may be decreased from W1 to W2. Accordingly, a width of the gate separation space in the first direction may be increased from Wa to Wb. In the present embodiment (FIGS. 32B and 32C), the width Wb of the gate separation pattern 151 in the first direction may be greater than the width Wa of the first and second gate electrode layers 142 and 145 in the first direction. A decrease in thickness depending on etching may vary. For example, unlike the present embodiment, the sidewall spacer 131 may be entirely etched or a portion of an etch-stop layer 132 may be etched in the sidewall portion SW.

Figure 33A:
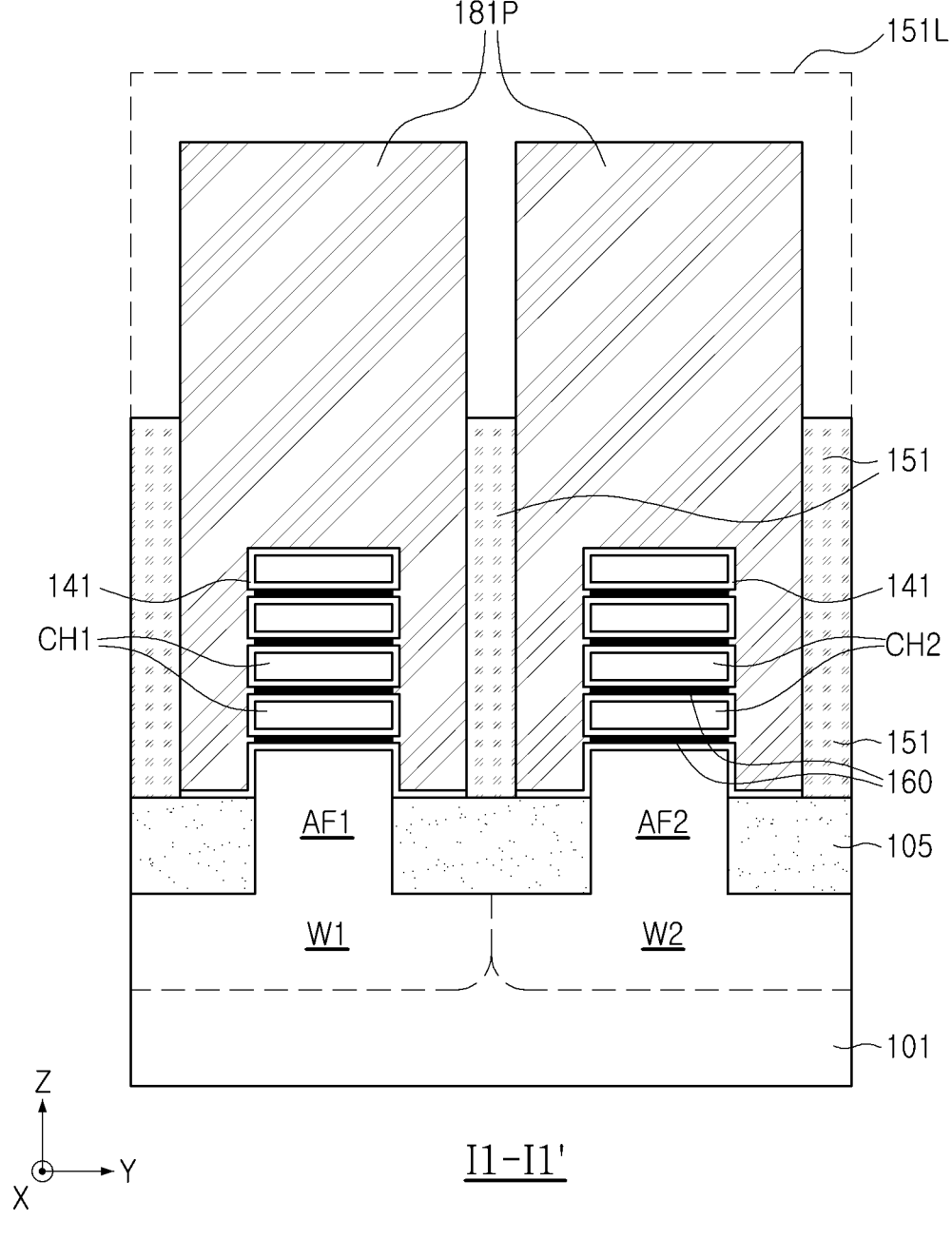
Figure 33B:
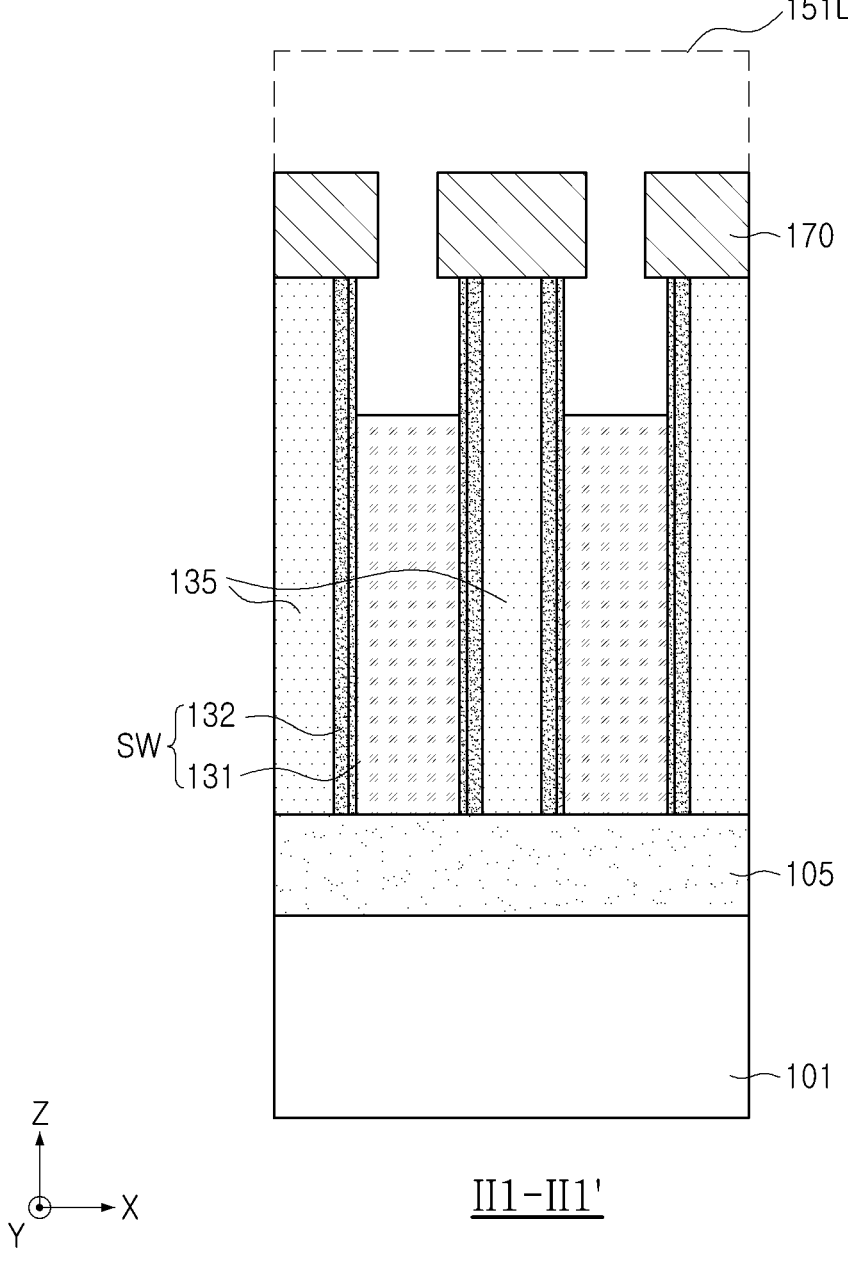
Figure 33C:
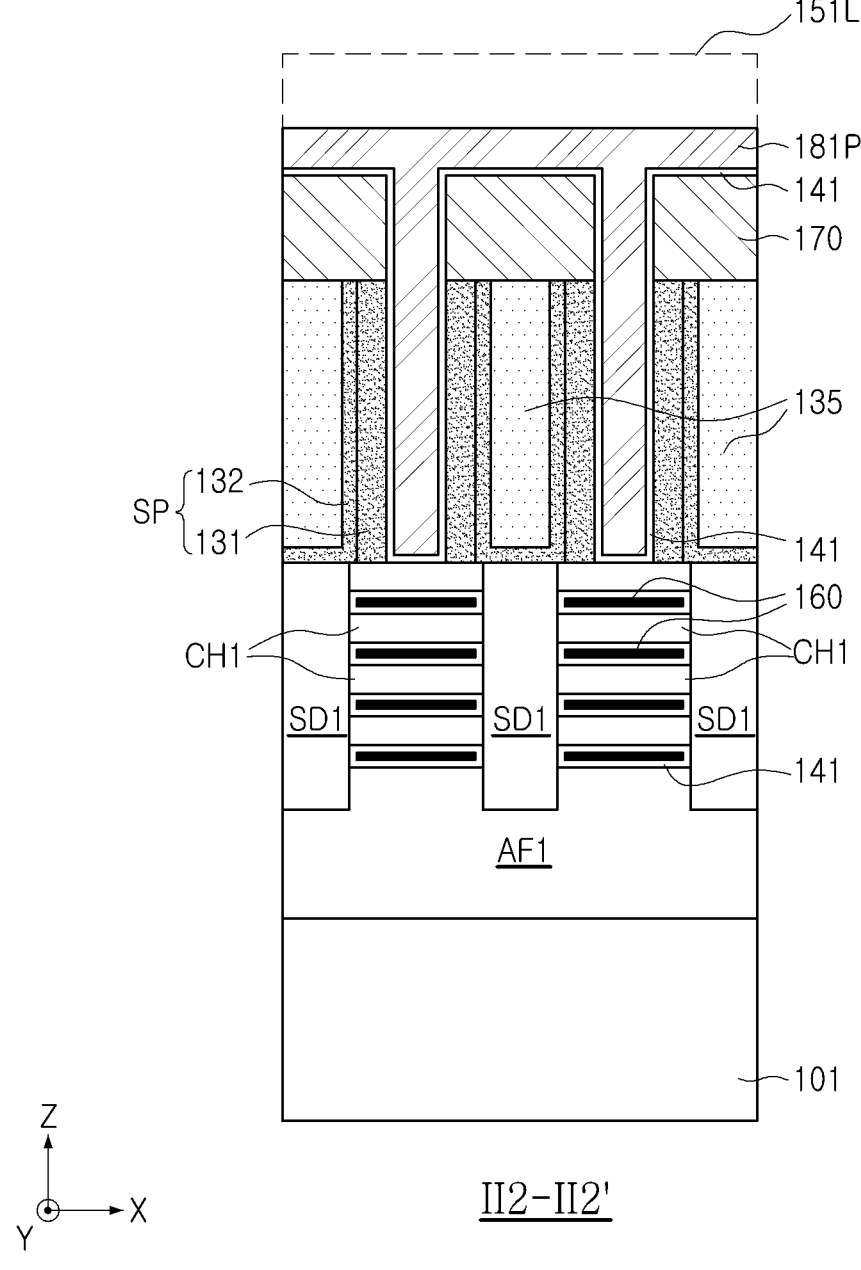

Referring to FIGS. 33A to 33C, an insulating layer 151L for gate separation may be formed and then etched back to form a gate separation pattern 151 having a first height (see FIGS. 19A to 19D).

As a subsequent process, a series of processes described with reference to FIGS. 20A to 23D may be additionally performed to fabricate the semiconductor device 100C illustrated in FIGS. 5A to 5D.

FIGS. 34A to 37A and FIGS. 34B to 37B are cross-sectional views of main processes illustrating a method of fabricating a semiconductor device, according to an embodiment (see FIGS. 6A to 6C), respectively. The method of fabricating a semiconductor device according to the present embodiment may be another example of the method of fabricating the semiconductor device 100C illustrated in FIGS. 6A to 6C.

Figure 34A:
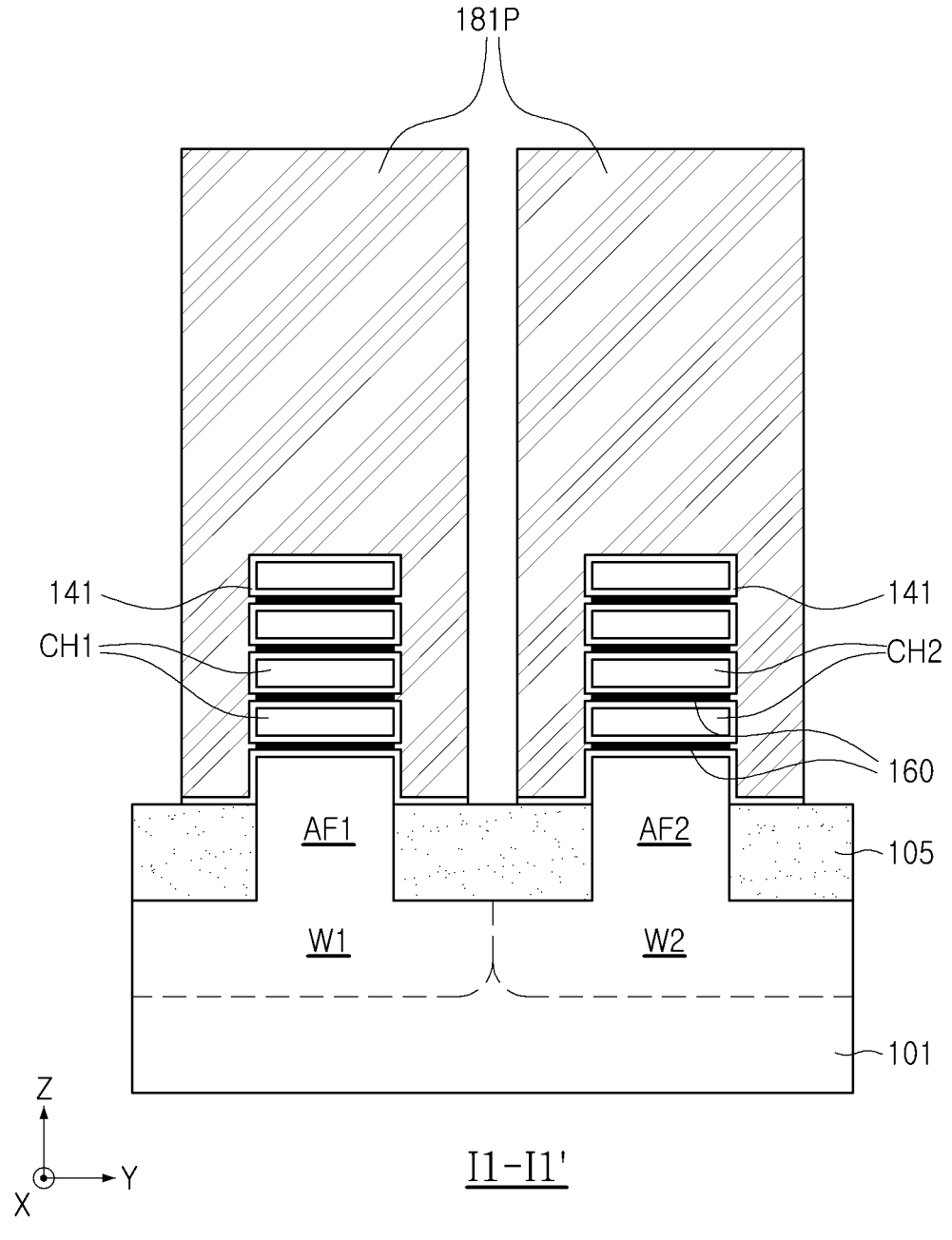
Figure 34B:
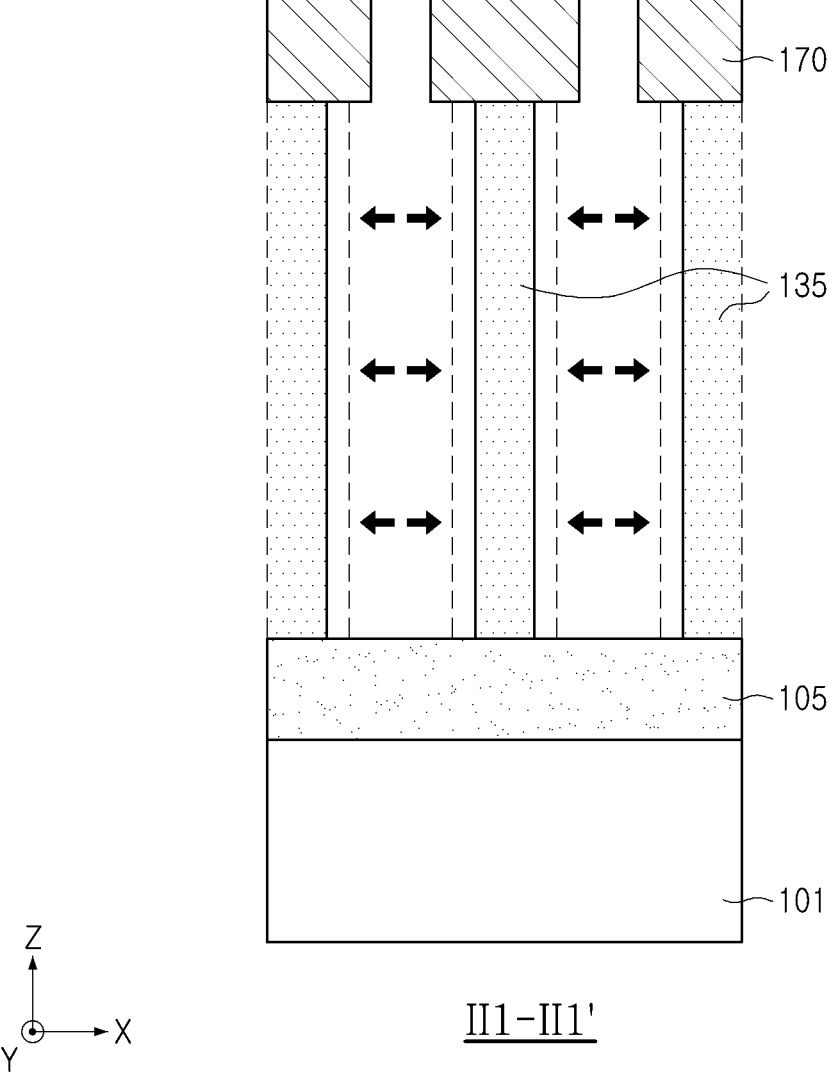
Figure 35A:
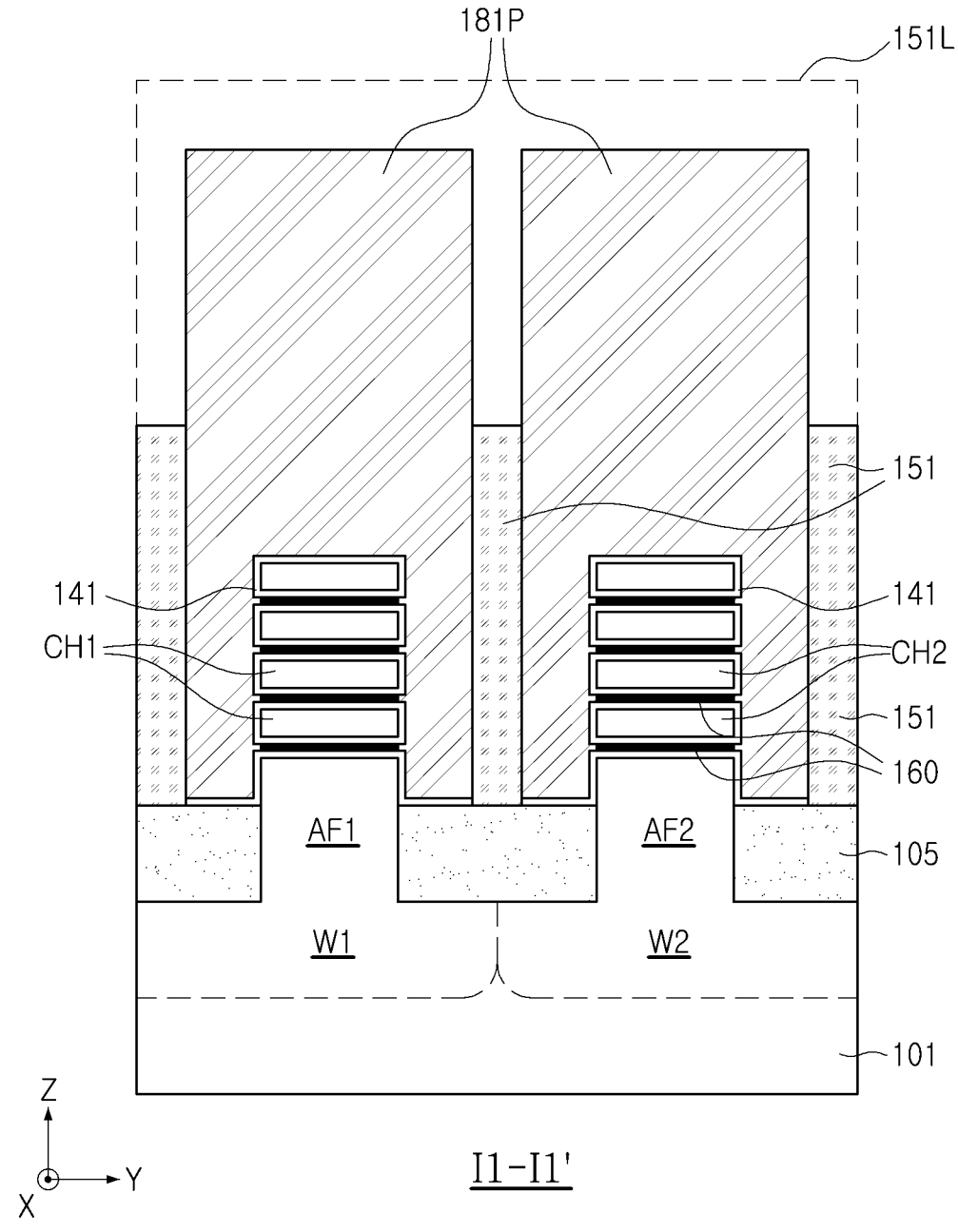
Figure 35B:
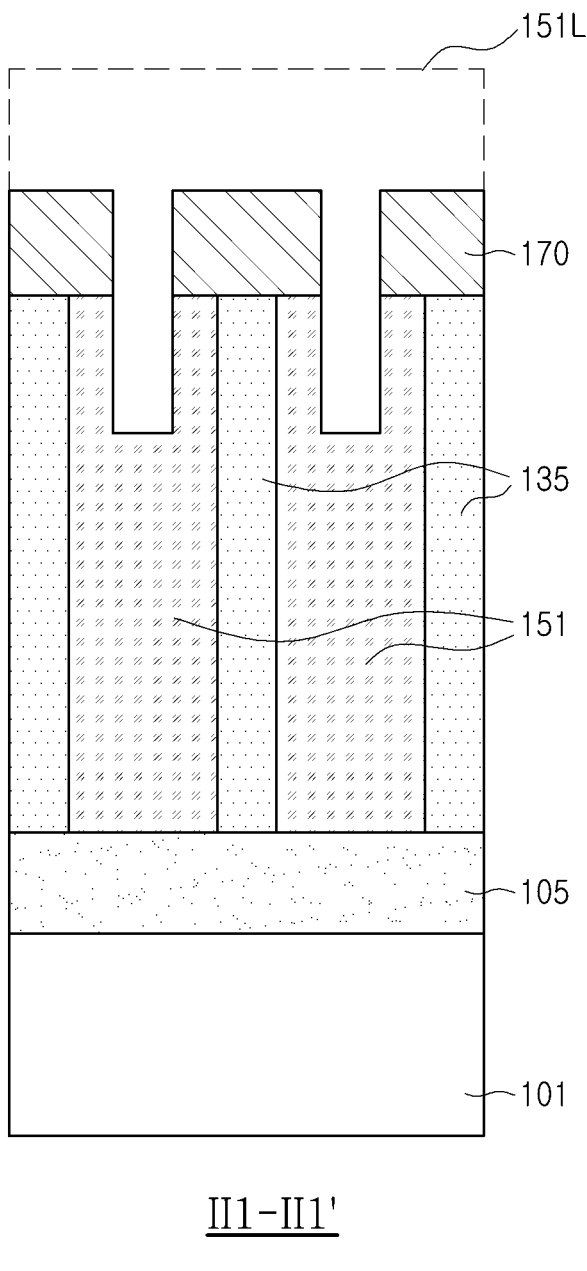

Referring to FIGS. 34A and 34B, after the process illustrated in FIGS. 18A to 18D, an etching process may be performed to remove all portions of a sidewall spacer 131 and an etch-stop layer 132 additionally exposed to a gate separation space. Accordingly, a width of the gate separation space in the first direction may be increased by a width of the removed portions. Referring to FIGS. 35A and 35B, an insulating layer 151L for gate separation may be formed and then etched back to form a gate separation pattern 151 having a first height (see FIGS. 19A to 19D).

Figure 36A:
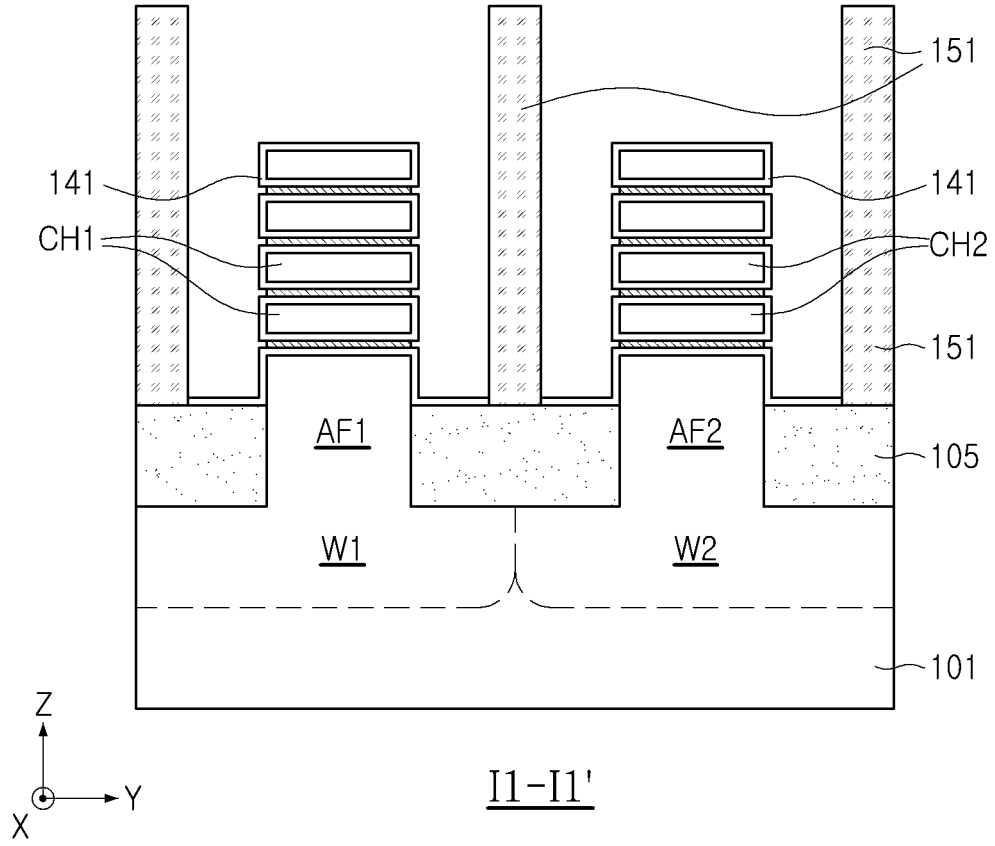
Figure 36B:
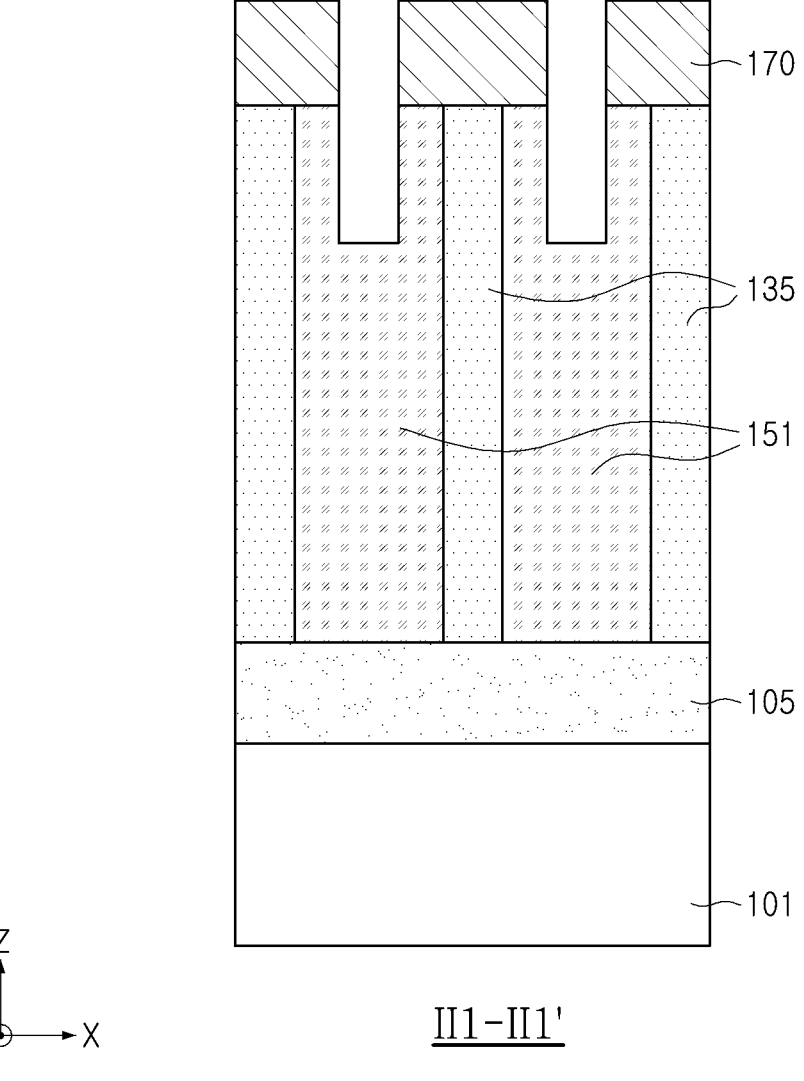

Referring to FIGS. 36A and 36B, an organic pattern layer 181P and a protective metal layer 160 may be removed to prepare a gate electrode formation space SG' (see FIGS. 20A to 20D). Referring to FIGS. 34B and 35B in a series of processes according to the present embodiment, a gate separation pattern 151 may be formed to extend to a region in which a gate spacer portion disposed in the gate separation space is removed, and a central region of the gate separation pattern 151 may be slightly lowered in the etch-back process of the insulating layer 151L for gate separation.

Figure 37A:
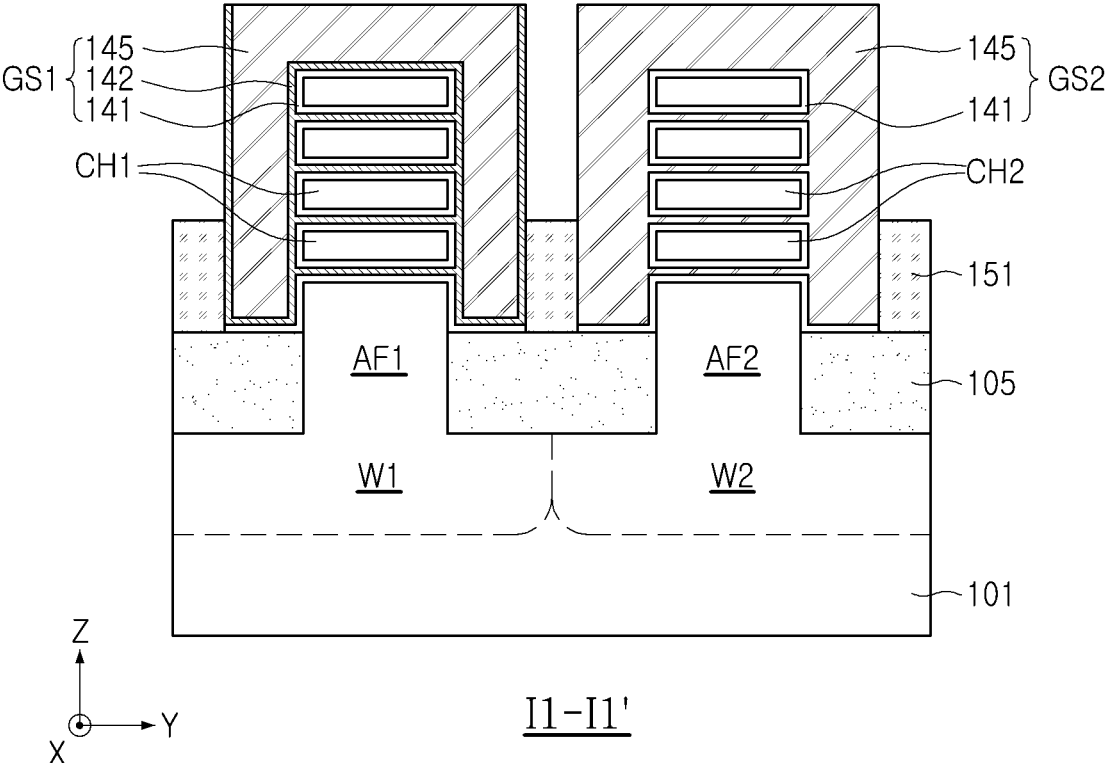
Figure 37B:
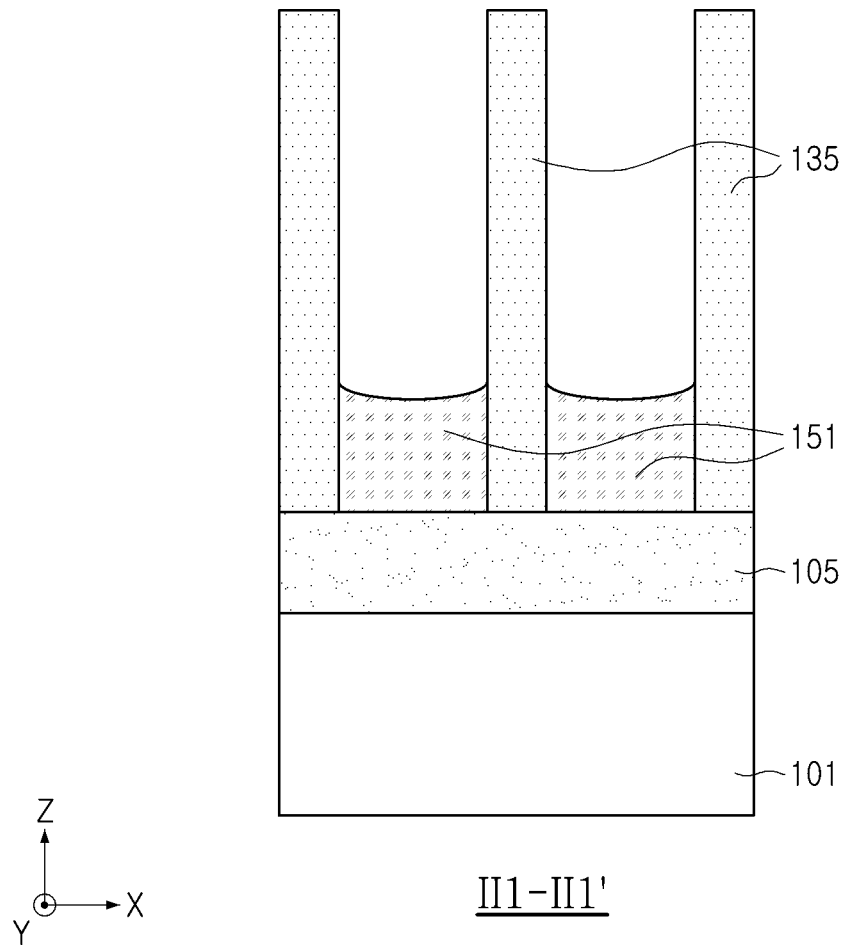

Referring to FIGS. 37A and 37B, gate electrode layers 142 and 145 may be formed in a gate electrode formation space SG' (see FIGS. 21A to 21D), and the second gate electrode layer 145 may be recessed to have a desired height (see FIGS. 22A to 22D).

In the present embodiment, after the first gate electrode layer 142 and the second gate electrode layer 145 are formed in the gate electrode formation space SG', the second gate electrode layer 145 may be planarized. Subsequent to the planarization process, the second gate electrode layer 145 may be additionally etched back to divide the first and second gate electrode layers 142 and 145 by gate separation patterns 151. In addition, during a process of recessing the second gate electrode layer 145, the gate separation pattern 151 may also be partially etched to have a second height smaller than the first height.

As illustrated in FIG. 37B, the gate separation pattern 151 formed in the present embodiment may have a width increased to fill a gap between interlayer insulating layers 131 in the first direction. Accordingly, the width of the gate separation pattern 151 in the first direction may correspond to a width of the gate capping layer 155, disposed on an upper surface of the gate separation pattern 151, in the first direction.

As a subsequent process, a series of processes described with reference to FIGS. 23A to 23D may be additionally performed to fabricate the semiconductor device 100D illustrated in FIGS. 6A to 6C.

FIGS. 38A and 39A, FIGS. 38B and 39B, and FIGS. 38C and 39C are cross-sectional views of main processes illustrating a method of fabricating a semiconductor device, according to an embodiment (see FIGS. 7A to 7C), respectively. The method of fabricating a semiconductor device according to the present embodiment may be another example of the method of fabricating the semiconductor device 100C illustrated in FIGS. 7A to 7C.

Figure 38A:
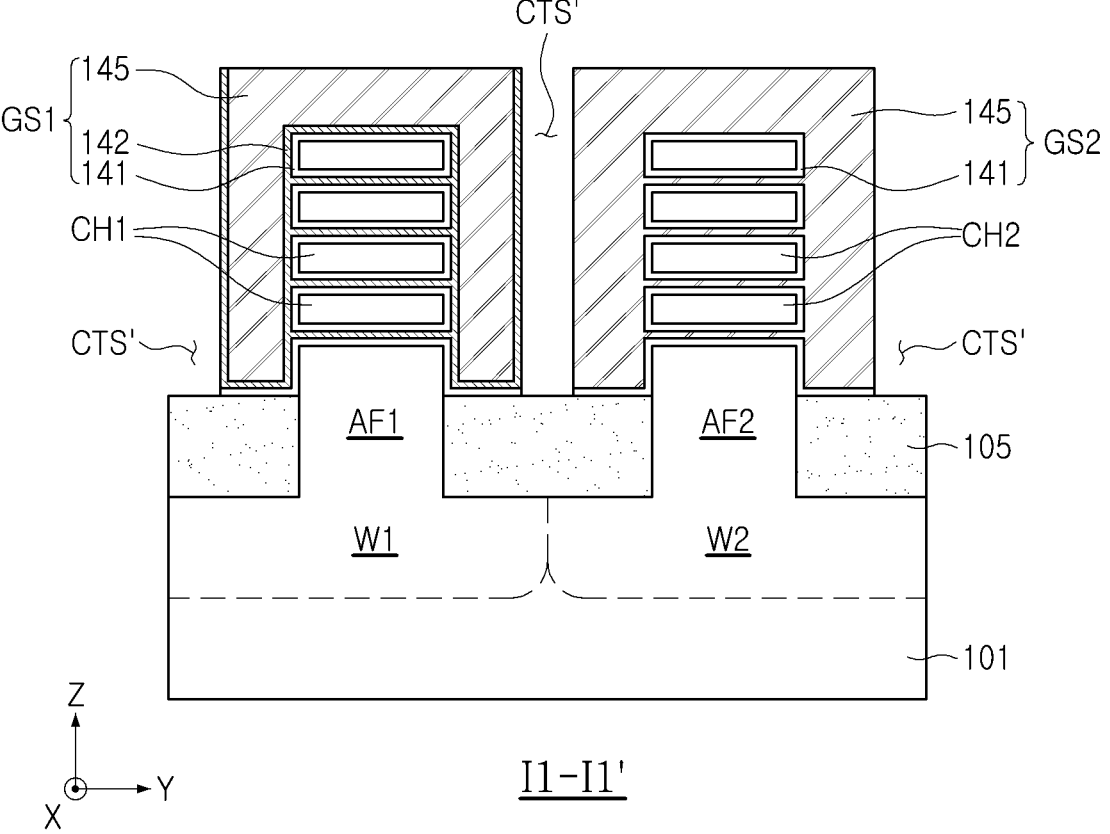
FIGS. 38A and 39A, FIGS. 38B and 39B, and FIGS. 38C and 39C are cross-sectional views of main processes illustrating a method of fabricating a semiconductor device, according to an embodiment (see FIGS. 7A to 7C), respectively.
Figure 38B:
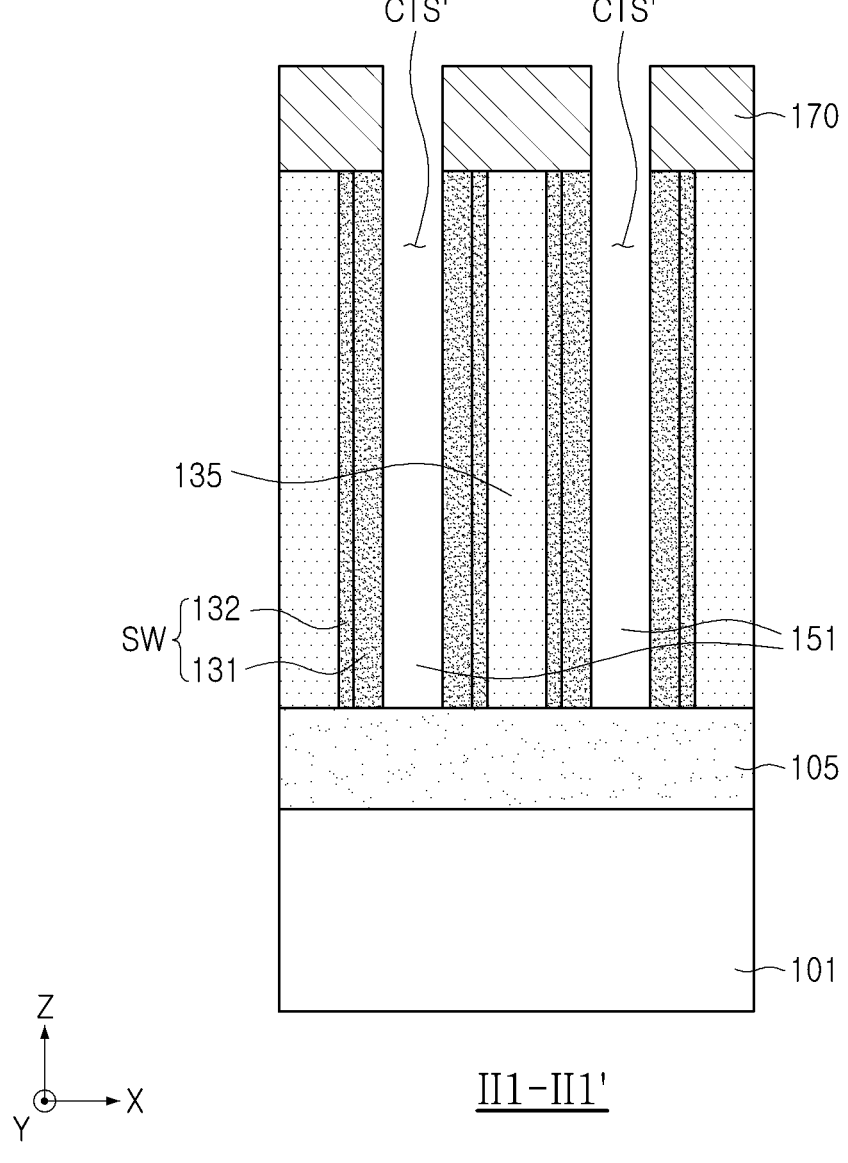
Figure 38C:
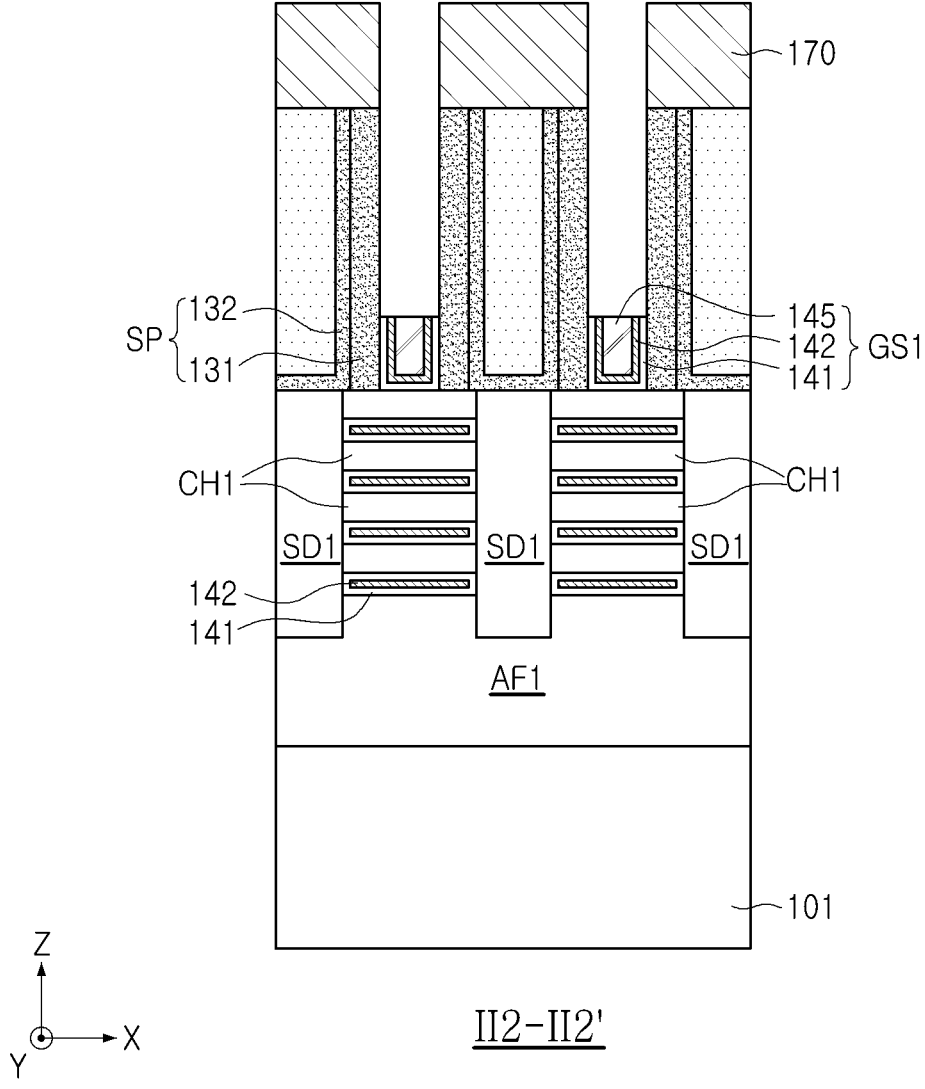

Referring to FIGS. 38A to 38C, after the process illustrated in FIGS. 22A to 22D, an additional etching process may be performed such that a gate separation pattern 151 may be removed to re-secure a gate separation space CTS'. In some embodiments, the gate separation pattern 151, unintentionally exposed in a process of recessing the second gate electrode layer 145, may be removed without an additional etching process.

Figure 39A:
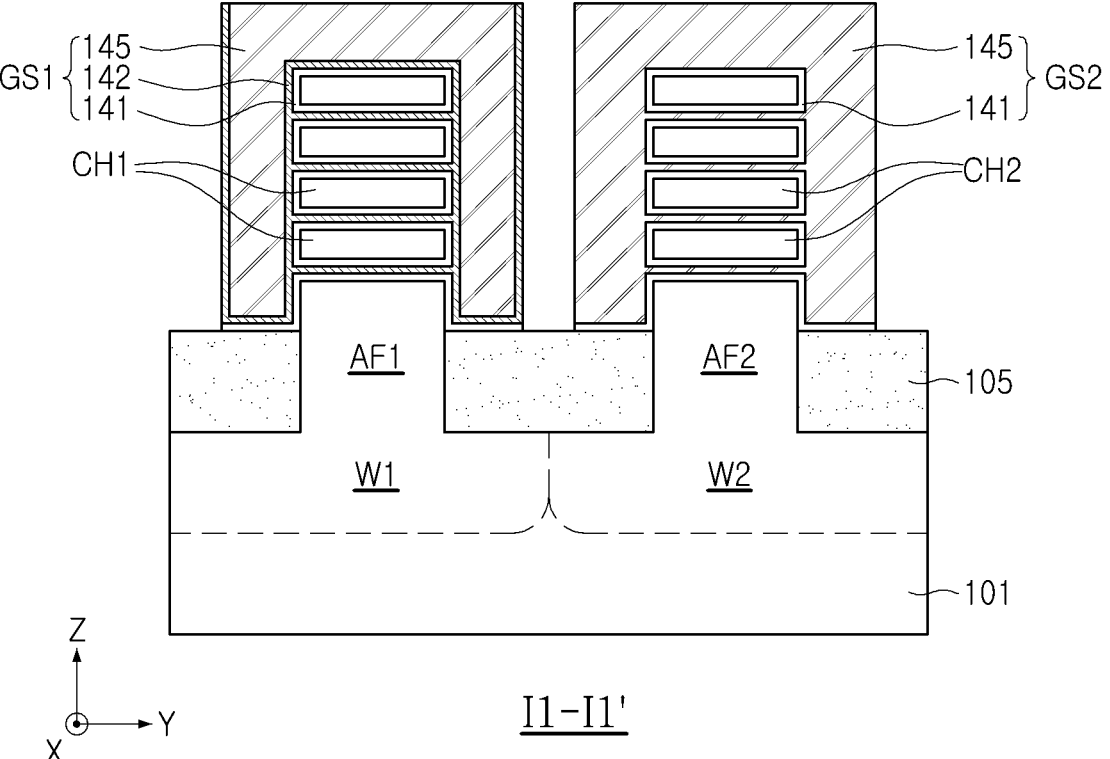
Figure 39B:
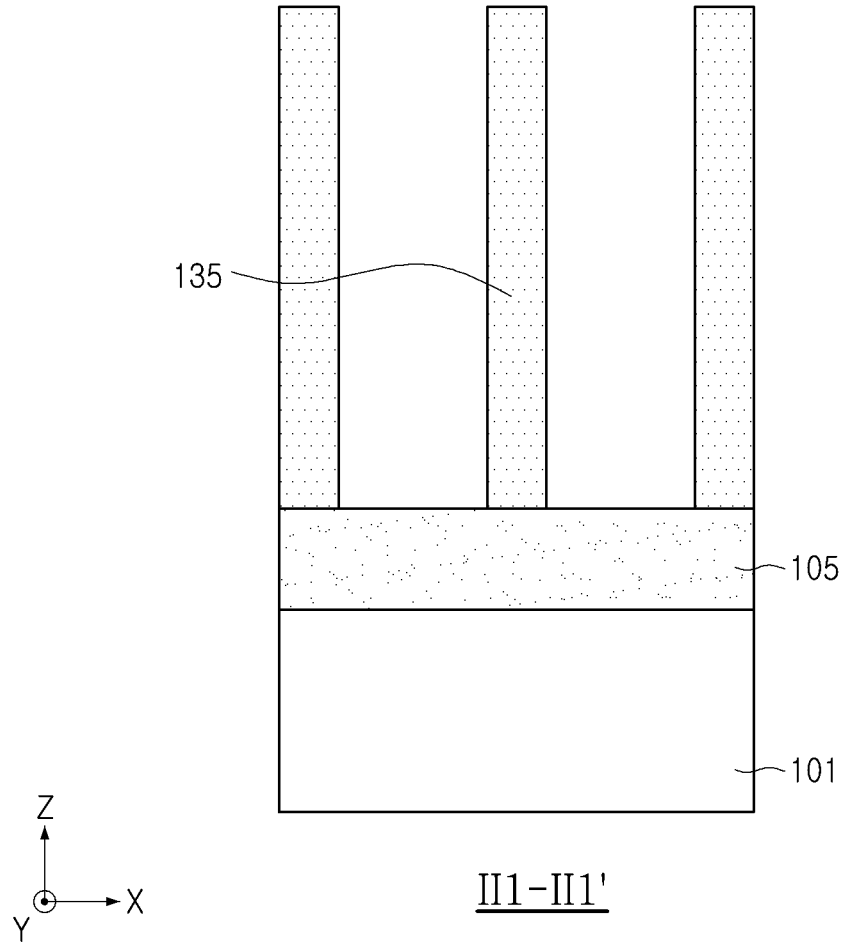
Figure 39C:
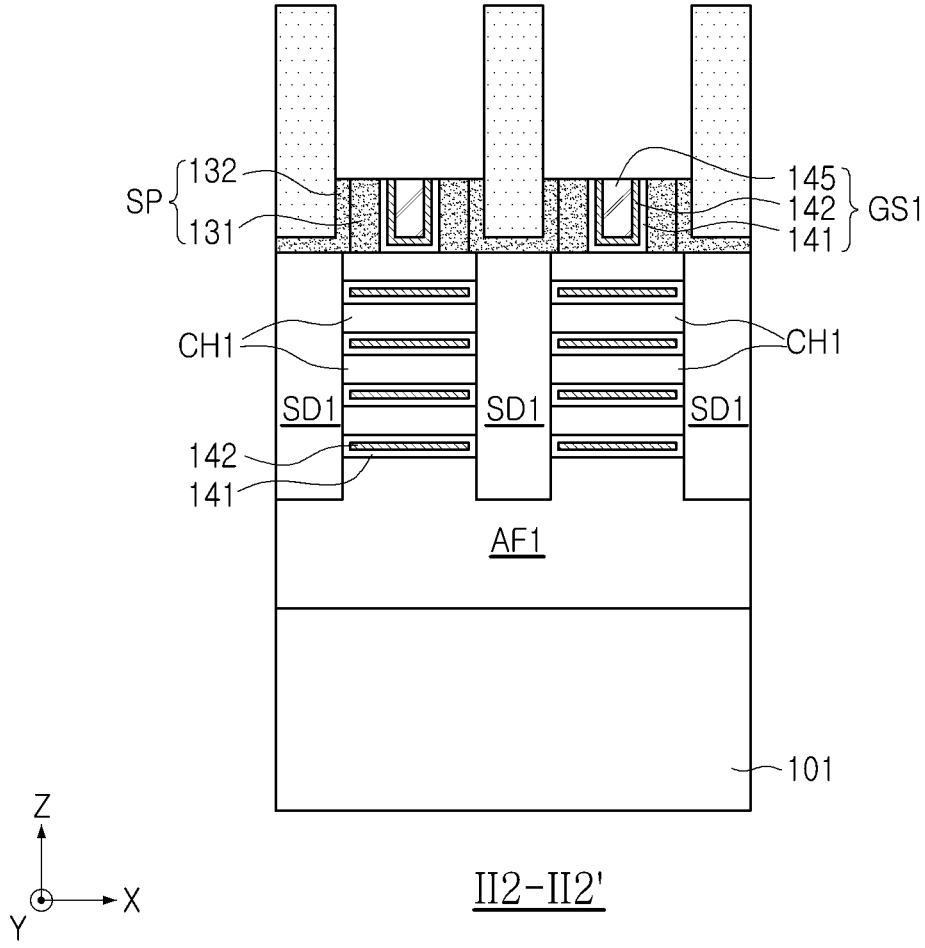

Referring to FIGS. 39A to 39C, an etching process may be performed on an ILD protective layer 170 and a gate spacer SP. The present selective etching process may be performed to remove the ILD protective layer 170 and the exposed gate spacer SP while allowing an interlayer insulating layer 135 to remain. As illustrated in FIG. 39B, the gate spacers SP exposed to the gate separation space may be completely removed.

Next, a gate capping layer 155' may be formed to fabricate the semiconductor device 100E illustrated in FIGS. 7A to 7C. The gate capping layer 155' may have a first region 155a, disposed on first and second gate structures GS1 and GS2, and a second region 155b' extending to a space between the first and second gate structures GS1 and GS2. Unlike the extension portion 155b of the previous embodiments, the second region 155b' may extend to a device isolation layer 105 to be provided as a single gate separation structure. In the present embodiment, the first region 155a and the second region 155b' may be formed of a single component system, that is, a single integrated structure.

FIGS. 40A and 41A, FIGS. 40B and 41B, and FIGS. 40C and 41C are cross-sectional views of main processes illustrating a method of fabricating a semiconductor device, according to an embodiment, respectively. The method of fabricating a semiconductor device according to the present embodiment may be a modified example of the method of fabricating the semiconductor device 100A illustrated in FIGS. 1A to 1E.

Figure 40A:
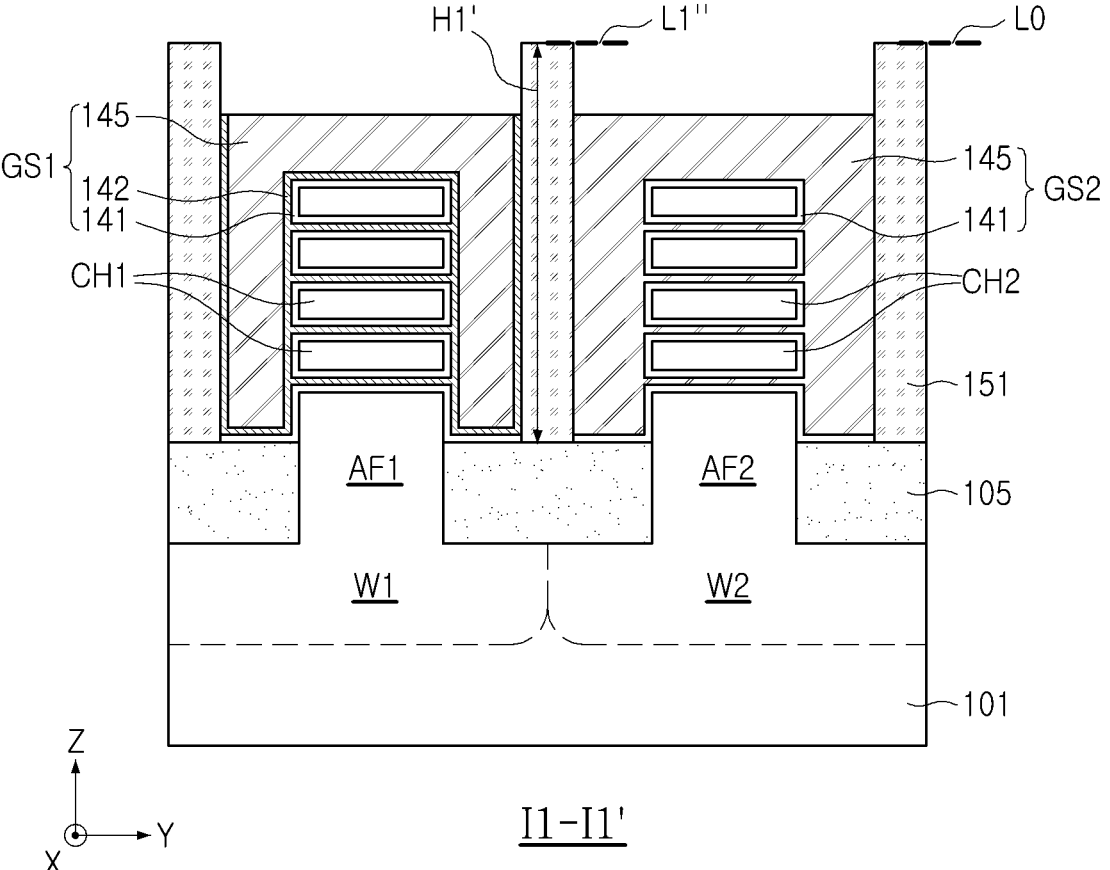
FIGS. 40A and 41A, FIGS. 40B and 41B, and FIGS. 40C and 41C are cross-sectional views of main processes illustrating a method of fabricating a semiconductor device, according to an embodiment, respectively.
Figure 40B:
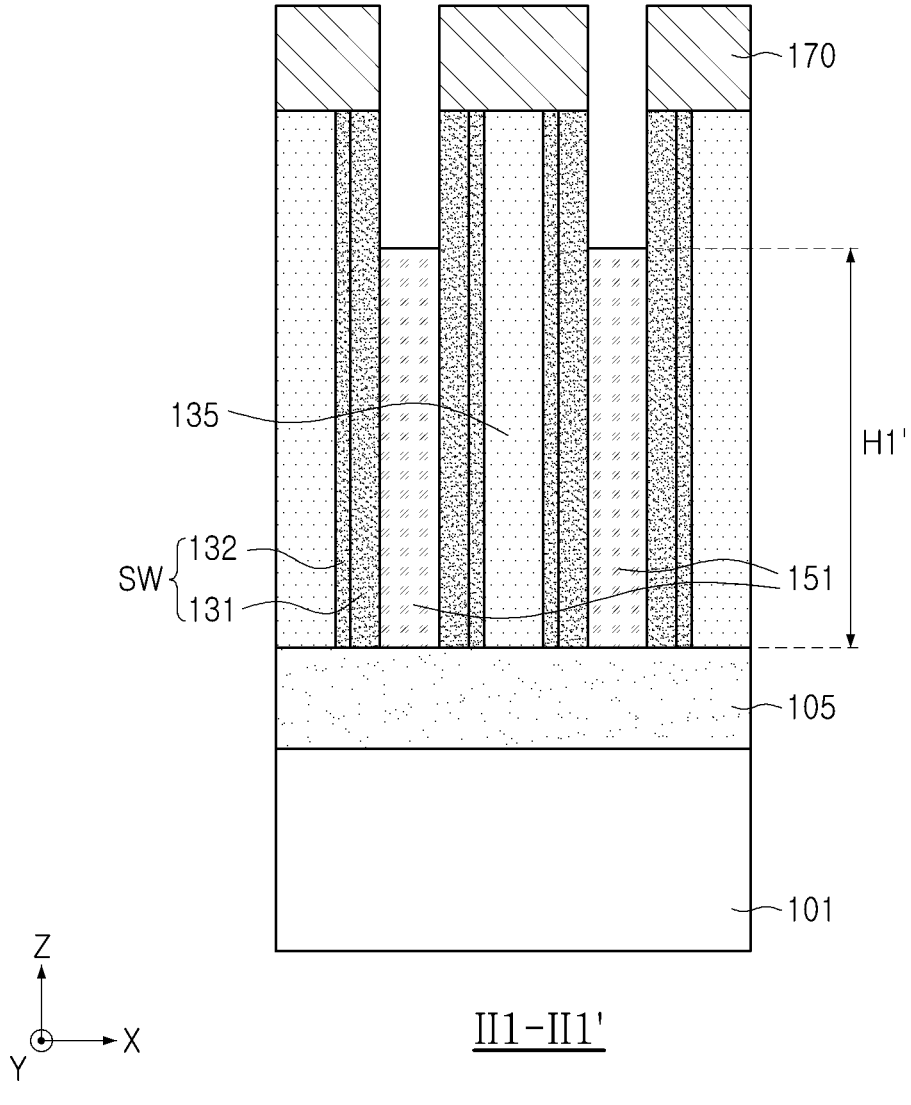
Figure 40C:
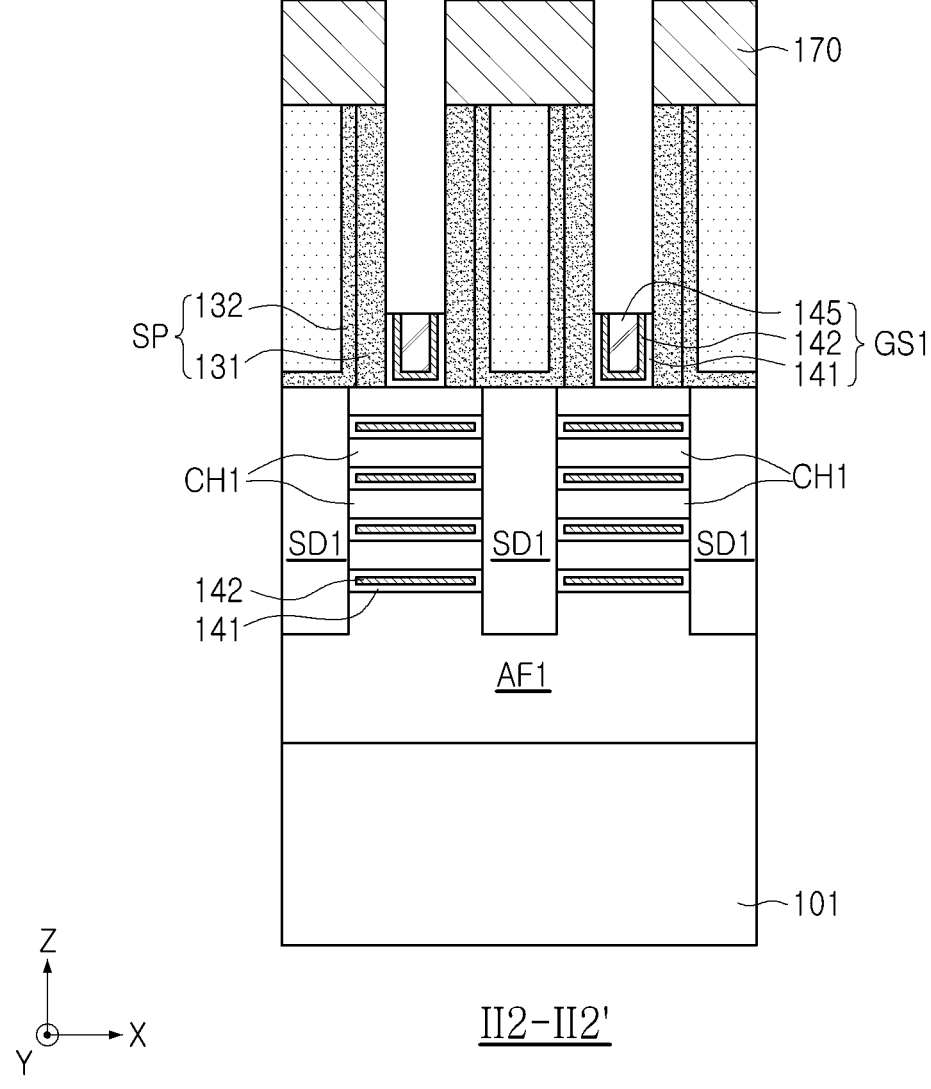

Referring to FIGS. 40A to 40C, after the process illustrated in FIGS. 21A to 21D, a second gate electrode layer 145 may be recessed to have a desired height. In the present embodiment, a gate separation pattern 151 may be maintained to have a relatively large height H1'. In the process of recessing the second gate electrode layer 145, unlike the previous embodiment (see FIG. 22A), an upper level L1'' of the gate separation pattern 151 may be higher than an upper level L0 of the second gate electrode layer 145.

Figure 41A:
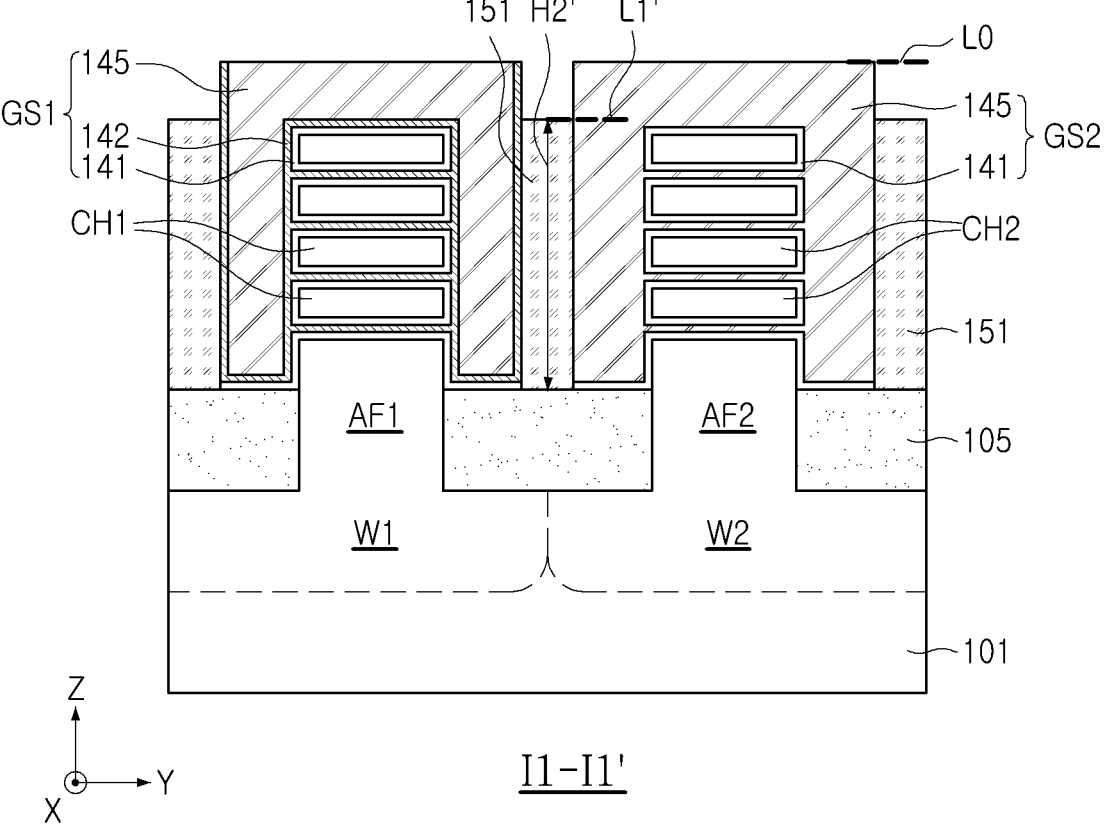
Figure 41B:
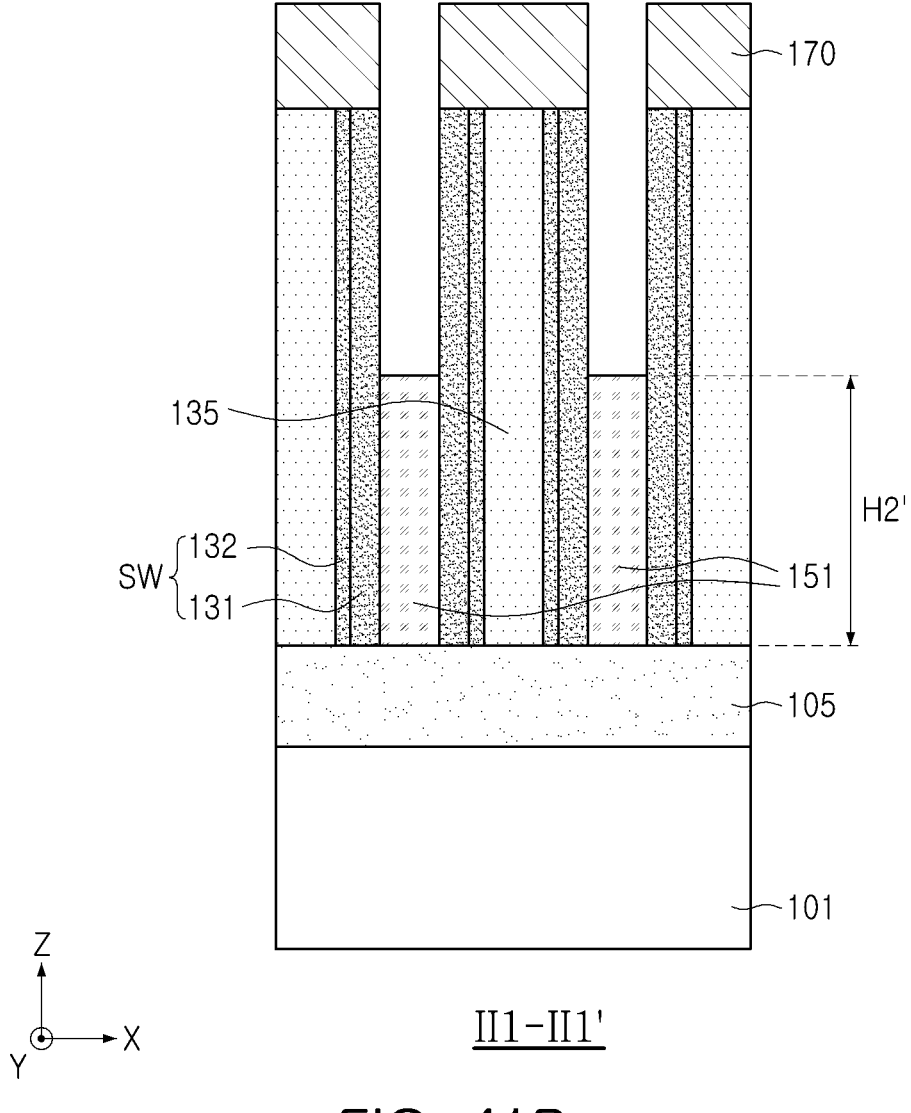
Figure 41C:
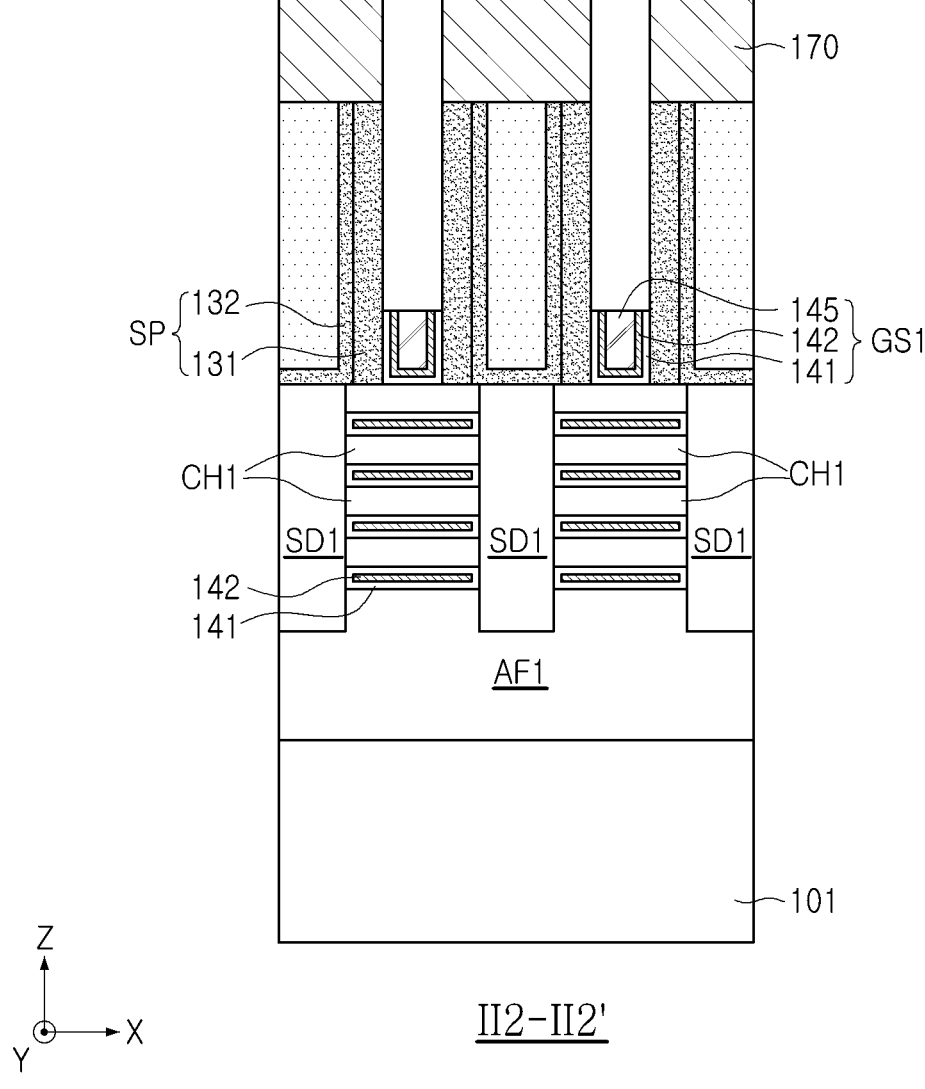

Referring to FIGS. 41A to 41C, after the process of recessing the second gate electrode layer 145, the gate separation pattern 151 may be additionally etched back to form a gate separation pattern 151 having a second height smaller than a first height of the gate separation pattern 151. As described above, an upper level L1' of the gate separation pattern 151 may be lower than an upper level L0 of the second gate electrode layer 145 through an additional etch-back process.

As a subsequent process, a series of processes described with reference to FIGS. 23A to 23D may be additionally performed to fabricate the semiconductor device 100 illustrated in FIGS. 1A to 1E.

Figure 42A:
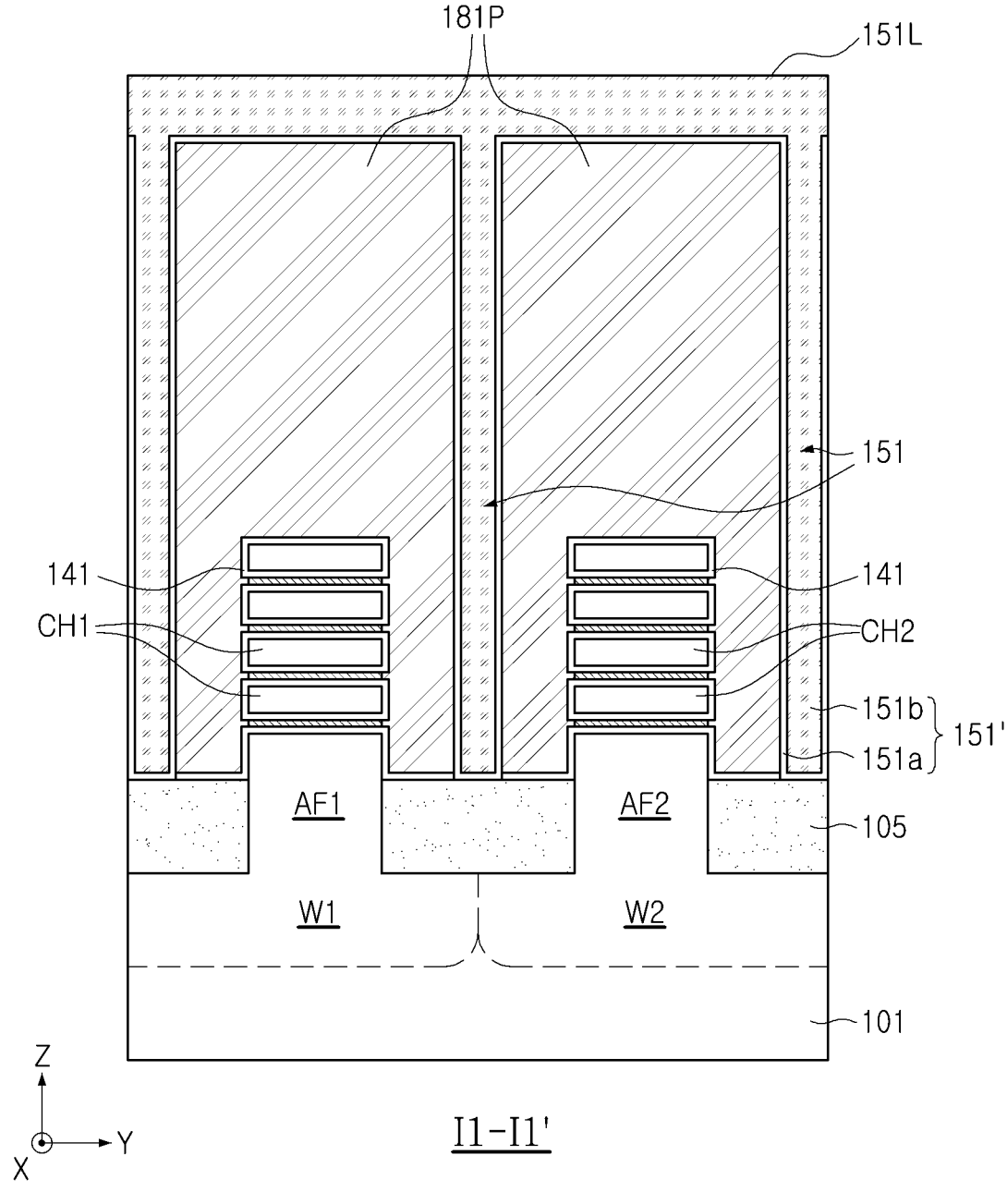
FIGS. 42A and 42B are cross-sectional views of main processes illustrating a method of fabricating a semiconductor device, according to an embodiment (see FIGS. 8A to 8C), respectively.
Figure 42B:
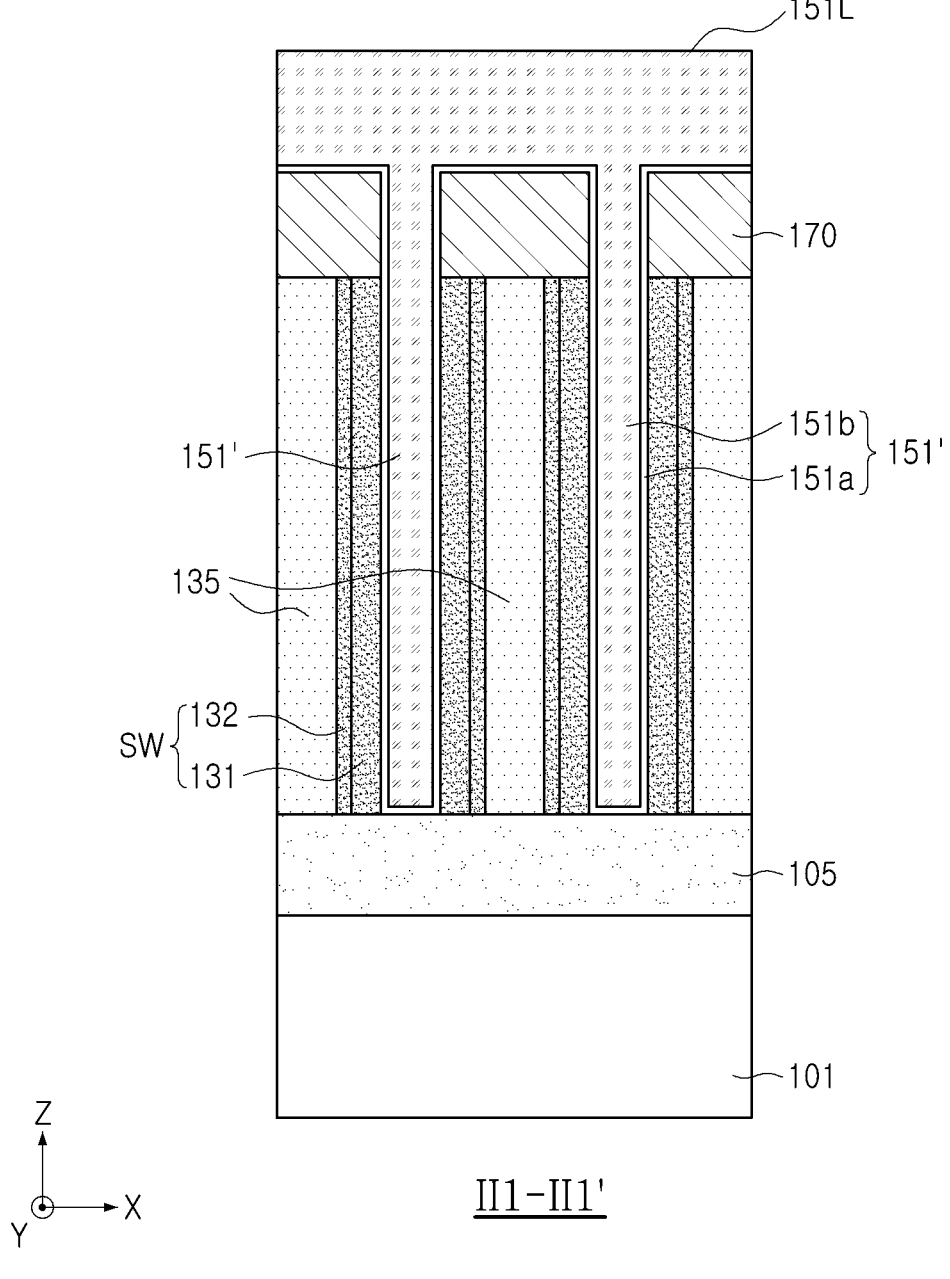

FIGS. 42A and 42B are cross-sectional views of main processes illustrating a method of fabricating a semiconductor device, according to an embodiment (see FIGS. 8A to 8C), respectively. The method of fabricating a semiconductor device according to the present embodiment may be another example of the method of fabricating the semiconductor device 100F illustrated in FIGS. 8A to 8C.

Referring to FIGS. 42A and 42B, after the process illustrated in FIGS. 18A to 18D, a barrier layer 151a may be conformally formed on an exposed surface of a gate separation space, and a separation region 151b may fill a remaining space (also referred to as a "separation region"). As describe above, an insulating layer 151L for gate separation may include a plurality of insulating layers. For example, the separation region 151b may include silicon oxide ($SiO_x$), and a barrier layer 151a may include silicon nitride ($SiN_x$), silicon oxynitride ($SiO_xN_y$), silicon carbonitride ($SiC_xN_y$), or silicon oxycarbonitride ($SiO_xC_yN_z$).

As a subsequent process, a series of processes described with reference to FIGS. 19A to 23D may be additionally performed to fabricate the semiconductor device 100F illustrated in FIGS. 8A to 8C.

FIGS. 43A to 46A, FIGS. 43B to 46B, and FIGS. 43C to 46C are cross-sectional views of main processes illustrating a method of fabricating a semiconductor device, according to an embodiment (see FIGS. 9A and 9B), respectively. The method of fabricating a semiconductor device according to the present embodiment may be another example of the method of fabricating the semiconductor device 100G illustrated in FIGS. 9A and 9B.

Figure 43A:
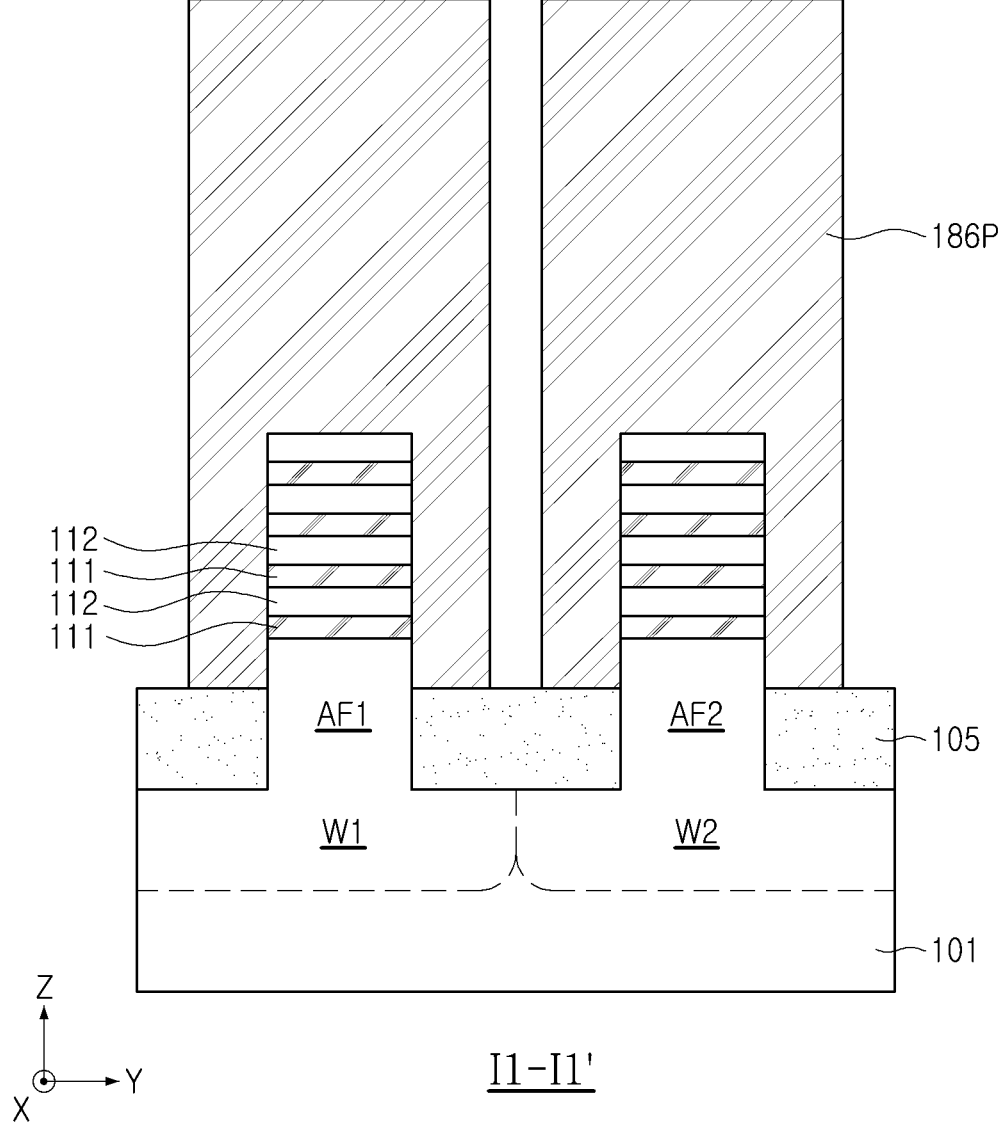
Figure 43B:
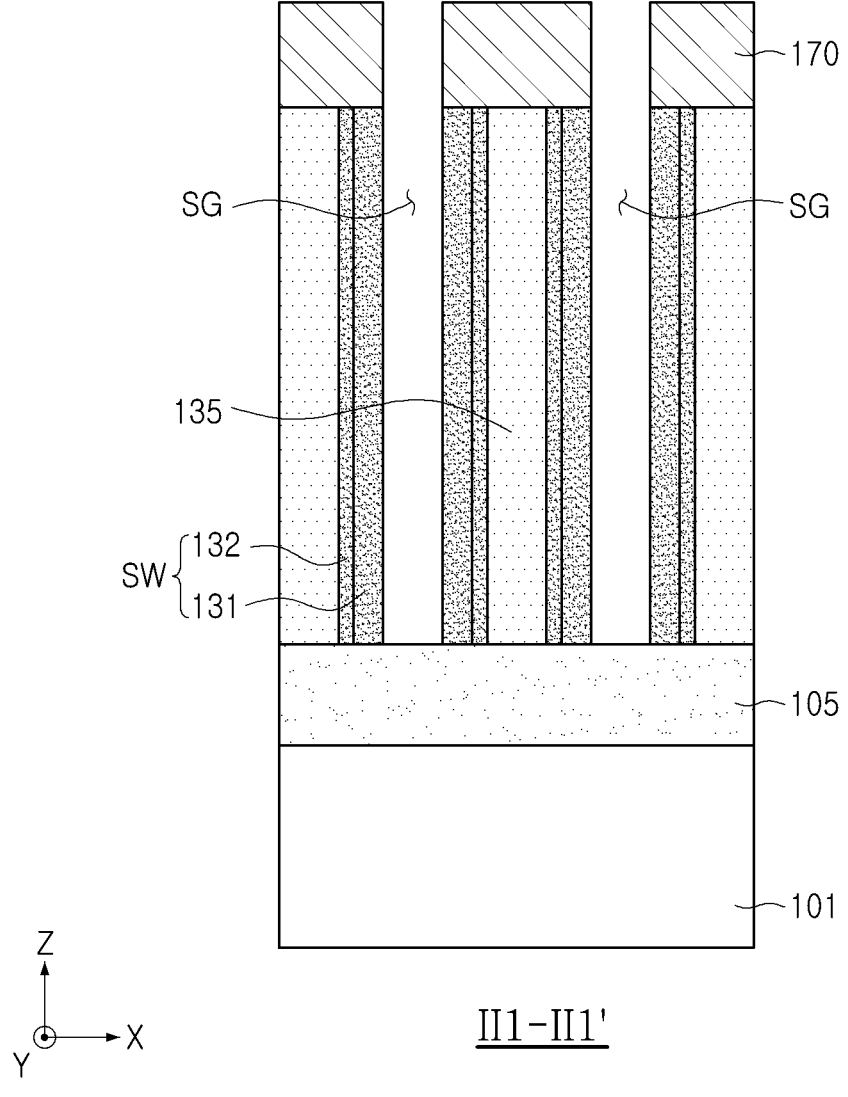
Figure 43C:
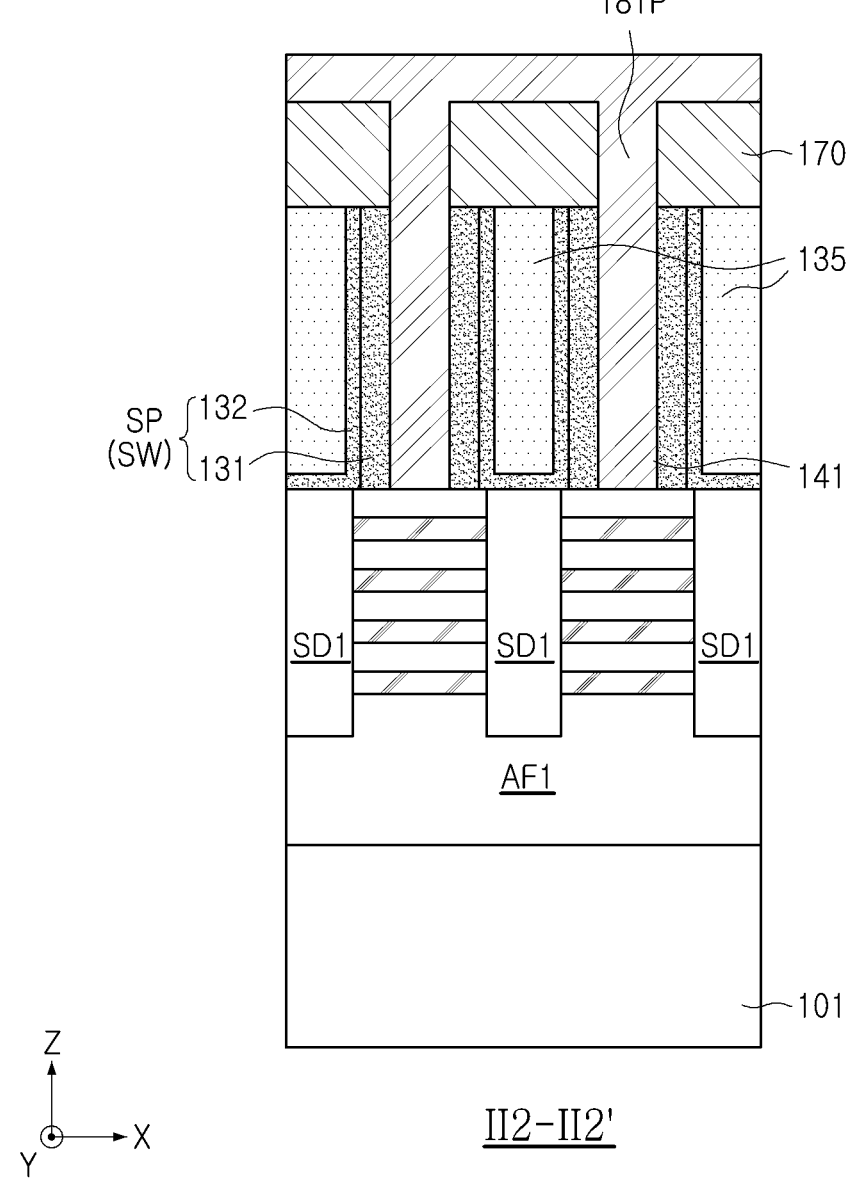

Referring to FIGS. 43A to 43C, as illustrated in FIGS. 12A to 12D, after a dummy gate pattern DG is removed, an organic planarization layer may be formed in the fin structure (FS) state in which first semiconductor patterns 111 serving as a sacrificial layer are not removed (see FIGS. 16A to 16D) and an organic planarization pattern 181P may be formed using a photomask pattern to define a gate separation space CTS (see FIGS. 17A to 17E).

Figure 44A:
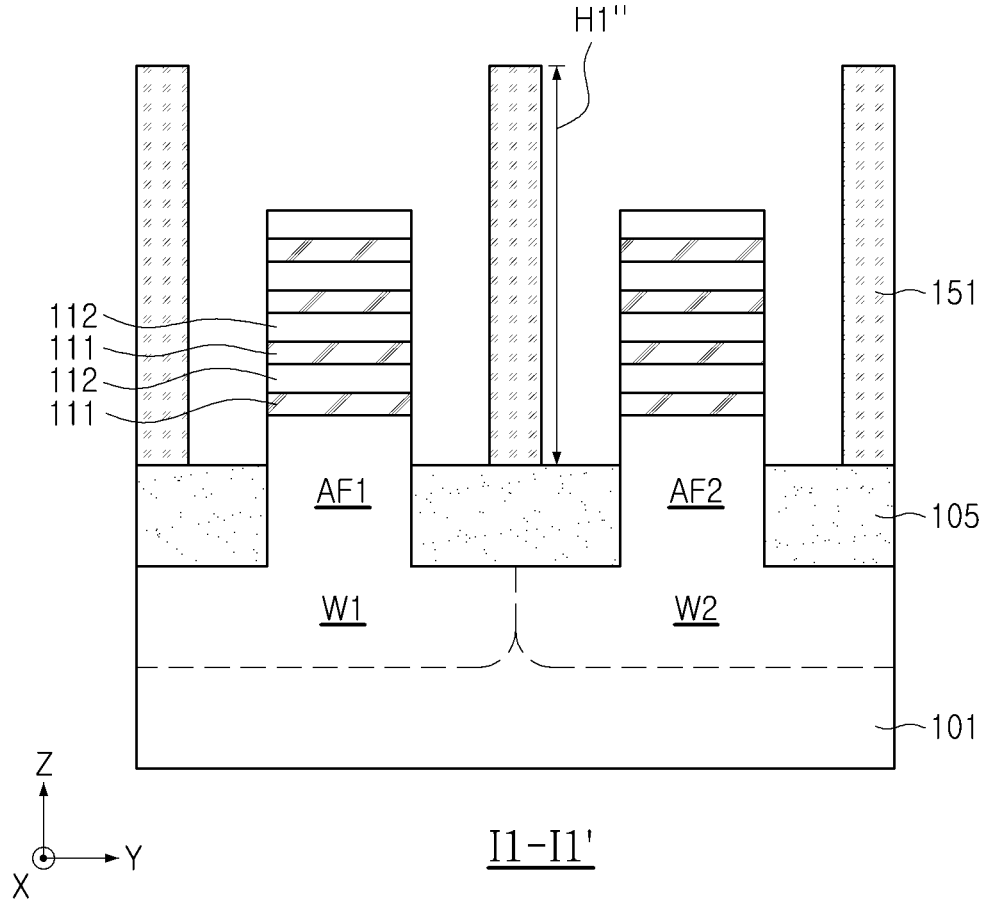
Figure 44B:
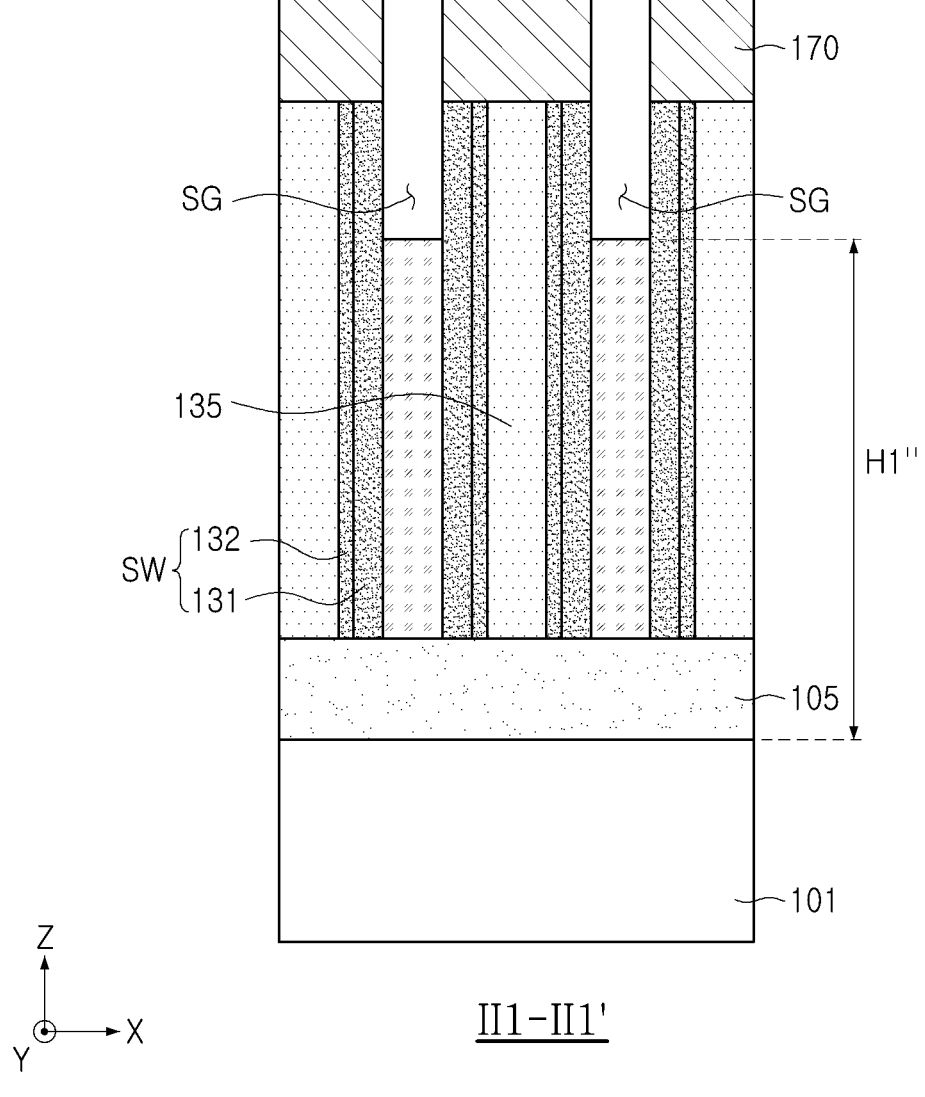
Figure 44C:
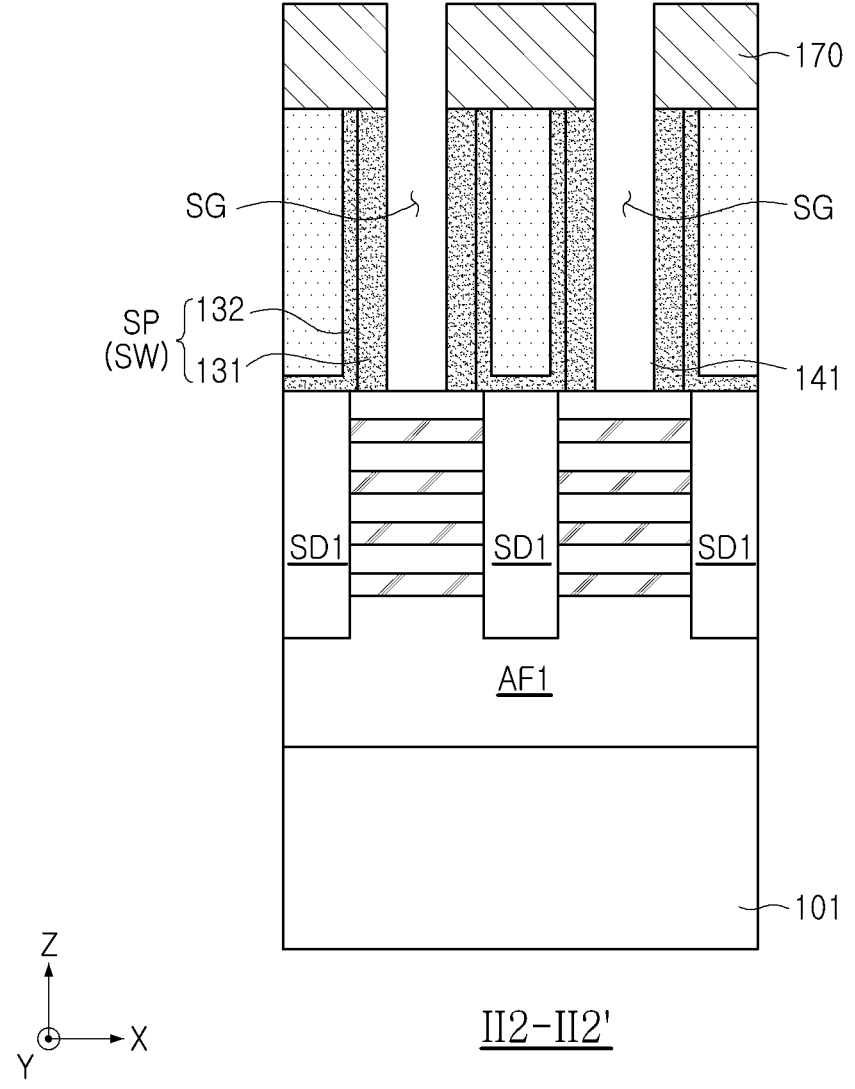

Referring to FIGS. 44A to 44C, an insulating layer for gate separation may be formed and then etched back to form a gate separation pattern 151 having a first height H1'' (FIG. 19A to 19D). Then, an organic pattern layer 181P may be removed to prepare a gate electrode formation space SG.

Figure 45A:
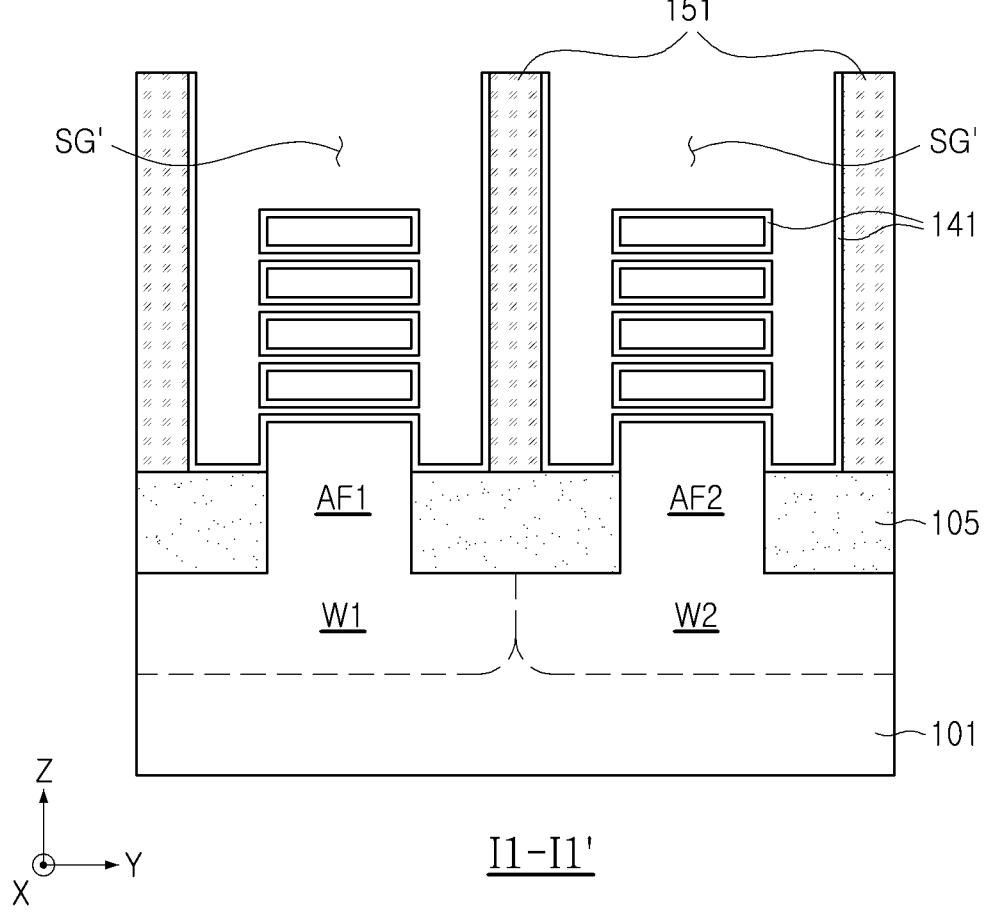
Figure 45B:
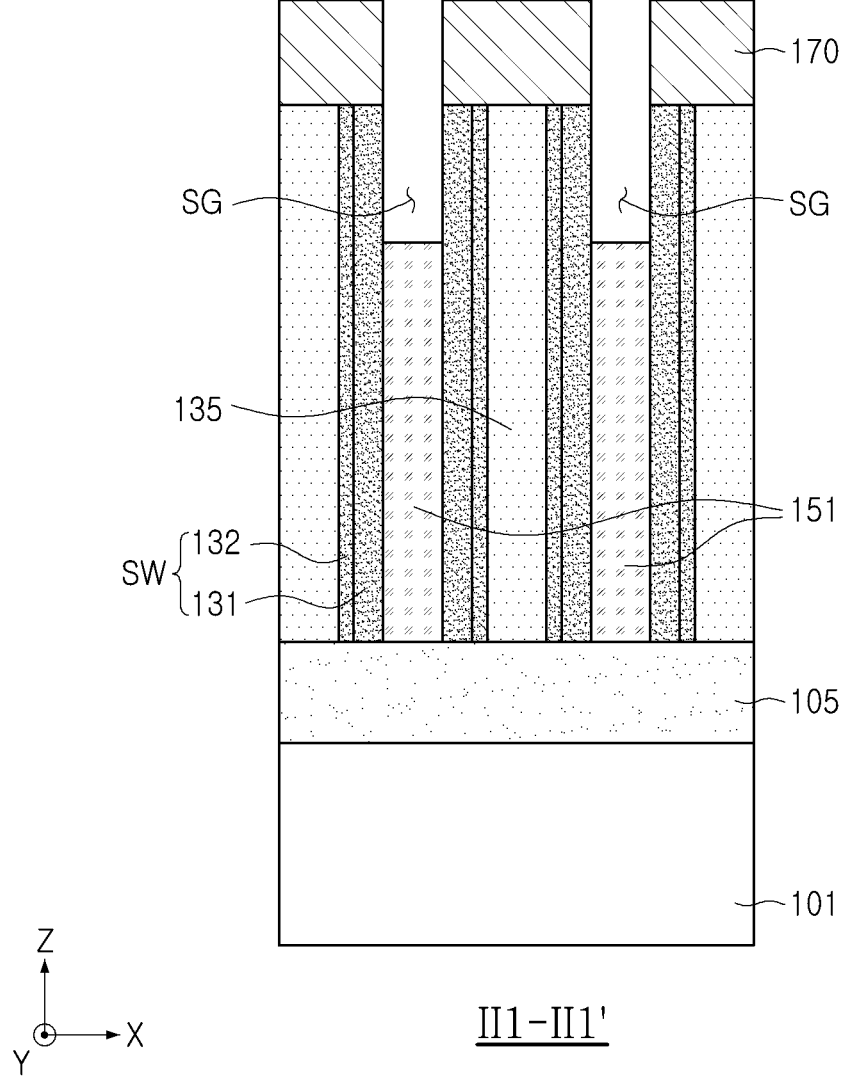
Figure 45C:
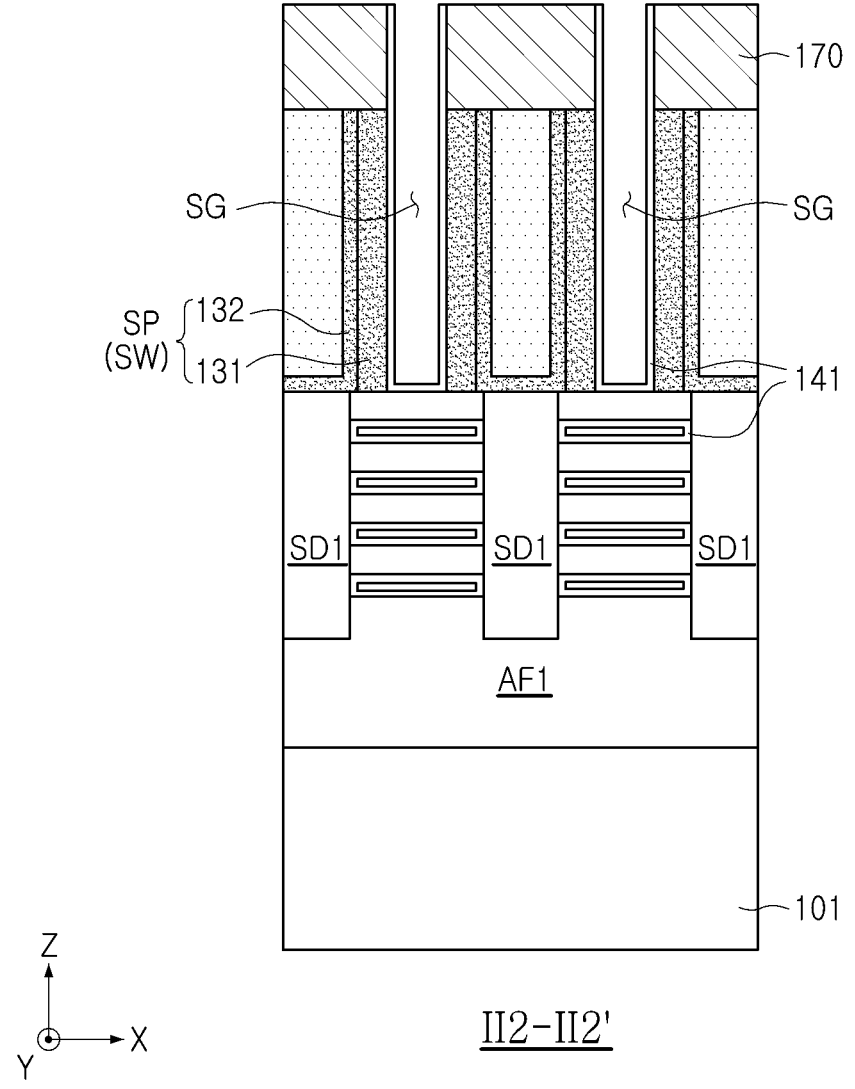

Referring to FIGS. 45A to 45C, a gate insulating layer 141 may be formed to surround a plurality of first and second channel layers CH1 and CH2 on a surface exposed by the gate electrode formation space SG. The gate insulating layer 141 may also be formed on a sidewall of the previously formed gate separation pattern 151. Since the gate separation pattern 151 is etched back in a subsequent process, a portion of an upper region of the gate separation pattern 151 may be removed to divide a gate insulating layer into portions belonging to the first and second gate structures.

Figure 46A:
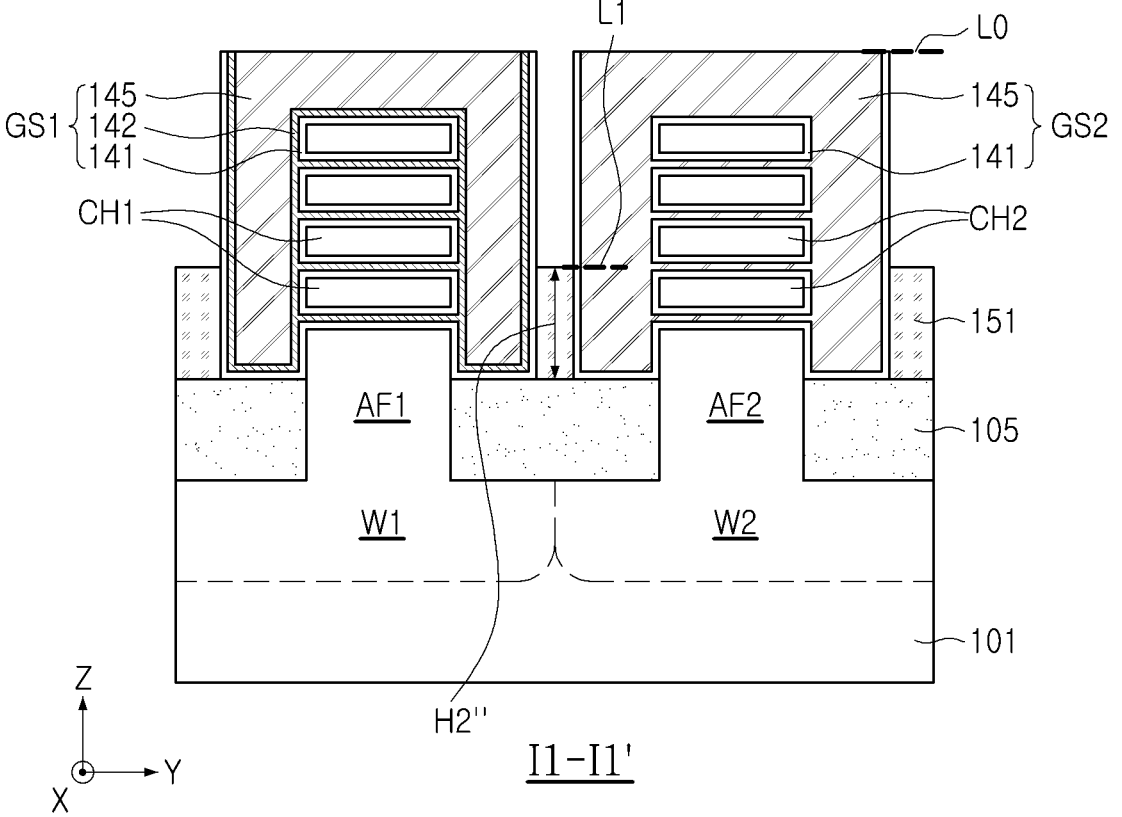
Figure 46B:
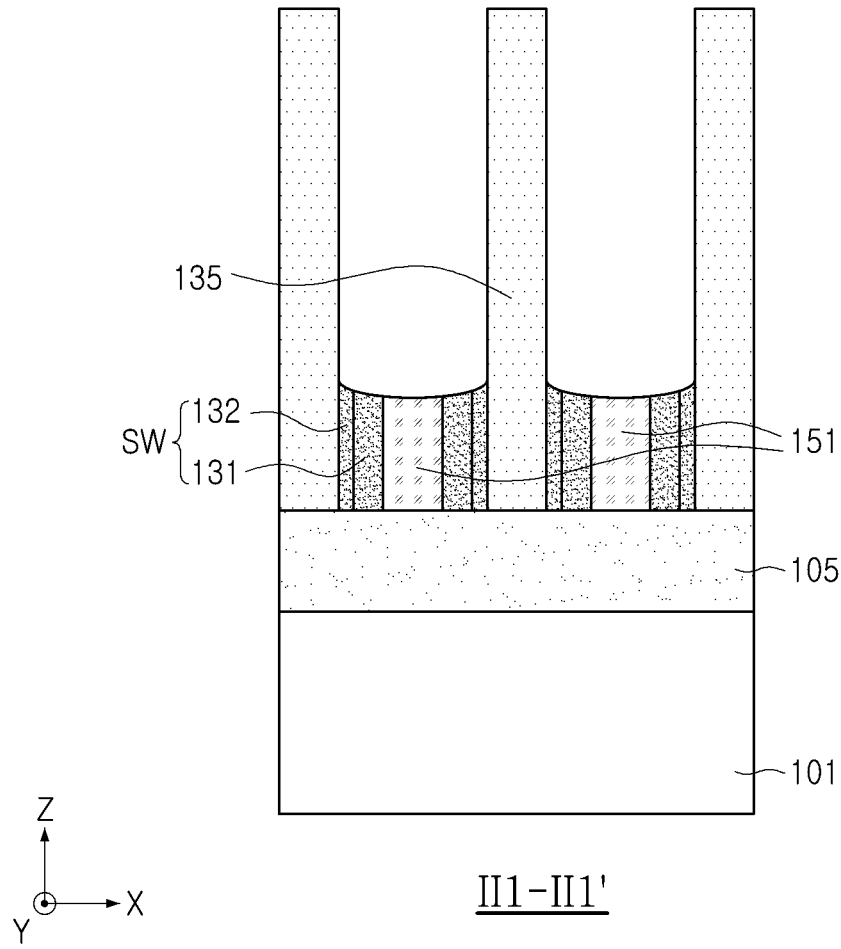
Figure 46C:
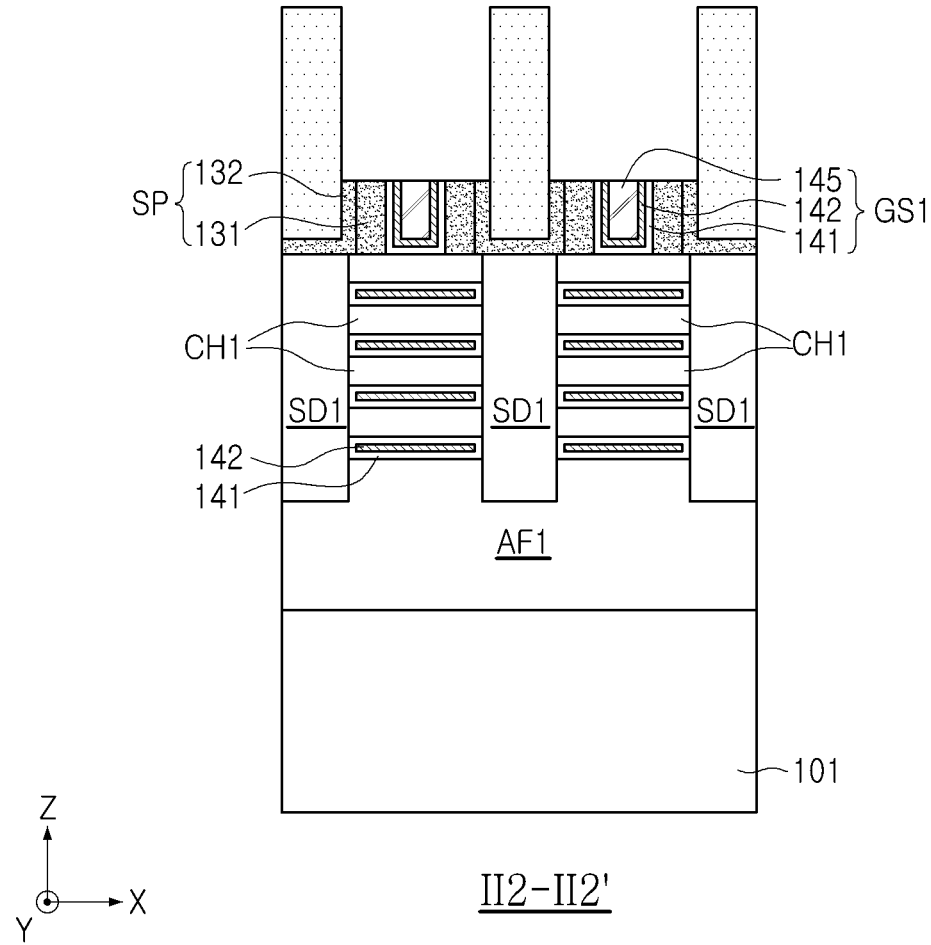

Referring to FIGS. 46A to 46C, gate electrode layers 142 and 145 may be formed in the gate electrode formation space SG' (see FIGS. 21A to 21D), and the second gate electrode layer 145 may be recessed to have a desired height (see FIGS. 22A to 22D).

In the present embodiment, after the first gate electrode layer 142 and the second gate electrode layer 145 are formed in the gate electrode formation space SG', the second gate electrode layer 145 may be planarized. The planarized second gate electrode layer 145 may be etched back, so that the first and second gate electrode layers 142 and 145 may be separated by the gate separation pattern 151. In addition, during a process of recessing the second gate electrode layer 145, the height H2" of the gate separation pattern 151 may be decreased. For example, an upper level L1 of the gate separation pattern 151 may be disposed to be lower than an upper level L0 of the second gate electrode layer 145.

As a subsequent process, a series of processes described with reference to FIGS. 23A to 23D may be additionally performed to fabricate the semiconductor device 100G illustrated in FIGS. 9A and 9B. As a result, the gate insulating layer 141 may extend between a sidewall of the gate separation pattern 151 and the gate electrodes 142 and 145 of the first and second gate structures GS1 and GS2. In the present embodiment, the gate insulating layer 141 may be disposed on substantially all sidewalls of the first and second gate structures GS1 and GS2 in the second direction.

Unlike a gate cut process according to the related art, a method of forming a gate separation pattern using an organic planarization layer (OPL) having high selectivity with respect to a surrounding insulating material (for example, SiN) after removal of a dummy gate electrode (for example, polysilicon) and before formation of a gate electrode layer is proposed. According to the present embodiment, loss of an interlayer insulating layer or an integrate insulating layer during formation of a contact may be prevented to effectively address an issue of short-circuit of a contact structure without an additional process.

While various embodiments have been shown and described above, it will be apparent to those skilled in the art that modifications and variations could be made without departing from the scope of the inventive concept as defined by the appended claims.

What is claimed is:

1. A semiconductor device, comprising:
a substrate having a first channel structure and a second channel structure each extending in a first direction and arranged in a second direction perpendicular to the first direction;
a first gate structure disposed on the first channel structure, the first gate structure extending in the second direction;
a second gate structure disposed on the second channel structure, the second gate structure extending in the second direction;
first source/drain regions respectively disposed on opposite sides of the first gate structure in the first direction;
second source/drain regions respectively disposed on opposite sides of the second gate structure in the first direction;
a gate separation pattern disposed between the first gate structure and the second gate structure, the gate separation pattern having an upper surface at a level lower than an upper surface of each of the first gate structure and the second gate structure, the gate separation pattern having a lower surface below a midpoint of a height of the first gate structure toward the substrate, the gate separation pattern comprising a first insulating material, the level being determined relative to the substrate along a third direction perpendicular to the first direction and the second direction; and
a gate capping layer disposed on the first gate structure and the second gate structure and extending in the third direction toward the substrate, the gate capping layer having an extension portion disposed between the first gate structure and the second gate structure, the gate capping layer connected to the gate separation pattern, the gate capping layer comprising a second insulating material different from the first insulating material.

2. The semiconductor device of claim 1, wherein each of the first gate structure and the second gate structure comprises:
a gate electrode layer disposed on the first channel structure and the second channel structure in the second direction;
a gate insulating layer disposed between each of the first channel structure and the second channel structure and the gate electrode layer; and
a pair of gate spacers disposed on opposite side surfaces of the gate separation pattern in the first direction.

3. The semiconductor device of claim 2, wherein:
the gate separation pattern further comprises a pair of sidewall portions extending from each of the pair of gate spacers in the second direction; and
the first insulating material is disposed between the pair of sidewall portions.

4. The semiconductor device of claim 3, wherein the pair of sidewall portions have an upper end at a level lower than an upper surface of the gate electrode layer in the third direction.

5. The semiconductor device of claim 3, wherein a width of each of the pair of sidewall portions in the first direction is smaller than a width of each of the pair of gate spacers in the first direction.

6. The semiconductor device of claim 3, wherein the gate separation pattern comprises:
a separation region comprising the first insulating material; and
a barrier layer disposed on a bottom surface and side surfaces of the separation region and comprising an insulating material different from the first insulating material.

7. The semiconductor device of claim 6, wherein:
the first insulating material comprise silicon oxide (SiOx); and
the barrier layer comprises silicon nitride (SiNx), silicon oxynitride (SiOxNy), silicon carbonitride (SiCxNy), or silicon oxycarbonitride (SiOxCyNz).

8. The semiconductor device of claim 2, further comprising:
a device isolation layer disposed on the substrate and defining the first and second channel structures; and
wherein the gate insulating layer has a portion extending between the gate electrode layer and the device isolation layer.

9. The semiconductor device of claim 8, wherein the gate electrode layer is disposed on side and upper surfaces of end portions of the extending portion of the gate insulating layer on the device isolation layer.

10. The semiconductor device of claim 8, wherein a gap between the first gate structure and the second gate structure is 15 nanometers or less.

11. The semiconductor device of claim 8, wherein the gate separation pattern has a portion extending in the third direction into the device isolation layer.

12. The semiconductor device of claim 2, wherein the gate electrode layer of the first gate structure comprises:

a first gate electrode layer surrounding an upper surface and side surfaces of the first channel structure; and a second gate electrode layer disposed on the first gate electrode layer.

13. The semiconductor device of claim 12, wherein the first gate electrode layer comprises a portion extending between a sidewall of the gate separation pattern and the second gate electrode layer.

14. The semiconductor device of claim 2, wherein the gate insulating layer comprises a portion extending between a sidewall of the gate separation pattern and the gate electrode layer.

15. The semiconductor device of claim 1, wherein:

the first insulating material comprises silicon oxide (SiOx) and the second insulating material comprises silicon nitride (SiNx), silicon oxynitride (SiOxNy), silicon carbonitride (SiCxNy), or silicon oxycarbonitride (SiOxCyNz).

16. The semiconductor device of claim 1, wherein:

each of the first channel structure and the second channel structure comprises a plurality of channel layers disposed to be spaced apart from each other in the third direction; and each of the first gate structure and the second gate structure comprises:

a gate electrode layer surrounding the plurality of channel layers and extending in the second direction; and a gate insulating layer disposed between the plurality of channel layers and the gate electrode layer.

17. A semiconductor device, comprising:

a substrate having a first channel structure and a second channel structure respectively each extending in a first direction and arranged in a second direction intersecting the first direction;

a device isolation layer disposed on the substrate and defining the first channel structure and the second channel structure;

a first gate structure disposed on the first channel structure, the first gate structure extending in the second direction on the substrate;

a second gate structure disposed on the second channel structure, the second gate structure extending in the second direction;

first source/drain regions respectively disposed on opposite sides of the first gate structure in the first direction;

second source/drain regions respectively disposed on opposite sides of the second gate structure in the first direction; and a single gate capping layer having:

a first region disposed directly over the first gate structure and the second gate structure; and a second region extending between the first gate structure and the second gate structure and filling a width of a space between the first gate structure and the second gate structure, the second region provided as a gate separation pattern, wherein the first region and the second region are a single integrated structure.

18. The semiconductor device of claim 17, wherein:

each of the first gate structure and the second gate structure comprises:

a gate electrode layer surrounding each of the first channel structure and the second channel structure in the second direction;

a gate insulating layer disposed between each of the first channel structure and the second channel structure and the gate electrode layer; and a pair of gate spacers disposed on opposite side surfaces of the gate separation pattern in the first direction;

the gate insulating layer comprises a portion extending between the gate electrode layer and the device isolation layer; and the gate electrode layer is disposed on side and upper surfaces of end portions of the extending portion of the gate insulating layer.

19. A semiconductor device, comprising:

a substrate having a channel structure extending in a first direction;

a gate structure disposed on the channel structure and extending in a second direction intersecting the first direction, the gate structure comprising an end portion extending in a third direction perpendicular to the first direction and the third direction;

a gate separation pattern directly contacting a surface of a lower region of the end portion of the gate structure, the gate separation pattern having an upper surface disposed in the third direction at a level lower than that of an upper surface of the gate structure, the gate separation pattern comprising a first insulating material;

a gate capping layer directly contacting a top surface of the gate structure, the gate capping layer having an extension portion extending in the third direction toward the substrate and directly contacting a surface of an upper region of the end portion of the gate structure, the gate capping layer comprising a second insulating material different from the first insulating material;

source/drain regions respectively disposed on opposite sides adjacent to the gate structure; and contact structures respectively connected to the source/drain regions.

20. The semiconductor device of claim 19, wherein:

the gate structure comprises:

a gate electrode layer surrounding the channel structure in the second direction;

a gate insulating layer disposed between the channel structure and the gate electrode layer; and a pair of gate spacers disposed on opposite side surfaces of the gate separation pattern in the first direction;

the gate separation pattern comprises a pair of sidewall portions extending from each of the pair of gate spacers in the second direction and having an upper end in the third direction at a level lower than that of an upper surface of the gate electrode layer; and the first insulating material is disposed between the pair of sidewall potions.

\* \* \* \* \*